(12) United States Patent  
Mima et al.

(10) Patent No.: US 8,927,978 B2
(45) Date of Patent: Jan. 6, 2015

(54) ORGANIC EL ELEMENT

(75) Inventors: Shoji Mima, Tsukuba (JP); Yoshinobu Ono, Tsukubamirai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/811,107

(22) PCT Filed: Jul. 20, 2011

(86) PCT No.: PCT/JP2011/066491
§ 371 (c)(1),
(2), (4) Date: Apr. 4, 2013

(87) PCT Pub. No.: WO2012/011510
PCT Pub. Date: Jan. 26, 2012

(65) Prior Publication Data
US 2013/0181205 A1    Jul. 18, 2013

(30) Foreign Application Priority Data
Jul. 21, 2010 (JP) ................... 2010-163675
Feb. 16, 2011 (JP) ................... 2011-030605

(51) Int. Cl.
*H01L 51/00* (2006.01)
*H01L 21/31* (2006.01)
(Continued)

(52) U.S. Cl.
CPC ............ *H01L 51/56* (2013.01); *H01L 51/5092* (2013.01); *H01L 51/5048* (2013.01);
(Continued)

(58) Field of Classification Search
CPC . H01L 51/50; H01L 51/5092; H01L 51/5203; H01L 21/02288; H01L 21/67126; H01L 51/0006; H01L 51/0039; H01L 51/5048; H01L 51/56; H01L 51/0043; H01L 51/5221; H01L 51/0002; H01L 51/0003; H01L 51/0004

USPC ................. 257/13, 40, 79, E33.001, E33.06, 257/E33.062, E33.063, E51.001, E51.018, 257/E51/019, E51.024, E51.026; 438/99, 438/584, 758, 761, 780
See application file for complete search history.

(56) References Cited

U.S. PATENT DOCUMENTS

| 5,821,002 A | 10/1998 | Ohnishi et al. |
| 2007/0176174 A1* | 8/2007 | Lee et al. ................. 257/40 |

(Continued)

FOREIGN PATENT DOCUMENTS

| JP | 9-045478 A | 2/1997 |
| JP | 2005-079064 A | 3/2005 |

(Continued)

OTHER PUBLICATIONS

STIC EIC 2800 Search Report, Aug. 21, 2014, 17p.*

(Continued)

*Primary Examiner* — Galina Yushina
(74) *Attorney, Agent, or Firm* — Sughrue Mion, PLLC

(57) ABSTRACT

An object of the invention is to provide an organic electroluminescence (EL) element formed using a relatively stable new electron injection material in an atmosphere of approximately ordinary pressure. An organic EL element of a preferable embodiment is an organic EL element including a supporting substrate, an anode, a light-emitting layer, an electron injection layer, and a cathode in this order, in which the electron injection layer is formed by applying an ink including an ionic polymer so as to form a film, and the cathode is formed by applying an ink including a material which forms the cathode so as to form a film or transferring a conductive thin film which forms the cathode.

4 Claims, 2 Drawing Sheets

(51) Int. Cl.
  *H01L 51/50* (2006.01)
  *H01L 51/56* (2006.01)
  *H05B 33/26* (2006.01)
  *H01L 51/52* (2006.01)

(52) U.S. Cl.
  CPC ............ *H01L 51/0022* (2013.01); *H05B 33/26* (2013.01); *H01L 51/0043* (2013.01); *H01L 51/0005* (2013.01); *H01L 51/0039* (2013.01); *H01L 51/5221* (2013.01)
  USPC .............. 257/40; 257/E33.063; 257/E51.018; 257/E51.019; 257/E51.024; 257/E51.026; 438/99; 438/584; 438/758; 438/761; 438/780

(56) References Cited

U.S. PATENT DOCUMENTS

| | | | |
|---|---|---|---|
| 2008/0020208 A1* | 1/2008 | Lee et al. | 428/411.1 |
| 2009/0023235 A1* | 1/2009 | MacKenzie et al. | 438/29 |
| 2009/0032107 A1* | 2/2009 | Kim et al. | 136/263 |
| 2011/0006294 A1* | 1/2011 | Tanaka et al. | 257/40 |
| 2011/0065282 A1* | 3/2011 | Yan et al. | 438/758 |
| 2011/0284825 A1* | 11/2011 | Yang et al. | 257/40 |

FOREIGN PATENT DOCUMENTS

| | | |
|---|---|---|
| JP | 2005-158489 A | 6/2005 |
| JP | 2007-149589 A | 6/2007 |
| JP | 2009-123690 A | 6/2009 |
| JP | 2009-239279 A | 10/2009 |
| JP | 2010-103040 A | 5/2010 |
| WO | 2009/012498 A1 | 1/2009 |

OTHER PUBLICATIONS

Michel Belletete, et al, "Theoretical and Experimental Investigations of the Spectroscopic and Photophysical Properties of Fluorene-Phenylene and Fluorene-Thiophene Derivatives: Precursors of Light-Emitting Polymers", The Journal of Physical Chemistry B, 2000, pp. 9118-9125, vol. 104.

Adalbert Maercker, "The Wittig Reaction", Organic Reactions, John Wiley & Sons, 1965, pp. 270-490, vol. 14.

Makoto Kumada, et al. "Phosphine-Nickel Complex Catalyzed Cross-Coupling of Grignard Reagents With Aryl and Alkenyl Halides: 1,2-Dibutylbenzene", Organic Syntheses Collective, John Wiley & Sons, pp. 407-411 vol. 6, 1988.

Norio Miyaura, et al., "Palladium-Catalyzed Cross-Coupling Reactions of Organoboron Compounds", Chem. Rev., 1995, pp. 2457-2483, vol. 95.

Akira Suzuki, "Recent advances in the cross-coupling reactions of organoboron derivatives with organic electrophiles, 1995-1998" Journal of Organometallic Chemistry, 1999, pp. 147-168, vol. 576.

H. -H. Horhold, et al., "Poly(phenylenevinylene)s—Synthesis and Redoxchemistry of Electroactive Polymers", Makromol. Chem., Macromol. Symp., 1987, pp. 229-258, vol. 12.

* cited by examiner

ORGANIC EL ELEMENT

CROSS REFERENCE TO RELATED APPLICATIONS

This application is a National Stage of International Application No. PCT/JP2011/066491, filed on Jul. 20, 2011, which claims priority from Japanese Patent Application Nos. 2010-163675, filed on Jul. 21, 2010, and 2011-030605, filed on Feb. 16, 2011, the contents of all of which are incorporated herein by reference in their entirety.

TECHNICAL FIELD

The present invention relates to an organic EL element and a method of manufacturing the same.

BACKGROUND ART

There are a variety of light-emitting elements having different configurations, light-emitting principles, and the like. Currently, organic electro luminescence (EL) elements are being put into practical use as one of the light-emitting elements.

An organic EL element is configured by laminating a supporting substrate, an anode, a light-emitting layer composed of an organic substance, and a cathode in this order. When a voltage is applied to the organic EL element, holes are injected from the anode, and electrons are injected from the cathode. In addition, the holes and the electrodes, which have been injected from the respective electrodes, combine with each other in the light-emitting layer so as to emit light.

Since it is difficult to obtain desired light-emitting characteristics, in the organic EL element configured only with an anode, a light-emitting layer, and a cathode, prescribed layers other than the light-emitting layer are usually provided between the anode and the cathode. For example, a hole injection layer, an electron injection layer, or the like is provided between the anode and the cathode as the prescribed layer. The hole injection layer is provided between the anode and the light-emitting layer in order to facilitate injection of holes from the anode. In addition, the electron injection layer is provided between the cathode and the light-emitting layer in order to facilitate injection of electrons from the cathode. The above organic EL element is formed by laminating the supporting substrate, the anode, the hole injection layer, the light-emitting layer, the electron injection layer, and the cathode in this order.

Generally, the electron injection layer is configured with an electron injection material which is unstable in an atmospheric air. For example, the electron injection layer is configured with Ba, BaO, NaF, and the like, and is usually formed in a vacuum atmosphere. In addition, the cathode provided on the electron injection layer is usually formed in a vacuum atmosphere in order to suppress deterioration of the electron injection layer which is unstable in the atmospheric air.

As such, in the related art, while it is necessary to introduce a vacuum atmosphere in order to form the electron injection layer and the cathode, the scale of an apparatus increases, or the process becomes complicated in order to produce the vacuum atmosphere. For example, in a roll to roll method, which is considered as a method to facilitate manufacturing of the organic EL element, it is necessary to maintain the entire apparatus including an apparatus in which flexible films are wound in a vacuum atmosphere in order to form the electron injection layer and the cathode in a vacuum atmosphere, and there is a problem in that the scale of the apparatus increases (for example, refer to Patent Literature 1).

Therefore, studies are being made to develop electron injection materials which are relatively stable in the atmosphere and facilitate injection of electrons from the cathode in order to enable formation of the electron injection layer without introducing a vacuum atmospheric air. As the electron injection materials, organometallic complexes are proposed, and, in techniques of the related art, an electron injection layer is formed by applying the above metallic complex so as to form a film (for example, refer to Patent Literature 2).

CITATION LIST

Patent Literature

[Patent Literature 1] JP 2007-149589A
[Patent Literature 2] JP 2005-158489A

SUMMARY OF INVENTION

Technical Problem

However, there are only limited types of electron injection materials which are relatively stable in an atmosphere of approximately ordinary pressure and facilitate injection of electrons from the cathode, and, as of today, efforts are being made to develop a variety of electron injection materials that are available for an organic EL element.

Therefore, an object of the invention is to provide an organic EL element formed by using a new electron injection material which is relatively stable in an atmosphere of approximately ordinary pressure.

Solution to Problem

The invention relates to an organic EL element which includes a supporting substrate, an anode, a light-emitting layer, an electron injection layer, and a cathode in this order, and the electron injection layer is formed by applying an ink including an ionic polymer so as to form a film, and the cathode is formed by applying an ink including a material which forms the cathode so as to form a film or transferring a conductive thin film which forms the cathode.

In addition, the invention relates to an organic EL element in which the cathode includes a conductive filler.

In addition, the invention relates to a method of manufacturing an organic EL element which includes a supporting substrate, an anode, a light-emitting layer, an electron injection layer, and a cathode in this order, and the method includes a step of forming the electron injection layer by applying an ink including an ionic polymer so as to form a film, and a step of forming the cathode by transferring a conductive thin film or applying an ink including a material which forms the cathode so as to form a film.

In addition, the invention relates to a method of manufacturing an organic EL element in which the electron injection layer and the cathode are formed by using a roll to roll method.

Advantageous Effects of Invention

According to the invention, it is possible to form an electron injection layer of an organic EL element in an atmosphere of approximately ordinary pressure through an application method using a relatively stable new electron injection material, and it is possible to provide an organic EL element containing an electron injection layer formed without introducing a vacuum atmosphere.

DESCRIPTION OF EMBODIMENTS

An organic EL element of a preferable embodiment is an organic EL element which includes a supporting substrate, an anode, a light-emitting layer, an electron injection layer, and a cathode in this order, and the electron injection layer is formed by applying an ink including an ionic polymer so as to form a film, and the cathode is formed by applying an ink including a material which forms the cathode so as to form a film or transferring a conductive thin film which forms the cathode.

Figure 1:
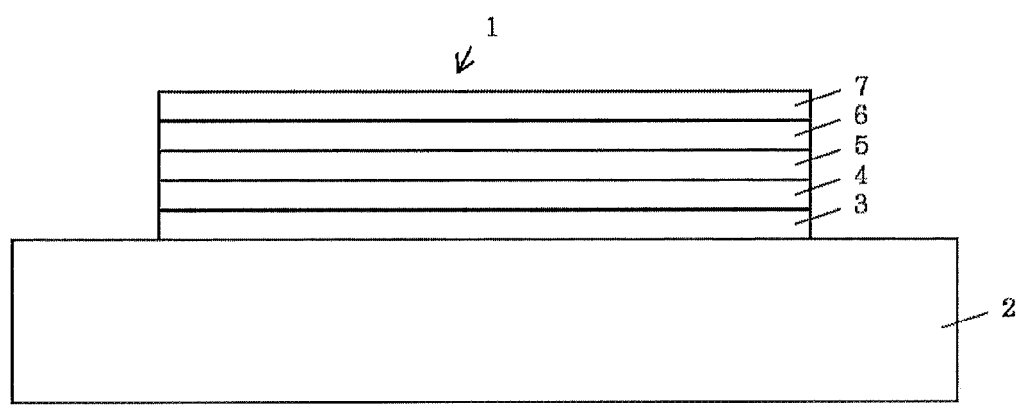
FIG. 1 is a cross-sectional view schematically showing an organic EL element.

The organic EL element can be used as, for example, a light source in lighting apparatuses or a backlight in display apparatuses. Hereinafter, the organic EL element of the present embodiment will be described referring to FIG. 1. FIG. 1 is a cross-sectional view schematically showing the organic EL element of the embodiment.

The organic EL element of the embodiment is configured by laminating at least the anode, the light-emitting layer, the electron injection layer, and the cathode on the supporting substrate in this order. Meanwhile, the organic EL element may be further provided with prescribed layers between the anode and the cathode as necessary in addition to the light-emitting layer and the electron injection layer. For example, a hole injection layer, a hole transport layer, an electron transport layer, and the like may be provided between the anode and the cathode. FIG. 1 shows an organic EL element 1 which is configured by laminating a supporting substrate 2, an anode 3, a hole injection layer 4, a light-emitting layer 5, an electron injection layer 6, and a cathode 7 in this order as an example.

The organic EL element is formed by sequentially laminating the respective components. In the invention, the electron injection layer is formed by applying an ink including an ionic polymer so as to form a film, and the cathode is formed by applying an ink including a material which forms the cathode so as to form a film or transferring a conductive thin film which forms the cathode.

As confirmed in examples described below, as in the embodiment, it is possible to obtain the light-emitting organic EL element by forming the electron injection layer in the atmospheric air by applying an ink including an ionic polymer so as to form a film, and further forming the cathode on the electron injection layer. That is, even when the electron injection layer is formed in the atmospheric air, it is possible to obtain a layer which functions as the electron injection layer. Meanwhile, as in techniques of the related art, when the electron injection layer made of Ba, BaO, NaF, and the like is formed, and then is exposed to the atmospheric air, the electron injection layer deteriorates immediately. In addition, when the cathode is formed on the electron injection layer having deteriorated once, it cannot be expected to obtain an organic EL element that emits light.

In the embodiment, the cathode is formed by applying an ink including a material which forms the cathode so as to form a film or transferring a conductive thin film which forms the cathode. The cathode also can be formed in the atmospheric air. As such, according to the embodiment, since the cathode as well as the electron injection layer can be formed without introducing a vacuum atmosphere, it becomes possible to facilitate the process of manufacturing the organic EL element. Meanwhile, in the examples described below, formation of the cathode is performed in a vacuum atmosphere, but the electron injection layer is exposed to the atmospheric air after the electron injection layer is formed until formation of the cathode begins. As such, according to the embodiment, even when the cathode is formed on the electron injection layer which has been exposed to the atmospheric air, a light-emitting organic EL element can be obtained. Therefore, a light-emitting organic EL element can be obtained even when the cathode is formed in the atmospheric air instead of using the method of the embodiment in which the cathode is formed in a vacuum atmosphere.

Hereinafter, a method of manufacturing an organic EL element using a roll to roll method (hereinafter sometimes referred to as the R2R method) will be described referring to FIG. 2. In the R2R method, at least a pair of winding cores 11 and 12 is disposed. A band-shaped flexible film is wound on the pair of winding cores 11 and 12 respectively. The flexible film unwound from one winding core 11 is wound onto the other winding core 12 so as to change the winding position of the flexible film from the winding core 11 to the winding core 12. When the winding position of the flexible film is changed, the respective components of the organic EL element are laminated respectively.

In the embodiment, firstly, the supporting substrate having the anode formed in advance on the surface is prepared, and the winding core 11 formed by winding the supporting substrate is used.

Figure 2:
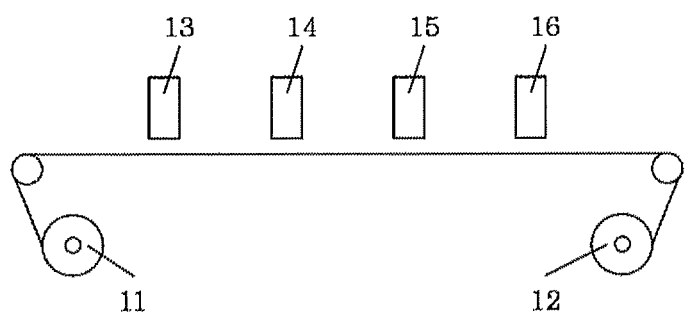
FIG. 2 is a view schematically showing a method of manufacturing an organic EL element.

The supporting substrate unwound from one winding core 11 moves toward the other winding core 12 in the horizontal direction (in FIG. 2, the supporting substrate moves in the right direction).

During movement of the supporting substrate, an ink including a material which forms the hole injection layer is applied on the anode on the supporting substrate so as to form a film, thereby forming the hole injection layer. The ink including a material which forms the hole injection layer is supplied from an application apparatus 13.

After the hole injection layer is formed, subsequently, an ink including a material which forms the light-emitting layer is applied on the hole injection layer so as to form a film, thereby forming the light-emitting layer. The ink including a material which forms the light-emitting layer is supplied from an application apparatus 14.

After the light-emitting layer is formed, subsequently, an ink including a material which forms the electron injection layer is applied on the light-emitting layer so as to form a film, thereby forming the electron injection layer. The ink including a material which forms the electron injection layer is supplied from an application apparatus 15.

After the electron injection layer is formed, subsequently, an ink including a material which forms the cathode is applied on the electron injection layer so as to form a film, thereby forming the cathode. The ink including a material which forms the cathode is supplied from an application apparatus 16.

The organic EL element is formed by using the above process.

After the cathode is formed, subsequently, the supporting substrate is wound on the other winding core 12.

The above process can be carried out in the atmospheric air. For example, it is possible to manufacture the organic EL element in a clean room. Meanwhile, the above process may be carried out in an inert gas atmosphere as necessary. As such, when the organic EL element is formed by using the R2R method without introducing a vacuum atmosphere, it becomes possible to readily form the organic EL element.

Examples of the application apparatuses 13, 14, 15, and 16 include a bar coating apparatus, a capillary coating apparatus, a slit coating apparatus, an ink jet apparatus, a spray coating apparatus, a nozzle coating apparatus, a printing apparatus, and the like. In the embodiment, the plurality of application apparatuses 13, 14, 15, and 16 is used, and all of the application apparatuses may be the same type of apparatus, or optimal application apparatuses may be appropriately and individually used depending on the types of inks.

FIG. 2 shows an embodiment in which the inks are applied on the supporting substrate from the top in the vertical direction to the supporting substrate so as to form a film; however, as another embodiment, the inks may be applied on the supporting substrate from the bottom in the vertical direction to the supporting substrate so as to form a film.

FIG. 2 shows an embodiment in which the supporting substrate is transported in the horizontal direction (the right and left direction in FIG. 2), but the supporting substrate may be transported in the vertical direction or a diagonal direction inclined between the horizontal direction and the vertical direction.

FIG. 2 shows only the application apparatuses 13, 14, 15, and 16, but a cleaning apparatus, a drying apparatus, a neutralization apparatus, and the like may be provided as necessary.

The cleaning apparatus cleans the supporting substrate in a process before the inks are applied to the supporting substrate unwound from the winding core 11 for the first time, for example, modifies the surface of the supporting substrate (that is, the surface of the anode). Examples of the cleaning apparatus include a low-pressure mercury lamp, an excimer lamp, a plasma washing apparatus, and the like. For example, cleaning can be carried out by irradiating light with a radiation intensity of 5 mW/cm$^2$ to 20 mW/cm$^2$ to the supporting substrate using low-pressure mercury lamps with a wavelength of 184.2 nm which are disposed at intervals of approximately 5 mm to 15 mm. In addition, in the plasma washing apparatus, for example, atmospheric-pressure plasma is preferably used. It is possible to carry out cleaning by using argon gas containing 1 volume % to 5 volume % of oxygen under conditions of a frequency of 100 kHz to 150 MHz, a voltage of 10 V to 10 kV, and an irradiation distance of 5 mm to 20 mm.

It is preferable to carry out a neutralization treatment on the supporting substrate before applying the inks respectively by using the respective application apparatuses 13, 14, 15, 16, and 17. The neutralization treatment can prevent attachment of foreign matter, insulation breakdown, and the like. Therefore, the neutralization apparatus is disposed at a location at which the neutralization treatment is carried out on the supporting substrate in a process before the inks are applied or a process after the inks are applied. The neutralization apparatus is realized by using, for example, a neutralization device which generates air ions. The air ions generated by using the neutralization apparatus are drawn to a charged body so as to supplement charges having the opposite polarity.

The inks applied to form a film are dried by using the drying apparatus as necessary. The drying apparatus is disposed at a location at which a drying treatment is carried out in a process after the inks are applied. Examples of the drying apparatus include a heating apparatus or a light irradiation apparatus. Meanwhile, in a case in which the inks include a material that forms crosslinking through supply of energy, it is possible to obtain a thin film in which at least some of a material that configures the thin film forms crosslinking by supplying energy using a heating apparatus or a light irradiation apparatus.

Speed adjusting means for adjusting the movement speed of the supporting substrate may be provided between the respective application apparatuses 13, 14, 15, and 16. It is possible to remove the variations in the application speed of the respective application apparatuses 13, 14, 15, and 16 by providing the speed adjusting means. Examples of the speed adjusting means include a so-called accumulator.

Meanwhile, in the embodiment, the method of forming the cathode using the application method has been described, but the cathode may be formed by using a method in which a conductive thin film which forms the cathode is transferred. That is, the cathode may be formed by disposing a so-called laminating apparatus instead of the application apparatus 16 (refer to FIG. 2) which applies the ink including a material which forms the cathode so as to form a film, and transferring a conductive thin film which forms the cathode by using the laminating method.

In addition, in the embodiment, the method of forming an organic EL element using the R2R method has been described; however, the organic EL element may be formed using, for example, a single element method. In this case, it is possible to form an organic EL element by sequentially applying the respective components of the organic EL element on a supporting substrate which has already been cut into a prescribed scale appropriately using a well-known application method so as to form a film.

Next, the layer structure of the organic EL element and the constituent materials of the respective layers will be described more specifically.

As described above, the organic EL element can have a variety of layer structures. The organic EL element is configured to include a pair of electrodes and a plurality of organic layers provided between the respective electrodes. In the embodiment, the organic EL element has at least one light-emitting layer and the electron injection layer as the plurality of organic layers. Meanwhile, the organic EL element may include layers including inorganic substances or organic substances, inorganic layers, and the like in addition to the organic layers. The organic substances that configure the organic layers may be low-molecular compounds, high molecular compounds, or mixtures of a low-molecular compound and a high molecular compound. The organic layer preferably includes a high molecular compound, and preferably includes a high molecular compound having a polystyrene equivalent number average molecular weight of $10^3$ to $10^8$.

The electron injection layer, an electron transport layer, a hole blocking layer, and the like may be provided between the cathode and the light-emitting layer. In a case in which both the electron injection layer and the electron transport layer are provided between the cathode and the light-emitting layer, the electron injection layer is provided near the cathode, and the electron transport layer is provided near the light-emitting layer. The hole injection layer, a hole transport layer, an electron blocking layer, and the like may be provided between the anode and the light-emitting layer. In a case in which both the hole injection layer and the hole transport layer are provided, the hole injection layer is provided near the anode, and the hole transport layer is provided near the light-emitting layer.

Hereinafter, examples of the layer structure of the organic EL element, which can be applied to the organic EL element of the invention, will be shown. Among the examples, (b) corresponds to the organic EL element shown in FIG. 1.

(a) supporting substrate/anode/light-emitting layer/electron injection layer/cathode (b) supporting substrate/anode/hole injection layer/light-emitting layer/electron injection layer/cathode (c) supporting substrate/anode/hole injection layer/hole transport layer/light-emitting layer/electron injection layer/cathode (d) supporting substrate/anode/hole transport layer/light-emitting layer/electron injection layer/cathode (herein, "/" indicates that the layers before and after "/" are adjacently laminated.)

<Supporting Substrate>

A light-permeable material or a light-impermeable material can be applied to the supporting substrate. Meanwhile, in the case of a so-called bottom emission-type organic EL element, a light-permeable material is used for the supporting substrate. In addition, in the case of a so-called top emission-type organic EL element, it is possible to use a light-impermeable material as well as a light-permeable material for the supporting substrate. Here, the bottom emission-type organic EL element refers to an element in which light emitted from the light-emitting layer sequentially penetrates the anode and the supporting substrate, and is emitted to the external system. The top emission-type organic EL element refers to an element in which light emitted from the light-emitting layer sequentially penetrates the cathode, and is emitted to the external system.

For the supporting substrate, it is possible to appropriately select and use a flexible material or an inflexible material depending on the use or manufacturing method of the organic EL element. For example, in a case in which the organic EL element is formed using the R2R method as described above, a flexible material is used for the supporting substrate.

A glass plate, a metal plate, a plastic plate, a high molecular film plate, a silicon plate, a laminate thereof, and the like can be used for the supporting substrate. Meanwhile, it is also possible to make a glass plate and a metal plate thin and use the thin plate as a flexible substrate.

<Anode>

In the case of the bottom emission-type organic EL element, a light-permeable electrode is used as the anode. As the light-permeable electrode, it is possible to use a thin film of a metallic oxide, a metallic sulfide, a metal and the like, which are highly conductive, and a highly light-permeable film is preferably used. For example, a thin film composed of indium oxide, zinc oxide, tin oxide, indium tin oxide (ITO), indium zinc oxide (IZO), gold, platinum, silver, copper, or the like is used. Among the above films, a thin film composed of ITO, IZO, or tin oxide is preferably used. As a method of manufacturing the anode on the supporting substrate, a vacuum deposition method, a sputtering method, an ion plating method, a plating method, or the like can be used. In addition, as the anode, an organic transparent conductive film, such as polyaniline, a derivative thereof, polythiophene, or a derivative thereof, may be used.

Particularly, the anode is preferably an anode different from an anode including a conductive filler, that is, an anode not including a conductive filler. For example, a flat anode formed by forming a film substantially uniformly throughout the entire anode by using a material that configures the anode is preferable. For example, an anode formed by forming a film using the material of the anode and a vacuum deposition method, a sputtering method, an ion plating method, a plating method, or the like, or an anode formed by forming a film using an application fluid in which a conductive high molecular compound is dissolved or dispersed and an application method is preferable. Examples of the conductive high molecular compound include polyaniline, a derivative thereof, polythiophene, a derivative thereof, and the like.

Meanwhile, in the case of the top emission-type organic EL element, a material that reflects light may be used for the anode, and the material is preferably a metal, a metal oxide, or a metal sulfide which has a work function of 3.0 eV or more.

The film thickness of the anode can be appropriately selected in consideration of light permeability, electric resistance, and the like. For example, the film thickness is 10 nm to 10 μm, preferably 20 nm to 1 μm, and more preferably 50 nm to 500 nm.

<Hole Injection Layer>

As a hole injection material that configures the hole injection layer, it is possible to use an oxide such as vanadium oxide, molybdenum oxide, ruthenium oxide or aluminum oxide, phenylamines, starburst amines, phthalocyanines, amorphous carbon, polyaniline, polythiophene derivatives, or the like.

As a method of forming the hole injection layer, for example, it is possible to use a method in which a film is formed using a solution including the hole injection material. The solvent of the solution used for film formation for which the solution is used is not particularly limited as long as the hole injection material can be dissolved in the solution. Examples thereof include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methyl ethyl ketone, ester-based solvents such as ethyl acetate, butyl acetate and ethyl cellosolve acetate, and water.

The film thickness of the hole injection layer is appropriately set in consideration of electrical characteristics, ease of film formation, and the like. For example, the film thickness is 1 nm to 1 μm, preferably 2 nm to 500 nm, and more preferably 5 nm to 200 nm.

<Hole Transport Layer>

As a hole transport material that configures the hole transport layer, it is possible to use polyvinyl carbazole or a derivative thereof, polysilane or a derivative thereof, a polysiloxane derivative having an aromatic amine in a side chain or the main chain, a pyrazoline derivative, an arylamine derivative, a stilbene derivative, a triphenyl diamine derivative, polyaniline or a derivative thereof, polythiophene or a derivative thereof, polyaryl amine or a derivative thereof, polypyrrole or a derivative thereof, polyp-phenylene vinylene) or a derivative thereof, poly(2,5-thienylene vinylene) or a derivative thereof.

Among the above, as the hole transport material, a high molecular hole transport material such as polyvinyl carbazole or a derivative thereof, polysilane or a derivative thereof, a polysiloxane derivative having an aromatic amine in a side chain or the main chain, polyaniline or a derivative thereof, polythiophene or a derivative thereof, polyaryl amine or a derivative thereof, poly(p-phenylene vinylene) or a derivative thereof, poly(2,5-thienylene vinylene) or a derivative thereof is preferable, and polyvinyl carbazole or a derivative thereof, polysilane or a derivative thereof, or a polysiloxane derivative having an aromatic amine in a side chain or the main chain is more preferable. In a case in which the hole transport material is a low-molecular material, the hole transport material is preferably used after being dispersed in a high molecular binder.

The method of forming the hole transport layer is not particularly limited, and the hole transport layer can be formed using a method in which a film is formed by using a solution.

The solvent of the solution used for film formation in which the solution is used is not particularly limited as long as the hole transport material is dissolved in the solution, and it is possible to use the solvents exemplified as the solvent of the solution used when the hole injection layer is formed by using the solution.

The high molecular binder mixed into the hole transport material is preferably a binder which does not significantly impair charge transport, and a binder which barely absorbs visible light is preferably used. Examples thereof include polycarbonate, polyacrylate, polymethyl acrylate, polymethyl methacrylate, polystyrene, polyvinyl chloride, polysiloxane, and the like.

The film thickness of the hole transport layer is appropriately set in consideration of electrical characteristics, ease of film formation, and the like. For example, the film thickness is 1 nm to 1 μm, preferably 2 nm to 500 nm, and more preferably 5 nm to 200 nm.

<Light-Emitting Layer>

The light-emitting layer is configured mainly with an organic substance that emits fluorescence and/or phosphorescence, or this organic substance and a dopant which supplements the organic substance. The dopant is added in order to, for example, improve the light-emitting efficiency or change the light-emitting wavelength. The organic substance may be a low-molecular compound or a high molecular compound. The light-emitting layer preferably includes a high molecular compound having a polystyrene equivalent number average molecular weight of $10^3$ to $10^8$. Examples of the light-emitting material that configures the light-emitting layer include the following colorant-based materials, metal complex-based materials, high molecule-based materials, and dopant materials.

(Colorant-Based Materials)

Examples of the colorant-based materials include cyclopentamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, coumarin derivatives, and the like.

(Metal Complex-Based Materials)

Examples of the metal complex-based materials include metal complexes including a rare earth metal, such as Tb, Eu or Dy, or Al, Zn, Be, Ir, Pt, or the like as a central metal and an oxadiazole structure, a thiadiazole structure, a phenylpyridine structure, a phenylbenzoimidazole structure, a quinoline structure, or the like as a ligand. Examples thereof include metal complexes exhibiting light emission from a triplet excited state, such as iridium complexes and platinum complexes, quinolinoaluminum complexes, benzoquinolinolberyllium complexes, benzooxazolylzinc complexes, benzothiazolezinc complexes, azomethylzinc complexes, porphyrinzinc complexes, phenanthrolineeuropium complexes, and the like.

(High Molecule-Based Materials)

Examples of the high molecule-based materials include polyparaphenylene vinylene derivatives, polythiophene derivatives, polyparaphenylene derivatives, polysilane derivatives, polyacetylene derivatives, polyfluorene derivatives, polyvinylcarbazole derivatives, and materials obtained by polymerizing the above colorant-based materials or metal complex-based light emitting materials, and the like.

Among the above light-emitting materials, examples of a material that emits blue light include distyrylarylene derivatives, oxadiazole derivatives, and polymers thereof, polyvinylcarbazole derivatives, polyparaphenylene derivatives, polyfluorene derivatives, and the like. Among the above, polyvinylcarbazole derivatives, polyparaphenylene derivatives, polyfluorene derivatives, and the like for high molecular materials are preferable.

In addition, examples of a material that emits green light include quinacridone derivatives, coumarin derivatives, and polymers thereof, polyparaphenylene vinylene derivatives, polyfluorene derivatives, and the like. Among the above, polyparaphenylene vinylene derivatives, polyfluorene derivatives, and the like for high molecular materials are preferable.

In addition, examples of a material that emits red light include coumarin derivatives, thiophene ring compounds, and polymers thereof, polyparaphenylene vinylene derivatives, polythiophene derivatives, polyfluorene derivatives, and the like. Among the above, polyparaphenylene vinylene derivatives, polythiophene derivatives, polyfluorene derivatives, and the like of high molecular materials are preferable.

(Dopant Materials)

Examples of the dopant materials include perylene derivatives, coumarin derivatives, rubrene derivatives, quinacridone derivatives, squarium derivatives, porphyrin derivatives, styryl-based colorant, tetracene derivatives, pyrazolone derivatives, decacyclene, phenoxazone, and the like. The thickness of this light-emitting layer is preferably approximately 2 nm to 200 nm.

A method of forming a film of the light-emitting material is not particularly limited, and a film can be formed from a solution. As described above, it is possible to use a bar coating apparatus, a capillary coating apparatus, a slit coating apparatus, an ink jet apparatus, a spray coating apparatus, a nozzle coating apparatus, a printing apparatus, and the like as a film-forming apparatus.

<Electron Transport Layer>

It is possible to use a well-known material as an electron transport material that configures the electron transport layer. Examples thereof include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or derivatives thereof, polyquinoline or derivatives thereof, polyquinoxaline or derivatives thereof, polyfluorene or derivatives thereof, and the like.

Among the above, as the electron transport material, oxadiazole derivatives, benzoquinone or derivatives thereof, anthraquinone or derivatives thereof, metal complexes of 8-hydroxyquinoline or derivatives thereof, polyquinoline, derivatives thereof, polyquinoxaline, derivatives thereof, polyfluorene, and derivatives thereof are preferable, and 2-(4-biphenylyl)-5-(4-t-butylphenyl)-1,3,4-oxadiazole, benzoquinone, anthraquinone, tris(8-quinolinol)aluminum, and polyquinoline are more preferable.

As a method of forming the electron transport layer, the electron transport layer can be formed using a solution.

The film thickness of the electron transport layer is appropriately set in consideration of electrical characteristics, ease of film formation, and the like. The film thickness is, for example, preferably 1 nm to 1 µm, more preferably 2 nm to 500 nm, and still more preferably 5 nm to 200 nm.

<Electron Injection Layer>

The electron injection layer includes an ionic polymer. Examples of the ionic polymer that configures the electron injection layer include polymers having a structural unit including one or more groups selected from a group consisting of groups represented by the formula (1) and groups represented by the formula (2). As a form of the ionic polymer, a polymer having the structural unit including one or more groups selected from a group consisting of groups represented by the formula (1) and groups represented by the formula (2) at 15 mol % to 100 mol % of the entire structural units can be used. These groups may be directly bonded to the main chain which configures the ionic polymer, or may be bonded to a substituent bonded to the main chain.

$$-(Q^1)_{n1}-Y^1(M^1)_{a1}(Z^1)_{b1} \quad (1)$$

(In the formula (1), $Q^1$ represents a divalent organic group, $Y^1$ represents $-CO_2^-$, $-SO_3^-$, $-SO_2^-$, $-PO_3^{2-}$, or $-B(R^a)_3$, $M^1$ represents a metal cation or an ammonium cation having a substituent or not having a substituent, $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, n1 represents an integer of 0 or more, a1 represents an integer of 1 or more, and b1 represents an integer of 0 or more. However, a1 and b1 are selected so that the charge of the group represented by the formula (1) can become zero, $R^a$ represents an alkyl group which has or does not have a substituent and has 1 to 30 carbon atoms or an aryl group which has or does not have a substituent and has 6 to 50 carbon atoms, and, in a case in which there are a plurality of $Q^1$s, $M^1$s, and $Z^1$s respectively, they may be the same as or different from each other.)

$$-(Q^2)_{n2}-Y^2(M^2)_{a2}(Z^2)_{b2} \quad (2)$$

(In the formula (2), $Q^2$ represents a divalent organic group, $Y^2$ represents a carbocation, an ammonium cation, a phosphonyl cation, a sulfonyl cation, or an iodonium cation, $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Z^2$ represents a metal cation or an ammonium cation having a substituent or not having a substituent, n2 represents an integer of 0 or more, a2 represents an integer of 1 or more, and b2 represents an integer of 0 or more. However, a2 and b2 are selected so that the charge of the group represented by the formula (2) can become zero, $R^b$ represents an alkyl group which has or does not have a substituent and has 1 to 30 carbon atoms or an aryl group which has or does not have a substituent and has 6 to 50 carbon atoms, and, in a case in which there are a plurality of $Q^2$s, $M^2$s, and $Z^2$s respectively, they may be the same as or different from each other.)

As a form of the ionic polymer used in the embodiment, a polymer further having a group represented by the formula (3) can be used. In a case in which the ionic polymer has the group represented by the formula (3), the group represented by the formula (3) may be included in the structural unit of the ionic polymer, may be included in the same structural unit as the structural unit including one or more groups selected from a group consisting of groups represented by the formula (1) and groups represented by the formula (2), or may be included in another structural unit which is different from the above structural units. Furthermore, as a form of the ionic polymer, a polymer having a structural unit including at least one of groups represented by the formula (1), groups represented by the formula (2), and groups represented by the formula (3) at 15 mol % to 100 mol % of the entire structural units can be used.

$$-(Q^3)_{n3}-Y^3 \quad (3)$$

(In the formula (3), $Q^3$ represents a divalent organic group, $Y^3$ represents $-CN$ or a group represented by any of the formulae (4) to (12), and n3 represents an integer of 0 or more.)

[Chem. 1]

(4)

(5)

(6)

(7)

(8)

(9)

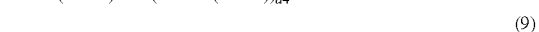
(10)

(11)

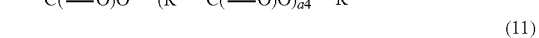
(12)

(In the formulae (4) to (12), R' represents a divalent hydrocarbon group having or not having a substituent, R" represents a hydrogen atom, a monovalent hydrocarbon group having or not having a substituent, $-COOH$, $-SO_3H$, $-OH$, $-SH$, $-NR^c_2$, $-CN$, or $-C(=O)NR^c_2$, R''' represents a trivalent hydrocarbon group having or not having a substituent, a3 represents an integer of 1 or more, a4 represents an integer of 0 or more, $R^c$ represents an alkyl group which has or does not have a substituent and has 1 to 30 carbon atoms or an aryl group which has or does not have a substituent and has 6 to 50 carbon atoms, and, in a case in which there are a plurality of R's, R"s, and R'''s respectively, they may be the same as or different from each other.)

The ionic polymer preferably includes one or more structural units selected from a group consisting of a structural unit represented by the formula (13), a structural unit represented by the formula (15), a structural unit represented by the formula (17), and a structural unit represented by the formula (20) at 15 mol % to 100 mol % of the entire structural units.

The structural unit represented by the formula (13) is a structural unit including the group represented by the formula (1) and the group represented by the formula (3).

[Chem. 2]

(13)

(In the formula (13), $R^1$ represents a monovalent group including a group represented by the formula (14), $Ar^1$ represents a (2+n4)-valent aromatic group having or not having a substituent other than $R^1$, and n4 represents an integer of 1 or more. In a case in which there is a plurality of $R^1$s, they may be the same as or different from each other.)

[Chem. 3]

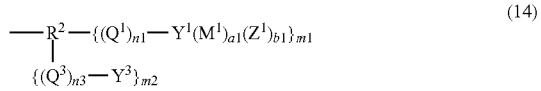
(14)

(In the formula (14), $R^2$ represents a (1+m1+m2)-valent organic group, $Q^1$, $Q^3$, $Y^1$, $M^1$, $Z^1$, $Y^3$, n1, a1, b1 and n3 have the same meaning as above, m1 and m2 individually represent an integer of 1 or more respectively, and, in a case in which there are a plurality of $Q^1$s, $Q^3$s, $Y^1$s, $M^1$s, $Z^1$s, $Y^3$s, n1s, a1s, b1s and n3s respectively, they may be the same as or different from each other.)

The structural unit represented by the formula (15) is a structural unit including the group represented by the formula (2) and the group represented by the formula (3).

[Chem. 4]

(15)

(In the formula (15), $R^3$ represents a monovalent group including a group represented by the formula (16), $Ar^2$ represents a (2+n5)-valent aromatic group having or not having a substituent other than $R^3$, and n5 represents an integer of 1 or more. In a case in which there is a plurality of $R^3$s, they may be the same as or different from each other.)

[Chem. 5]

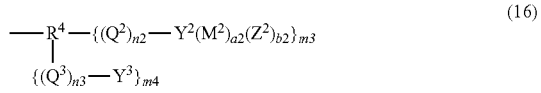
(16)

(In the formula (16), $R^4$ represents a (1+m3+m4)-valent organic group, $Q^2$, $Q^3$, $Y^2$, $M^2$, $Z^2$, $Y^3$, n2, a2, b2 and n3 have the same meaning as above, and m3 and m4 individually represent an integer of 1 or more respectively. In a case in which there are a plurality of $Q^2$s, $Q^3$s, $Y^2$s, $M^2$s, $Z^2$s, $Y^3$s, n2s, a2s, b2s and n3s respectively, they may be the same as or different from each other.)

The structural unit represented by the formula (17) is a structural unit including the group represented by the formula (1) and the group represented by the formula (3).

[Chem. 6]

(17)

(In the formula (17), $R^5$ represents a monovalent group including a group represented by the formula (18), $R^6$ represents a monovalent group including a group represented by the formula (19), $Ar^3$ represents a (2+n6+n7)-valent aromatic group having or not having a substituent other than $R^5$ and $R^6$, and n6 and n7 individually represent an integer of 1 or more respectively. In a case in which there is a plurality of $R^5$s and $R^6$s respectively, they may be the same as or different from each other.)

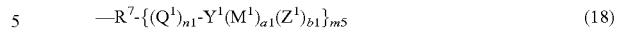
(18)

(In the formula (18), $R^7$ represents a direct bond or (1+m5)-valent organic group, $Q^1$, $Y^1$, $M^1$, $Z^1$, n1, a1 and b1 have the same meaning as above, and m5 represents an integer of 1 or more. In a case in which there are a plurality of $Q^1$s, $Y^1$s, $M^1$s, $Z^1$s, n1s, a1s and b1s respectively, they may be the same as or different from each other.)

(19)

(In the formula (19), $R^8$ represents a single bond or (1+m6)-valent organic group, $Y^3$ and n3 have the same meaning as above, and m6 represent an integer of 1 or more. However, in a case in which $R^8$ is a single bond, m6 represents 1, and in a case in which there are a plurality of $Q^3$s, $Y^3$s and n3s respectively, they may be the same as or different from each other.)

The structural unit represented by the formula (20) is a structural unit including the group represented by the formula (2) and the group represented by the formula (3).

[Chem. 7]

(20)

(In the formula (20), $R^9$ represents a monovalent group including a group represented by the formula (21), $R^{10}$ represents a monovalent group including a group represented by the formula (22), $Ar^4$ represents a (2+n8+n9)-valent aromatic group having or not having a substituent other than $R^9$ and $R^{10}$, and n8 and n9 individually represent an integer of 1 or more respectively. In a case in which there is a plurality of $R^9$s and $R^{10}$s respectively, they may be the same as or different from each other.)

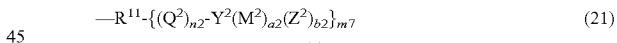
(21)

(In the formula (21), $R^{11}$ represents a single bond or (1+m7)-valent organic group, $Q^2$, $Y^2$, $M^2$, $Z^2$, n2, a2 and b2 have the same meaning as above, and m7 represents an integer of 1 or more. However, in a case in which $R^{11}$ is a single bond, m7 represents 1, and, in a case in which there are a plurality of $Q^2$s, $Y^2$s, $M^2$s, $Z^2$s, n2s, a2s and b2s respectively, they may be the same as or different from each other.)

(22)

(In the formula (22), $R^{12}$ represents a single bond or (1+m8)-valent organic group, $Y^3$ and n3 have the same meaning as above, and m8 represent an integer of 1 or more. However, in a case in which $R^{12}$ is a single bond, m8 represents 1, and in a case in which there are a plurality of $Q^3$s, $Y^3$s and n3s respectively, they may be the same as or different from each other.)

The structural unit in the ionic polymer may include two or more groups represented by the formula (1), may include two or more groups represented by the formula (2), and may include two or more groups represented by the formula (3). Hereinafter, the groups represented by the formulae (1) to (3) will be described in more detail.

—Group Represented by Formula (1)—

In the formula (1), the divalent organic group represented by $Q^1$ includes a divalent saturated hydrocarbon group having 1 to 50 carbon atoms which has a substituent or does not have a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group or a group in which at least one hydrogen atom in these groups is substituted with a substituent; an alkenylene group having 2 to 50 carbon atoms which has a substituent or does not have a substituent such as an ethenylene group, a propenylene group, a 3-butenylene group, a 2-butenylene group, a 2-pentenylene group, a 2-hexenylene group, a 2-nonenylene group, a 2-dodecenylene group or a group in which at least one hydrogen atom in these groups is substituted with a substituent, or a divalent unsaturated hydrocarbon group having 2 to 50 carbon atoms which has a substituent or does not have a substituent such as an ethynylene group; a divalent cyclic saturated hydrocarbon group having 3 to 50 carbon atoms which has a substituent or does not have a substituent such as a cyclopropylene group, a cyclobutylene group, a cyclopentylene group, a cyclohexylene group, a cyclononylene group, a cyclododecylene group, a norbonylene group, an adamantylene group or a group in which at least one hydrogen atom in these groups is substituted with a substituent; an arylene group having 6 to 50 carbon atoms which has a substituent or does not have a substituent such as a 1,3-phenylene group, a 1,4-phenylene group, a 1,4-naphthylene group, a 1,5-naphthylene group, a 2,6-naphthylene group, a biphenyl-4,4'-diyl group or a group in which at least one hydrogen atom in these groups is substituted with a substituent; an alkyleneoxy group having 1 to 50 carbon atoms which has a substituent or does not have a substituent such as a methyleneoxy group, an ethyleneoxy group, a propyleneoxy group, a butyleneoxy group, a pentyleneoxy group, a hexyleneoxy group or a group in which at least one hydrogen atom in these groups is substituted with a substituent; an imino group which has a substituent including a carbon atom; and a silylene group which has a substituent group including a carbon atom. From the viewpoint of ease of monomer synthesis which is a raw material of an ionic polymer (hereinafter referred to as a "starting monomer"), a divalent saturated hydrocarbon group, an arylene group or an alkyleneoxy group is preferable.

The substituent these groups have includes an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a hydroxy group, a carboxyl group, a substituted carboxyl group, a cyano group, a nitro group, and the like. When a plurality of substituents are present, they may be the same as or different from each other. Among these, substituents other than an amino group, a silyl group, a halogen atom, a hydroxy group and a nitro group include carbon atoms.

Hereinafter, the substituent will be described. In the present specification, the term "$C_m$ to $C_n$" (m and n are positive integers satisfying m<n) represents that the number of carbon atoms of an organic group described with this term is m to n. For example, $C_m$ to $C_n$ alkyl group represents that the number of carbon atoms in the alkyl group is m to n, $C_m$ to $C_n$ alkylaryl group represents that the number of carbon atoms in the alkyl group is m to n, and aryl-$C_m$ to $C_n$ alkyl group represents that the number of carbon atoms in the alkyl group is m to n.

The alkyl group may be linear, branched, or be a cycloalkyl group. The number of carbon atoms in the alkyl group is preferably 1 to 20, and more preferably 1 to 10. The alkyl group includes a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group, or the like.

Hydrogen atoms in the alkyl group may be substituted with fluorine atoms. The corresponding fluorine atom-substituted alkyl group includes a trifluoromethyl group, a pentafluoroethyl group, a perfluorobutyl group, a perfluorohexyl group, a perfluorooctyl group, or the like. In addition, examples of the $C_1$ to $C_{12}$ alkyl group include a methyl group, an ethyl group, a propyl group, an isopropyl group, a butyl group, an isobutyl group, an s-butyl group, a t-butyl group, a pentyl group, an isoamyl group, a hexyl group, a cyclohexyl group, a heptyl group, an octyl group, a nonyl group, a decyl group or a lauryl group.

The alkoxy group may be linear, branched, a cycloalkyloxy group, or may have a substituent. The number of carbon atoms in the alkoxy group is preferably 1 to 20, and more preferably 1 to 10. The alkoxy group includes a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a nonyloxy group, a decyloxy group, a lauryloxy group, or the like.

Hydrogen atoms in the alkoxy group may be substituted with fluorine atoms. The corresponding fluorine atom-substituted alkoxy group includes a trifluoromethoxy group, a pentafluoroethoxy group, a perfluorobutoxy group, a perfluorohexyl group, a perfluorooctyl group, or the like. The alkoxy group also includes a methoxymethyloxy group or a 2-methoxyethyloxy group. In addition, examples of the $C_1$ to $C_{12}$ alkoxy group include a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group or a lauryloxy group.

The alkylthio group may be linear, branched, a cycloalkylthio group, or may have a substituent. The number of carbon atoms in the alkylthio group is preferably 1 to 20, and more preferably 1 to 10. The alkylthio group includes a methylthio group, an ethylthio group, a propylthio group, an isopropylthio group, a butylthio group, an isobutylthio group, an s-butylthio group, a t-butylthio group, a pentylthio group, a hexylthio group, a cyclohexylthio group, a heptylthio group, an octylthio group, a nonylthio group, a decylthio group, a laurylthio group, or the like.

Hydrogen atoms in the alkylthio group may be substituted with fluorine atoms. The corresponding fluorine atom-substituted alkylthio group includes a trifluoromethylthio group or the like.

The aryl group is an atomic group remaining after one hydrogen atom bonded to the carbon atoms constituting the aromatic ring is removed from an aromatic hydrocarbon. The aryl group also includes a group having a benzene ring, a group having a condensed ring, or a group in which an independent benzene ring or two or more condensed rings are bonded via a single bond or a divalent organic group (for example, an alkenylene group such as a vinylene group). The number of carbon atoms in the aryl group is preferably 6 to 60, and more preferably 7 to 48. The aryl group includes a phenyl group, a $C_1$ to $C_{12}$alkoxyphenyl group, a $C_1$ to $C_{12}$alkylphenyl group, a 1-naphthyl group, a 2-naphthyl group, a 1-anthracenyl group, a 2-anthracenyl group, a 9-anthracenyl group, or the like.

Hydrogen atoms in the aryl group may be substituted with fluorine atoms. The corresponding fluorine atom-substituted aryl group includes a pentafluorophenyl group or the like. Among the aryl groups, a $C_1$ to $C_{12}$alkoxyphenyl group and a $C_1$ to $C_{12}$alkylphenyl group are preferable.

Among the aryl groups, the $C_1$ to $C_{12}$alkylphenyl group includes a methoxyphenyl group, an ethoxyphenyl group, a propyloxyphenyl group, an isopropyloxyphenyl group, a butoxyphenyl group, an isobutoxyphenyl group, an s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, or the like.

Among the aryl groups, the $C_1$ to $C_{12}$alkylphenyl group includes a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group, a dodecylphenyl group, or the like.

The number of carbon atoms in the aryloxy group is preferably 6 to 60, and more preferably 7 to 48. The aryloxy group includes a phenoxy group, a $C_1$ to $C_{12}$alkoxyphenoxy group, a $C_1$ to $C_{12}$alkylphenoxy group, a 1-naphthyloxy group, a 2-naphthyloxy group, a pentafluorophenyloxy group, or the like. Among the aryloxy groups, a $C_1$ to $C_{12}$alkoxyphenoxy group and a $C_1$ to $C_{12}$alkylphenoxy group are preferable.

Among the aryloxy groups, the $C_1$ to $C_{12}$alkoxyphenoxy group includes a methoxyphenoxy group, an ethoxyphenoxy group, a propyloxyphenoxy group, an isopropyloxyphenoxy group, a butoxyphenoxy group, an isobutoxyphenoxy group, an s-butoxyphenoxy group, a t-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, a lauryloxyphenoxy group, or the like.

Among the aryloxy groups, the $C_1$ to $C_{12}$alkylphenoxy group includes a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, an s-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group, a dodecylphenoxy group, or the like.

The arylthio group is, for example, a group in which a sulfur atom is bonded to the aryl group described above. The arylthio group may have a substituent on the aromatic ring of the aryl group. The number of carbon atoms in the arylthio group is preferably 6 to 60, and more preferably 6 to 30. The arylthio group includes a phenylthio group, a $C_1$ to $C_{12}$alkoxyphenylthio group, a $C_1$ to $C_{12}$alkylphenylthio group, a 1-naphthylthio group, a 2-naphthylthio group, a pentafluorophenylthio group, or the like.

The arylalkyl group is, for example, a group in which the alkyl group described above is bonded to the aryl group described above. The arylalkyl group may have a substituent. The number of carbon atoms in the arylalkyl group is preferably 7 to 60, and more preferably 7 to 30. The arylalkyl group includes a phenyl-$C_1$ to $C_{12}$alkyl group, a $C_1$ to $C_{12}$alkoxyphenyl-$C_1$ to $C_{12}$alkyl group, a $C_1$ to $C_{12}$alkylphenyl-$C_1$ to $C_{12}$alkyl group, a 1-naphthyl-$C_1$ to $C_{12}$alkyl group, a 2-naphthyl-$C_1$ to $C_{12}$alkyl group, or the like.

The arylalkoxy group is, for example, a group in which the alkoxy group described above is bonded to the aryl group described above. The arylalkoxy group may have a substituent. The number of carbon atoms in the arylalkoxy group is preferably 7 to 60, and more preferably 7 to 30. The arylalkoxy group includes a phenyl-$C_1$ to $C_{12}$alkoxy group, a $C_1$ to $C_{12}$alkoxyphenyl-$C_1$ to $C_{12}$alkoxy group, a $C_1$ to $C_{12}$alkylphenyl-$C_1$ to $C_{12}$alkoxy group, a 1-naphthyl-$C_1$ to $C_{12}$alkoxy group, a 2-naphthyl-$C_1$ to $C_{12}$alkoxy group, or the like.

The arylalkylthio group is, for example, a group in which the alkylthio group described above is bonded to the aryl group described above. The arylalkylthio group may have a substituent. The number of carbon atoms in the arylalkylthio group is preferably 7 to 60, and more preferably 7 to 30. The arylalkylthio group includes a phenyl-$C_1$ to $C_{12}$alkylthio group, a $C_1$ to $C_{12}$alkoxyphenyl-$C_1$ to $C_{12}$alkylthio group, a $C_1$ to $C_{12}$alkylphenyl-$C_1$ to $C_{12}$alkylthio group, a 1-naphthyl-$C_1$ to $C_{12}$alkylthio group, a 2-naphthyl-$C_1$ to $C_{12}$alkylthio group, or the like.

The arylalkenyl group is, for example, a group in which an alkenyl group is bonded to the aryl group described above. The number of carbon atoms in the arylalkenyl group is preferably 8 to 60, and more preferably 8 to 30. The arylalkenyl group includes a phenyl-$C_2$ to $C_{12}$alkenyl group, a $C_1$ to $C_{12}$alkoxyphenyl-$C_2$ to $C_{12}$alkenyl group, a $C_1$ to $C_{12}$alkylphenyl-$C_2$ to $C_{12}$alkenyl group, a 1-naphthyl-$C_2$ to $C_{12}$alkenyl group, a 2-naphthyl-$C_2$ to $C_{12}$alkenyl group or the like, and is preferably a $C_1$ to $C_{12}$alkoxyphenyl-$C_2$ to $C_{12}$alkenyl group or a $C_1$ to $C_{12}$alkylphenyl-$C_2$ to $C_{12}$alkenyl group. Herein, examples of the $C_2$ to $C_{12}$alkenyl group include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group or a 1-octenyl group.

The arylalkynyl group is, for example, a group in which an alkynyl group is bonded to the aryl group described above. The number of carbon atoms in the arylalkynyl group is preferably 8 to 60, and more preferably 8 to 30. The arylalkynyl group includes a phenyl-$C_2$ to $C_{12}$alkynyl group, a $C_1$ to $C_{12}$alkoxyphenyl-$C_2$ to $C_{12}$alkynyl group, a $C_1$ to $C_{12}$alkylphenyl-$C_2$ to $C_{12}$alkynyl group, a 1-naphthyl-$C_2$ to $C_{12}$alkynyl group, a 2-naphthyl-$C_2$ to $C_{12}$alkynyl group or the like, and is preferably a $C_1$ to $C_{12}$alkoxyphenyl-$C_2$ to $C_{12}$alkynyl group or a $C_1$ to $C_{12}$alkylphenyl-$C_2$ to $C_{12}$alkynyl group. Herein, examples of the $C_2$ to $C_{12}$alkynyl group include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group or a 1-octynyl group.

The substituted amino group is preferably an amino group in which at least one hydrogen atom in the amino group is substituted with one or two groups selected from the group consisting of an alkyl group, an aryl group, an arylalkyl group and a monovalent heterocyclic group. The alkyl group, the aryl group, the arylalkyl group or the monovalent heterocyclic group may have a substituent. The number of carbon atoms in the substituted amino group does not include the number of carbon atoms in the substituent which the alkyl group, the aryl group, the arylalkyl group or the monovalent heterocyclic group may have, and is preferably 1 to 60 and more preferably 2 to 48.

The substituted amino group includes a methylamino group, a dimethylamino group, an ethylamino group, a diethylamino group, a propylamino group, a dipropylamino group, an isopropylamino group, a diisopropylamino group, a butylamino group, an isobutylamino group, an s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_1$ to $C_{12}$alkoxyphenyl)amino group, a di($C_1$ to $C_{12}$alkoxyphenyl) amino group, a di($C_1$ to $C_{12}$alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_1$ to $C_{12}$alkyl)amino group, a ($C_1$ to $C_{12}$alkoxyphenyl-$C_1$ to $C_{12}$alkyl)amino group, a ($C_1$ to $C_{12}$alkylphenyl-$C_1$ to $C_{12}$alkyl)amino group, a di($C_1$ to $C_{12}$alkoxyphenyl-$C_1$ to $C_{12}$alkyl)amino group, a di($C_1$ to $C_{12}$alkylphenyl-$C_1$ to $C_{12}$alkyl)amino group, a 1-naphthyl-$C_1$ to $C_{12}$alkylamino group, a 2-naphthyl-$C_1$ to $C_{12}$alkylamino group, or the like.

The substituted silyl group is preferably a silyl group in which at least one hydrogen atom in the silyl group is substituted with one to three groups selected from the group consisting of an alkyl group, an aryl group, an arylalkyl group and a monovalent heterocyclic group. The alkyl group, the aryl group, the arylalkyl group or the monovalent heterocyclic group may have a substituent. The number of carbon atoms in the substituted silyl group does not include the number of carbon atoms in the substituent which the alkyl group, the aryl group, the arylalkyl group or the monovalent heterocyclic group may have, and is preferably 1 to 60 and more preferably 3 to 48.

The substituted silyl group includes a trimethylsilyl group, a triethylsilyl group, a tripropylsilyl group, a triisopropylsilyl group, an isopropyldimethylsilyl group, an isopropyldiethylsilyl group, a t-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_1$ to $C_{12}$alkyl group)silyl group, a ($C_1$ to $C_{12}$alkoxyphenyl-$C_1$ to $C_{12}$alkyl)silyl group, a ($C_1$ to $C_{12}$alkylphenyl-$C_1$ to $C_{12}$alkyl)silyl group, a (1-naphthyl-$C_1$ to $C_{12}$alkyl)silyl group, a (2-naphthyl-$C_1$ to $C_{12}$alkyl)silyl group, a (phenyl-$C_1$ to $C_{12}$alkyl)dimethylsilyl group, a triphenylsilyl group, a tri(p-xylyl)silyl group, a tribenzylsilyl group, a diphenylmethylsilyl group, a t-butyldiphenylsilyl group, a dimethylphenylsilyl group, or the like.

The halogen atom includes a fluorine atom, a chlorine atom, a bromine atom and an iodine atom.

The number of carbon atoms in the acyl group is preferably 2 to 20, and more preferably 2 to 18. The acyl group includes an acetyl group, a propionyl group, a butyryl group, an isobutyryl group, a pivaloyl group, a benzoyl group, a trifluoroacetyl group, a pentafluorobenzoyl group, or the like.

The number of carbon atoms in the acyloxy group is preferably 2 to 20, and more preferably 2 to 18. The acyloxy group includes an acetoxy group, a propionyloxy group, a butyryloxy group, an isobutyryloxy group, a pivaloyloxy group, a benzoyloxy group, a trifluoroacetyloxy group, a pentafluorobenzoyloxy group, or the like.

The imine residue refers to a residue in which, from the imine compound having a structure represented by at least one of the formula: H—N=C< and the formula: —N=CH—, one hydrogen atom in the structure is removed. Examples of such an imine compound include a compound in which a hydrogen atom bonded to a nitrogen atom in aldimine, ketimine and aldimine is substituted with an alkyl group, an aryl group, an arylalkyl group, an arylalkenyl group, an arylalkynyl group, or the like. The number of carbon atoms in the imine residue is preferably 2 to 20, and more preferably 2 to 18. Examples of the imine residue include a group represented by the formula: —CR$^β$=N—R$^γ$ or the formula: —N=C(R$^γ$)$_2$ (in the formula, R$^β$ represents a hydrogen atom, an alkyl group, an aryl group, an arylalkyl group, an arylalkenyl group or an arylalkynyl group, and R$^γ$ independently represents an alkyl group, an aryl group, an arylalkyl group, an arylalkenyl group or an arylalkynyl group. However, when there are two R$^γ$s, the two R$^γ$s may be bonded to each other to be united and be a divalent group, for example, an ethylene group, a trimethylene group, a tetramethylene group, a pentamethylene group, a hexamethylene group, which may form a ring as an alkylene group having 2 to 18 carbon atoms). The imine residue includes the following groups.

[Chem. 8]

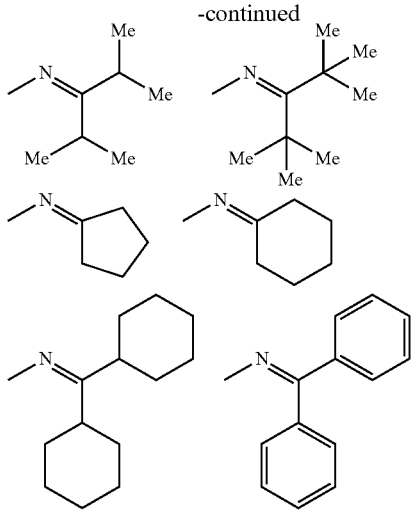

(In the formula, Me represents a methyl group, and hereinafter, the same applies.)

The number of carbon atoms in the amide group is preferably 1 to 20, and more preferably 2 to 18. The amide group includes a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamido group, a dibenzamide group, a ditrifluoroacetamide group, a dipentafluorobenzamide group, or the like.

The acid imide group is a residue obtained by removing a hydrogen atom bonded to the nitrogen atom from the acid imide, and the number of carbon atoms is preferably 4 to 20 and more preferably 4 to 18. The acid imide group includes the following groups.

[Chem. 9]

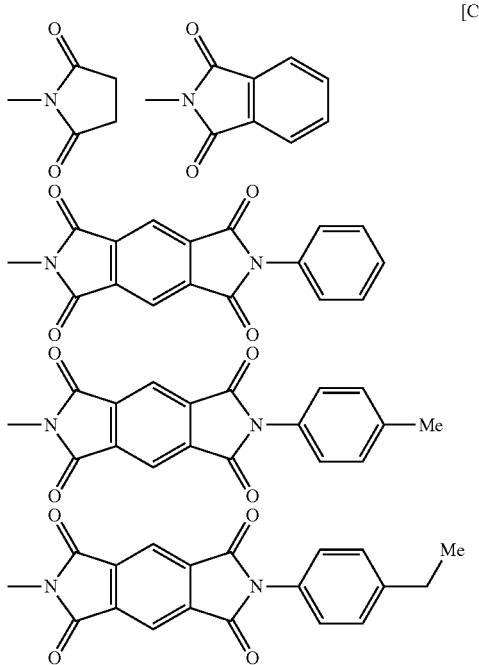

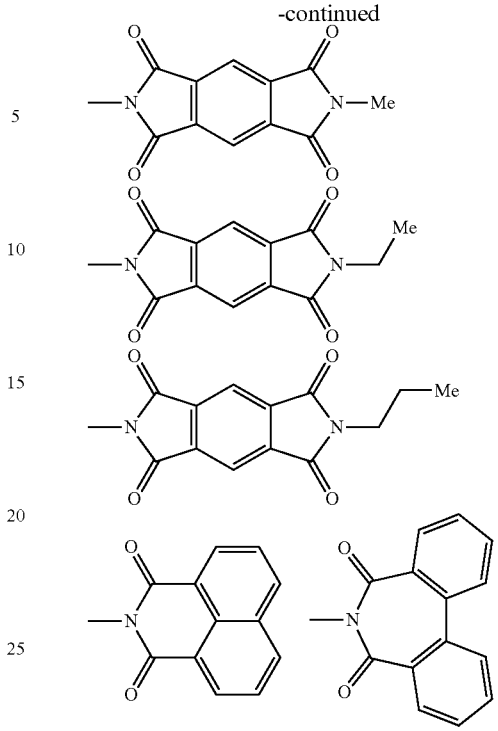

The monovalent heterocyclic group is an atomic group remaining after one hydrogen atom is removed from a heterocyclic compound. Herein, the heterocyclic compound refers to, among organic compounds having a cyclic structure, an organic compound including not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element constituting a ring. The monovalent heterocyclic group may have a substituent. The number of carbon atoms in the monovalent heterocyclic group is preferably 3 to 60, and more preferably 3 to 20. In addition, the number of carbon atoms in the monovalent heterocyclic group does not include the number of carbon atoms in the substituent.

Examples of such a monovalent heterocyclic group include a thienyl group, a $C_1$ to $C_{12}$alkylthienyl group, a pyrrolyl group, a furyl group, a pyridyl group, a $C_1$ to $C_{12}$alkylpyridyl group, a pyridazinyl group, a pyrimidyl group, a pyrazinyl group, a triazinyl group, a pyrrolidyl group, a piperidyl group, a quinolyl group, an isoquinolyl group, and among these, a thienyl group, a $C_1$ to $C_{12}$alkylthienyl group, a pyridyl group and a $C_1$ to $C_{12}$alkylpyridyl group are preferable. As the monovalent heterocyclic group, a monovalent aromatic heterocyclic group is preferable.

The substituted carboxyl group is a group in which a hydrogen atom in the carboxyl group is substituted with an alkyl group, an aryl group, an arylalkyl group or a monovalent heterocyclic group, that is, a group represented by the formula: —C(=O)OR* (in the formula, R* is an alkyl group, an aryl group, an arylalkyl group or a monovalent heterocyclic group). The number of carbon atoms in the substituted oxycarbonyl group is preferably 2 to 60, and more preferably 2 to 48. The alkyl group, the aryl group, the arylalkyl group or the monovalent heterocyclic group may have a substituent. In addition, the number of carbon atoms above does not include the number of carbon atoms in the substituent which the alkyl group, the aryl group, the arylalkyl group or the monovalent heterocyclic group may have.

The substituted carboxyl group includes a methoxycarbonyl group, an ethoxycarbonyl group, a propoxycarbonyl group, an isopropoxycarbonyl group, a butoxycarbonyl group, an isobutoxycarbonyl group, an s-butoxycarbonyl group, a t-butoxy carbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl, a pyridyloxycarbonyl group, or the like.

In the formula (1), $Y^1$ represents a monovalent group such as $-CO_2^-$, $-SO_3^-$, $-SO_2^-$, $-PO_3^-$ or $B(R^a)_3^-$. As $Y^1$, $-CO_2^-$, $-SO_2^-$, or $-PO_3^-$ is preferable, and $-CO_2^-$ is more preferable from the viewpoint of acidity of an ionic polymer. $-CO_2^-$, $-SO_3^-$, $-SO_2^-$ or $-PO_3^-$ is preferable from the viewpoint of stability of an ionic polymer.

In the formula (1), $M^1$ represents a metal cation, or an ammonium cation which has a substituent or does not have a substituent. The metal cation is preferably a monovalent, divalent or trivalent ion, and includes ions such as Li, Na, K, Cs, Be, Mg, Ca, Ba, Ag, Al, Bi, Cu, Fe, Ga, Mn, Pb, Sn, Ti, V, W, Y, Yb, Zn or Zr. Among these, $Li^+$, $Na^+$, $K^+$, $Cs^+$, $Ag^+$, $Mg^{2+}$ or $Ca^{2+}$ is preferable. Furthermore, the substituent the ammonium cation may have includes an alkyl group having 1 to 10 carbon atoms such as a methyl group, an ethyl group, a propyl group, an isopropyl group, an n-butyl group, an i-butyl group or a t-butyl group.

In the formula (1), $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In the formula (1), n1 represents an integer of 0 or more. n1 is preferably an integer of 0 to 8, and is more preferably an integer of 0 to 2 from the viewpoint of synthesis of starting monomers.

In the formula (1) a1 represents an integer of 1 or more, and b1 represents an integer of 0 or more.

a1 and b1 are selected so that the charge of the group represented by the formula (1) can become zero. For example, when $Y^1$ is $-CO_2^-$, $-SO_3^-$, $-SO_2^-$, $-PO_3^-$ or $B(R^a)_3^-$, $M^1$ is a monovalent metal cation, or an ammonium cation which has a substituent or does not have a substituent, and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, the values of a1 and b1 are selected so as to satisfy a1=b1+1. In addition, when $Y^1$ is $-CO_2^-$, $-SO_3^-$, $-SO_2^-$, $-PO_3^-$ or $B(R^a)_3^-$, $M^1$ is a divalent metal cation, and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, the values of a1 and b1 are selected so as to satisfy b1=2xa1−1.

When $Y^1$ is $-CO_2^-$, $-SO_3^-$, $-SO_2^-$, $-PO_3^-$ or $B(R^a)_3^-$, $M^1$ is a trivalent metal cation, and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, the values of a1 and b1 are selected so as to satisfy b1=3xa1−1. When $Y^1$ is $-CO_2^-$, $-SO_3^-$, $-SO_2^-$, $-PO_3^-$ or $B(R^a)_3^-$, $M^1$ is a monovalent metal cation, or an ammonium cation which has a substituent or does not have a substituent, and $Z^1$ is $SO_4^{2-}$ or $HPO_4^-$, the values of a1 and b1 are selected so as to satisfy a1=2xb1+1. In any of the above equations representing the relationship between a1 and b1, a1 is preferably an integer of 1 to 5, and more preferably 1 or 2.

While $R^a$ represents an alkyl group having 1 to 30 carbon atoms which has a substituent or does not have a substituent, or an aryl group having 6 to 50 carbon atoms which has a substituent or does not have a substituent, the substituent these groups may have includes the same substituents exemplified in the description of $Q^1$ described above. When a plurality of substituents are present, they may be the same as or different from each other.

$R^a$ includes an alkyl group having 1 to 20 carbon atoms such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group or a lauryl group, an aryl group having 6 to 30 carbon atoms such as a phenyl group, a 1-naphthyl group, a 2-naphthyl group, a 1-anthracenyl group, a 2-anthracenyl group or a 9-anthracenyl group, or the like.

Examples of the group represented by the formula (1) include the following groups.

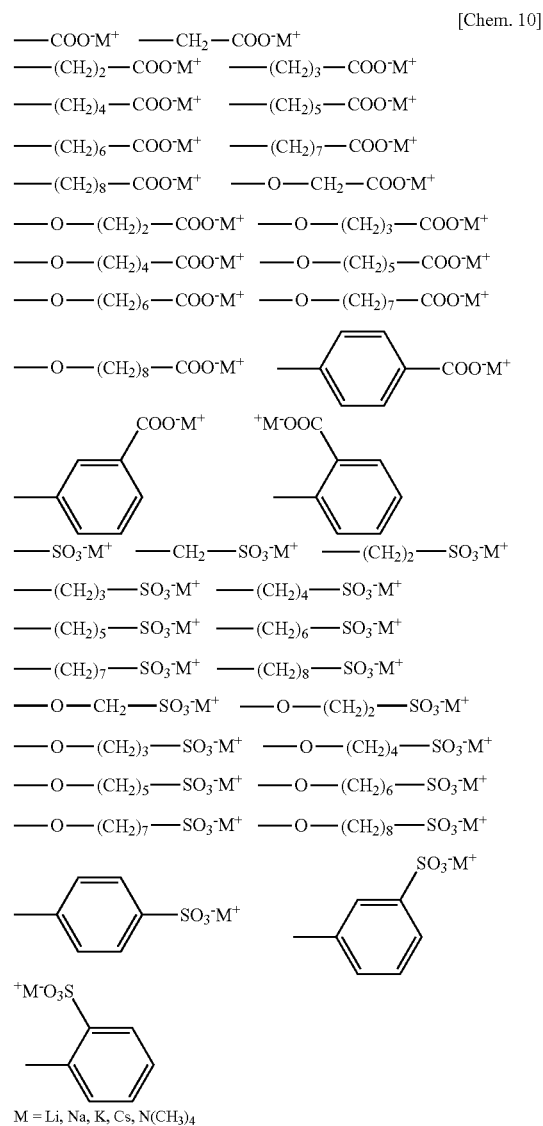

[Chem. 10]

—Group Represented by the Formula (2)—
In the formula (2), the divalent organic group represented by $Q^2$ includes the same groups exemplified as the divalent organic group represented by $Q^1$ described above. From the viewpoint of ease of starting monomer synthesis, a divalent saturated hydrocarbon group, an arylene group or an alkyleneoxy group is preferable.

The group exemplified as a divalent organic group represented by $Q^2$ may have a substituent, and the substituent includes the same substituents exemplified in the description of $Q^1$ described above. When a plurality of substituents are present, they may be the same as or different from each other.

In the formula (2), $Y^2$ represents a carbocation, an ammonium cation, a phosphonyl cation, a sulfonyl cation or an iodonium cation.

Examples of the carbocation include a group represented by

—C$^+$R$_2$ (In the formula, Rs are the same as or different from each other, and represent an alkyl group or an aryl group).
Examples of the ammonium cation include a group represented by

—N$^+$R$_3$ (In the formula, Rs are the same as or different from each other, and represent an alkyl group or an aryl group).
Examples of the phosphonyl cation include a group represented by

—P$^+$R$_3$ (In the formula, Rs are the same as or different from each other, and represent an alkyl group or an aryl group).
Examples of the sulfonyl cation include a group represented by

—S$^+$R$_2$ (In the formula, Rs are the same as or different from each other, and represent an alkyl group or an aryl group).
Examples of the iodonium cation include a group represented by

—I$^+$R$_2$ (In the formula, Rs are the same as or different from each other, and represent an alkyl group or an aryl group).

In the formula (2), $Y^2$ is preferably a carbocation, an ammonium cation, a phosphonyl cation or sulfonyl cation, and more preferably an ammonium cation from the viewpoint of ease of starting monomer synthesis and stability of an ionic polymer to air, moisture or heat.

In the formula (2), $Z^2$ represents a metal cation, or an ammonium cation which has a substituent or does not have a substituent. The metal cation is preferably a monovalent, divalent or trivalent ion, and includes ions such as Li, Na, K, Cs, Be, Mg, Ca, Ba, Ag, Al, Bi, Cu, Fe, Ga, Mn, Pb, Sn, Ti, V, W, Y, Yb, Zn or Zr. Furthermore, as the substituent the ammonium cation may have includes an alkyl group having 1 to 10 carbon atoms such as a methyl group, an ethyl group, a propyl group, an isopropyl group, an n-butyl group, an i-butyl group or a t-butyl group.

In the formula (2), $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In the formula (2), n2 represents an integer of 0 or more, is preferably an integer of 0 to 6, and is more preferably an integer of 0 to 2.

In the formula (2) a2 represents an integer of 1 or more, and b2 represents an integer of 0 or more.

a2 and b2 are selected so that the charge of the group represented by the formula (2) can become zero. For example, when $M^2$ is $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, the values of a2 and b2 are selected so as to satisfy a2=b2+1 when $Z^2$ is a monovalent metal cation, or an ammonium cation which has a substituent or does not have a substituent, the values of a2 and b2 are selected so as to satisfy a2=2xb2+1 when $Z^2$ is a divalent metal ion, and the values of a2 and b2 are selected so as to satisfy a2=3xb2+1 when $Z^2$ is a trivalent metal ion.

When $M^2$ is $SO_4^{2-}$ or $HPO_4^{2-}$, the values of a2 and b2 are selected so as to satisfy b2=2xa2−1 when $Z^2$ is a monovalent metal cation, or an ammonium cation which has a substituent or does not have a substituent, and the values of a2 and b2 are selected so as to satisfy 2xa2=3xb2+1 when $Z^2$ is a trivalent metal ion. In any of the above equations representing the relationship between a2 and b2, a2 is preferably an integer of 1 to 3, and more preferably 1 or 2.

In the formula (2) $R^b$ represents an alkyl group having 1 to 30 carbon atoms which has a substituent or does not have a substituent, or an aryl group having 6 to 50 carbon atoms which has a substituent or does not have a substituent. The substituent these groups may have includes the same substituents exemplified in the description of $Q^1$ described above. When a plurality of substituents are present, they may be the same as or different from each other.

$R^b$ includes an alkyl group having 1 to 20 carbon atoms such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group or a lauryl group, an aryl group having 6 to 30 carbon atoms such as a phenyl group, a 1-naphthyl group, a 2-naphthyl group, a 1-anthracenyl group, a 2-anthracenyl group or a 9-anthracenyl group, or the like.

Examples of the group represented by the formula (2) include the following groups.

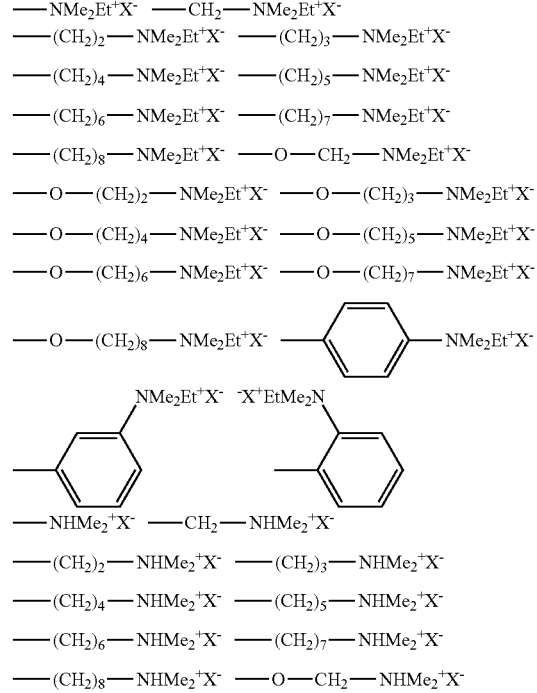

[Chem. 11]

-continued

—O—(CH$_2$)$_2$—NHMe$_2$$^+$X$^-$   —O—(CH$_2$)$_3$—NHMe$_2$$^+$X$^-$
—O—(CH$_2$)$_4$—NHMe$_2$$^+$X$^-$   —O—(CH$_2$)$_5$—NEt$_3$$^+$X$^-$
—O—(CH$_2$)$_6$—NEt$_3$$^+$X$^-$   —O—(CH$_2$)$_7$—NHMe$_2$$^+$X$^-$
—O—(CH$_2$)$_8$—NHMe$_2$$^+$X$^-$

—NEt$_3$$^+$X$^-$   —CH$_2$—NEt$_3$$^+$X$^-$
—(CH$_2$)$_2$—NEt$_3$$^+$X$^-$   —(CH$_2$)$_3$—NEt$_3$$^+$X$^-$
—(CH$_2$)$_4$—NEt$_3$$^+$X$^-$   —(CH$_2$)$_5$—NEt$_3$$^+$X$^-$
—(CH$_2$)$_6$—NEt$_3$$^+$X$^-$   —(CH$_2$)$_7$—NEt$_3$$^+$X$^-$
—(CH$_2$)$_8$—NEt$_3$$^+$X$^-$   —O—CH$_2$—NEt$_3$$^+$X$^-$
—O—(CH$_2$)$_2$—NEt$_3$$^+$X$^-$   —O—(CH$_2$)$_3$—NEt$_3$$^+$X$^-$
—O—(CH$_2$)$_4$—NEt$_3$$^+$X$^-$   —O—(CH$_2$)$_5$—NEt$_3$$^+$X$^-$
—O—(CH$_2$)$_6$—NEt$_3$$^+$X$^-$   —O—(CH$_2$)$_7$—NEt$_3$$^+$X$^-$
—O—(CH$_2$)$_8$—NEt$_3$$^+$X$^-$

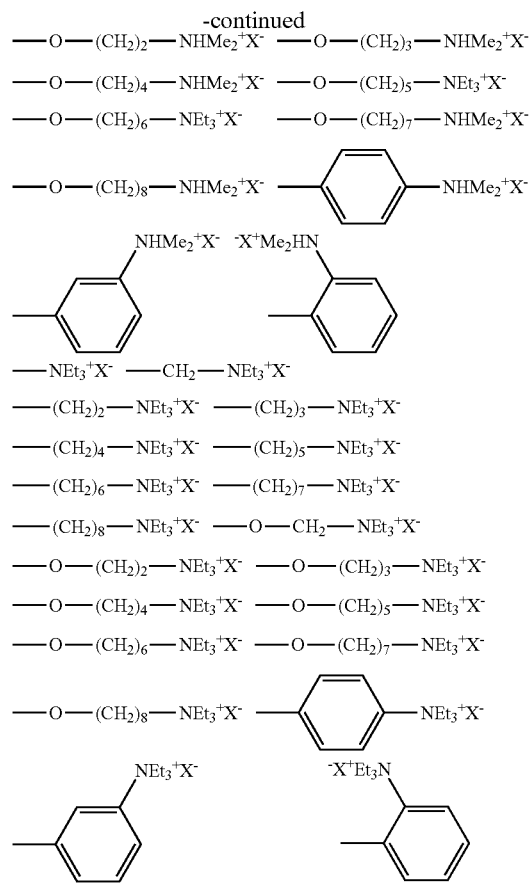

Me = CH$_3$
Et = CH$_2$CH$_3$
X = F, Cl, Br, I, BPh$_4$, CH$_3$COO, CF$_3$SO$_3$,

[Chem. 12]

—NHEt$_2$$^+$X$^-$   —CH$_2$—NHEt$_2$$^+$X$^-$
—(CH$_2$)$_2$—NHEt$_2$$^+$X$^-$   —(CH$_2$)$_3$—NHEt$_2$$^+$X$^-$
—(CH$_2$)$_4$—NHEt$_2$$^+$X$^-$   —(CH$_2$)$_5$—NHEt$_2$$^+$X$^-$
—(CH$_2$)$_6$—NHEt$_2$$^+$X$^-$   —(CH$_2$)$_7$—NHEt$_2$$^+$X$^-$
—(CH$_2$)$_8$—NHEt$_2$$^+$X$^-$   —O—CH$_2$—NHEt$_2$$^+$X$^-$
—O—(CH$_2$)$_2$—NHEt$_2$$^+$X$^-$   —O—(CH$_2$)$_3$—NHEt$_2$$^+$X$^-$
—O—(CH$_2$)$_4$—NHEt$_2$$^+$X$^-$   —O—(CH$_2$)$_5$—NHEt$_2$$^+$X$^-$
—O—(CH$_2$)$_6$—NHEt$_2$$^+$X$^-$   —O—(CH$_2$)$_7$—NHEt$_2$$^+$X$^-$
—O—(CH$_2$)$_8$—NHEt$_2$$^+$X$^-$

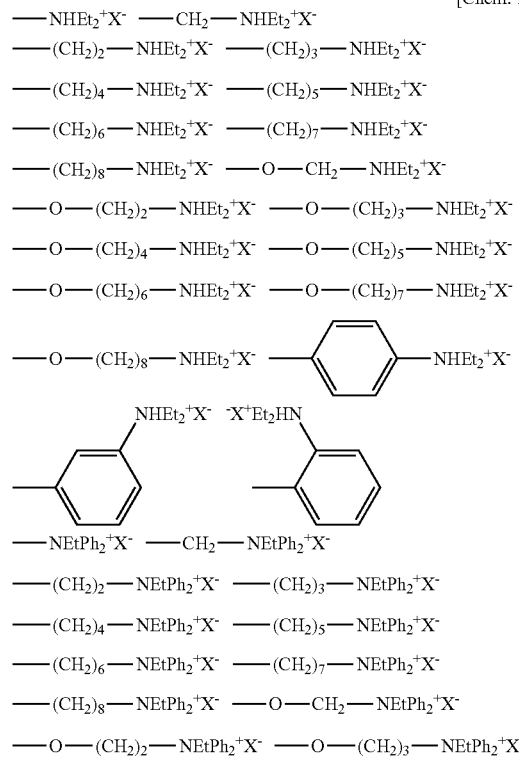

—NEtPh$_2$$^+$X$^-$   —CH$_2$—NEtPh$_2$$^+$X$^-$
—(CH$_2$)$_2$—NEtPh$_2$$^+$X$^-$   —(CH$_2$)$_3$—NEtPh$_2$$^+$X$^-$
—(CH$_2$)$_4$—NEtPh$_2$$^+$X$^-$   —(CH$_2$)$_5$—NEtPh$_2$$^+$X$^-$
—(CH$_2$)$_6$—NEtPh$_2$$^+$X$^-$   —(CH$_2$)$_7$—NEtPh$_2$$^+$X$^-$
—(CH$_2$)$_8$—NEtPh$_2$$^+$X$^-$   —O—CH$_2$—NEtPh$_2$$^+$X$^-$
—O—(CH$_2$)$_2$—NEtPh$_2$$^+$X$^-$   —O—(CH$_2$)$_3$—NEtPh$_2$$^+$X$^-$

-continued

—O—(CH$_2$)$_4$—NEtPh$_2$$^+$X$^-$   —O—(CH$_2$)$_5$—NEtPh$_2$$^+$X$^-$
—O—(CH$_2$)$_6$—NEtPh$_2$$^+$X$^-$   —O—(CH$_2$)$_7$—NEtPh$_2$$^+$X$^-$
—O—(CH$_2$)$_8$—NEtPh$_2$$^+$X$^-$

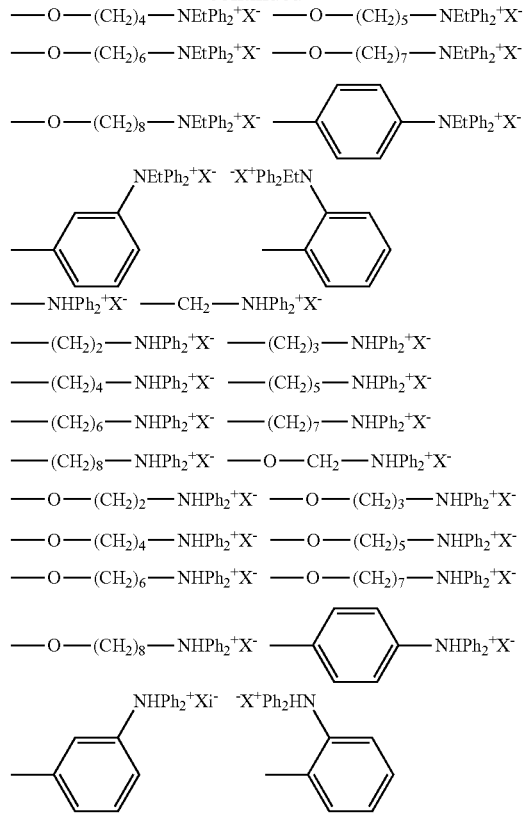

—NHPh$_2$$^+$X$^-$   —CH$_2$—NHPh$_2$$^+$X$^-$
—(CH$_2$)$_2$—NHPh$_2$$^+$X$^-$   —(CH$_2$)$_3$—NHPh$_2$$^+$X$^-$
—(CH$_2$)$_4$—NHPh$_2$$^+$X$^-$   —(CH$_2$)$_5$—NHPh$_2$$^+$X$^-$
—(CH$_2$)$_6$—NHPh$_2$$^+$X$^-$   —(CH$_2$)$_7$—NHPh$_2$$^+$X$^-$
—(CH$_2$)$_8$—NHPh$_2$$^+$X$^-$   —O—CH$_2$—NHPh$_2$$^+$X$^-$
—O—(CH$_2$)$_2$—NHPh$_2$$^+$X$^-$   —O—(CH$_2$)$_3$—NHPh$_2$$^+$X$^-$
—O—(CH$_2$)$_4$—NHPh$_2$$^+$X$^-$   —O—(CH$_2$)$_5$—NHPh$_2$$^+$X$^-$
—O—(CH$_2$)$_6$—NHPh$_2$$^+$X$^-$   —O—(CH$_2$)$_7$—NHPh$_2$$^+$X$^-$
—O—(CH$_2$)$_8$—NHPh$_2$$^+$X$^-$

Et = CH$_2$CH$_3$
Ph = C$_6$H$_5$
X = F, Cl, Br, I, BPh$_4$, CH$_3$COO, CF$_3$SO$_3$,

—Group Represented by the Formula (3)—

In the formula (3), the divalent organic group represented by $Q^3$ includes the same groups exemplified as the divalent organic group represented by $Q^1$ described above. From the viewpoint of ease of starting monomer synthesis, a divalent saturated hydrocarbon group, an arylene group or an alkyleneoxy group is preferable.

The group exemplified as a divalent organic group represented by $Q^3$ may have a substituent, and the substituent includes the same substituents exemplified in the description of $Q^1$ described above. When a plurality of substituents are present, they may be the same as or different from each other.

The divalent organic group represented by $Q^3$ is preferably a group represented by —(CH$_2$)—.

In the formula (3), n3 represents an integer of 0 or more, is preferably an integer of 0 to 20, and is more preferably an integer of 0 to 8.

In the formula (3), $Y^3$ represents —CN or a group represented by any one of the formulae (4) to (12).

In the formulae (4) to (12), the divalent hydrocarbon group represented by R' includes a divalent saturated hydrocarbon group having 1 to 50 carbon atoms which has a substituent or does not have a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group or a group in which at least one hydrogen atom in these groups is substituted with a substituent; an alkenylene group having 2 to 50 carbon atoms which has a substituent or does not have a substituent such as an ethenylene group, a propenylene group, a 3-butenylene group, a 2-butenylene group, a 2-pentenylene group, a 2-hexenylene group, a 2-nonenylene group, a 2-dodecenylene group or a group in which at least one hydrogen atom in these groups is substituted with a substituent, and a divalent unsaturated hydrocarbon group having 2 to 50 carbon atoms which has a substituent or does not have a substituent such as an ethynylene group; a divalent cyclic saturated hydrocarbon group having 3 to 50 carbon atoms which has a substituent or does not have a substituent such as a cyclopropylene group, a cyclobutylene group, a cyclopentylene group, a cyclohexylene group, a cyclononylene group, a cyclododecylene group, a norbonylene group, an adamantylene group or a group in which at least one hydrogen atom in these groups is substituted with a substituent; an arylene group having 6 to 50 carbon atoms which has a substituent or does not have a substituent such as a 1,3-phenylene group, a 1,4-phenylene group, a 1,4-naphthylene group, a 1,5-naphthylene group, a 2,6-naphthylene group, a biphenyl-4,4'-diyl group or a group in which at least one hydrogen atom in these groups is substituted with a substituent; an alkyleneoxy group having 1 to 50 carbon atoms which has a substituent or does not have a substituent such as a methyleneoxy group, an ethyleneoxy group, a propyleneoxy group, a butyleneoxy group, a pentyleneoxy group, a hexyleneoxy group or a group in which at least one hydrogen atom in these groups is substituted with a substituent.

The substituent in these groups includes the same substituents exemplified in the description of $Q^1$ described above. When a plurality of substituents are present, they may be the same as or different from each other.

In the formulae (4) to (12), the monovalent hydrocarbon group represented by R" includes an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group or a lauryl group or a group in which at least one hydrogen atom in these groups is substituted with a substituent; an aryl group having 6 to 30 carbon atoms which has a substituent or does not have a substituent such as a phenyl group, a 1-naphthyl group, a 2-naphthyl group, a 1-anthracenyl group, a 2-anthracenyl group or a 9-anthracenyl group or a group in which at least one hydrogen atom in these groups is substituted with a substituent, or the like. From the viewpoint of solubility of an ionic polymer, a methyl group, an ethyl group, a phenyl group, a 1-naphthyl group or a 2-naphthyl group is preferable.

The substituent in these groups includes the same substituents exemplified in the description of $Q^1$ described above. When a plurality of substituents are present, they may be the same as or different from each other.

In the formula (5), the trivalent hydrocarbon group represented by R''' includes an alkyltriyl group having 1 to 20 carbon atoms which has a substituent or does not have a substituent such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group or a group in which at least one hydrogen atom in these groups is substituted with a substituent; an aryl triyl group having 6 to 30 carbon atoms which has a substituent or does not have a substituent such as a 1,2,3-benzenetriyl group, 1,2,4-benzenetriyl group, 1,3,5-benzenetriyl group or a group in which at least one hydrogen atom in these groups is substituted with a substituent, or the like. From the viewpoint of solubility of an ionic polymer, a methanetriyl group, an ethanetriyl group, a 1,2,4-benzenetriyl group or a 1,3,5-benzenetriyl group is preferable.

In the formulae (4) to (12), $R^c$ is preferably a methyl group, an ethyl group, a phenyl group, a 1-naphthyl group or a 2-naphthyl group from the viewpoint of solubility of an ionic polymer.

In the formula (4) and the formula (5), a3 represents an integer of 1 or more, and is preferably an integer of 3 to 10. In the formulae (6) to (12), a4 represents an integer of 0 or more. In the formula (6), a4 is preferably an integer of 0 to 30, and more preferably an integer of 3 to 20. In the formulae (7) to (10), a4 is preferably an integer of 0 to 10, and more preferably an integer of 0 to 5. In the formula (11), a4 is preferably an integer of 0 to 20, and more preferably an integer of 3 to 20. In the formula (12), a4 is preferably an integer of 0 to 20, and more preferably an integer of 0 to 10.

From the viewpoint of ease of starting monomer synthesis, $Y^3$ is preferably —CN, a group represented by the formula (4), a group represented by the formula (6), a group represented by the formula (10) or a group represented by the formula (11), more preferably a group represented by the formula (4), a group represented by the formula (6) or a group represented by the formula (11), and particularly preferably the following groups.

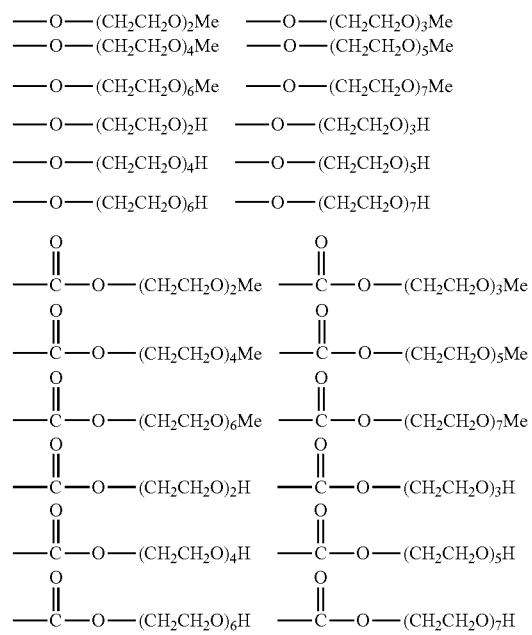

[Chem. 13]

—Structural Unit of Ionic Polymer—

The ionic polymer of the present embodiment preferably has one or more types of structural units selected from the group consisting of a structural unit represented by the formula (13), a structural unit represented by the formula (15), a structural unit represented by the formula (17) and a structural unit represented by the formula (20), and is more preferably an ionic polymer having 15 to 100 mol % of this structure among total structural units.

(Structural Unit Represented by the formula (13))

In the formula (13), $R^1$ is a monovalent group including a group represented by the formula (14), $Ar^1$ represents an aromatic group having a valency of (2+n4) which has a substituent or does not have a substituent other than $R^1$, and n4 is an integer of 1 or more.

The group represented by the formula (14) may be bonded directly to $Ar^1$ or may be bonded to $Ar^1$ through a prescribed group. This prescribed group includes an alkylene group having 1 to 50 carbon atoms which has a substituent or does not have a substituent such as a methylene group, an ethylene group, a propylene group, a butylene group, a pentylene group, a hexylene group, a nonylene group, a dodecylene group, a cycloprolylene group, a cyclobutylene group, a cyclopentylene group, a cyclohexylene group, a cyclononylene group, a cyclododecylene group, a norbonylene group, an adamantylene group or a group in which at least one hydrogen atom in these groups is substituted with a substituent; an oxyalkylene group having 1 to 50 carbon atoms which has a substituent or does not have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbonyleneoxy group, an adamantyleneoxy group or a group in which at least one hydrogen atom in these groups is substituted with a substituent; an imino group which has a substituent or does not have a substituent; a silylene group which has a substituent or does not have a substituent; an ethenylene group which has a substituent or does not have a substituent; an ethynylene group; a methanetriyl group which has a substituent or does not have a substituent; a heteroatom such as an oxygen atom, a nitrogen atom or a sulfur atom, or the like.

$Ar^1$ may have a substituent other than $R^1$. The substituent includes the same substituents exemplified in the description of $Q^1$ described above. When a plurality of substituents are present, they may be the same as or different from each other.

From the viewpoint of ease of starting monomer synthesis, the substituent $Ar^1$ may have other than $R^1$ is preferably an alkyl group, an alkoxy group, an aryl group, an aryloxy group, a carboxyl group or a substituted carboxyl group.

In the formula (13), n4 represents an integer of 1 or more, preferably an integer of 1 to 4, and more preferably an integer of 1 to 3.

The aromatic group having a valency of (2+n4) represented by $Ar^1$ in the formula (13) includes an aromatic hydrocarbon group having a valency of (2+n4) or an aromatic heterocyclic group having a valency of (2+n4). Among these, an aromatic group having a valency of (2+n4) formed with only carbon atoms, or formed with one or more atoms selected from the group consisting of carbon atoms, hydrogen atoms, nitrogen atoms and oxygen atoms is preferable.

The aromatic group having a valency of (2+n4) includes a group having a valency of (2+n4) in which (2+n4) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring or an azadiazole ring; a group having a valency of (2+n4) in which (2+n4) hydrogen atoms are removed from a condensed polycyclic aromatic ring in which two or more rings selected from the group consisting of monocyclic aromatic rings are condensed; a group having a valency of (2+n4) in which (2+n4) hydrogen atoms are removed from an assembly of aromatic rings formed by connecting two or more aromatic rings selected from the group consisting of a monocyclic aromatic ring and a condensed polycyclic aromatic ring through a single bond, an ethenylene group or an ethynylene group; a group having a valency of (2+n4) in which (2+n4) hydrogen atoms are removed from a bridged polycyclic aromatic ring having a cross-linking in which an assembly of condensed polycyclic aromatic rings or aromatic rings is bridged by two adjacent aromatic rings through a divalent group such as a methylene group, an ethylene group or a carbonyl group, or the like.

Examples of the monocyclic aromatic ring include the following rings.

[Chem. 14]

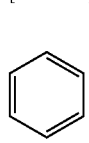

1

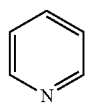

2

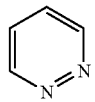

3

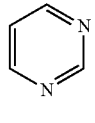

4

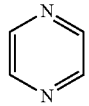

5

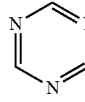

6

7

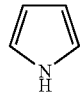

8

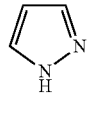

9

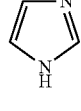

10

11

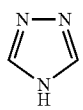
Examples of the condensed polycyclic aromatic ring include the following rings.
[Chem. 15]
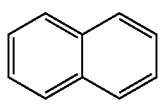
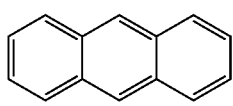
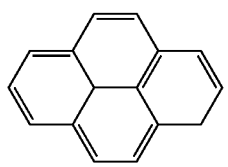
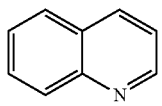
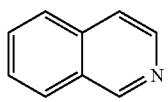
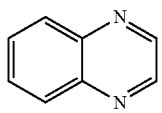
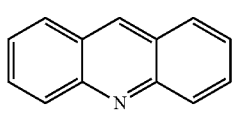
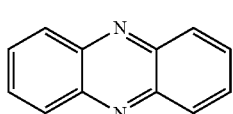
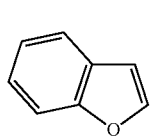
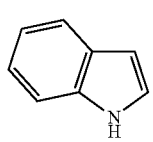
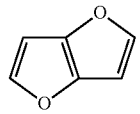
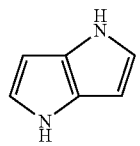
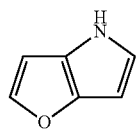
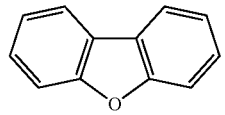
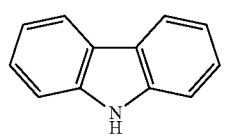
Examples of the assembly of aromatic rings include the following rings.
[Chem. 16]
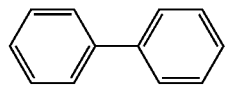
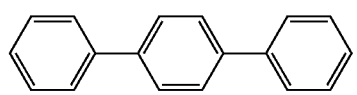
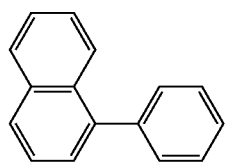
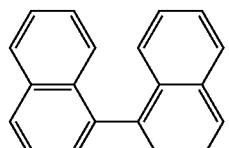
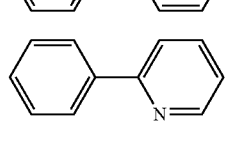
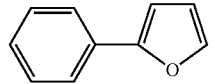

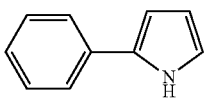

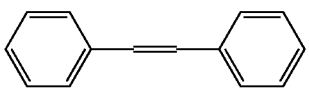

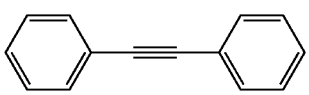

Examples of the bridged polycyclic aromatic ring include the following rings.

[Chem. 17]

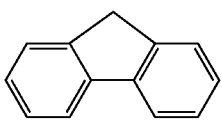

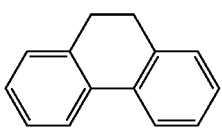

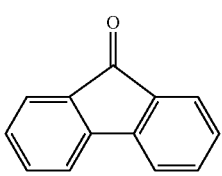

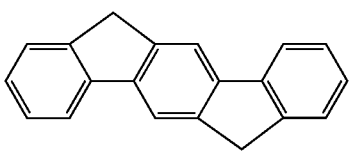

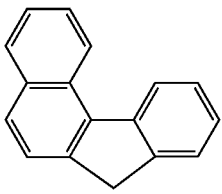

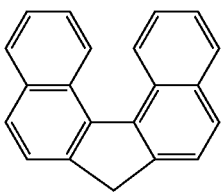

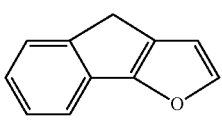

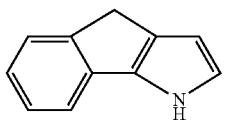

From the viewpoint of ease of starting monomer synthesis, the aromatic group having a valency of (2+n4) is preferably a group in which (2+n4) hydrogen atoms are removed from a ring represented by the formulae 1 to 14, 26 to 29, 37 to 39, or 41, more preferably a group in which (2+n4) hydrogen atoms are removed from a ring represented by the formulae 1 to 6, 8, 13, 26, 27, 37 or 41, and even more preferably a group in which (2+n4) hydrogen atoms are removed from a ring represented by the formulae 1, 37 or 41.

In the formula (14), examples of the organic group having a valency of (1+m1+m2) represented by $R^2$ include a group in which (m1+m2) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m1+m2) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m1+m2) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m1+m2) hydrogen atoms are removed from an amino group which has a substituent including a carbon atom; a group in which (m1+m2) hydrogen atoms are removed from a silyl group which has a substituent including a carbon atom. From the viewpoint of ease of starting monomer synthesis, a group in which (m1+m2) hydrogen atoms are removed from an alkyl group, a group in which (m1+m2) hydrogen atoms are removed from an aryl group, or a group in which (m1+m2) hydrogen atoms are removed from an alkoxy group is preferable.

The substituent in these groups includes the same substituents exemplified in the description of $Q^1$ described above. When a plurality of substituents are present, they may be the same as or different from each other.

(Structural Unit Represented by the Formula (15))

In the formula (15), $R^3$ is a monovalent group including a group represented by the formula (16), $Ar^2$ represents an aromatic group having a valency of (2+n5) which has a substituent or does not have a substituent other than $R^3$, and n5 is an integer of 1 or more.

The group represented by the formula (16) may be bonded directly to $Ar^2$ or may be bonded to $Ar^2$ through a prescribed group. This prescribed group includes an alkylene group having 1 to 50 carbon atoms which has a substituent or does not have a substituent such as a methylene group, an ethylene group, a propylene group, a butylene group, a pentylene group, a hexylene group, a nonylene group, a dodecylene group, a cycloprolylene group, a cyclobutylene group, a cyclopentylene group, a cyclohexylene group, a cyclononylene group, a cyclododecylene group, a norbonylene group, an adamantylene group or a group in which at least one hydrogen atom in these groups is substituted with a substituent; an oxyalkylene group having 1 to 50 carbon atoms which has a substituent or does not have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbonyleneoxy group, an adamantyleneoxy group or a group in which at least one hydrogen atom in these groups is substituted with a substituent; an imino group which has a substituent or does not have a substituent; a silylene group which has a substituent or does not have a substituent; an ethenylene group which has a substituent or does not have a substituent; an ethynylene group; a methanetriyl group which has a substituent or does not have a substituent; a heteroatom such as an oxygen atom, a nitrogen atom or a sulfur atom, or the like.

$Ar^2$ may have a substituent other than $R^3$. The substituent includes the same substituents exemplified in the description of $Q^1$ described above. When a plurality of substituents are present, they may be the same as or different from each other.

From the viewpoint of ease of starting monomer synthesis, the substituent $Ar^2$ may have other than $R^3$ is preferably an alkyl group, an alkoxy group, an aryl group, an aryloxy group, a carboxyl group or a substituted carboxyl group.

In the formula (15), n5 represents an integer of 1 or more, preferably an integer of 1 to 4, and more preferably an integer of 1 to 3.

The aromatic group having a valency of (2+n5) represented by $Ar^2$ in the formula (15) includes an aromatic hydrocarbon group having a valency of (2+n5) or an aromatic heterocyclic group having a valency of (2+n5). Among these, an aromatic group having a valency of (2+n5) formed with only carbon atoms, or formed with one or more atoms selected from the group consisting of a carbon atom, a hydrogen atom, a nitrogen atom and an oxygen atom is preferable.

The aromatic group having a valency of (2+n5) includes a group having a valency of (2+n5) in which (2+n5) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring or an azadiazole ring; a group having a valency of (2+n5) in which (2+n5) hydrogen atoms are removed from a condensed polycyclic aromatic ring in which two or more rings selected from the group consisting of monocyclic aromatic rings are condensed; a group having a valency of (2+n5) in which (2+n5) hydrogen atoms are removed from an assembly of aromatic rings formed by connecting two or more aromatic rings selected from the group consisting of a monocyclic aromatic ring and a condensed polycyclic aromatic ring through a single bond, an ethenylene group or an ethynylene group; a group having a valency of (2+n5) in which (2+n5) hydrogen atoms are removed from a bridged polycyclic aromatic ring having a cross-linking in which an assembly of condensed polycyclic aromatic rings or aromatic rings is bridged by two adjacent aromatic rings through a divalent group such as a methylene group, an ethylene group or a carbonyl group, or the like.

Examples of the monocyclic aromatic ring include the rings represented by the formulae 1 to 12 exemplified in the description of the structural unit represented by the formula (13).

Examples of the condensed polycyclic aromatic ring include the rings represented by the formulae 13 to 27 exemplified in the description of the structural unit represented by the formula (13).

Examples of the assembly of aromatic rings include the rings represented by the formulae 28 to 36 exemplified in the description of the structural unit represented by the formula (13).

Examples of the bridged polycyclic aromatic ring include the rings represented by the formulae 37 to 44 exemplified in the description of the structural unit represented by the formula (13).

From the viewpoint of ease of starting monomer synthesis, the aromatic group having a valency of (2+n5) is preferably a group in which (2+n5) hydrogen atoms are removed from a ring represented by the formulae 1 to 14, 26 to 29, 37 to 39, or 41, more preferably a group in which (2+n5) hydrogen atoms are removed from a ring represented by the formulae 1 to 6, 8, 13, 26, 27, 37 or 41, and even more preferably a group in which (2+n5) hydrogen atoms are removed from a ring represented by the formulae 1, 37 or 41.

In the formula (16), m3 and m4 each independently represent an integer of 1 or more.

In the formula (16), examples of the organic group having a valency of (1+m3+m4) represented by $R^4$ include a group in which (m3+m4) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m3+m4) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m3+m4) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m3+m4) hydrogen atoms are removed from an amino group which has a substituent including a carbon atom; a group in which (m3+m4) hydrogen atoms are removed from a silyl group which has a substituent including a carbon atom. From the viewpoint of ease of starting monomer synthesis, a group in which (m3+m4) hydrogen atoms are removed from an alkyl group, a group in which (m3+m4) hydrogen atoms are removed from an aryl group, or a group in which (m3+m4) hydrogen atoms are removed from an alkoxy group is preferable.

The substituent in these groups includes the same substituents exemplified in the description of $Q^1$ described above. When a plurality of substituents are present, they may be the same as or different from each other.

(Structural Unit Represented by the Formula (17))

In the formula (17), $R^5$ is a monovalent group including a group represented by the formula (18), $R^6$ is a monovalent group including a group represented by the formula (19), $Ar^3$ represents an aromatic group having a valency of $(2+n6+n7)$ which has a substituent or does not have a substituent other than $R^5$ and $R^6$, and n6 and n7 each independently represent an integer of 1 or more.

The group represented by the formula (18) and the group represented by the formula (19) may be bonded directly to $Ar^3$ or may be bonded to $Ar^3$ through a prescribed group. This prescribed group includes an alkylene group having 1 to 50 carbon atoms which has a substituent or does not have a substituent such as a methylene group, an ethylene group, a propylene group, a butylene group, a pentylene group, a hexylene group, a nonylene group, a dodecylene group, a cycloprolylene group, a cyclobutylene group, a cyclopentylene group, a cyclohexylene group, a cyclononylene group, a cyclododecylene group, a norbonylene group, an adamantylene group or a group in which at least one hydrogen atom in these groups is substituted with a substituent; an oxyalkylene group having 1 to 50 carbon atoms which has a substituent or does not have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbonyleneoxy group, an adamantyleneoxy group or a group in which at least one hydrogen atom in these groups is substituted with a substituent; an imino group which has a substituent or does not have a substituent; a silylene group which has a substituent or does not have a substituent; an ethenylene group which has a substituent or does not have a substituent; an ethynylene group; a methanetriyl group which has a substituent or does not have a substituent; a heteroatom such as an oxygen atom, a nitrogen atom or a sulfur atom, or the like.

$Ar^3$ may have a substituent other than $R^5$ and $R^6$. The substituent includes the same substituents exemplified in the description of $Q^1$ described above. When a plurality of substituents are present, they may be the same as or different from each other.

From the viewpoint of ease of starting monomer synthesis, the substituent $Ar^3$ may have other than $R^5$ and $R^6$ is preferably an alkyl group, an alkoxy group, an aryl group, an aryloxy group, a carboxyl group or a substituted carboxyl group.

In the formula (17), n6 represents an integer of 1 or more, preferably an integer of 1 to 4, and more preferably an integer of 1 to 3.

In the formula (17), n7 represents an integer of 1 or more, preferably an integer of 1 to 4, and more preferably an integer of 1 to 3.

The aromatic group having a valency of $(2+n6+n7)$ represented by $Ar^3$ in the formula (17) includes an aromatic hydrocarbon group having a valency of $(2+n6+n7)$ or an aromatic heterocyclic group having a valency of $(2+n6+n7)$. Among these, an aromatic group having a valency of $(2+n6+n7)$ formed with only carbon atoms, or formed with one or more atoms selected from the group consisting of a carbon atom, a hydrogen atom, a nitrogen atom and an oxygen atom is preferable. The aromatic group having a valency of $(2+n6+n7)$ includes a group having a valency of $(2+n6+n7)$ in which $(2+n6+n7)$ hydrogen atoms are removed from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, an imidazole ring or an oxazole ring; a group having a valency of $(2+n6+n7)$ in which $(2+n6+n7)$ hydrogen atoms are removed from a condensed polycyclic aromatic ring in which two or more rings selected from the group consisting of monocyclic aromatic rings are condensed; a group having a valency of $(2+n6+n7)$ in which $(2+n6+n7)$ hydrogen atoms are removed from an assembly of aromatic rings formed by connecting two or more aromatic rings selected from the group consisting of a monocyclic aromatic ring and a condensed polycyclic aromatic ring through a single bond, an ethenylene group or an ethynylene group; a group having a valency of $(2+n6+n7)$ in which $(2+n6+n7)$ hydrogen atoms are removed from a bridged polycyclic aromatic ring having a cross-linking in which an assembly of condensed polycyclic aromatic rings or aromatic rings is bridged by two adjacent aromatic rings through a divalent group such as a methylene group, an ethylene group or a carbonyl group, or the like.

Examples of the monocyclic aromatic ring include the rings represented by the formulae 1 to 5 and the formulae 7 to 10 exemplified in the description of the structural unit represented by the formula (13).

Examples of the condensed polycyclic aromatic ring include the rings represented by the formulae 13 to 27 exemplified in the description of the structural unit represented by the formula (13).

Examples of the assembly of aromatic rings include the rings represented by the formulae 28 to 36 exemplified in the description of the structural unit represented by the formula (13).

Examples of the bridged polycyclic aromatic ring include the rings represented by the formulae 37 to 44 exemplified in the description of the structural unit represented by the formula (13).

From the viewpoint of ease of starting monomer synthesis, the aromatic group having a valency of $(2+n6+n7)$ is preferably a group in which $(2+n6+n7)$ hydrogen atoms are removed from a ring represented by the formulae 1 to 5, 7 to 10, 13, 14, 26 to 29, 37 to 39, or 41, more preferably a group in which $(2+n6+n7)$ hydrogen atoms are removed from a ring represented by the formulae 1, 37 or 41, and even more preferably a group in which $(2+n6+n7)$ hydrogen atoms are removed from a ring represented by the formulae 1, 38 or 42.

In the formula (18), $R^7$ represents a single bond or an organic group having a valency of $(1+m5)$, and is preferably an organic group having a valency of $(1+m5)$.

In the formula (18), examples of the organic group having a valency of $(1+m5)$ represented by $R^7$ include a group in which m5 numbers of hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which m5 numbers of hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which m5 numbers of hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which m5 numbers of hydrogen atoms are removed from an amino group which has a substituent including a carbon atom; a group in which m5 numbers of hydrogen atoms are removed from a silyl group which has a substituent including a carbon atom. From the viewpoint of ease of starting monomer synthesis, a group in which m5 numbers of hydrogen atoms are removed from an alkyl group, a group in which m5 numbers of hydrogen atoms are removed from an aryl group, or a group in which m5 numbers of hydrogen atoms are removed from an alkoxy group is preferable.

The substituent in these groups includes the same substituents exemplified in the description of $Q^1$ described above. When a plurality of substituents are present, they may be the same as or different from each other.

In the formula (18), m5 represents an integer of 1 or more. However, when $R^7$ is a single bond, m5 represents 1.

In the formula (19), $R^8$ represents a single bond or an organic group having a valency of (1+m6), and is preferably an organic group having a valency of (1+m6).

In the formula (19), examples of the organic group having a valency of (1+m6) represented by $R^8$ include a group in which m6 numbers of hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which m6 numbers of hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which m6 numbers of hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which m6 numbers of hydrogen atoms are removed from an amino group which has a substituent including a carbon atom; a group in which m6 numbers of hydrogen atoms are removed from a silyl group which has a substituent including a carbon atom. From the viewpoint of ease of starting monomer synthesis, a group in which m6 numbers of hydrogen atoms are removed from an alkyl group, a group in which m6 numbers of hydrogen atoms are removed from an aryl group, or a group in which m6 numbers of hydrogen atoms are removed from an alkoxy group is preferable.

The substituent in these groups includes the same substituents exemplified in the description of $Q^1$ described above. When a plurality of substituents are present, they may be the same as or different from each other.

In the formula (19), m6 represents an integer of 1 or more. However, when $R^8$ is a single bond, m6 represents 1.

(Structural Unit Represented by the Formula (20))

In the formula (20), $R^9$ is a monovalent group including a group represented by the formula (21), $R^{10}$ is a monovalent group including a group represented by the formula (22), $Ar^4$ represents an aromatic group having a valency of (2+n8+n9) which has a substituent or does not have a substituent other than $R^9$ and $R^{10}$, and n8 and n9 each independently represent an integer of 1 or more.

The group represented by the formula (21) and the group represented by the formula (22) may be bonded directly to $Ar^4$ or may be bonded to $Ar^4$ via a prescribed group. This prescribed group via which the group may be bonded to $Ar^4$ includes an alkylene group having 1 to 50 carbon atoms which has a substituent or does not have a substituent such as a methylene group, an ethylene group, a propylene group, a butylene group, a pentylene group, a hexylene group, a nonylene group, a dodecylene group, a cycloprolylene group, a cyclobutylene group, a cyclopentylene group, a cyclohexylene group, a cyclononylene group, a cyclododecylene group, a norbonylene group, an adamantylene group or a group in which at least one hydrogen atom in these groups is substituted with a substituent; an oxyalkylene group having 1 to 50 carbon atoms which has a substituent or does not have a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbonyleneoxy group, an adamantyleneoxy group or a group in which at least one hydrogen atom in these groups is substituted with a substituent; an imino group which has a substituent or does not have a substituent; a silylene group which has a substituent or does not have a substituent; an ethenylene group which has a substituent or does not have a substituent; an ethynylene group; a methanetriyl group which has a substituent or does not have a substituent; a heteroatom such as an oxygen atom, a nitrogen atom or a sulfur atom.

$Ar^4$ may have a substituent other than $R^9$ and $R^{10}$. The substituent includes the same substituents exemplified in the description of $Q^1$ described above. When a plurality of substituents are present, they may be the same as or different from each other.

From the viewpoint of ease of starting monomer synthesis, the substituent $Ar^4$ may have other than $R^9$ and $R^{10}$ is preferably an alkyl group, an alkoxy group, an aryl group, an aryloxy group, a carboxyl group or a substituted carboxyl group.

In the formula (20), n8 represents an integer of 1 or more, preferably an integer of 1 to 4, and more preferably an integer of 1 to 3.

In the formula (20), n9 represents an integer of 1 or more, preferably an integer of 1 to 4, and more preferably an integer of 1 to 3.

The aromatic group having a valency of (2+n8+n9) represented by $Ar^4$ in the formula (20) includes an aromatic hydrocarbon group having a valency of (2+n8+n9) or an aromatic heterocyclic group having a valency of (2+n8+n9). Among these, an aromatic group having a valency of (2+n8+n9) formed with only carbon atoms, or formed with one or more atoms selected from the group consisting of carbon atoms, hydrogen atoms, nitrogen atoms and oxygen atoms is preferable.

The aromatic group having a valency of (2+n8+n9) includes a group having a valency of (2+n8+n9) in which (2+n8+n9) hydrogen atoms are removed from a monocyclic aromatic ring such as a benzene ring, a pyridine ring, a 1,2-diazine ring, a 1,3-diazine ring, a 1,4-diazine ring, a furan ring, a pyrrole ring, a pyrazole ring or an imidazole ring; a group having a valency of (2+n8+n9) in which (2+n8+n9) hydrogen atoms are removed from a condensed polycyclic aromatic ring in which two or more rings selected from the group consisting of monocyclic aromatic rings are condensed; a group having a valency of (2+n8+n9) in which (2+n8+n9) hydrogen atoms are removed from an assembly of aromatic rings formed by connecting two or more aromatic rings selected from the group consisting of a monocyclic aromatic ring and a condensed polycyclic aromatic ring through a single bond, an ethenylene group or an ethynylene group; a group having a valency of (2+n8+n9) in which (2+n8+n9) hydrogen atoms are removed from a bridged polycyclic aromatic ring having a cross-linking in which an assembly of condensed polycyclic aromatic rings or aromatic rings is bridged by two adjacent aromatic rings through a divalent group such as a methylene group, an ethylene group or a carbonyl group, or the like.

Examples of the monocyclic aromatic ring include the rings represented by the formulae 1 to 5 and the formulae 7 to 10 exemplified in the description of the structural unit represented by the formula (13).

Examples of the condensed polycyclic aromatic ring include the rings represented by the formulae 13 to 27 exemplified in the description of the structural unit represented by the formula (13).

Examples of the assembly of aromatic rings include the rings represented by the formulae 28 to 36 exemplified in the description of the structural unit represented by the formula (13).

Examples of the bridged polycyclic aromatic ring include the rings represented by the formulae 37 to 44 exemplified in the description of the structural unit represented by the formula (13).

From the viewpoint of ease of starting monomer synthesis, the aromatic group having a valency of (2+n8+n9) is preferably a group in which (2+n8+n9) hydrogen atoms are removed from a ring represented by the formulae 1 to 5, 7 to 10, 13, 14, 26 to 29, 37 to 39, or 41, more preferably a group in which (2+n8+n9) hydrogen atoms are removed from a ring represented by the formulae 1 to 6, 8, 14, 27, 28, 38 or 42, and even more preferably a group in which (2+n8+n9) hydrogen atoms are removed from a ring represented by the formulae 1, 37 or 41.

In the formula (21), $R^{11}$ represents a single bond or an organic group having a valency of (1+m7), and is preferably an organic group having a valency of (1+m7).

In the formula (21), examples of the organic group having a valency of (1+m7) represented by $R^{11}$ include a group in which m7 numbers of hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which m7 numbers of hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which m7 numbers of hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which m7 numbers of hydrogen atoms are removed from an amino group which has a substituent including a carbon atom; a group in which m7 numbers of hydrogen atoms are removed from a silyl group which has a substituent including a carbon atom. From the viewpoint of ease of starting monomer synthesis, a group in which m7 numbers of hydrogen atoms are removed from an alkyl group, a group in which m7 numbers of hydrogen atoms are removed from an aryl group, or a group in which m7 numbers of hydrogen atoms are removed from an alkoxy group is preferable.

The substituent in these groups includes the same substituents exemplified in the description of $Q^1$ described above. When a plurality of substituents are present, they may be the same as or different from each other.

In the formula (21), m7 represents an integer of 1 or more. However, when $R^{11}$ is a single bond, m7 represents 1.

In the formula (22), $R^{12}$ represents a single bond or an organic group having a valency of (1+m8), and is preferably an organic group having a valency of (1+m8).

In the formula (22), examples of the organic group having a valency of (1+m8) represented by $R^{12}$ include a group in which m8 numbers of hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which m8 numbers of hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which m8 numbers of hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which m8 numbers of hydrogen atoms are removed from an amino group which has a substituent including a carbon atom; a group in which m8 numbers of hydrogen atoms are removed from a silyl group which has a substituent including a carbon atom. From the viewpoint of ease of starting monomer synthesis, a group in which m8 numbers of hydrogen atoms are removed from an alkyl group, a group in which m8 numbers of hydrogen atoms are removed from an aryl group, or a group in which m8 numbers of hydrogen atoms are removed from an alkoxy group is preferable.

The substituent in these groups includes the same substituents exemplified in the description of $Q^1$ described above. When a plurality of substituents are present, they may be the same as or different from each other.

In the formula (22), m8 represents an integer of 1 or more. However, when $R^{12}$ is a single bond, m8 represents 1.

Hereinafter, examples of each structural unit described above will be described.

(Examples of Structural Unit Represented by the Formula (13))

The structural unit represented by the formula (13) is preferably a structural unit represented by the formula (23) or a structural unit represented by the formula (24), and more preferably a structural unit represented by the formula (24) from the viewpoint of electron transporting properties of the ionic polymer obtained.

First, the structural unit represented by the formula (23) is described.

[Chem. 18]

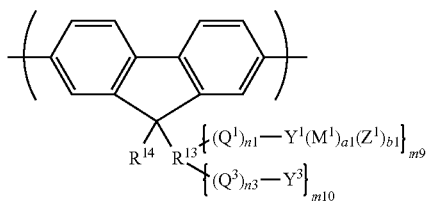

(23)

(In the formula (23), $R^{13}$ represents an organic group having a valency of (1+m9+m10), $R^{14}$ represents a monovalent organic group, $Q^1$, $Q^3$, $Y^1$, $M^1$, $Z^1$, $Y^3$, n1, a1, b1 and n3 represents the same meaning as described above, and m9 and m10 each independently represent an integer of 1 or more. When each $Q^1$, $Q^3$, $Y^1$, $M^1$, $Z^1$, $Y^3$, n1, a1, b1 and n3 are present in a plurality, they may be the same as or different from each other.)

In the formula (23), examples of the organic group having a valency of (1+m9+m10) represented by $R^{13}$ include a group in which (m9+m10) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m9+m10) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m9+m10) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m9+m10) hydrogen atoms are removed from an amino group which has a substituent including a carbon atom; a group in which (m9+m10) hydrogen atoms are removed from a silyl group which has a substituent including a carbon atom. From the viewpoint of ease of starting monomer synthesis, a group in which (m9+m10) hydrogen atoms are removed from an alkyl group, a group in which (m9+m10) hydrogen atoms are removed from an aryl group, or a group in which (m9+m10) hydrogen atoms are removed from an alkoxy group is preferable.

In the formula (23), examples of the monovalent organic group represented by $R^{14}$ include a group in which one hydrogen atom is removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which one hydrogen atom is removed from an aryl group having 6 to carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which one hydrogen atom is removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which one hydrogen atom is removed from an amino group which has a substituent including a carbon atom; a group in which one hydrogen atom is removed from a silyl group which has a substituent including a carbon atom. From the viewpoint of ease of starting monomer synthesis, a group in which one hydrogen atom is removed from an alkyl group, a group in which one hydrogen atom is removed from an aryl group, or a group in which one hydrogen atom is removed from an alkoxy group is preferable.

The structural unit represented by the formula (23) includes the following structural units.

[Chem. 19]

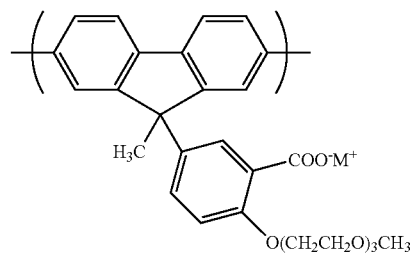

M = Li, Na, K, Cs, N(CH$_3$)$_4$

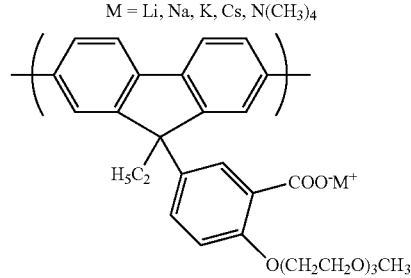

M = Li, Na, K, Cs, N(CH$_3$)$_4$

47
-continued
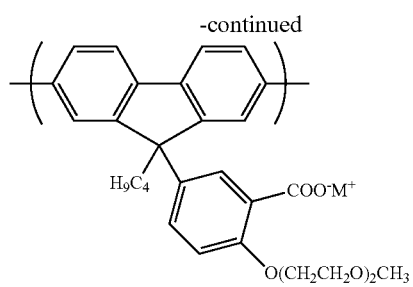
M = Li, Na, K, Cs, N(CH$_3$)$_4$
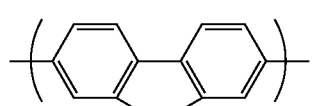
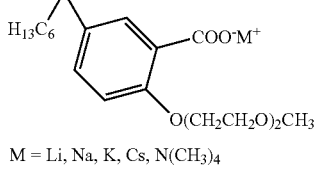
M = Li, Na, K, Cs, N(CH$_3$)$_4$
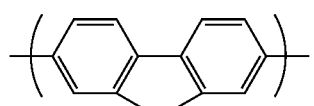
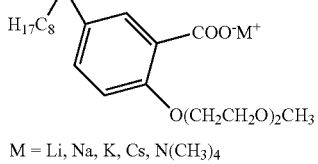
M = Li, Na, K, Cs, N(CH$_3$)$_4$
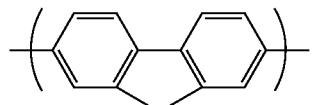
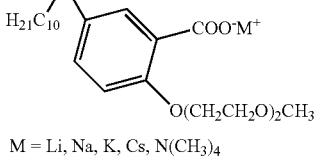
M = Li, Na, K, Cs, N(CH$_3$)$_4$
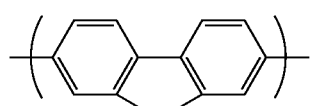
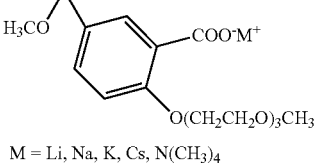
M = Li, Na, K, Cs, N(CH$_3$)$_4$
48
-continued
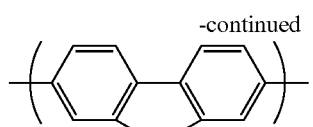
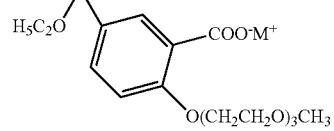
M = Li, Na, K, Cs, N(CH$_3$)$_4$
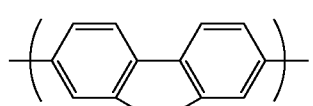
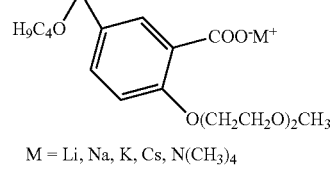
M = Li, Na, K, Cs, N(CH$_3$)$_4$
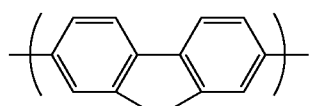
M = Li, Na, K, Cs, N(CH$_3$)$_4$
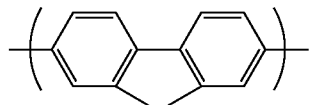
M = Li, Na, K, Cs, N(CH$_3$)$_4$
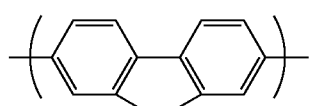
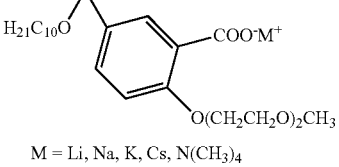
M = Li, Na, K, Cs, N(CH$_3$)$_4$ Next, the structural unit represented by the formula (24) is described.

[Chem. 20]

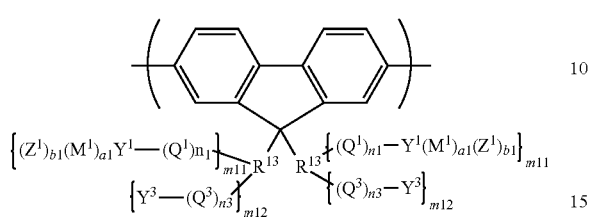

(24)

(In the formula (24), $R^{13}$ represents an organic group having a valency of $(1+m11+m12)$, $Q^1$, $Q^3$, $Y^1$, $M^1$, $Z^1$, $Y^3$, n1, a1, b1 and n3 represent the same meaning as described above, and m11 and m12 each independently represent an integer of 1 or more. When each $R^{13}$, m11, m12, $Q^1$, $Q^3$, $Y^1$, $M^1$, $Z^1$, $Y^3$, n1, a1, b1 and n3 are present in a plurality, they may be the same as or different from each other.)

In the formula (24), examples of the organic group having a valency of $(1+m11+m12)$ represented by $R^{13}$ include a group in which $(m11+m12)$ hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which $(m11+m12)$ hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which $(m11+m12)$ hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which $(m11+m12)$ hydrogen atoms are removed from an amino group which has a substituent including a carbon atom; a group in which $(m11+m2)$ hydrogen atoms are removed from a silyl group which has a substituent including a carbon atom. From the viewpoint of ease of starting monomer synthesis, a group in which $(m11+m12)$ hydrogen atoms are removed from an alkyl group, a group in which $(m11+m12)$ hydrogen atoms are removed from an aryl group, or a group in which $(m11+m12)$ hydrogen atoms are removed from an alkoxy group is preferable.

The structural unit represented by the formula (24) includes the following structural units.

[Chem. 21]

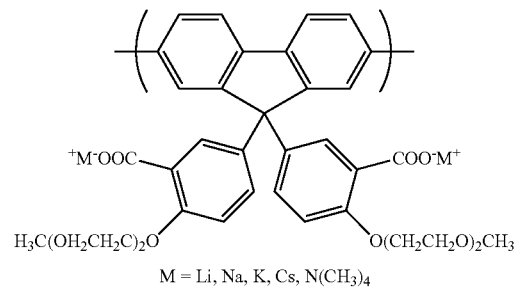

M = Li, Na, K, Cs, N(CH$_3$)$_4$

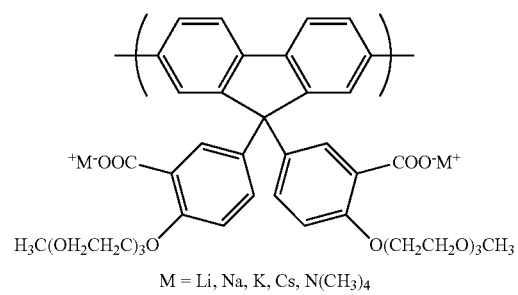

M = Li, Na, K, Cs, N(CH$_3$)$_4$

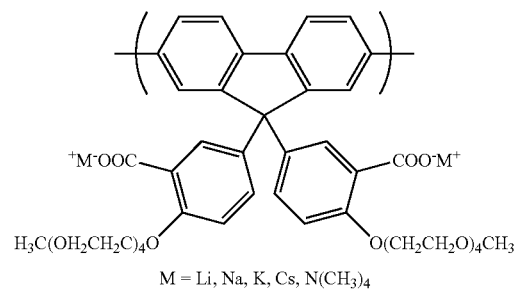

M = Li, Na, K, Cs, N(CH$_3$)$_4$

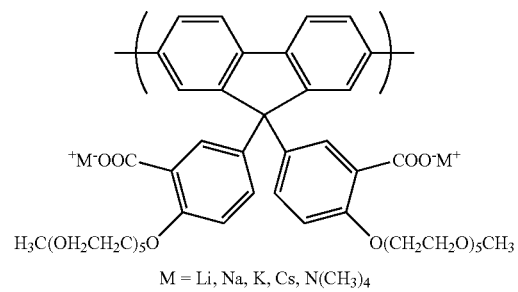

M = Li, Na, K, Cs, N(CH$_3$)$_4$

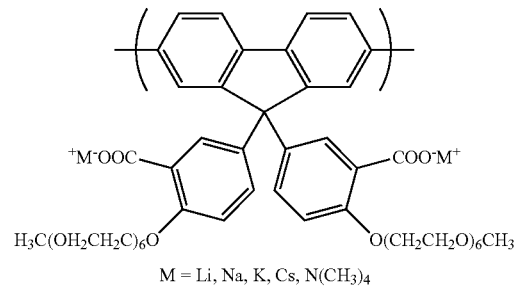

M = Li, Na, K, Cs, N(CH$_3$)$_4$

51
-continued
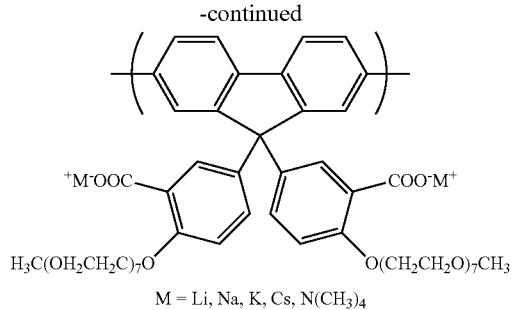
M = Li, Na, K, Cs, N(CH$_3$)$_4$
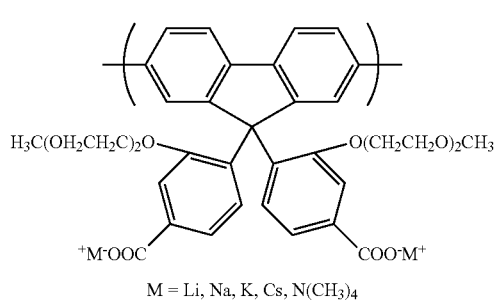
M = Li, Na, K, Cs, N(CH$_3$)$_4$
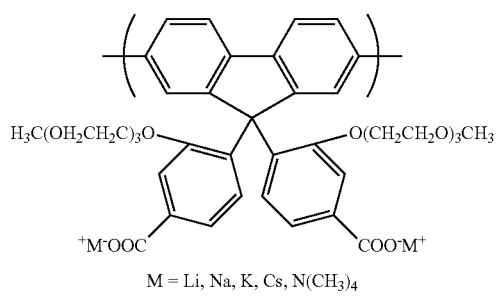
M = Li, Na, K, Cs, N(CH$_3$)$_4$
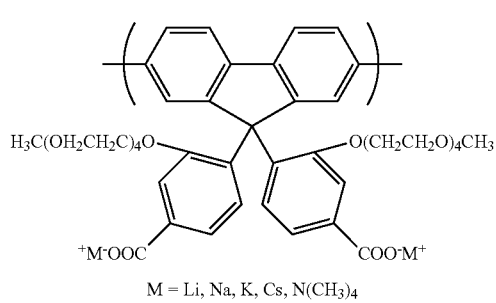
M = Li, Na, K, Cs, N(CH$_3$)$_4$
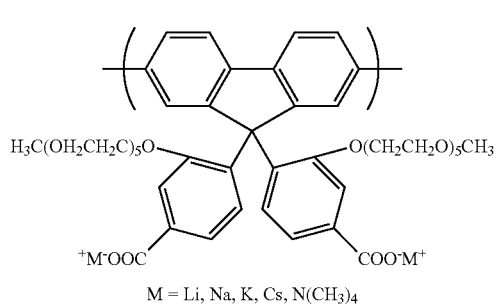
M = Li, Na, K, Cs, N(CH$_3$)$_4$
52
-continued
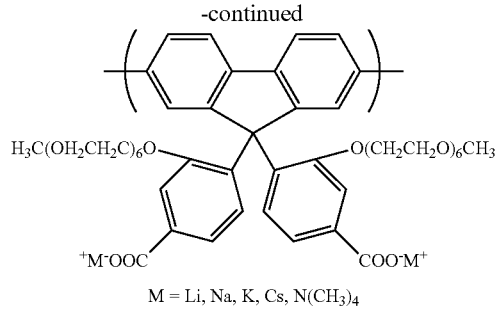
M = Li, Na, K, Cs, N(CH$_3$)$_4$
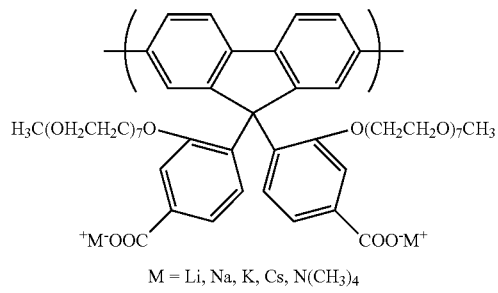
M = Li, Na, K, Cs, N(CH$_3$)$_4$
[Chem. 22]
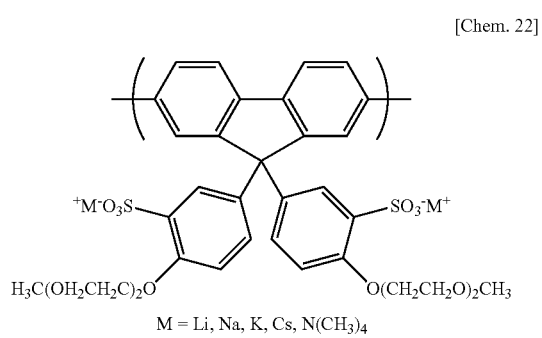
M = Li, Na, K, Cs, N(CH$_3$)$_4$
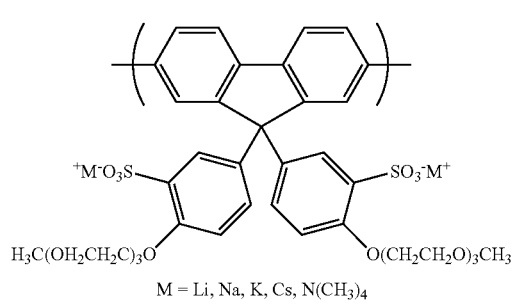
M = Li, Na, K, Cs, N(CH$_3$)$_4$
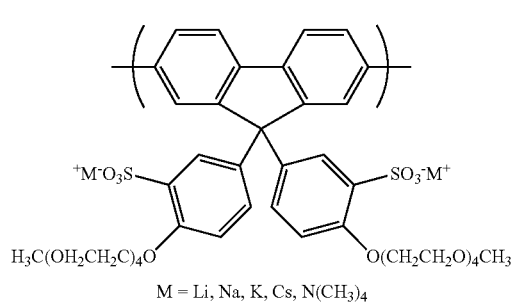
M = Li, Na, K, Cs, N(CH$_3$)$_4$ 53
-continued
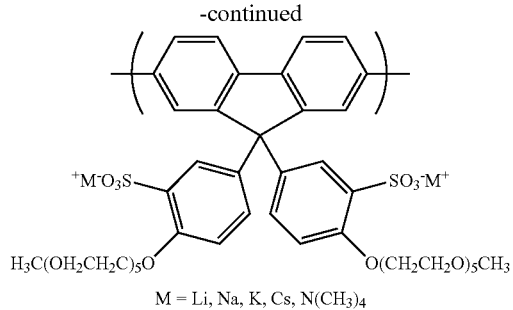
M = Li, Na, K, Cs, N(CH₃)₄
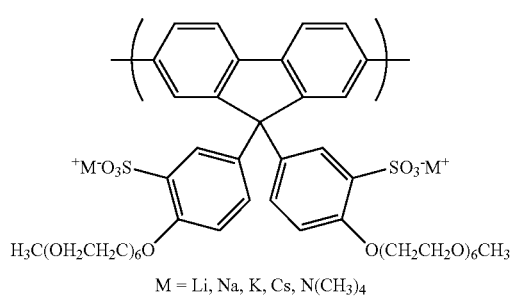
M = Li, Na, K, Cs, N(CH₃)₄
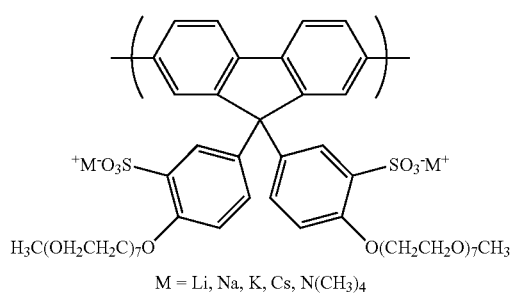
M = Li, Na, K, Cs, N(CH₃)₄
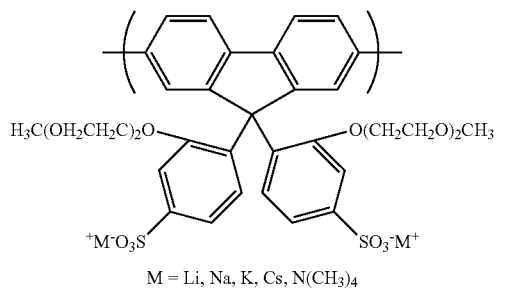
M = Li, Na, K, Cs, N(CH₃)₄
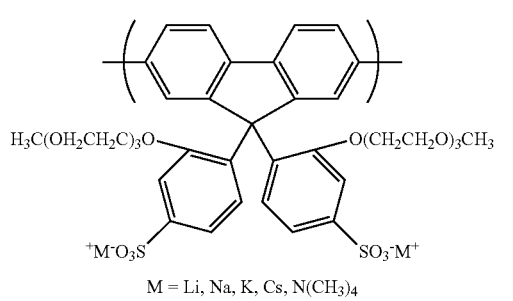
M = Li, Na, K, Cs, N(CH₃)₄
54
-continued
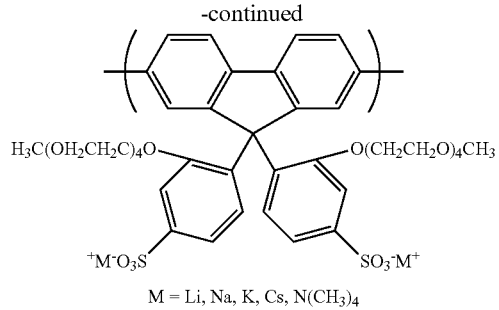
M = Li, Na, K, Cs, N(CH₃)₄
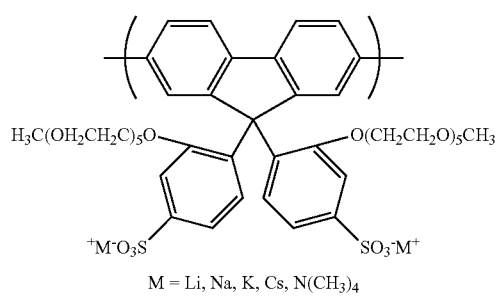
M = Li, Na, K, Cs, N(CH₃)₄
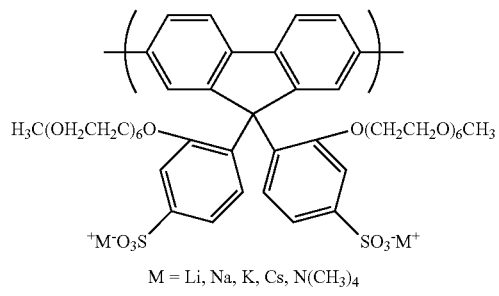
M = Li, Na, K, Cs, N(CH₃)₄
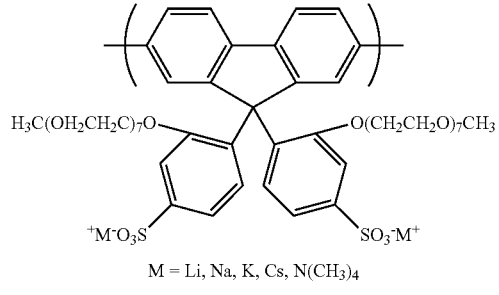
M = Li, Na, K, Cs, N(CH₃)₄
[Chem. 23]
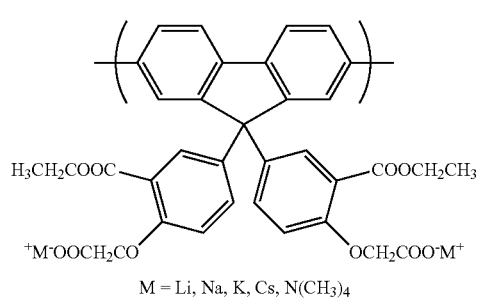
M = Li, Na, K, Cs, N(CH₃)₄

55
-continued
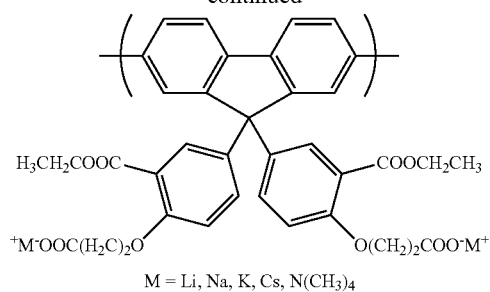
M = Li, Na, K, Cs, N(CH₃)₄
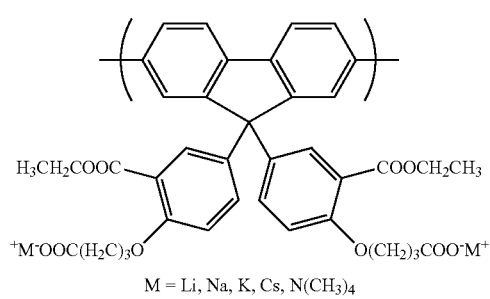
M = Li, Na, K, Cs, N(CH₃)₄
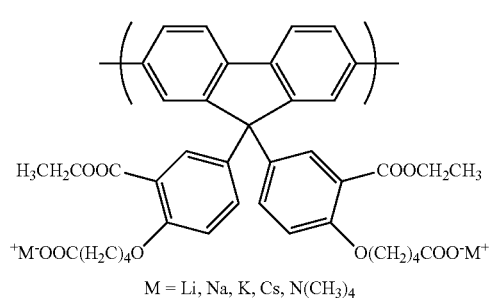
M = Li, Na, K, Cs, N(CH₃)₄
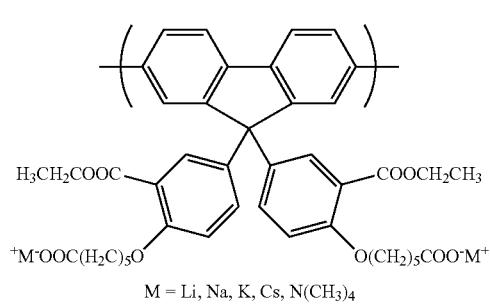
M = Li, Na, K, Cs, N(CH₃)₄
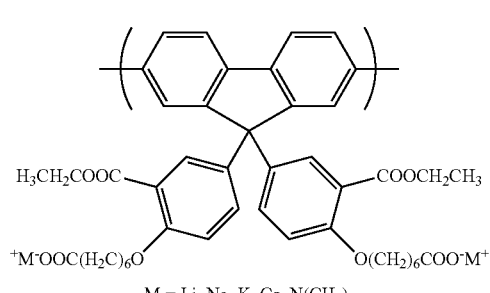
M = Li, Na, K, Cs, N(CH₃)₄
56
-continued
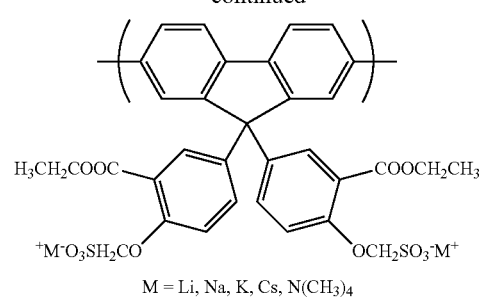
M = Li, Na, K, Cs, N(CH₃)₄
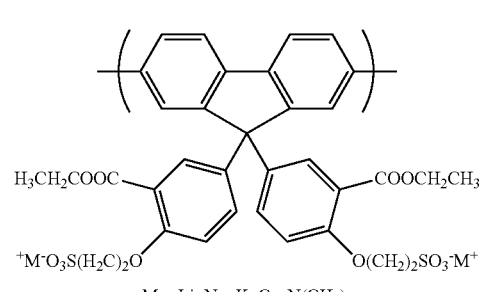
M = Li, Na, K, Cs, N(CH₃)₄
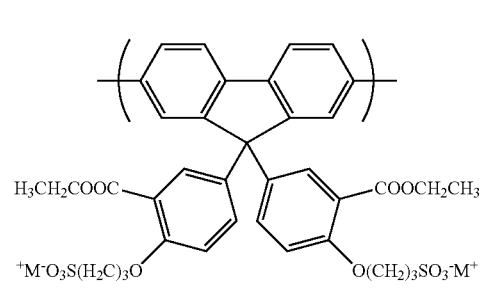
M = Li, Na, K, Cs, N(CH₃)₄
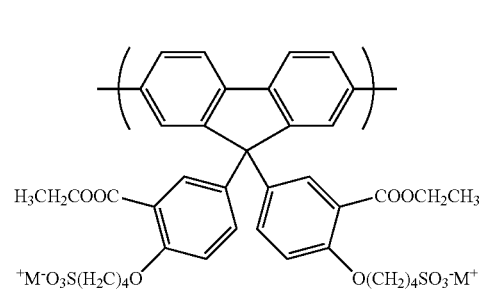
M = Li, Na, K, Cs, N(CH₃)₄
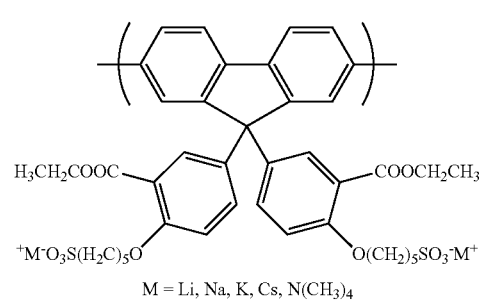
M = Li, Na, K, Cs, N(CH₃)₄

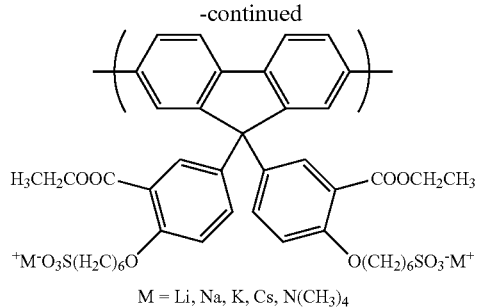
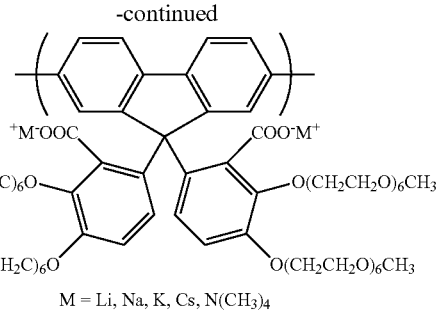
[Chem. 24]
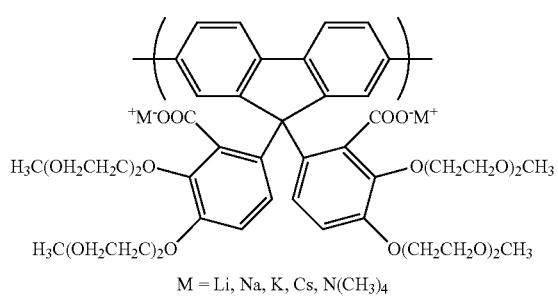
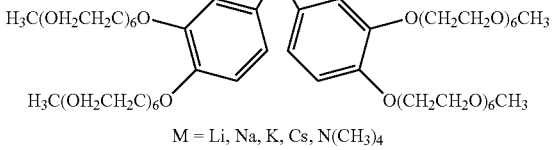
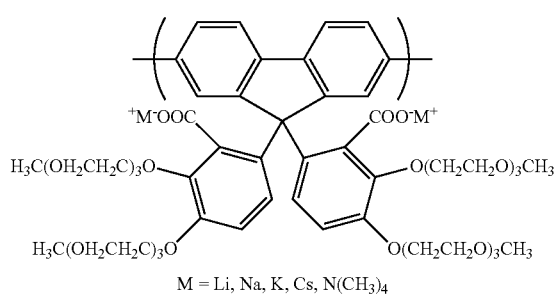
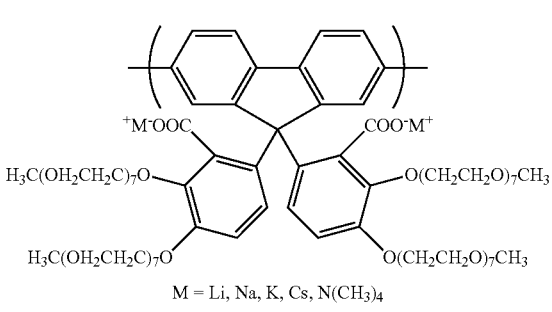
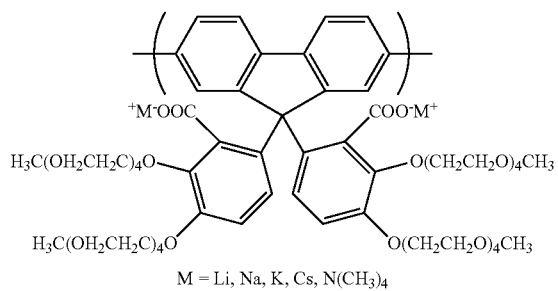
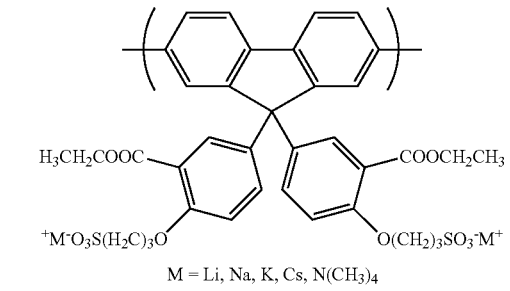
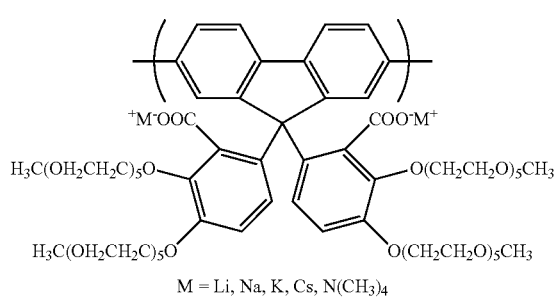
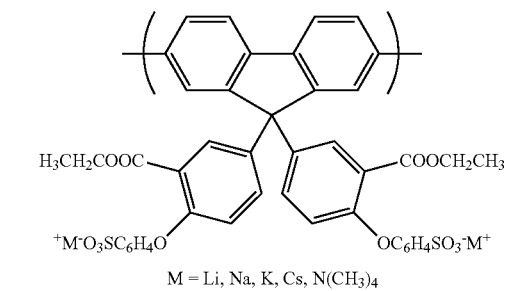
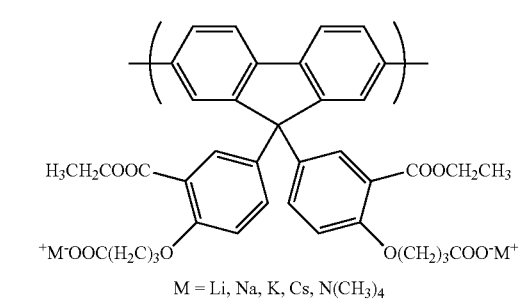

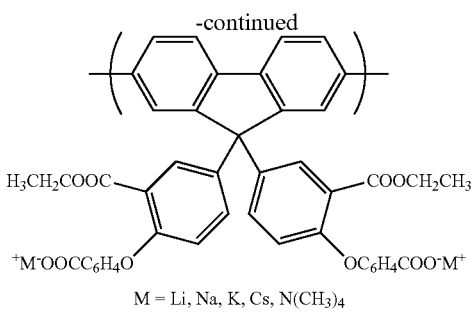

M = Li, Na, K, Cs, N(CH₃)₄

Furthermore, the structural unit represented by the formula (13) is preferably a structural unit represented by the formula (25) from the viewpoint of durability of the ionic polymer obtained.

[Chem. 25]

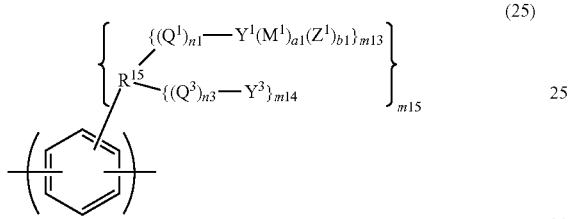

(In the formula (25), $R^{15}$ represents an organic group having a valency of (1+m13+m14), $Q^1$, $Q^3$, $Y^1$, $M^1$, $Z^1$, $Y^3$, n1, a1, b1 and n3 represent the same meaning as described above, and m13, m14 and m15 each independently represent an integer of 1 or more. When each $R^{15}$, m13, m14, $Q^1$, $Q^3$, $Y^1$, $M^1$, $Z^1$, $Y^3$, n1, a1, b1 and n3 are present in a plurality, they may be the same as or different from each other.)

In the formula (25), examples of the organic group having a valency of (1+m13+m14) represented by $R^{15}$ include a group in which (m13+m14) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m13+m14) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m13+m14) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m13+m14) hydrogen atoms are removed from an amino group which has a substituent including a carbon atom; a group in which (m13+m14) hydrogen atoms are removed from a silyl group which has a substituent including a carbon atom. From the viewpoint of ease of starting monomer synthesis, a group in which (m13+m14) hydrogen atoms are removed from an alkyl group, a group in which (m13+m14) hydrogen atoms are removed from an aryl group, or a group in which (m13+m14) hydrogen atoms are removed from an alkoxy group is preferable.

The structural unit represented by the formula (25) includes the following structural units.

[Chem. 26]

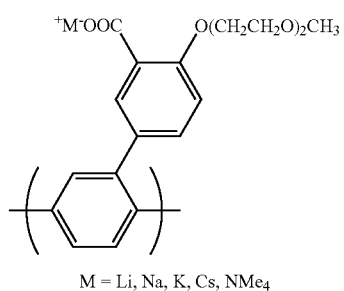

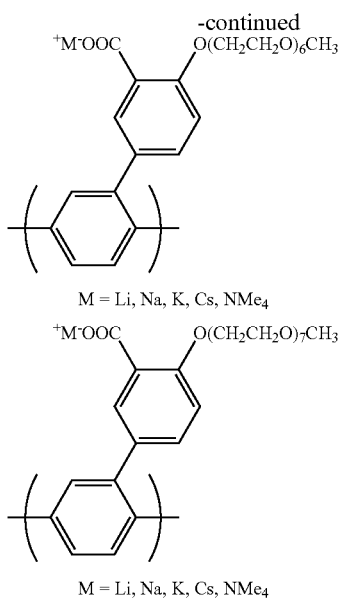

M = Li, Na, K, Cs, NMe₄

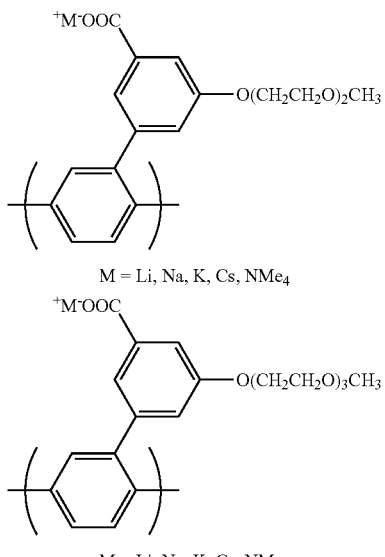

M = Li, Na, K, Cs, NMe₄

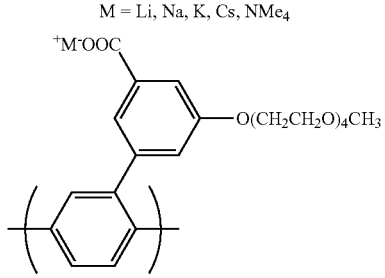

M = Li, Na, K, Cs, NMe₄

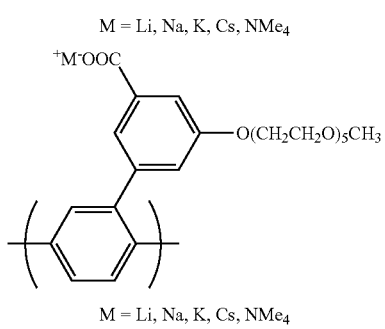

M = Li, Na, K, Cs, NMe₄

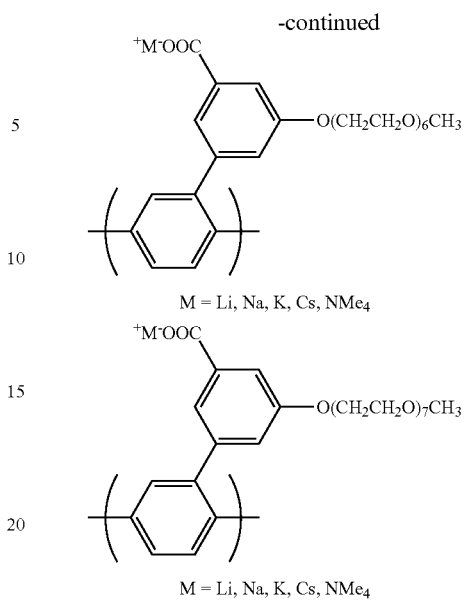

M = Li, Na, K, Cs, NMe₄

(Examples of Structural Unit Represented by the Formula (15))

The structural unit represented by the formula (15) is preferably a structural unit represented by the formula (26) or a structural unit represented by the formula (27), and more preferably a structural unit represented by the formula (27) from the viewpoint of electron transporting properties of the ionic polymer obtained.

First, the structural unit represented by the formula (26) is described.

[Chem. 27]

(26)

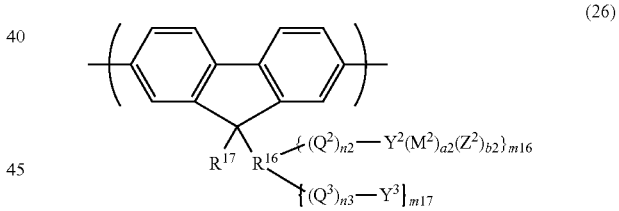

(In the formula (26), $R^{16}$ represents an organic group having a valency of (1+m16+m17), $R^{17}$ represents a monovalent organic group, $Q^2$, $Q^3$, $Y^2$, $M^2$, $Z^2$, $Y^3$, n2, a2, b2 and n3 represent the same meaning as described above, and m16 and m17 each independently represent an integer of 1 or more. When each $Q^2$, $Q^3$, $Y^2$, $M^2$, $Z^2$, $Y^3$, n2, a2, b2 and n3 are present in a plurality, they may be the same as or different from each other.)

In the formula (26), examples of the organic group having a valency of (1+m16+m17) represented by $R^{16}$ include a group in which (m16+m17) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m16+m17) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m16+m17) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m16+m17) hydrogen atoms are removed from an amino group which has a substituent including a carbon atom; a group in which (m16+m17) hydrogen atoms are removed from a silyl group which has a substituent including a carbon atom. From the viewpoint of ease of starting monomer synthesis, a group in which (m16+m17) hydrogen atoms are removed from an alkyl group, a group in which (m16+m17) hydrogen atoms are removed from an aryl group, or a group in which (m16+m17) hydrogen atoms are removed from an alkoxy group is preferable.

In the formula (26), examples of the monovalent organic group represented by $R^{17}$ include a group in which one hydrogen atom is removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which one hydrogen atom is removed from an aryl group having 6 to carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which one hydrogen atom is removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which one hydrogen atom is removed from an amino group which has a substituent including a carbon atom; a group in which one hydrogen atom is removed from a silyl group which has a substituent including a carbon atom. From the viewpoint of ease of starting monomer synthesis, a group in which one hydrogen atom is removed from an alkyl group, a group in which one hydrogen atom is removed from an aryl group, or a group in which one hydrogen atom is removed from an alkoxy group is preferable.

The structural unit represented by the formula (26) includes the following structural units.

[Chem. 28]

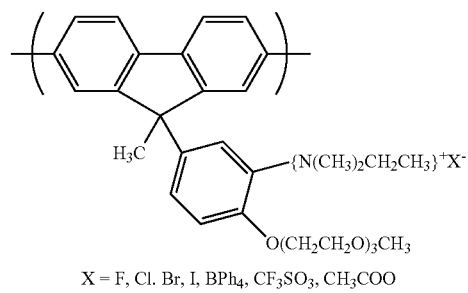

X = F, Cl, Br, I, $BPh_4$, $CF_3SO_3$, $CH_3COO$

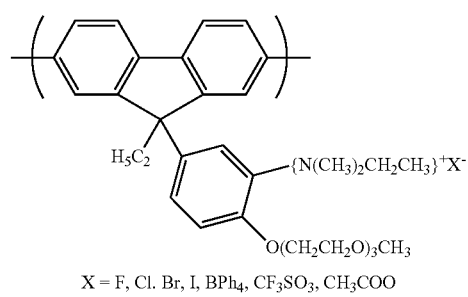

X = F, Cl, Br, I, $BPh_4$, $CF_3SO_3$, $CH_3COO$

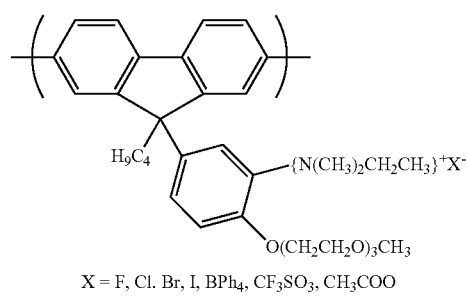

X = F, Cl, Br, I, $BPh_4$, $CF_3SO_3$, $CH_3COO$

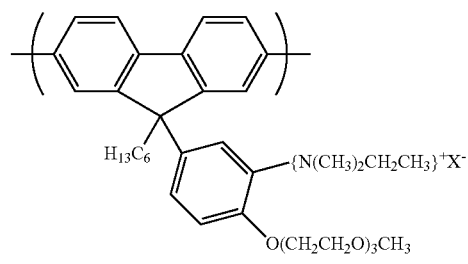

X = F, Cl, Br, I, $BPh_4$, $CF_3SO_3$, $CH_3COO$

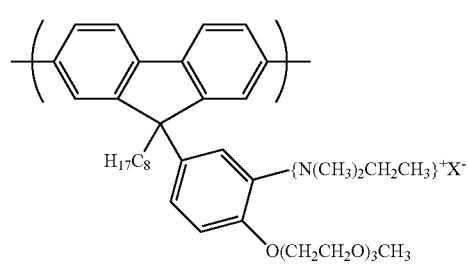

X = F, Cl, Br, I, $BPh_4$, $CF_3SO_3$, $CH_3COO$

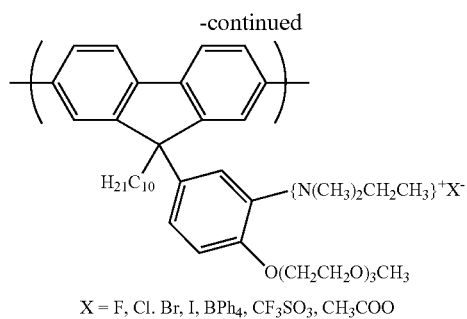

X = F, Cl. Br, I, BPh$_4$, CF$_3$SO$_3$, CH$_3$COO

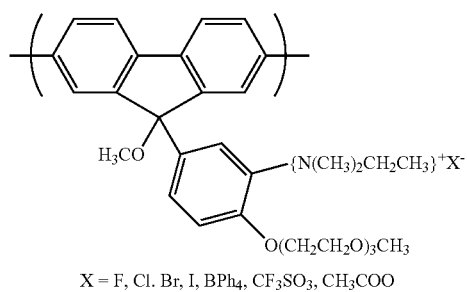

X = F, Cl. Br, I, BPh$_4$, CF$_3$SO$_3$, CH$_3$COO

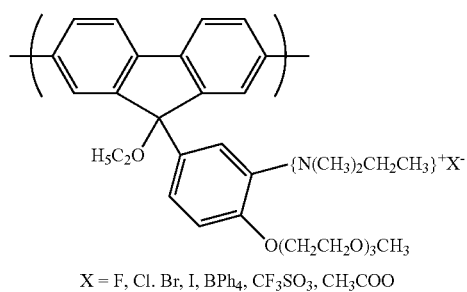

X = F, Cl. Br, I, BPh$_4$, CF$_3$SO$_3$, CH$_3$COO

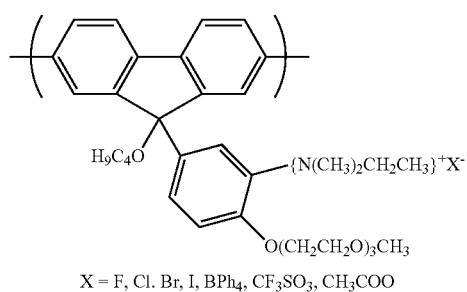

X = F, Cl. Br, I, BPh$_4$, CF$_3$SO$_3$, CH$_3$COO

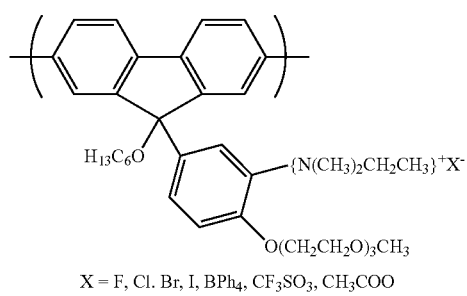

X = F, Cl. Br, I, BPh$_4$, CF$_3$SO$_3$, CH$_3$COO

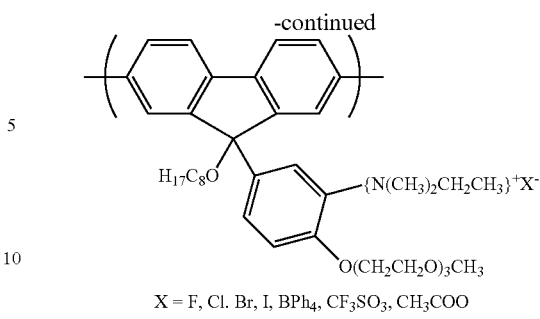

X = F, Cl. Br, I, BPh$_4$, CF$_3$SO$_3$, CH$_3$COO

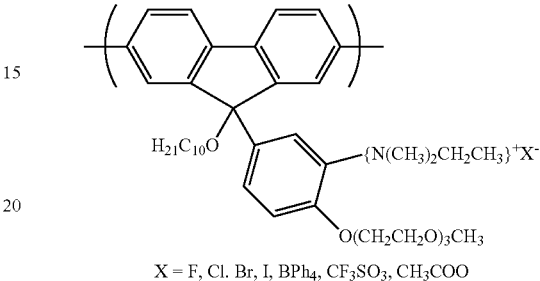

X = F, Cl. Br, I, BPh$_4$, CF$_3$SO$_3$, CH$_3$COO

Next, the structural unit represented by the formula (27) is described.

[Chem. 29]

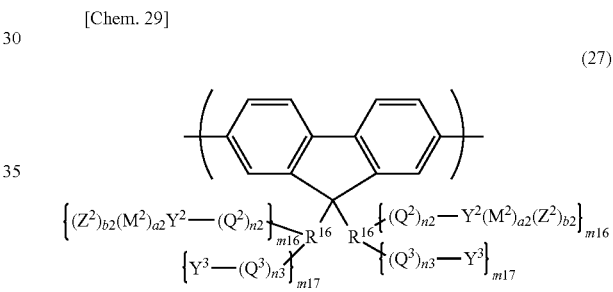

(27)

(In the formula (27), $R^{16}$ represents an organic group having a valency of (1+m6+m17), $Q^2$, $Q^3$, $Y^2$, $M^2$, $Z^2$, $Y^3$, n2, a2, b2 and n3 represent the same meaning as described above, m16 and m17 each independently represent an integer of 1 or more. When each $R^{16}$, m16, m17, $Q^2$, $Q^3$, $Y^2$, $M^2$, $Z^2$, $Y^3$, n2, a2, b2 and n3 are present in a plurality, they may be the same as or different from each other.)

In the formula (27), examples of the organic group having a valency of (1+m16+m17) represented by $R^{16}$ include a group in which (m16+m17) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m16+m17) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m16+m17) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m16+m17) hydrogen atoms are removed from an amino group which has a substituent including a carbon atom; a group in which (m16+m17) hydrogen atoms are removed from a silyl group which has a substituent including a carbon atom. From the viewpoint of ease of starting monomer synthesis, a group in which (m16+m17) hydrogen atoms are removed from an alkyl group, a group in which (m16+m17) hydrogen atoms are removed from an aryl group, or a group in which (m16+m17) hydrogen atoms are removed from an alkoxy group is preferable.

The structural unit represented by the formula (27) includes the following structural units.

[Chem. 30]

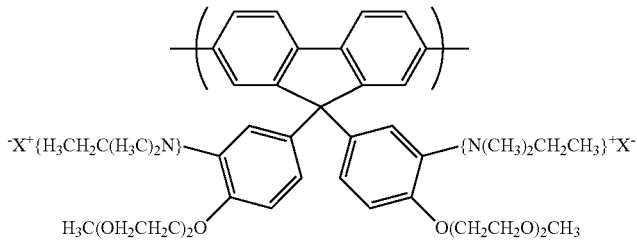

$X = F, Cl, Br, I, BPh_4, CF_3SO_3$

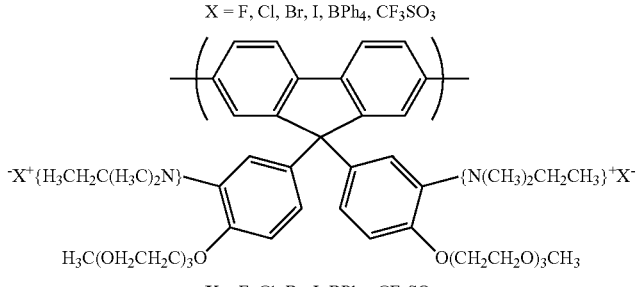

$X = F, Cl, Br, I, BPh_4, CF_3SO_3$

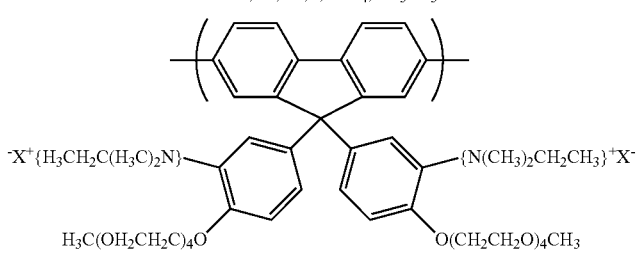

$X = F, Cl, Br, I, BPh_4, CF_3SO_3$

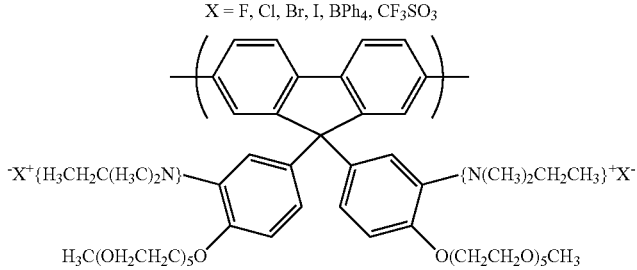

$X = F, Cl, Br, I, BPh_4, CF_3SO_3$

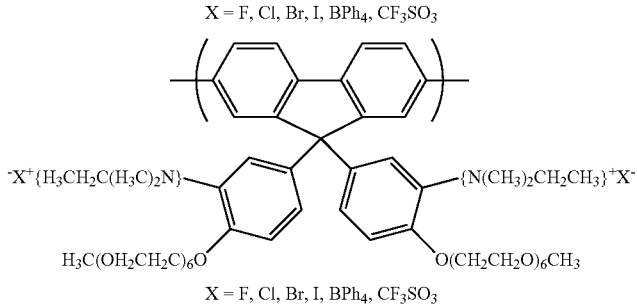

$X = F, Cl, Br, I, BPh_4, CF_3SO_3$

-continued
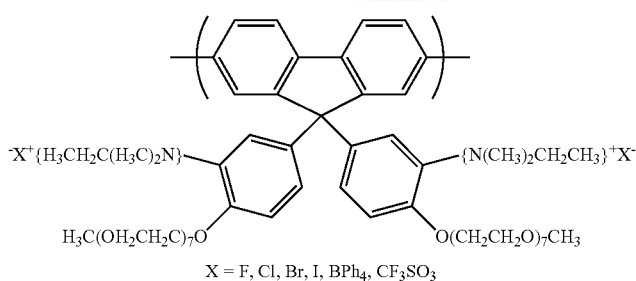
X = F, Cl, Br, I, BPh4, CF3SO3
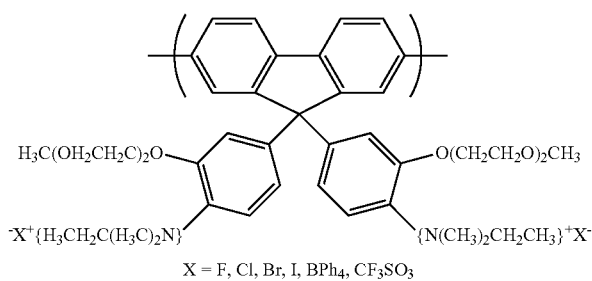
X = F, Cl, Br, I, BPh4, CF3SO3
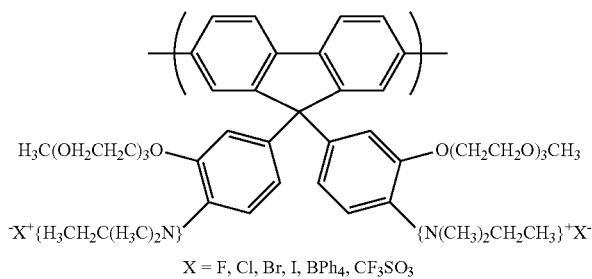
X = F, Cl, Br, I, BPh4, CF3SO3
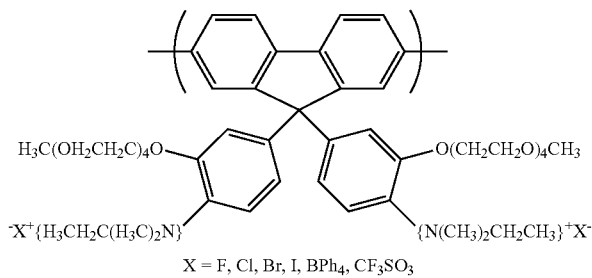
X = F, Cl, Br, I, BPh4, CF3SO3
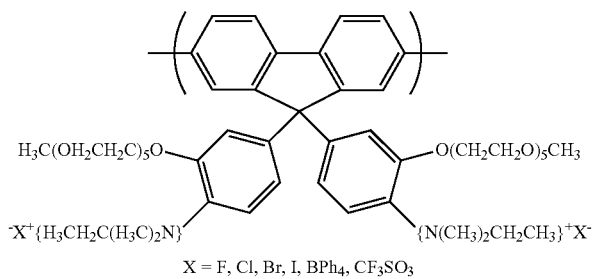
X = F, Cl, Br, I, BPh4, CF3SO3
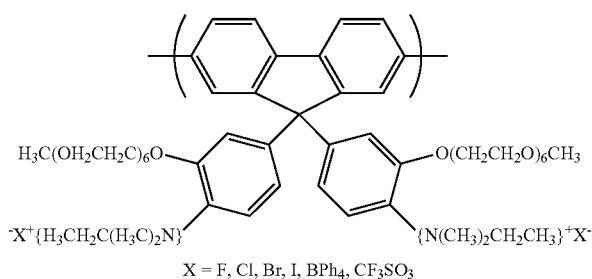
X = F, Cl, Br, I, BPh4, CF3SO3

-continued
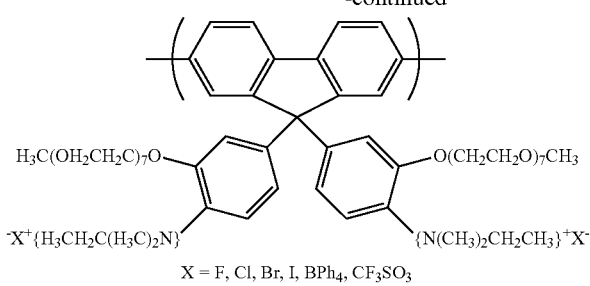
X = F, Cl, Br, I, BPh₄, CF₃SO₃
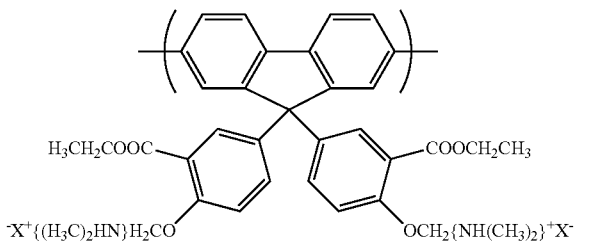
X = F, Cl, Br, I, BPh₄, CF₃SO₃, CH₃COO
[Chem. 31]
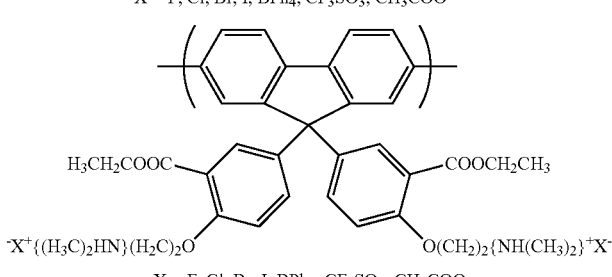
X = F, Cl, Br, I, BPh₄, CF₃SO₃, CH₃COO
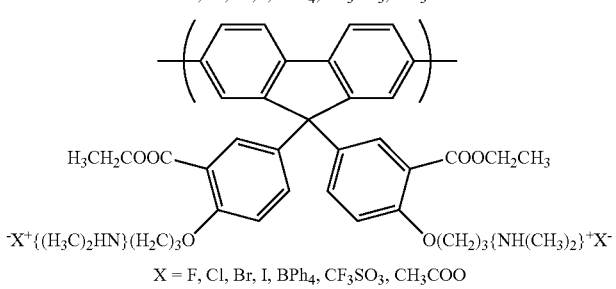
X = F, Cl, Br, I, BPh₄, CF₃SO₃, CH₃COO
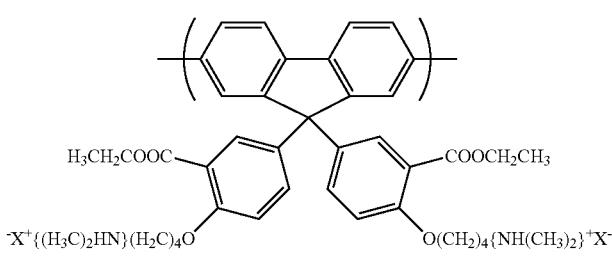
X = F, Cl, Br, I, BPh₄, CF₃SO₃, CH₃COO
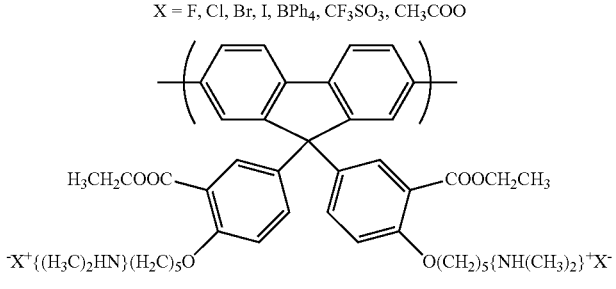
X = F, Cl, Br, I, BPh₄, CF₃SO₃, CH₃COO -continued
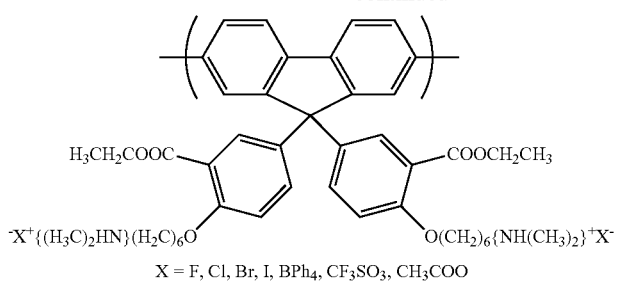
X = F, Cl, Br, I, BPh₄, CF₃SO₃, CH₃COO
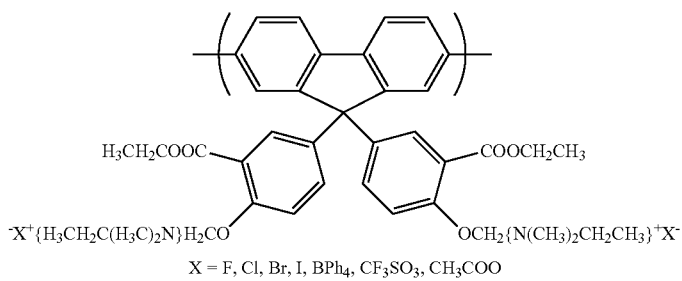
X = F, Cl, Br, I, BPh₄, CF₃SO₃, CH₃COO
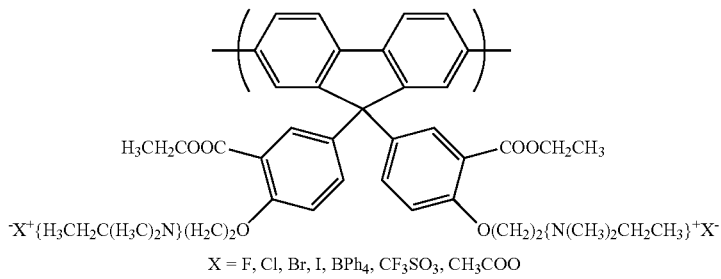
X = F, Cl, Br, I, BPh₄, CF₃SO₃, CH₃COO
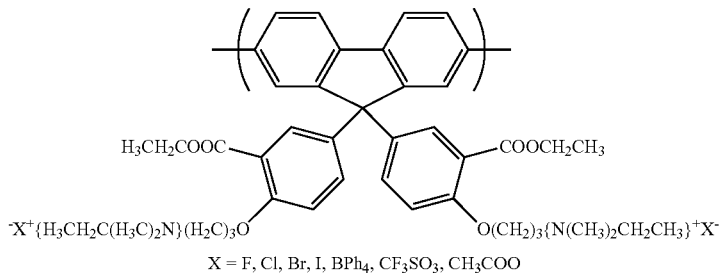
X = F, Cl, Br, I, BPh₄, CF₃SO₃, CH₃COO
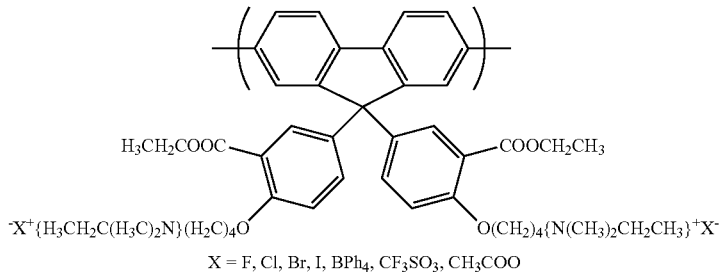
X = F, Cl, Br, I, BPh₄, CF₃SO₃, CH₃COO
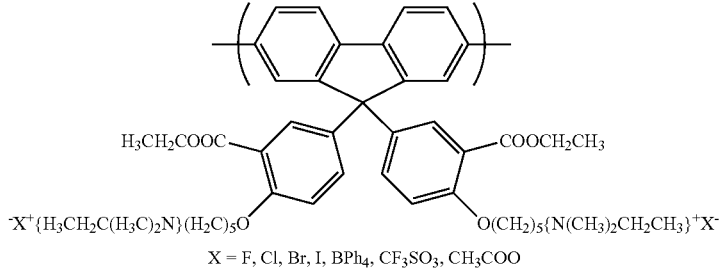
X = F, Cl, Br, I, BPh₄, CF₃SO₃, CH₃COO

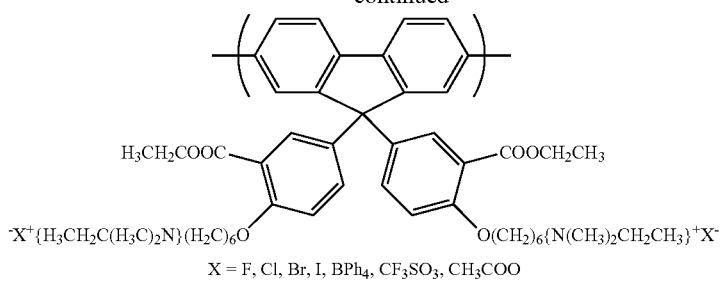
X = F, Cl, Br, I, BPh4, CF3SO3, CH3COO
[Chem. 32]
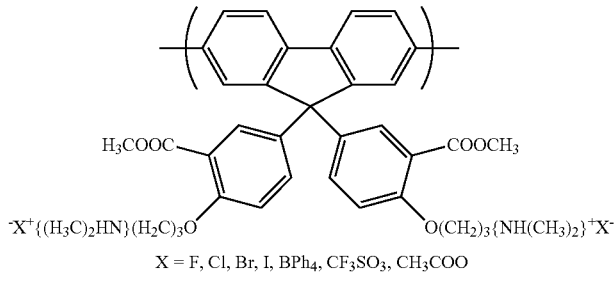
X = F, Cl, Br, I, BPh4, CF3SO3, CH3COO
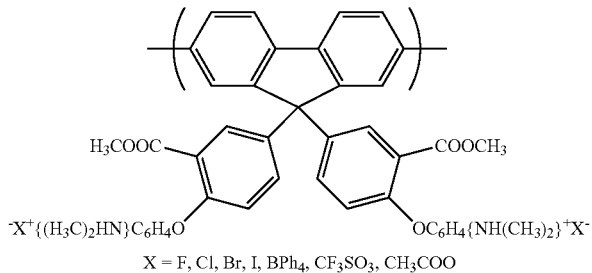
X = F, Cl, Br, I, BPh4, CF3SO3, CH3COO
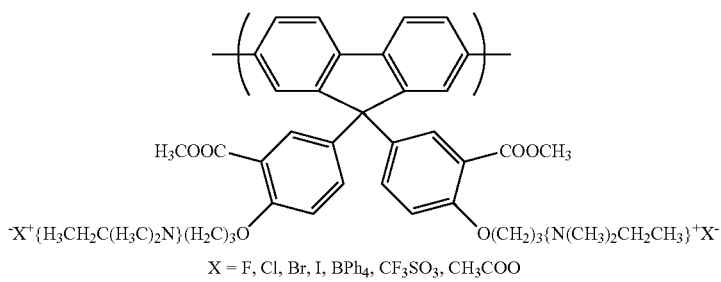
X = F, Cl, Br, I, BPh4, CF3SO3, CH3COO
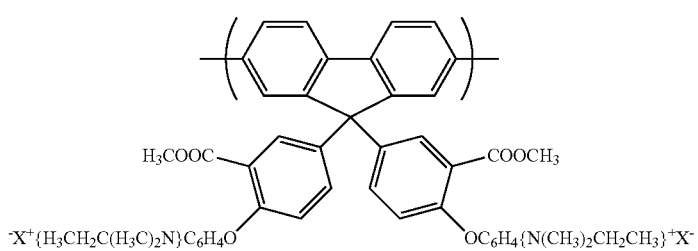
X = F, Cl, Br, I, BPh4, CF3SO3, CH3COO
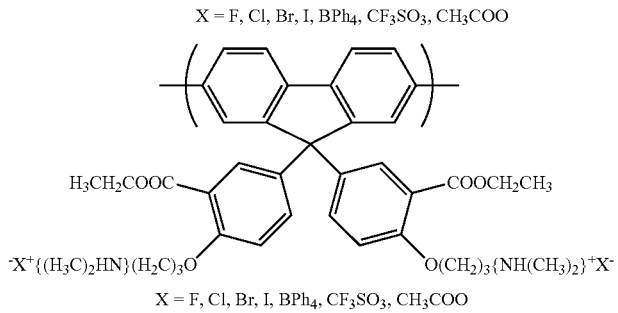
X = F, Cl, Br, I, BPh4, CF3SO3, CH3COO

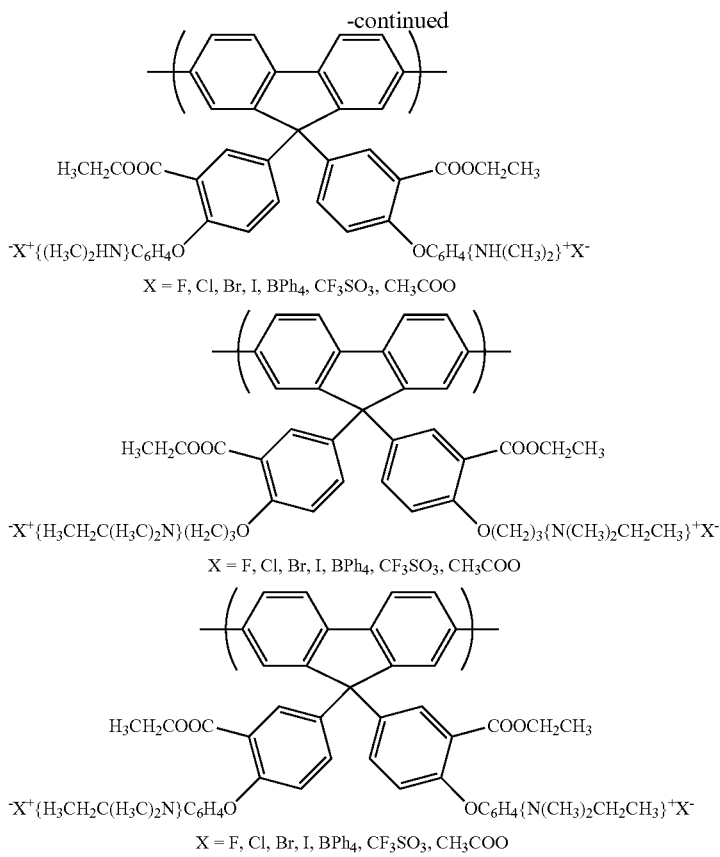

Furthermore, the structural unit represented by the formula (15) is preferably a structural unit represented by the formula (28) from the viewpoint of durability of the ionic polymer obtained.

[Chem. 33]

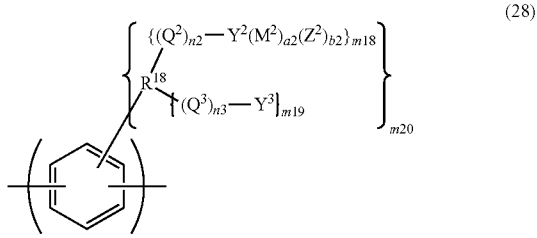

(In the formula (28), $R^{18}$ represents an organic group having a valency of $(1+m18+m19)$, $Q^2$, $Q^3$, $Y^2$, $M^2$, $Z^2$, $Y^3$, n2, a2, b2 and n3 represent the same meaning as described above, m18, m19 and m20 each independently represent an integer of 1 or more. When each $R^8$, m18, m19, $Q^2$, $Q^3$, $Y^2$, M2, $Z^2$, $Y^3$, n2, a2, b2 and n3 are present in a plurality, they may be the same as or different from each other.)

In the formula (28), examples of the organic group having a valency of $(1+m18+m19)$ represented by $R^{18}$ include a group in which (m18+m19) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m18+m19) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m18+m19) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m18+m19) hydrogen atoms are removed from an amino group which has a substituent including a carbon atom; a group in which (m18+m19) hydrogen atoms are removed from a silyl group which has a substituent including a carbon atom. From the viewpoint of ease of starting monomer synthesis, a group in which (m18+m19) hydrogen atoms are removed from an alkyl group, a group in which (m18+m19) hydrogen atoms are removed from an aryl group, or a group in which (m18+m19) hydrogen atoms are removed from an alkoxy group is preferable.

The structural unit represented by the formula (28) includes the following structural units.

[Chem. 34]

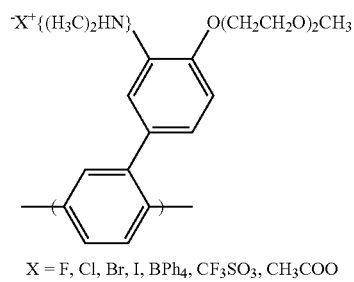

X = F, Cl, Br, I, BPh$_4$, CF$_3$SO$_3$, CH$_3$COO

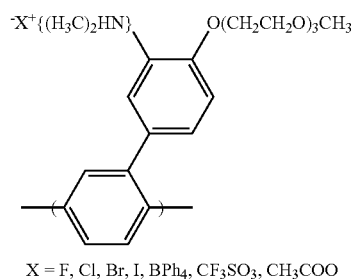

X = F, Cl, Br, I, BPh$_4$, CF$_3$SO$_3$, CH$_3$COO

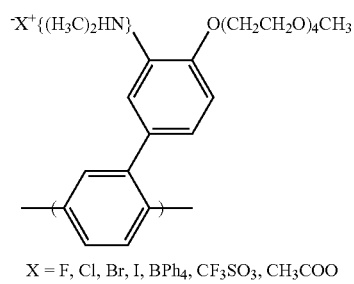

X = F, Cl, Br, I, BPh$_4$, CF$_3$SO$_3$, CH$_3$COO

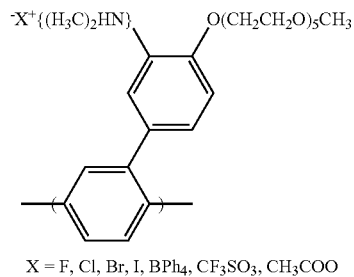

X = F, Cl, Br, I, BPh$_4$, CF$_3$SO$_3$, CH$_3$COO

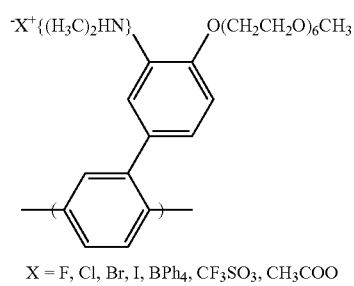

X = F, Cl, Br, I, BPh$_4$, CF$_3$SO$_3$, CH$_3$COO

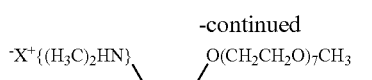

X = F, Cl, Br, I, BPh$_4$, CF$_3$SO$_3$, CH$_3$COO

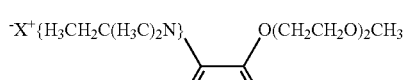

X = F, Cl, Br, I, BPh$_4$, CF$_3$SO$_3$, CH$_3$COO

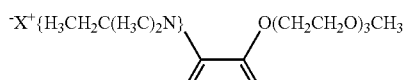

X = F, Cl, Br, I, BPh$_4$, CF$_3$SO$_3$, CH$_3$COO

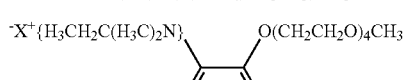

X = F, Cl, Br, I, BPh$_4$, CF$_3$SO$_3$, CH$_3$COO

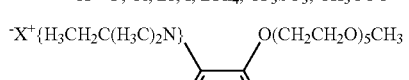

X = F, Cl, Br, I, BPh$_4$, CF$_3$SO$_3$, CH$_3$COO

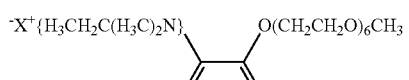

X = F, Cl, Br, I, BPh$_4$, CF$_3$SO$_3$, CH$_3$COO

81
-continued

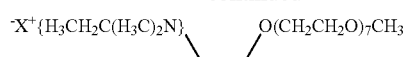

X = F, Cl, Br, I, BPh$_4$, CF$_3$SO$_3$, CH$_3$COO

X = F, Cl, Br, I, BPh$_4$, CF$_3$SO$_3$, CH$_3$COO

X = F, Cl, Br, I, BPh$_4$, CF$_3$SO$_3$, CH$_3$COO

X = F, Cl, Br, I, BPh$_4$, CF$_3$SO$_3$, CH$_3$COO

X = F, Cl, Br, I, BPh$_4$, CF$_3$SO$_3$, CH$_3$COO

X = F, Cl, Br, I, BPh$_4$, CF$_3$SO$_3$, CH$_3$COO

82
-continued

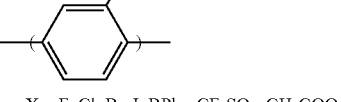

X = F, Cl, Br, I, BPh$_4$, CF$_3$SO$_3$, CH$_3$COO

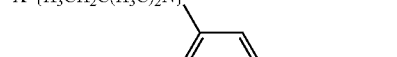

X = F, Cl, Br, I, BPh$_4$, CF$_3$SO$_3$, CH$_3$COO

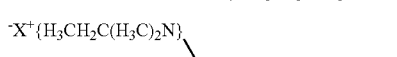

X = F, Cl, Br, I, BPh$_4$, CF$_3$SO$_3$, CH$_3$COO

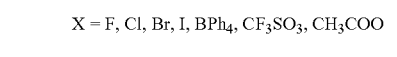

X = F, Cl, Br, I, BPh$_4$, CF$_3$SO$_3$, CH$_3$COO

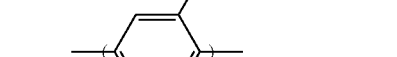

X = F, Cl, Br, I, BPh$_4$, CF$_3$SO$_3$, CH$_3$COO

X = F, Cl, Br, I, BPh$_4$, CF$_3$SO$_3$, CH$_3$COO

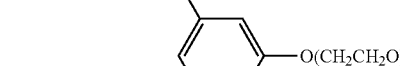

X = F, Cl, Br, I, BPh$_4$, CF$_3$SO$_3$, CH$_3$COO

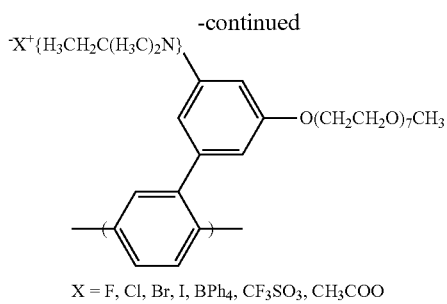

X = F, Cl, Br, I, BPh$_4$, CF$_3$SO$_3$, CH$_3$COO (Examples of Structural Unit Represented by the Formula (17))

The structural unit represented by the formula (17) is preferably a structural unit represented by the formula (29) from the viewpoint of electron transporting properties of the ionic polymer obtained.

[Chem. 35]

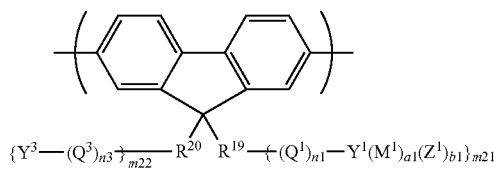

(29)

(In the formula (29), $R^{19}$ represents a single bond or an organic group having a valency of (1+m21), $R^{20}$ represents a single bond or an organic group having a valency of (1+m22), $Q^1$, $Q^3$, $Y^1$, $M^1$, $Z^1$, $Y^3$, n1, a1, b1 and n3 represent the same meaning as described above, m21 and m22 each independently represent an integer of 1 or more. However, when $R^{19}$ is a single bond, m21 represents 1, and when $R^{20}$ is a single bond, m22 represents 1. When each $Q^1$, $Q^3$, $Y^1$, $M^1$, $Z^1$, $Y^3$, n1, a1, b1 and n3 are present in a plurality, they may be the same as or different from each other.)

In the formula (29), examples of the organic group having a valency of (1+m21) represented by $R^{19}$ include a group in which (m21) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m21) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m21) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m21) hydrogen atoms are removed from an amino group which has a substituent including a carbon atom; a group in which (m21) hydrogen atoms are removed from a silyl group which has a substituent including a carbon atom. From the viewpoint of ease of starting monomer synthesis, a group in which (m21) hydrogen atoms are removed from an alkyl group, a group in which (m21) hydrogen atoms are removed from an aryl group, or a group in which (m21) hydrogen atoms are removed from an alkoxy group is preferable.

In the formula (29), examples of the organic group having a valency of (1+m22) represented by $R^{20}$ include a group in which (m22) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m22) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m22) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m22) hydrogen atoms are removed from an amino group which has a substituent including a carbon atom; a group in which (m22) hydrogen atoms are removed from a silyl group which has a substituent including a carbon atom. From the viewpoint of ease of starting monomer synthesis, a group in which (m22) hydrogen atoms are removed from an alkyl group, a group in which (m22) hydrogen atoms are removed from an aryl group, or a group in which (m22) hydrogen atoms are removed from an alkoxy group is preferable.

The structural unit represented by the formula (29) includes the following structural units.

[Chem. 36]

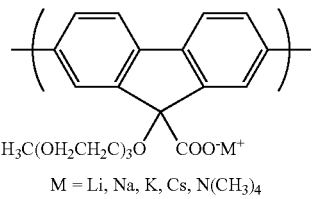

M = Li, Na, K, Cs, N(CH$_3$)$_4$

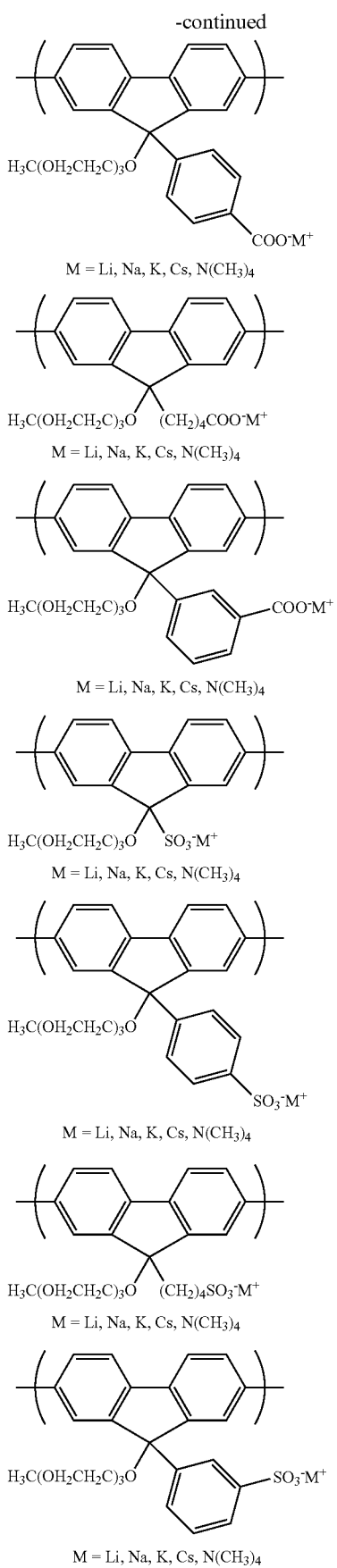

Furthermore, the structural unit represented by the formula (17) is preferably a structural unit represented by the formula (30) from the viewpoint of durability of the ionic polymer obtained.

[Chem. 37]

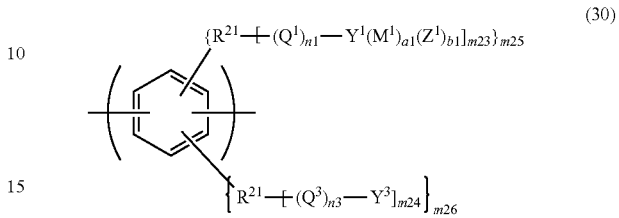

(30)

(In the formula (30), $R^{21}$ represents a single bond or an organic group having a valency of (1+m23), $R^{22}$ represents a single bond or an organic group having a valency of (1+m24), $Q^1$, $Q^3$, $Y^1$, $M^1$, $Z^1$, $Y^3$, n1, a1, b1 and n3 represent the same meaning as described above, and m23 and m24 each independently represent an integer of 1 or more. However, when $R^{21}$ is a single bond, m23 represents 1, and when $R^{22}$ is a single bond, m24 represents 1, and m25 and m26 each independently represent an integer of 1 or more. When each m23, m24, $R^{21}$, $R^{22}$, $Q^1$, $Q^3$, $Y^1$, $M^1$, $Z^1$, $Y^3$, n1, a1, b1 and n3 are present in a plurality, they may be the same as or different from each other.)

In the formula (30), examples of the organic group having a valency of (1+m23) represented by $R^{21}$ include a group in which (m23) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m23) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m23) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m23) hydrogen atoms are removed from an amino group which has a substituent including a carbon atom; a group in which (m23) hydrogen atoms are removed from a silyl group which has a substituent including a carbon atom. From the viewpoint of ease of starting monomer synthesis, a group in which (m23) hydrogen atoms are removed from an alkyl group, a group in which (m23) hydrogen atoms are removed from an aryl group, or a group in which (m23) hydrogen atoms are removed from an alkoxy group is preferable.

In the formula (30), examples of the organic group having a valency of (1+m24) represented by $R^{22}$ include a group in which (m24) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m24) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m24) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m24) hydrogen atoms are removed from an amino group which has a substituent including a carbon atom; a group in which (m24) hydrogen atoms are removed from a silyl group which has a substituent including a carbon atom. From the viewpoint of ease of starting monomer synthesis, a group in which (m24) hydrogen atoms are removed from an alkyl group, a group in which (m24) hydrogen atoms are removed from an aryl group, or a group in which (m24) hydrogen atoms are removed from an alkoxy group is preferable.

The structural unit represented by the formula (30) includes the following structural units.

[Chem. 38]

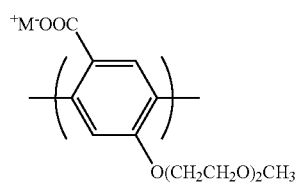

M = Li, Na, K, Cs, NMe$_4$

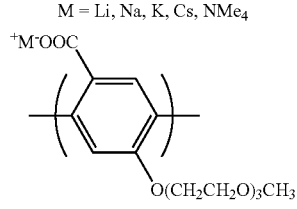

M = Li, Na, K, Cs, NMe$_4$

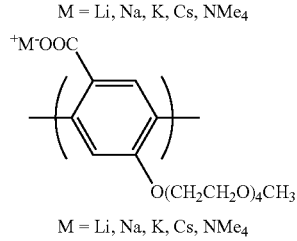

M = Li, Na, K, Cs, NMe$_4$

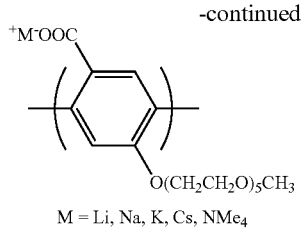

M = Li, Na, K, Cs, NMe$_4$

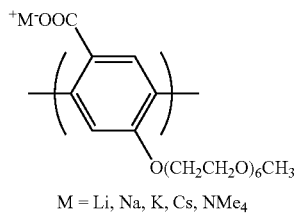

M = Li, Na, K, Cs, NMe$_4$

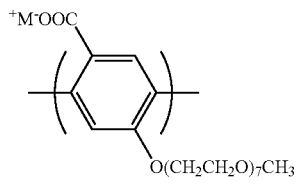

M = Li, Na, K, Cs, NMe$_4$

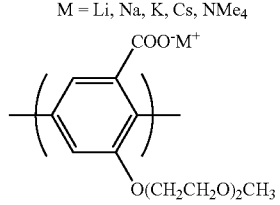

M = Li, Na, K, Cs, NMe$_4$

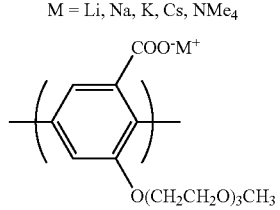

M = Li, Na, K, Cs, NMe$_4$

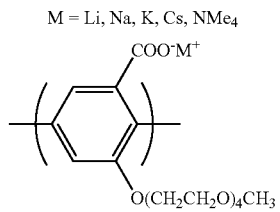

M = Li, Na, K, Cs, NMe$_4$

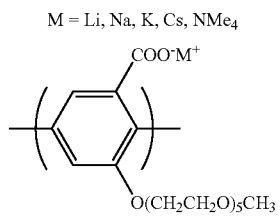

M = Li, Na, K, Cs, NMe$_4$

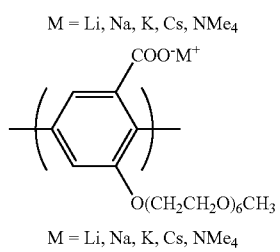

M = Li, Na, K, Cs, NMe$_4$

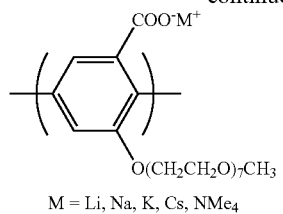
M = Li, Na, K, Cs, NMe4

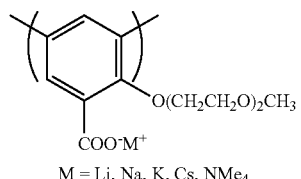
M = Li, Na, K, Cs, NMe4

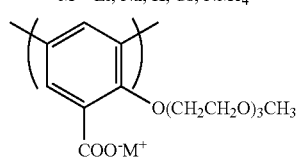
M = Li, Na, K, Cs, NMe4

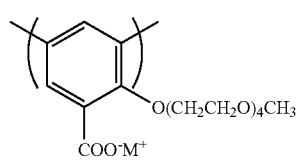
M = Li, Na, K, Cs, NMe4

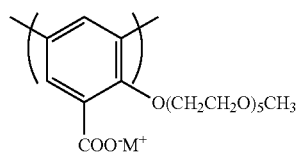
M = Li, Na, K, Cs, NMe4

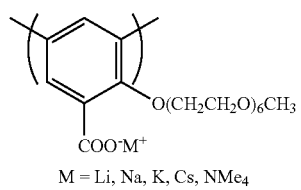
M = Li, Na, K, Cs, NMe4

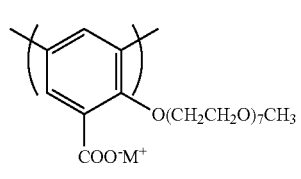
M = Li, Na, K, Cs, NMe4

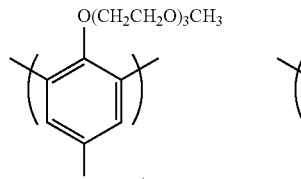
M = Li, Na, K, Cs, NMe4    M = Li, Na, K, Cs, NMe4

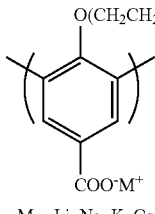
M = Li, Na, K, Cs, NMe4

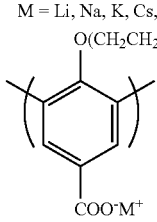
M = Li, Na, K, Cs, NMe4

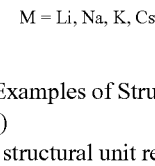

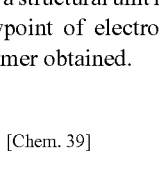
M = Li, Na, K, Cs, NMe4

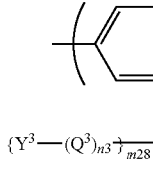

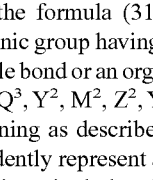
M = Li, Na, K, Cs, NMe4

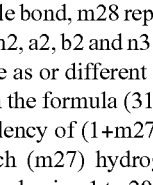

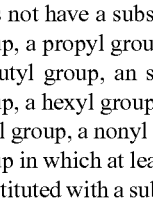
M = Li, Na, K, Cs, NMe4

(Examples of Structural Unit Represented by the Formula (20))

The structural unit represented by the formula (20) is preferably a structural unit represented by the formula (31) from the viewpoint of electron transporting properties of the ionic polymer obtained.

[Chem. 39]

(31)

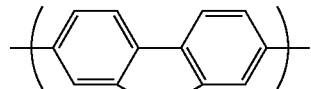

(In the formula (31), $R^{23}$ represents a single bond or an organic group having a valency of (1+m27), $R^{24}$ represents a single bond or an organic group having a valency of (1+m28), $Q^2$, $Q^3$, $Y^2$, $M^2$, $Z^2$, $Y^3$, n2, a2, b2 and n3 represent the same meaning as described above, and m27 and m28 each independently represent an integer of 1 or more. However, when $R^{23}$ is a single bond, m27 represents 1, and when $R^{24}$ is a single bond, m28 represents 1. When each $Q^2$, $Q^3$, $Y^2$, $M^2$, $Z^2$, $Y^3$, n2, a2, b2 and n3 are present in a plurality, they may be the same as or different from each other.)

In the formula (31), examples of the organic group having a valency of (1+m27) represented by $R^{23}$ include a group in which (m27) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m27) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m27) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m27) hydrogen atoms are removed from an amino group which has a substituent including a carbon atom; a group in which (m27) hydrogen atoms are removed from a silyl group which has a substituent including a carbon atom. From the viewpoint of ease of starting monomer synthesis, a group in which (m27) hydrogen atoms are removed from an alkyl group, a group in which (m27) hydrogen atoms are removed from an aryl group, or a group in which (m27) hydrogen atoms are removed from an alkoxy group is preferable.

In the formula (31), examples of the organic group having a valency of (1+m28) represented by $R^{24}$ include a group in which (m28) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m28) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m28) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbonyloxy group, an adamantyloxy group or a group in which at least one hydrogen atom in these groups is substituted with a substituent; a group in which (m28) hydrogen atoms are removed from an amino group which has a substituent including a carbon atom; a group in which (m28) hydrogen atoms are removed from a silyl group which has a substituent including a carbon atom. From the viewpoint of ease of starting monomer synthesis, a group in which (m28) hydrogen atoms are removed from an alkyl group, a group in which (m28) hydrogen atoms are removed from an aryl group, or a group in which (m28) hydrogen atoms are removed from an alkoxy group is preferable.

The structural unit represented by the formula (31) includes the following structural units.

[Chem. 40]

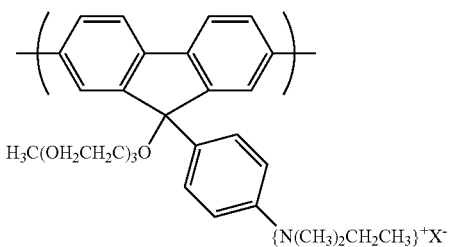

X = F, Cl, Br, I, BPh$_4$, CF$_3$SO$_3$, CH$_3$COO

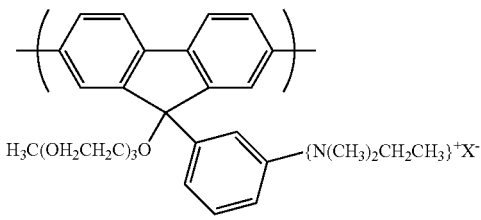

X = F, Cl, Br, I, BPh$_4$, CF$_3$SO$_3$, CH$_3$COO

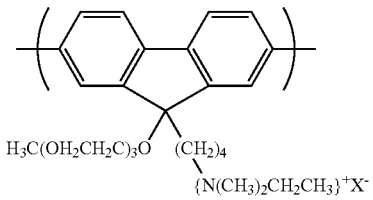

X = F, Cl, Br, I, BPh$_4$, CF$_3$SO$_3$, CH$_3$COO

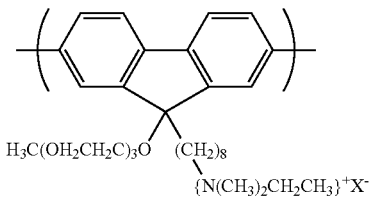

X = F, Cl, Br, I, BPh$_4$, CF$_3$SO$_3$, CH$_3$COO

Furthermore, the structural unit represented by the formula (20) is preferably a structural unit represented by the formula (32) from the viewpoint of durability of the ionic polymer obtained.

[Chem. 41]

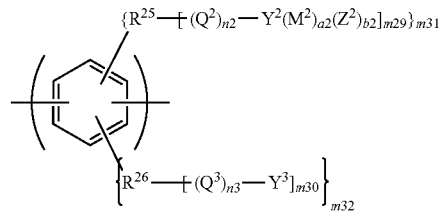

(32)

(In the formula (32), $R^{25}$ represents a single bond or an organic group having a valency of (1+m29), $R^{26}$ represents a single bond or an organic group having a valency of (1+m30), $Q^2$, $Q^3$, $Y^2$, $M^2$, $Z^2$, $Y^3$, n2, a2, b2 and n3 represent the same meaning as described above, and m29 and m30 each independently represent an integer of 1 or more. However, when $R^{25}$ is a single bond, m29 represents 1, and when $R^{26}$ is a single bond, m30 represents 1. m31 and m32 each independently represent an integer of 1 or more. When each m29, m30, $R^{25}$, $R^{26}$, $Q^2$, $Q^3$, $Y^2$, $M^2$, $Z^2$, $Y^3$, n2, a2, b2 and n3 are present in a plurality, they may be the same as or different from each other.)

In the formula (32), examples of the organic group having a valency of (1+m29) represented by $R^{25}$ include a group in which (m29) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m29) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m29) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group or a group in which at least one hydrogen atom in these groups is substituted with a substituent; a group in which (m29) hydrogen atoms are removed from an amino group which has a substituent including a carbon atom; a group in which (m29) hydrogen atoms are removed from a silyl group which has a substituent including a carbon atom. From the viewpoint of ease of starting monomer synthesis, a group in which (m29) hydrogen atoms are removed from an alkyl group, a group in which (m29) hydrogen atoms are removed from an aryl group, or a group in which (m29) hydrogen atoms are removed from an alkoxy group is preferable.

In the formula (32), examples of the organic group having a valency of (1+m30) represented by $R^{26}$ include a group in which (m30) hydrogen atoms are removed from an alkyl group having 1 to 20 carbon atoms which has a substituent or does not have a substituent such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a nonyl group, a decyl group, a lauryl group or a group in which at least one hydrogen atom in these groups is substituted with a substituent; a group in which (m30) hydrogen atoms are removed from an aryl group having 6 to 30 carbon atoms which has a substituent or does not have a substituent such as a phenyl group, a 1-naphthyl group, a 2-naphthyl group, a 1-anthracenyl group, a 2-anthracenyl group, a 9-anthracenyl group or a group in which at least one hydrogen atom in these groups is substituted with a substituent; a group in which (m30) hydrogen atoms are removed from an alkoxy group having 1 to 50 carbon atoms which has a substituent or does not have a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group or a group in which at least one hydrogen atom in these groups is substituted with a substituent; a group in which (m30) hydrogen atoms are removed from an amino group which has a substituent including a carbon atom; a group in which (m30) hydrogen atoms are removed from a silyl group which has a substituent including a carbon atom. From the viewpoint of ease of starting monomer synthesis, a group in which (m30) hydrogen atoms are removed from an alkyl group, a group in which (m30) hydrogen atoms are removed from an aryl group, or a group in which (m30) hydrogen atoms are removed from an alkoxy group is preferable.

The structural unit represented by the formula (32) includes the following structural units.

[Chem. 42]

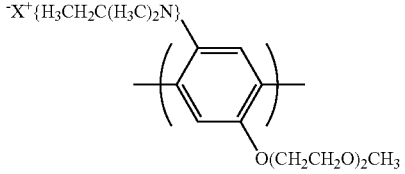

X = F, Cl, Br, I, BPh$_4$, CF$_3$SO$_3$, CH$_3$COO

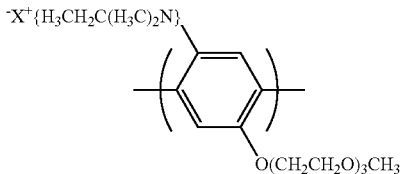

X = F, Cl, Br, I, BPh$_4$, CF$_3$SO$_3$, CH$_3$COO

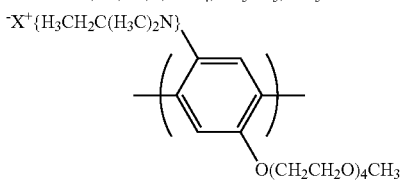

X = F, Cl, Br, I, BPh$_4$, CF$_3$SO$_3$, CH$_3$COO

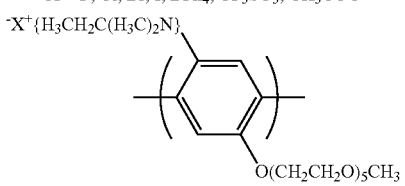

X = F, Cl, Br, I, BPh$_4$, CF$_3$SO$_3$, CH$_3$COO

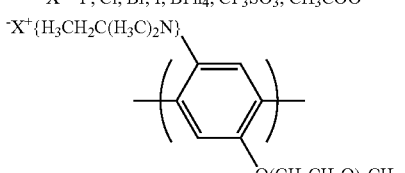

X = F, Cl, Br, I, BPh$_4$, CF$_3$SO$_3$, CH$_3$COO

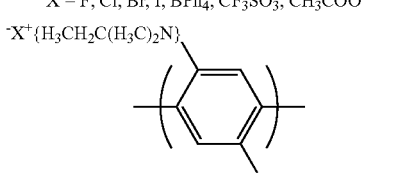

X = F, Cl, Br, I, BPh$_4$, CF$_3$SO$_3$, CH$_3$COO

-continued

{N(CH₃)₂CH₂CH₃}⁺X⁻
—◯— O(CH₂CH₂O)₂CH₃
X = F, Cl, Br, I, BPh₄, CF₃SO₃, CH₃COO

{N(CH₃)₂CH₂CH₃}⁺X⁻
—◯— O(CH₂CH₂O)₃CH₃
X = F, Cl, Br, I, BPh₄, CF₃SO₃, CH₃COO

{N(CH₃)₂CH₂CH₃}⁺X⁻
—◯— O(CH₂CH₂O)₄CH₃
X = F, Cl, Br, I, BPh₄, CF₃SO₃, CH₃COO

{N(CH₃)₂CH₂CH₃}⁺X⁻
—◯— O(CH₂CH₂O)₅CH₃
X = F, Cl, Br, I, BPh₄, CF₃SO₃, CH₃COO

{N(CH₃)₂CH₂CH₃}⁺X⁻
—◯— O(CH₂CH₂O)₆CH₃
X = F, Cl, Br, I, BPh₄, CF₃SO₃, CH₃COO

{N(CH₃)₂CH₂CH₃}⁺X⁻
—◯— O(CH₂CH₂O)₇CH₃
X = F, Cl, Br, I, BPh₄, CF₃SO₃, CH₃COO

—◯— O(CH₂CH₂O)₂CH₃
{N(CH₃)₂CH₂CH₃}⁺X⁻
X = F, Cl, Br, I, BPh₄, CF₃SO₃, CH₃COO

—◯— O(CH₂CH₂O)₃CH₃
{N(CH₃)₂CH₂CH₃}⁺X⁻
X = F, Cl, Br, I, BPh₄, CF₃SO₃, CH₃COO

-continued

—◯— O(CH₂CH₂O)₄CH₃
{N(CH₃)₂CH₂CH₃}⁺X⁻
X = F, Cl, Br, I, BPh₄, CF₃SO₃, CH₃COO

—◯— O(CH₂CH₂O)₅CH₃
{N(CH₃)₂CH₂CH₃}⁺X⁻
X = F, Cl, Br, I, BPh₄, CF₃SO₃, CH₃COO

—◯— O(CH₂CH₂O)₆CH₃
{N(CH₃)₂CH₂CH₃}⁺X⁻
X = F, Cl, Br, I, BPh₄, CF₃SO₃, CH₃COO

—◯— O(CH₂CH₂O)₇CH₃
{N(CH₃)₂CH₂CH₃}⁺X⁻
X = F, Cl, Br, I, BPh₄, CF₃SO₃, CH₃COO

O(CH₂CH₂O)₂CH₃
—◯—
{N(CH₃)₂CH₂CH₃}⁺X⁻
X = F, Cl, Br, I, BPh₄, CF₃SO₃, CH₃COO

O(CH₂CH₂O)₃CH₃
—◯—
{N(CH₃)₂CH₂CH₃}⁺X⁻
X = F, Cl, Br, I, BPh₄, CF₃SO₃, CH₃COO

O(CH₂CH₂O)₄CH₃
—◯—
{N(CH₃)₂CH₂CH₃}⁺X⁻
X = F, Cl, Br, I, BPh₄, CF₃SO₃, CH₃COO

O(CH₂CH₂O)₅CH₃
—◯—
{N(CH₃)₂CH₂CH₃}⁺X⁻
X = F, Cl, Br, I, BPh₄, CF₃SO₃, CH₃COO

-continued

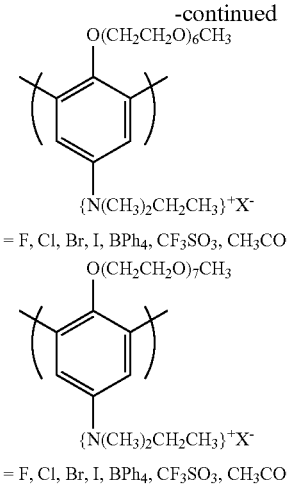

X = F, Cl, Br, I, BPh$_4$, CF$_3$SO$_3$, CH$_3$COO

X = F, Cl, Br, I, BPh$_4$, CF$_3$SO$_3$, CH$_3$COO (Other Structural Units)

The ionic polymer of the present embodiment may further have one or more types of structural units represented by the formula (33), in addition to the structural units represented by the formulae (13), (15), (17) and (20).

[Chem. 43]

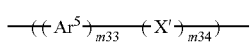 (33)

(In the formula (33), Ar$^5$ represents a divalent aromatic group which has a substituent or does not have a substituent, or a divalent aromatic amine residue which has a substituent or does not have a substituent, X' represents an imino group which has a substituent or does not have a substituent, a silylene group which has a substituent or does not have a substituent, an ethenylene group which has a substituent or does not have a substituent, or an ethynylene group, m33 and m34 each independently represent 0 or 1, and at least one of m33 and m34 is 1)

The divalent aromatic group represented by Ar$^5$ in the formula (33) includes a divalent aromatic hydrocarbon group or a divalent aromatic heterocyclic group. The divalent aromatic group includes a divalent group in which two hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring or an azadiazole ring; a divalent group in which two hydrogen atoms are removed from a condensed polycyclic aromatic ring in which two or more rings selected from the group consisting of monocyclic aromatic rings are condensed; a divalent group in which two hydrogen atoms are removed from an assembly of aromatic rings formed by connecting two or more aromatic rings selected from the group consisting of a monocyclic aromatic ring and a condensed polycyclic aromatic ring through a single bond, an ethenylene group or an ethynylene group; a divalent group in which two hydrogen atoms are removed from a bridged polycyclic aromatic ring having a cross-linking in which an assembly of condensed polycyclic aromatic rings or aromatic rings is bridged by two adjacent aromatic rings through a divalent group such as a methylene group, an ethylene group or a carbonyl group, an imino group, or the like.

In the condensed polycyclic aromatic ring, the number of monocyclic aromatic rings condensed is preferably 2 to 4, more preferably 2 to 3, and even more preferably 2 from the viewpoint of solubility of the ionic polymer. In the assembly of aromatic rings, the number of aromatic rings connected is preferably 2 to 4, more preferably 2 to 3, and even more preferably 2 from the viewpoint of solubility. In the bridged polycyclic aromatic ring, the number of aromatic rings bridged is preferably 2 to 4, more preferably 2 to 3, and even more preferably 2 from the viewpoint of solubility of the ionic polymer.

Examples of the monocyclic aromatic ring include the following rings.

[Chem. 44]

 45

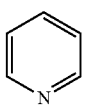 46

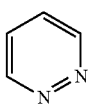 47

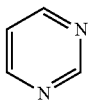 48

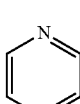 49

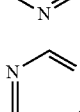 50

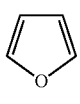 51

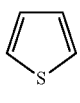 52

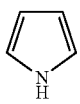 53

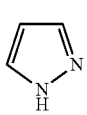 54

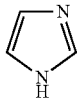 55

-continued
  56
  57
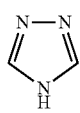  58
  59
  60
Examples of the condensed polycyclic aromatic ring include the following rings.
[Chem. 45]
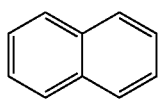
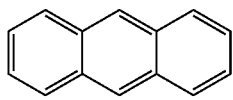  61
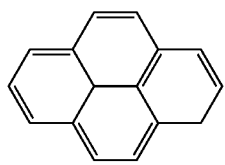  62
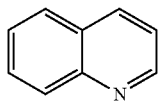  63
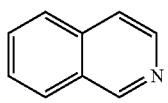  64
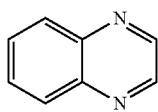  65
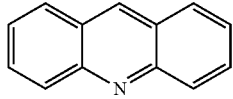  66
-continued
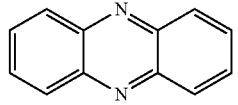  68
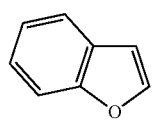  69
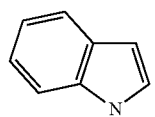  70
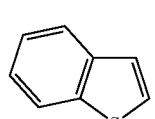  71
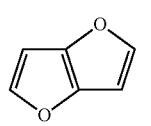  72
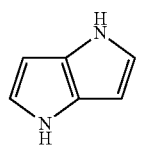  73
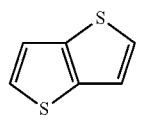  74
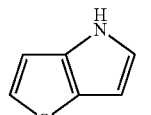  75
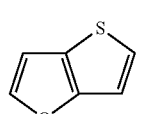  76
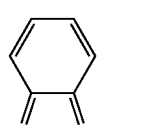  77
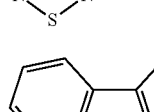  78
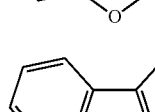  79

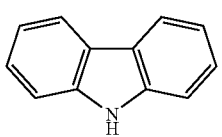
80

Examples of the assembly of aromatic rings include the following rings.

[Chem. 46]

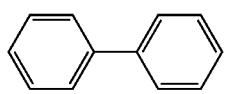
81

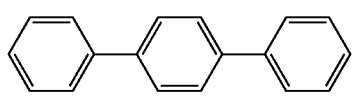
82

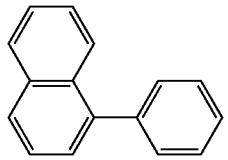
83

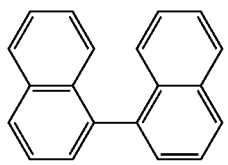
84

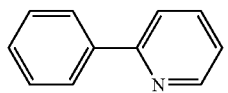
85

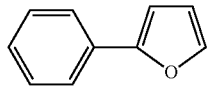
86

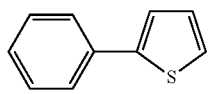
87

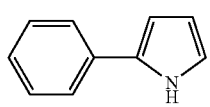
88

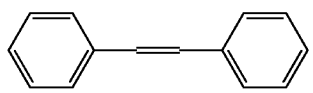
89

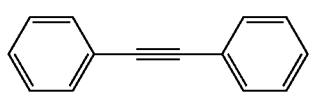
90

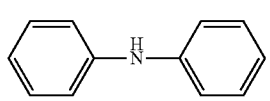
91

Examples of the bridged polycyclic aromatic ring include the following rings.

[Chem. 47]

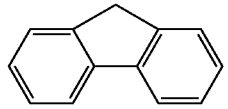
92

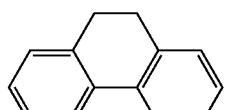
93

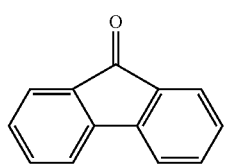
94

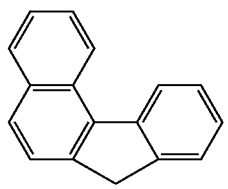
95

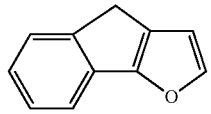
96

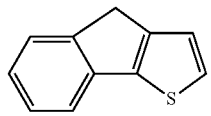
97

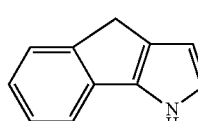
98

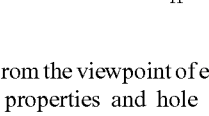
99

100

From the viewpoint of either one or both of electron accepting properties and hole accepting properties, the divalent aromatic group represented by $Ar^5$ is preferably a divalent group in which two hydrogen atoms are removed from a ring represented by the formulae 45 to 60, 61 to 71, 77 to 80, 91, 92, 93 or 96, more preferably a divalent group in which two hydrogen atoms are removed from a ring represented by the formulae 45 to 50, 59, 60, 77, 80, 91, 92 or 96.

The above divalent aromatic group may have a substituent. The substituent includes the same substituents exemplified in the description of $Q^1$ described above.

The divalent aromatic amine residue represented by $Ar^5$ in the formula (33) includes a group represented by the formula (34).

[Chem. 48]

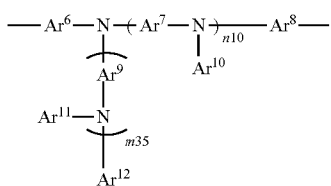

(34)

(In the formula (34), $Ar^6$, $Ar^7$, $Ar^8$ and $Ar^9$ each independently represent an arylene group which has a substituent or does not have a substituent, or a divalent heterocyclic group which has a substituent or does not have a substituent, $Ar^{10}$, $Ar^{11}$ and $Ar^{12}$ each independently represent an aryl group which has a substituent or does not have a substituent, or a monovalent heterocyclic group which has a substituent or does not have a substituent, and n10 and m35 each independently represent 0 or 1.)

The substituent the arylene group, the aryl group, the divalent heterocyclic group and the monovalent heterocyclic group may have includes a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, a carboxyl group, and the like. The substituent may also be a cross-linking group such as a vinyl group, an acetylene group, a butenyl group, an acryl group, an acrylate group, an acrylamide group, a methacrylic group, a methacrylate group, a methacrylamide group, a vinylether group, a vinylamino group, a silanol group, a group having a small-membered ring (a cyclopropyl group, a cyclobutyl group, an epoxy group, an oxetane group, a diketene group, an episulfide group, or the like), a lactone group, a lactam group or a group containing a structure of siloxane derivatives).

When n10 is 0, carbon atoms in $Ar^6$ and carbon atoms in $Ar^8$ may be bonded directly to a nitrogen atom, respectively, or may be bonded via a divalent group such as —O—, —S—.

The aryl group represented by $Ar^{10}$, $Ar^{11}$ and $Ar^{12}$, and the monovalent heterocyclic group may include the same aryl groups and the monovalent heterocyclic groups described and exemplified as substituents above.

The arylene group represented by $Ar^6$, $Ar^7$, $Ar^8$ and $Ar^9$ includes an atomic group remaining after two hydrogen atoms bonded to carbon atoms constituting the aromatic ring are removed from an aromatic hydrocarbon. For example, a group having a benzene ring, a group having a condensed ring, or a group in which an independent benzene ring, or two or more condensed rings are bonded via a single bond or a divalent organic group (for example, an alkenylene group such as a vinylene group), or the like, is included.

The number of carbon atoms in the arylene group is preferably 6 to 60, and more preferably 7 to 48. Specific examples of the arylene group includes a phenylene group, a biphenylene group, a $C_1$ to $C_{17}$alkoxyphenylene group, a $C_1$ to $C_{17}$alkylphenylene group, a 1-naphthylene group, a 2-naphthylene group, a 1-anthracenylene group, a 2-anthracenylene group or a 9-anthracenylene group. Hydrogen atoms in the aryl group may be substituted with fluorine atoms. The corresponding fluorine atom-substituted aryl group includes a tetrafluorophenylene group and the like.

As the aryl group, a phenylene group, a biphenylene group, a $C_1$ to $C_{12}$alkoxyphenylene group or a $C_1$ to $C_{12}$alkylphenylene group is preferable.

The divalent heterocyclic group represented by $Ar^6$, $Ar^7$, $Ar^8$ and $Ar^9$ includes an atomic group remaining after two hydrogen atoms are removed from a heterocyclic compound. Herein, the heterocyclic group refers to, among organic compounds having a cyclic structure, an organic compound including not only a carbon atom, but also a hetero atom such as an oxygen atom, a sulfur atom, a nitrogen atom, a phosphorus atom, a boron atom, a silicon atom, a selenium atom, a tellurium atom, an arsenic atom as an element constituting a ring. The divalent heterocyclic group may have a substituent. The number of carbon atoms in the divalent heterocyclic group is preferably is 4 to 60, and more preferably 4 to 20. In addition, the number of carbon atoms in the divalent heterocyclic group does not include the number of carbon atoms in the substituent.

Examples of such a divalent heterocyclic group include a thiophenediyl group, a $C_1$ to $C_{12}$alkylthiophenediyl group, a pyrrolediyl group, a furandiyl group, a pyridinediyl group, a $C_1$ to $C_{12}$alkylpyridinediyl group, a pyridazinediyl group, a pyrimidinediyl group, a pyrazinediyl group, a triazinediyl group, a pyrrolidindiyl group, a piperidindiyl group, a quinolinediyl group or an isoquinolinediyl group. Among these, a thiophenediyl group, a $C_1$ to $C_{12}$alkylthiophenediyl group, a pyridinediyl group or a $C_1$ to $C_{12}$alkylpyridinediyl group is more preferable.

The ionic polymer including a divalent aromatic amine residue as a structural unit may further have other structural units. The other structural units include an arylene group such as a phenylene group or a fluorenediyl group, or the like. In addition, among these, an ionic polymer containing a cross-linking group is preferable.

Examples of the divalent aromatic amine residue represented by the formula (34) include a group in which two hydrogen atoms are removed from an aromatic amine represented by the formulae 101 to 110.

[Chem. 49]

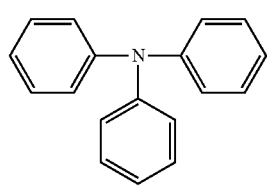

101

-continued

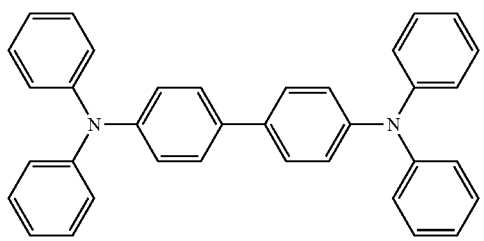
102

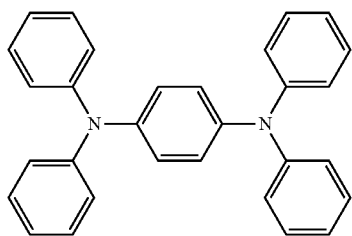
103

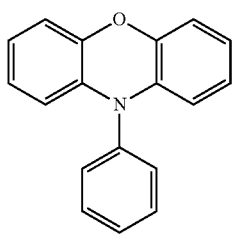
104

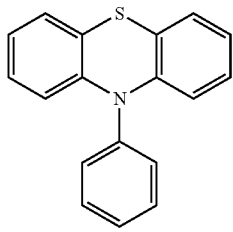
105

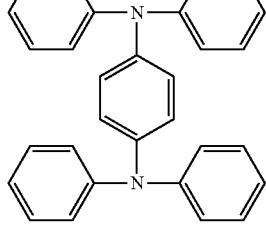
106

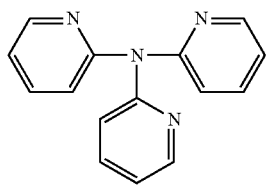
107

-continued

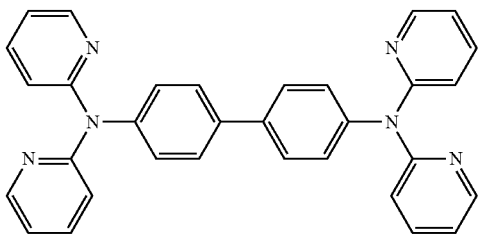
108

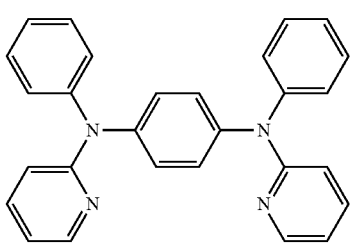
109

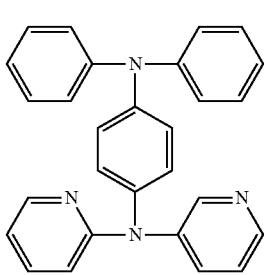
110

The aromatic amine represented by the formulae 101 to 110 may have a substituent within the range capable of generating a divalent aromatic amine residue. The substituent includes the same substituents exemplified in the description of $Q^1$ described above. When a plurality of substituents are present, they may be the same as or different from each other.

In the formula (33), X' represents an imino group which has a substituent or does not have a substituent, a silylene group which has a substituent or does not have a substituent, an ethenylene group which has a substituent or does not have a substituent, or an ethynylene group. The substituent the imino group, the silylene group, and the ethenylene group may have includes an alkyl group having 1 to 20 carbon atoms such as a methyl group, an ethyl group, a propyl group, an isopropyl group, a butyl group, an isobutyl group, an s-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group or a lauryl group; an aryl group having 6 to 30 carbon atoms such as a phenyl group, a 1-naphthyl group, a 2-naphthyl group, a 1-anthracenyl group, a 2-anthracenyl group or a 9-anthracenyl group, or the like. When a plurality of substituents are present, they may be the same as or different from each other.

From the viewpoint of stability of the ionic polymer to air, moisture or heat, X' is preferably an imino group, an ethenylene group or an ethynylene group.

From the viewpoint of electron accepting properties and hole accepting properties of the ionic polymer, it is preferable that m33 be 1, and m34 be 0.

The structural unit represented by the formula (33) is preferably a structural unit represented by the formula (35) from the viewpoint of electron accepting properties of the ionic polymer.

[Chem. 50]

(35)

(In the formula (35), $Ar^{13}$ represents a pyridinediyl group which has a substituent or does not have a substituent, a pyrazinediyl group which has a substituent or does not have a substituent, a pyrimidinediyl group which has a substituent or does not have a substituent, a pyridazinediyl group which has a substituent or does not have a substituent or a triazinediyl group which has a substituent or does not have a substituent.)

The substituent the pyridinediyl group may have includes the same substituents exemplified in the description of $Q^1$ described above. When a plurality of substituents are present, they may be the same as or different from each other.

The substituent the pyrazinediyl group may have includes the same substituents exemplified in the description of $Q^1$ described above. When a plurality of substituents are present, they may be the same as or different from each other.

The substituent the pyrimidinediyl group may have includes the same substituents exemplified in the description of $Q^1$ described above. When a plurality of substituents are present, they may be the same as or different from each other.

The substituent the pyridazinediyl group may have includes the same substituents exemplified in the description of $Q^1$ described above. When a plurality of substituents are present, they may be the same as or different from each other.

The substituent the triazinediyl group may have includes the same substituents exemplified in the description of $Q^1$ described above. When a plurality of substituents are present, they may be the same as or different from each other.

(Ratio of Structural Units)

The proportion of the sum of the structural units represented by the formula (13), the structural units represented by the formula (15), the structural units represented by the formula (17) and the structural units represented by the formula (20) included in the ionic polymer of the present embodiment is more preferably 30 to 100 mol % among the total structural units included in the ionic polymer in which a terminal structural unit is excluded, from the viewpoint of luminous efficiency of an organic EL element.

(Terminal Structural Unit)

The terminal structural unit (terminal group) of the ionic polymer of the present embodiment includes a hydrogen atom, a methyl group, an ethyl group, a propyl group, an isopropyl group, a butyl group, an isobutyl group, an s-butyl group, a t-butyl group, a pentyl group, an isoamyl group, a hexyl group, a cyclohexyl group, a heptyl group, an octyl group, a nonyl group, a decyl group, a lauryl group a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a methylthio group, an ethylthio group, a propylthio group, an isopropylthio group, a butylthio group, an isobutylthio group, an s-butylthio group, a t-butylthio group, a pentylthio group, a hexylthio group, a cyclohexylthio group, a heptylthio group, an octylthio group, a nonylthio group, a decylthio group, a laurylthio group, a methoxyphenyl group, an ethoxyphenyl group, a propyloxyphenyl group, an isopropyloxyphenyl group, a butoxyphenyl group, an isobutoxyphenyl group, an s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, an s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_1$ to $C_{12}$alkoxyphenyl)amino group, a di($C_1$ to $C_{12}$alkoxyphenyl)amino group, a di($C_1$ to $C_{12}$alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_1$ to $C_{12}$alkyl)amino group, a ($C_1$ to $C_{12}$alkoxyphenyl-$C_1$ to $C_{12}$alkyl)amino group, a ($C_1$ to $C_{12}$alkylphenyl-$C_1$ to $C_{12}$alkyl)amino group, a di($C_1$ to $C_{12}$alkoxyphenyl-$C_1$ to $C_{12}$alkyl)amino group, a di($C_1$ to $C_{12}$alkylphenyl-$C_1$ to $C_{12}$alkyl)amino group, a 1-naphthyl-$C_1$ to $C_{12}$alkylamino group, a 2-naphthyl-$C_1$ to $C_{12}$alkylamino group, a trimethylsilyl group, a triethylsilyl group, a tripropylsilyl group, a triisopropylsilyl group, an isopropyldimethylsilyl group, an isopropyldiethylsilyl group, a t-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_1$ to $C_{12}$alkyl group)silyl group, a ($C_1$ to $C_{12}$alkoxyphenyl-$C_1$ to $C_{12}$alkyl)silyl group, a ($C_1$ to $C_{12}$alkylphenyl-$C_1$ to $C_{12}$alkyl)silyl group, a (1-naphthyl-$C_1$ to $C_{12}$alkyl)silyl group, a (2-naphthyl-$C_1$ to $C_{12}$alkyl)silyl group, a (phenyl-$C_1$ to $C_{12}$alkyl)dimethylsilyl group, a triphenylsilyl group, a tri(p-xylyl)silyl group, a tribenzylsilyl group, a diphenylmethylsilyl group, a t-butyldiphenylsilyl group, a dimethylphenylsilyl group, a thienyl group, a $C_1$ to $C_{12}$alkylthienyl group, a pyrrolyl group, a furyl group, a pyridyl group, a $C_1$ to $C_{12}$alkylpyridyl group, a pyridazinyl group, a pyrimidyl group, a pyrazinyl group, a triazinyl group, a pyrrolidyl group, a piperidyl group, a quinolyl group, an isoquinolyl group, a hydroxy group, a mercapto group, a fluorine atom, a chlorine atom, a bromine atom, an iodine atom, and the like. When a plurality of terminal structural units are present, they may be the same as or different from each other.

—Characteristics of Ionic Polymer—

The ionic polymer of the present embodiment is preferably a conjugated compound. The ionic polymer being a conjugated compound means that this ionic polymer includes multiple bonds (for example, double bonds or triple bonds), or a region in which unshared electron pairs of, a nitrogen atom, an oxygen atom or the like are continuous across one single bond in the main chain. When the ionic polymer is a conjugated compound, the value calculated by {(the number of atoms on the main chain included in the multiple chain or the region in which unshared electron pairs of a nitrogen atom, an oxygen atom or the like are continuous across one single bond)/(the number of all atoms on the main chain)}×100% is preferably 50% or more, more preferably 60% or more, more preferably 70% or more, more preferably 80% or more, and even more preferably 90% or more from the viewpoint of electron transporting properties of the conjugated compound.

In addition, the ionic polymer of the present embodiment is preferably a high-molecular compound, and more preferably a conjugated high-molecular compound. Herein, the high-molecular compound refers to a compound in which a polystyrene equivalent number average molecular weight is $1 \times 10^3$ or more. In addition, the ionic polymer being a conjugated high-molecular compound means that this ionic polymer is a conjugated compound and a high-molecular compound.

From the viewpoint of film forming properties of the ionic polymer of the present embodiment by applying, a polystyrene equivalent number average molecular weight of the ionic polymer is preferably $1 \times 10^3$ to $1 \times 10^8$, more preferably $2 \times 10^3$ to $1 \times 10^7$, more preferably $3 \times 10^3$ to $1 \times 10^7$, and even more preferably $5 \times 10^3$ to $1 \times 10^7$. In addition, from the viewpoint of purity of the ionic polymer, a polystyrene equivalent weight average molecular weight is preferably $1 \times 10^3$ to $5 \times 10^7$, more preferably $1 \times 10^3$ to $1 \times 10^7$, and even more preferably $1 \times 10^3$ to $5 \times 10^6$. Furthermore, from the viewpoint of solubility of the ionic polymer, a polystyrene equivalent number average molecular weight of the ionic polymer is preferably $1 \times 10^3$ to $5 \times 10^5$, more preferably $1 \times 10^3$ to $5 \times 10^4$, and even more preferably $1 \times 10^3$ to $3 \times 10^3$. A polystyrene equivalent number average molecular weight and a polystyrene equivalent weight average molecular weight of the ionic polymer can be determined using, for example, Gel Permeation Chromatography (GPC).

From the viewpoint of purity of the ionic polymer of the present embodiment, the number of the total structural units included in the ionic polymer in which a terminal structural unit is excluded (that is, a degree of polymerization) is preferably greater than or equal to 1 and less than or equal to 20, more preferably greater than or equal to 1 and less than or equal to 10, and even more preferably greater than or equal to 1 and less than or equal to 5.

From the viewpoint of electron accepting properties and hole accepting properties of the ionic polymer of the present embodiment, the orbital energy of the Lowest Unoccupied Molecular Orbital (LUMO) of the ionic polymer is preferably greater than or equal to $-5.0$ eV and less than or equal to $-2.0$ eV, and more preferably greater than or equal to $-4.5$ eV and less than or equal to $-2.0$ eV. In addition, from the same viewpoint, the orbital energy of the Highest Occupied Molecular Orbital (HOMO) of the ionic polymer is preferably greater than or equal to $-6.0$ eV and less than or equal to $-3.0$ eV, and more preferably greater than or equal to $-5.5$ eV and less than or equal to $-3.0$ eV. However, the orbital energy of the HOMO is lower than the orbital energy of the LUMO.

In addition, the orbital energy of the Highest Occupied Molecular Orbital (HOMO) of the ionic polymer is determined employing the ionization potential obtained by measuring the ionization potential of the ionic polymer as the orbital energy. Meanwhile, the orbital energy of the Lowest Unoccupied Molecular Orbital (LUMO) of the ionic polymer is determined by calculating the energy difference between the LUMO and the HOMO, and employing the sum of the value obtained therefrom and the ionization potential measured above as the orbital energy. A photoelectron spectrometer is used in the measurement of the ionization potential. In addition, the energy difference between the HOMO and the LUMO is measured by the absorption spectrum of the ionic polymer using an ultraviolet, visible, and near-infrared spectrophotometer, and determined from an absorption end thereof.

It is preferable that a polymer composed of the ionic polymer of the present embodiment be substantially non-luminescent when used as an electroluminescence element. Herein, any polymer being substantially non-luminescent has the following meanings. First, an electroluminescence element A which has a layer including any polymer is prepared. Meanwhile, an electroluminescence element 2 which has a layer not including a polymer is prepared. The electroluminescence element A is different from the electroluminescence element 2 only in that the electroluminescence element A has a layer including a polymer, and the electroluminescence element 2 has a layer not including a polymer. Next, an emission spectrum is measured by supplying a forward voltage of 10 V to the electroluminescence element A and the electroluminescence element 2. A wavelength λ giving the maximum peak is determined in the emission spectrum obtained for the electroluminescence element 2. The emission spectrum obtained for the electroluminescence element 2 is normalized with the emission intensity at wavelength λ as 1, and a normalized amount of light emission $S_0$ is calculated by being integrated with respect to wavelength. Meanwhile, the emission spectrum obtained for the electroluminescence element A is also normalized with the emission intensity at wavelength λ as 1, and a normalized amount of light emission S is calculated by being integrated with respect to wavelength. When the value calculated by $(S-S_0)/S_0 \times 100\%$ is 30% or less, that is, when an increase in the normalized amount of light emission of the electroluminescence element A which has a layer including a polymer is 30% or less compared to the normalized amount of light emission of the electroluminescence element 2 which has a layer not including a polymer, the polymer used is determined as substantially non-luminescent. The polymer in the present embodiment preferably has a value calculated by $(S-S_0)/S_0 \times 100\%$ being 15% or less, and more preferably 10% or less.

The ionic polymer including the group represented by the formula (1) and the group represented by the formula (3) includes an ionic polymer formed with only a group represented by the formula (23), an ionic polymer formed with one or more types of groups selected from the group consisting of a group represented by the formula (23) and a group in which two hydrogen atoms are removed from a group represented by 45 to 50, 59, 60, 77, 80, 91, 92, 96, 101 to 110, an ionic polymer formed with only a group represented by the formula (24), an ionic polymer formed with one or more types of groups selected from the group consisting of a group represented by the formula (24) and a group in which two hydrogen atoms are removed from a group represented by 45 to 50, 59, 60, 77, 80, 91, 92, 96, 101 to 110, an ionic polymer formed with only a group represented by the formula (25), an ionic polymer formed with one or more types of groups selected from the group consisting of a group represented by the formula (25) and a group in which two hydrogen atoms are removed from a group represented by 45 to 50, 59, 60, 77, 80, 91, 92, 96, 101 to 110, an ionic polymer formed with only a group represented by the formula (29), an ionic polymer formed with one or more types of groups selected from the group consisting of a group represented by the formula (29) and a group in which two hydrogen atoms are removed from a group represented by 45 to 50, 59, 60, 77, 80, 91, 92, 96, 101 to 110, an ionic polymer formed with only a group represented by the formula (30), and an ionic polymer formed with one or more types of groups selected from the group consisting of a group represented by the formula (30) and a group in which two hydrogen atoms are removed from a group represented by 45 to 50, 59, 60, 77, 80, 91, 92, 96, 101 to 110.

The ionic polymer including the group represented by the formula (1) and the group represented by the formula (3) includes the following high-molecular compounds. Among these, in the high-molecular compounds represented by the formula in which two types of structural units are separated by a slash "/", the proportion of structural units to the left is p mol %, the proportion of structural units to the right side is (100-p) mol %, and these structural units are arranged at random. In addition, in the formulae below, n represents a degree of polymerization.

[Chem. 51]

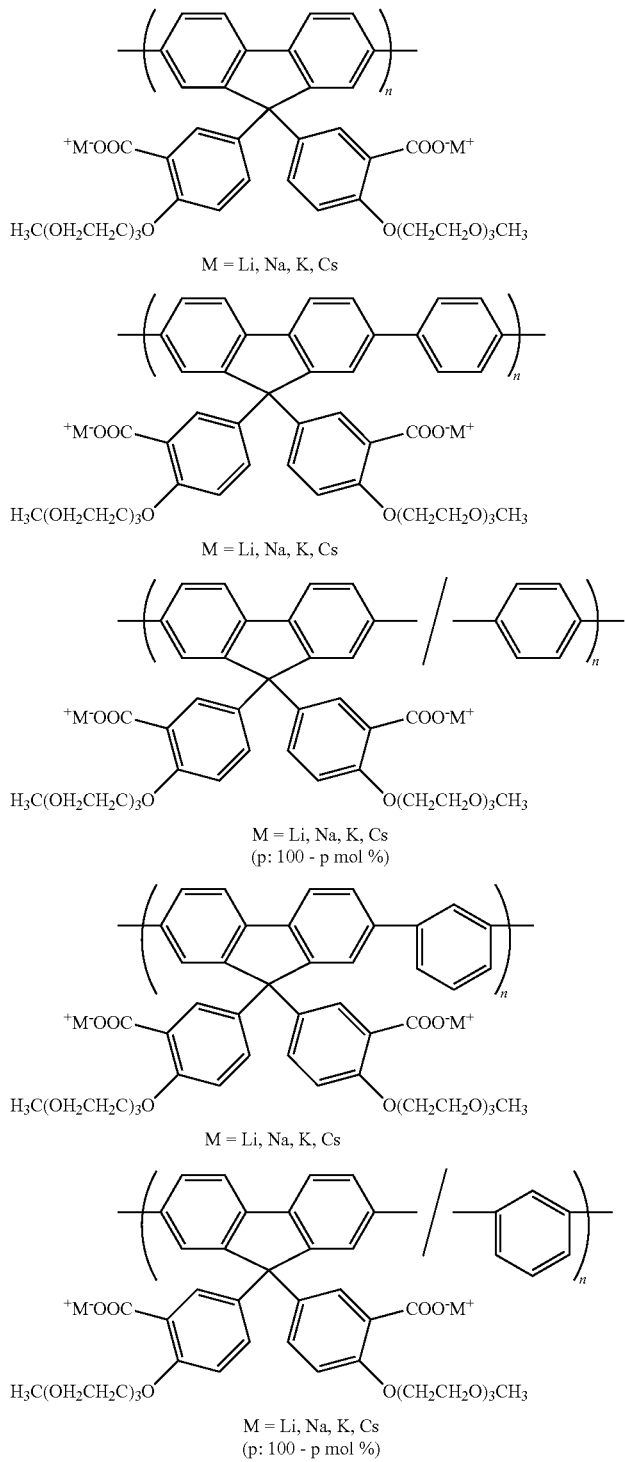

-continued
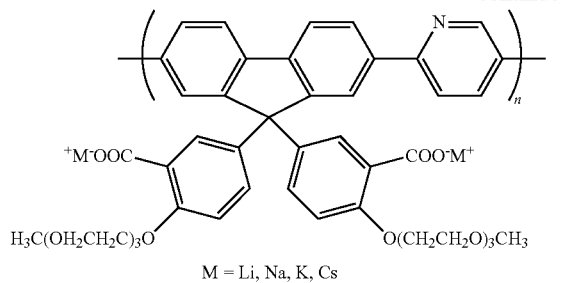
M = Li, Na, K, Cs
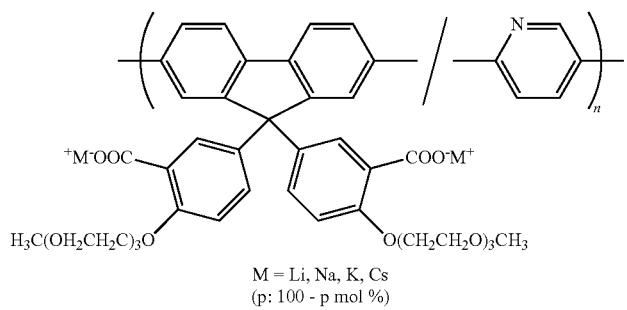
M = Li, Na, K, Cs
(p: 100 - p mol %)
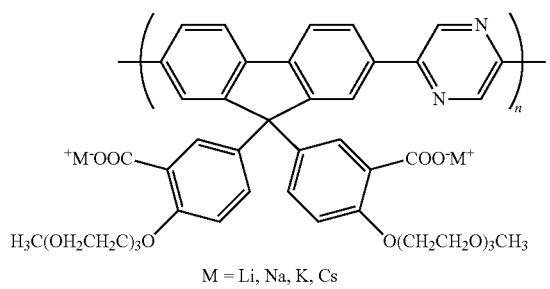
M = Li, Na, K, Cs
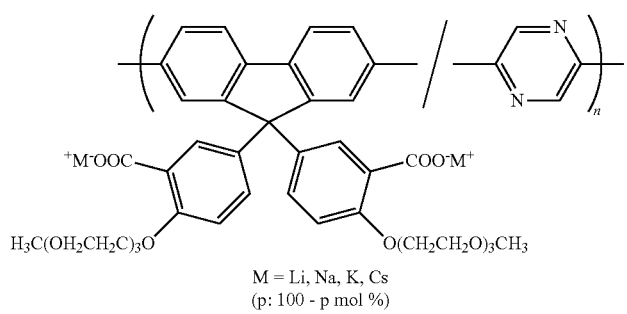
M = Li, Na, K, Cs
(p: 100 - p mol %)
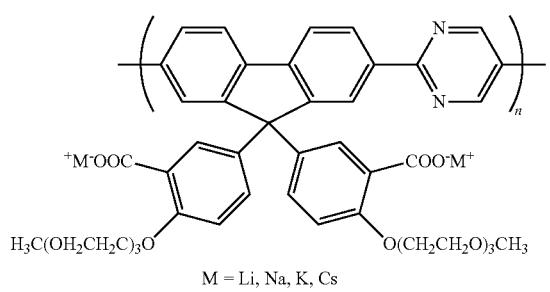
M = Li, Na, K, Cs -continued
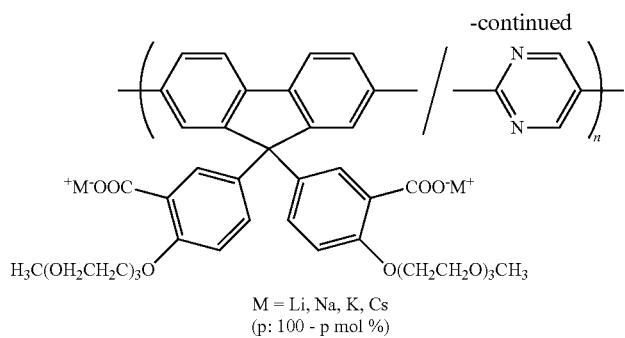
M = Li, Na, K, Cs
(p: 100 - p mol %)
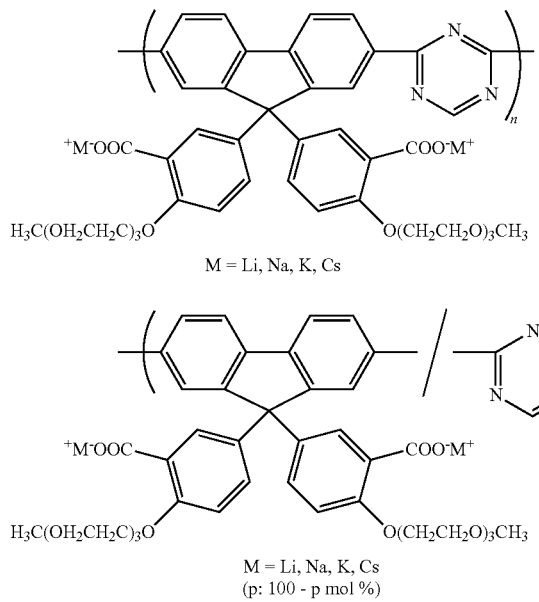
M = Li, Na, K, Cs
[Chem. 52]
M = Li, Na, K, Cs
(p: 100 - p mol %)
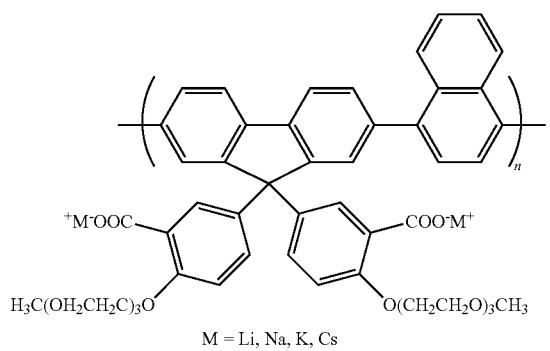
M = Li, Na, K, Cs
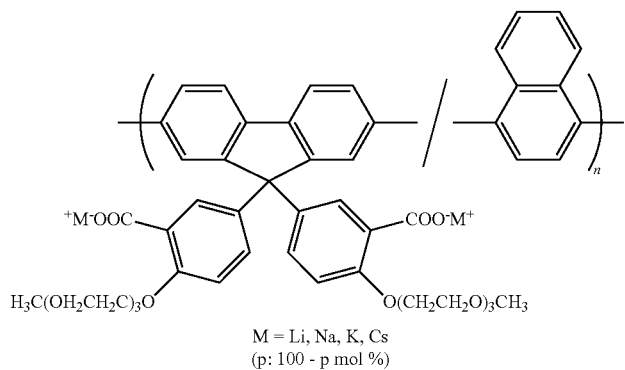
M = Li, Na, K, Cs
(p: 100 - p mol %)

-continued
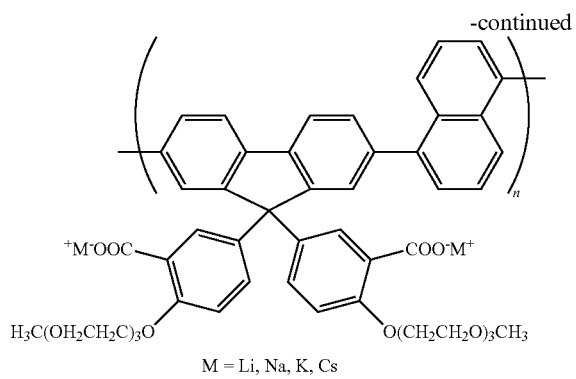
M = Li, Na, K, Cs
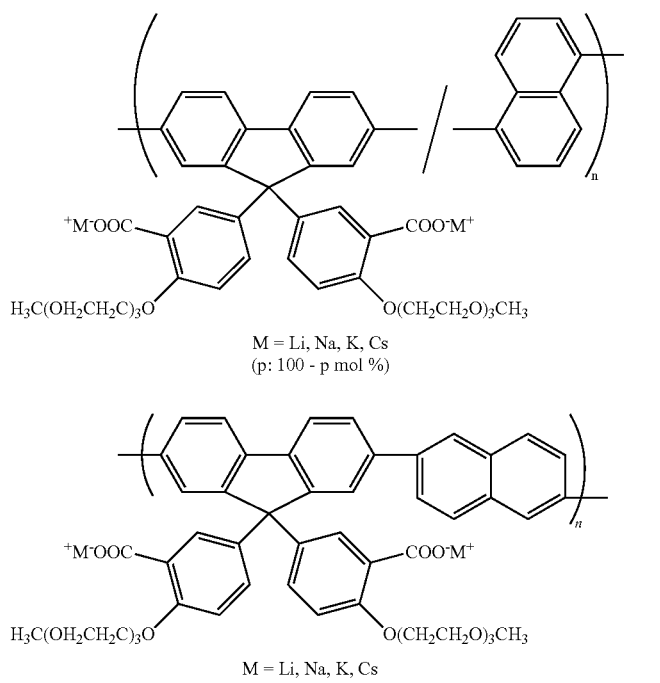
M = Li, Na, K, Cs
(p: 100 - p mol %)
M = Li, Na, K, Cs
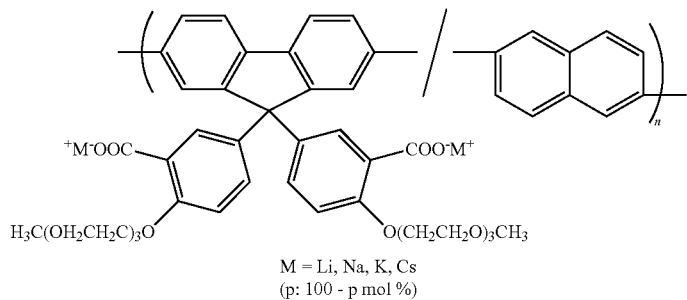
M = Li, Na, K, Cs
(p: 100 - p mol %)
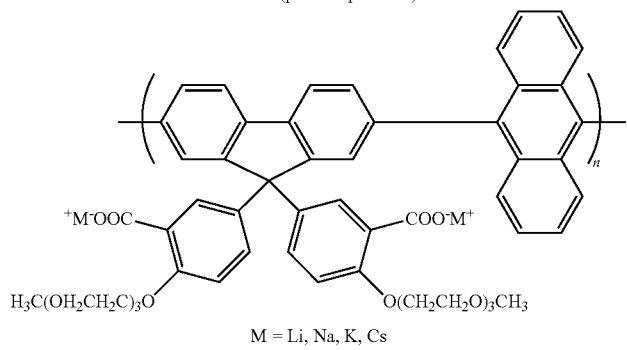
M = Li, Na, K, Cs -continued
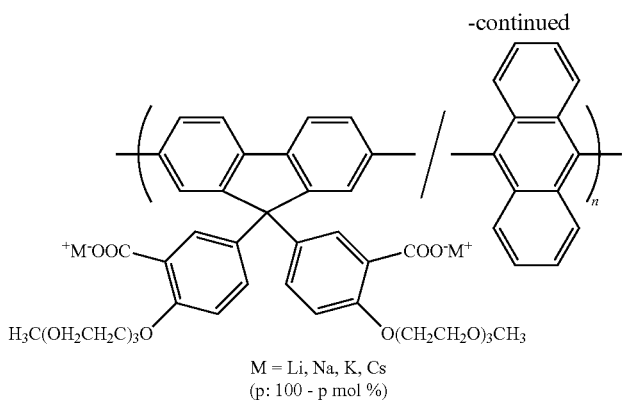
M = Li, Na, K, Cs
(p: 100 - p mol %)
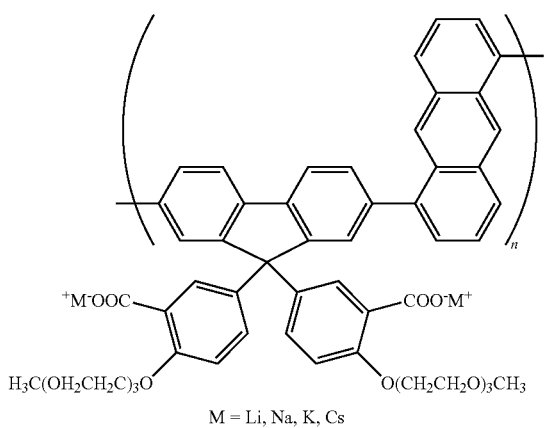
M = Li, Na, K, Cs
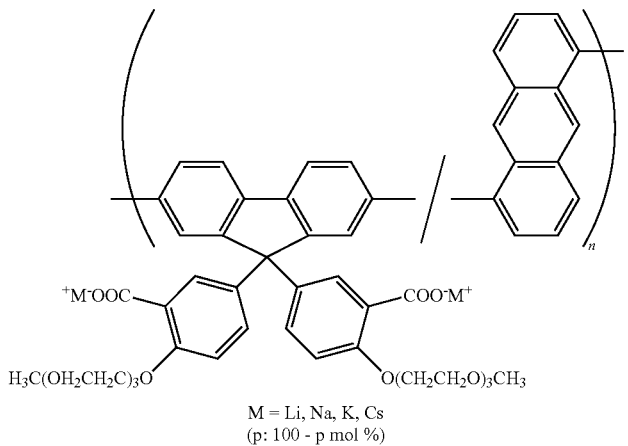
M = Li, Na, K, Cs
(p: 100 - p mol %)
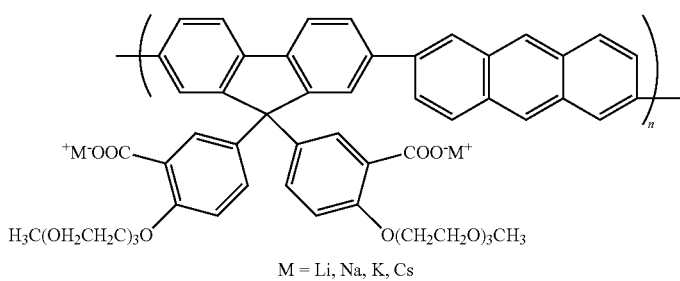
M = Li, Na, K, Cs -continued
[Chem. 53]
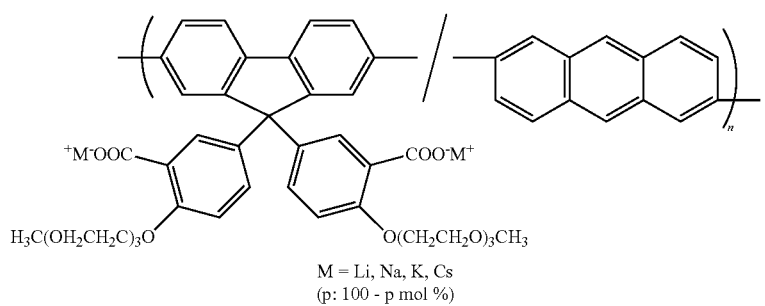
M = Li, Na, K, Cs
(p: 100 - p mol %)
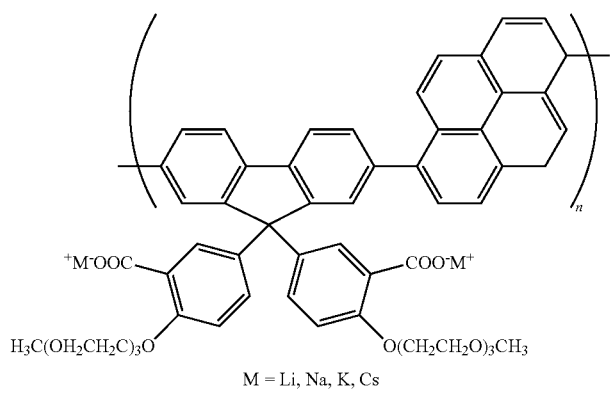
M = Li, Na, K, Cs
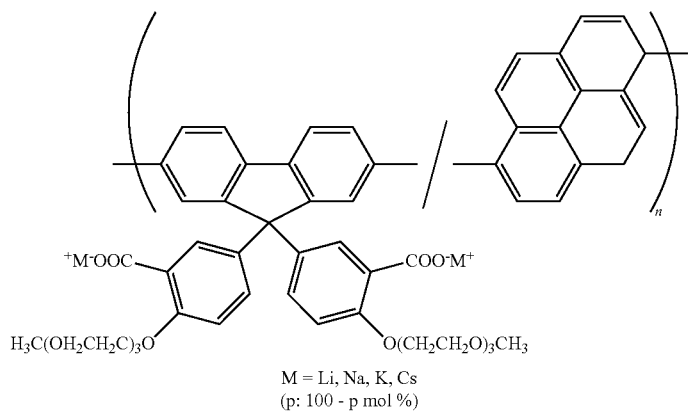
M = Li, Na, K, Cs
(p: 100 - p mol %)
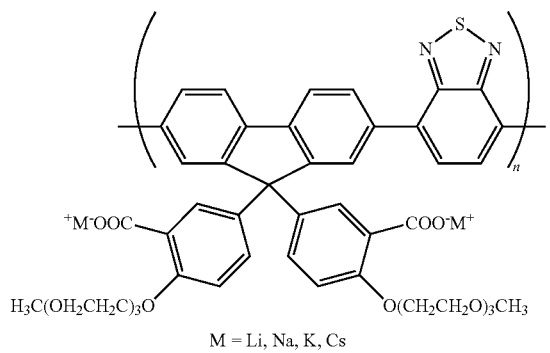
M = Li, Na, K, Cs -continued
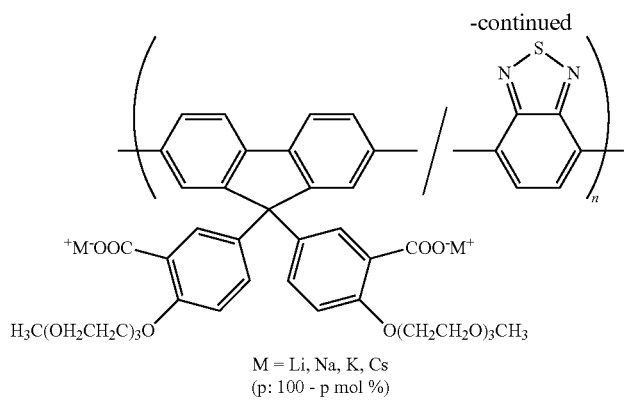
M = Li, Na, K, Cs
(p: 100 - p mol %)
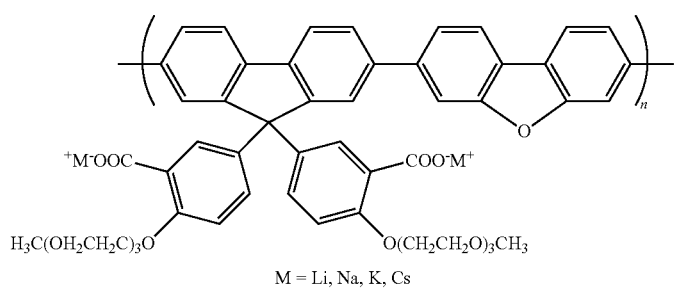
M = Li, Na, K, Cs
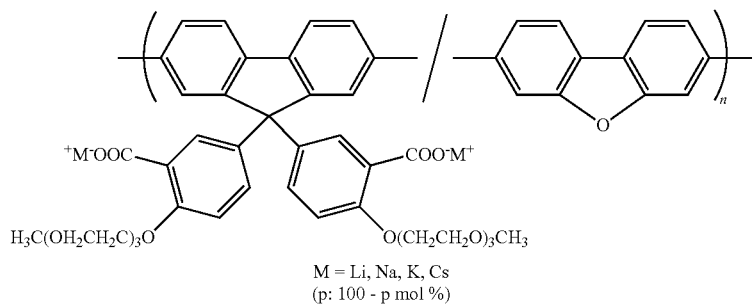
M = Li, Na, K, Cs
(p: 100 - p mol %)
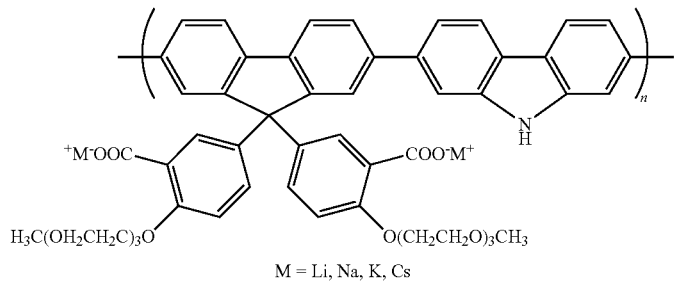
M = Li, Na, K, Cs
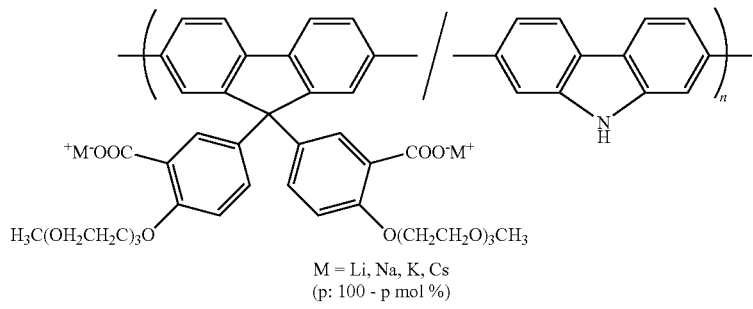
M = Li, Na, K, Cs
(p: 100 - p mol %)

-continued
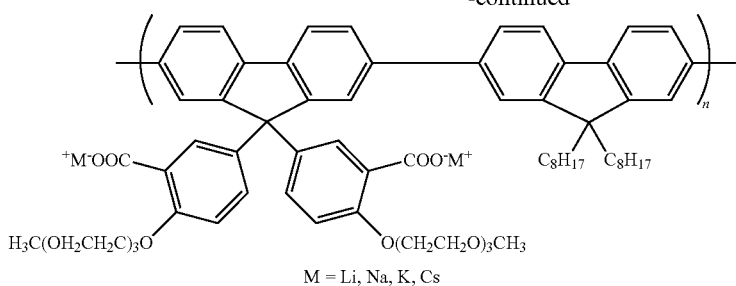
M = Li, Na, K, Cs
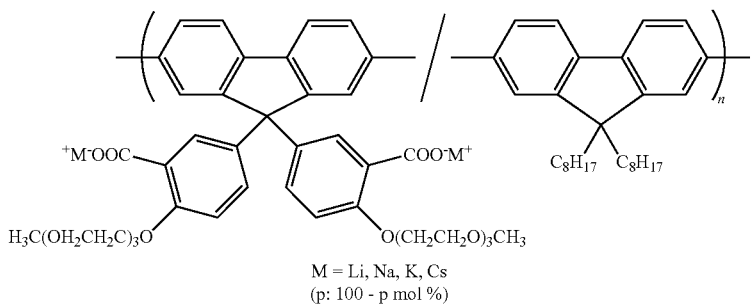
M = Li, Na, K, Cs
(p: 100 - p mol %)
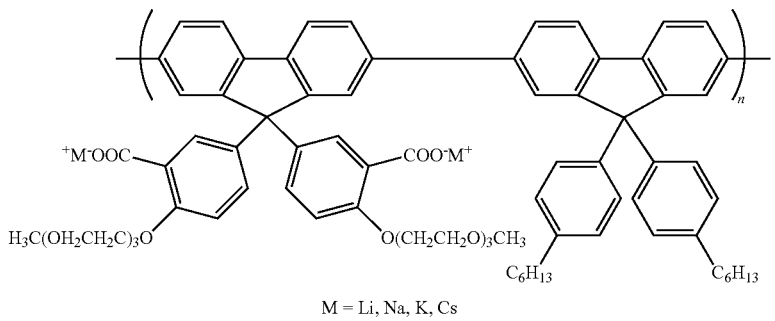
M = Li, Na, K, Cs
[Chem. 54]
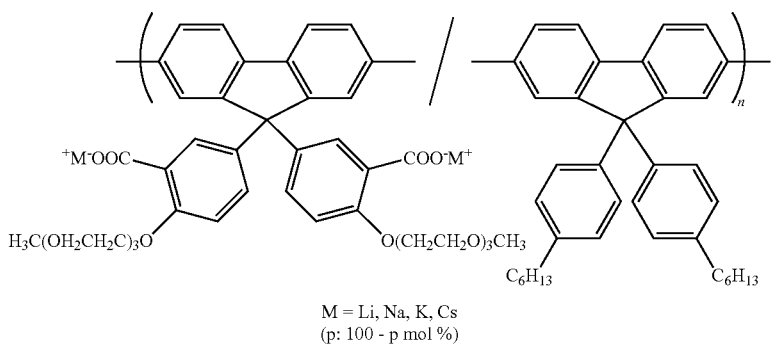
M = Li, Na, K, Cs
(p: 100 - p mol %)
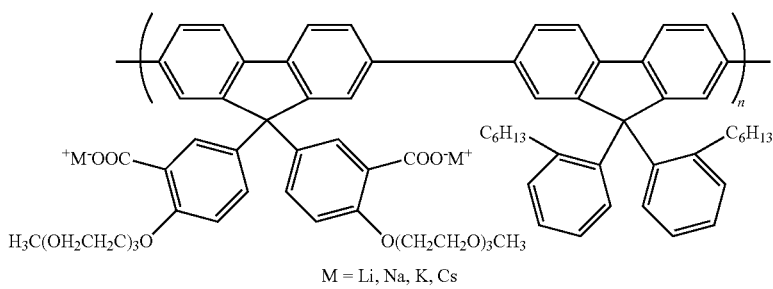
M = Li, Na, K, Cs -continued
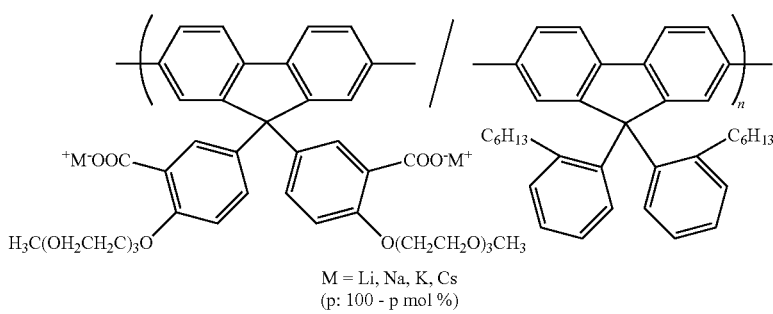
M = Li, Na, K, Cs
(p: 100 - p mol %)
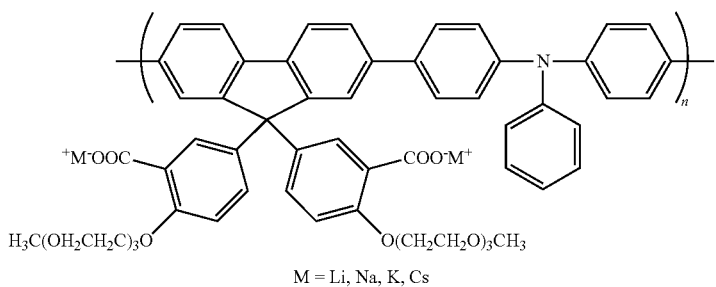
M = Li, Na, K, Cs
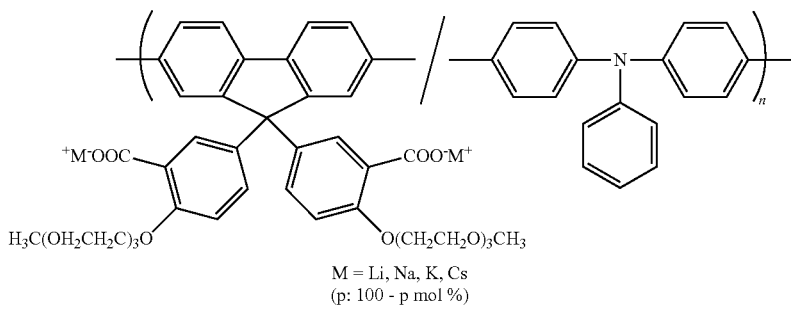
M = Li, Na, K, Cs
(p: 100 - p mol %)
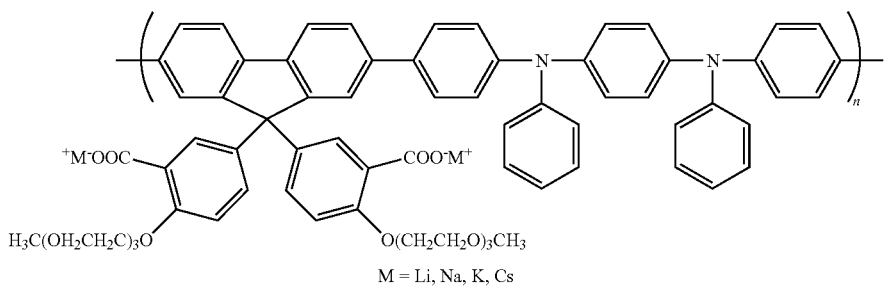
M = Li, Na, K, Cs
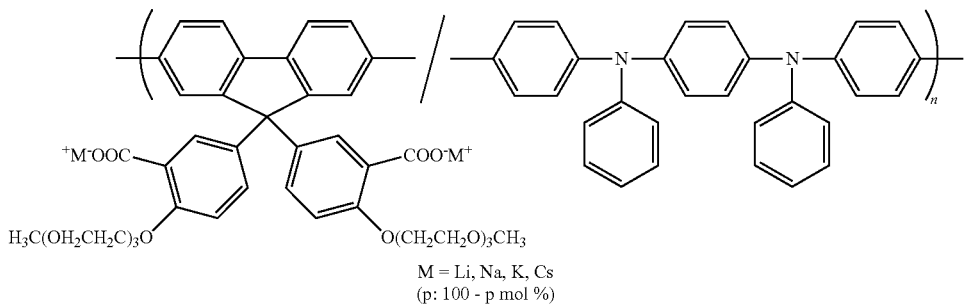
M = Li, Na, K, Cs
(p: 100 - p mol %)

-continued
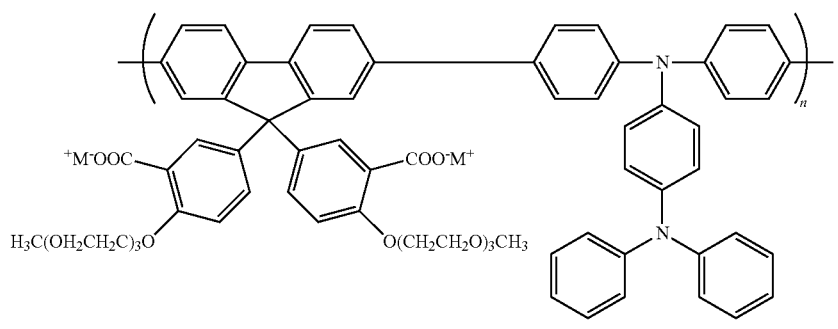
M = Li, Na, K, Cs
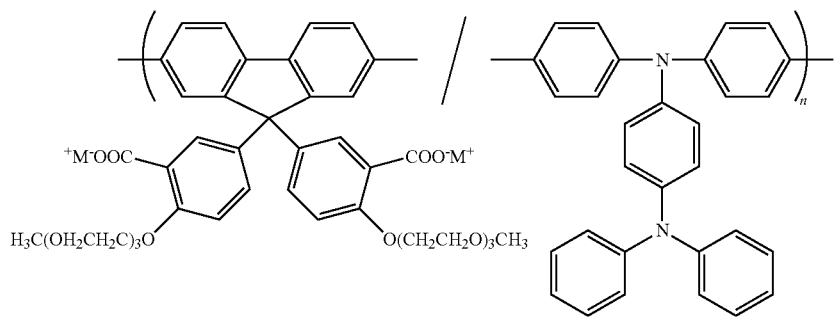
M = Li, Na, K, Cs
(p: 100 - p mol %)
[Chem. 55]
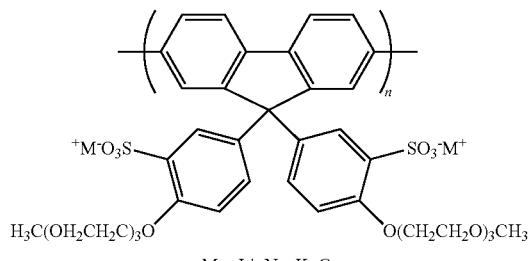
M = Li, Na, K, Cs
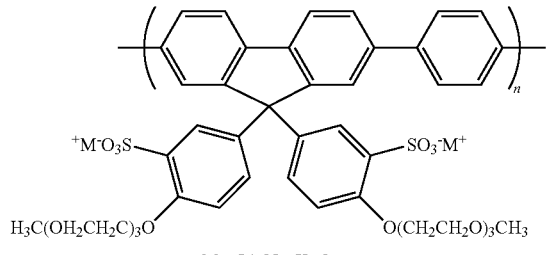
M = Li, Na, K, Cs
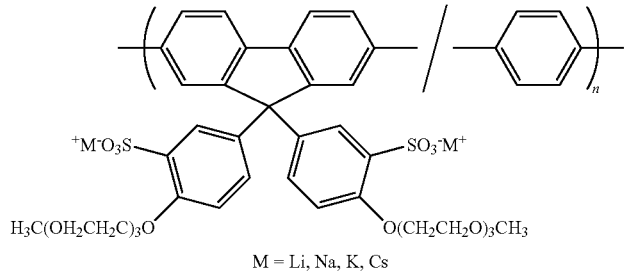
M = Li, Na, K, Cs
(p: 100 - p mol %)

-continued
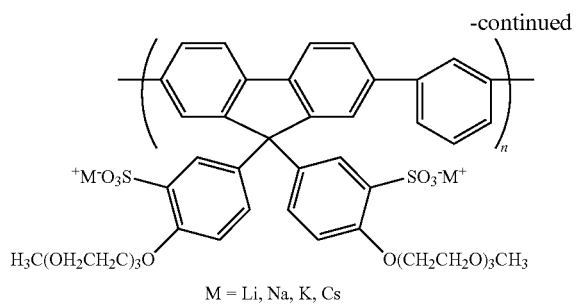
M = Li, Na, K, Cs
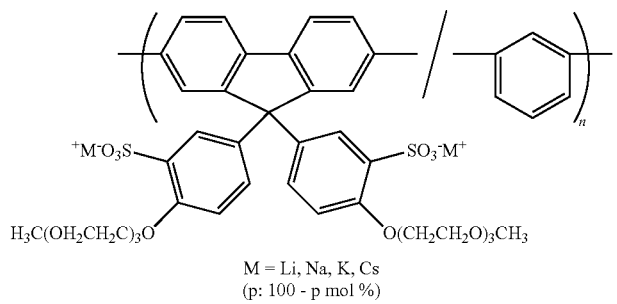
M = Li, Na, K, Cs
(p: 100 - p mol %)
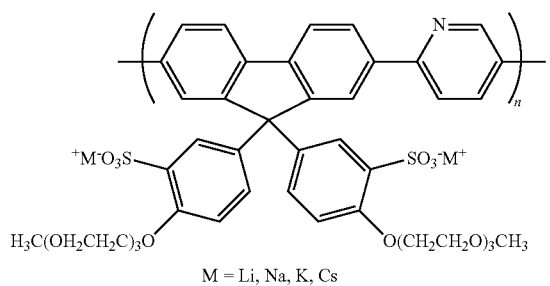
M = Li, Na, K, Cs
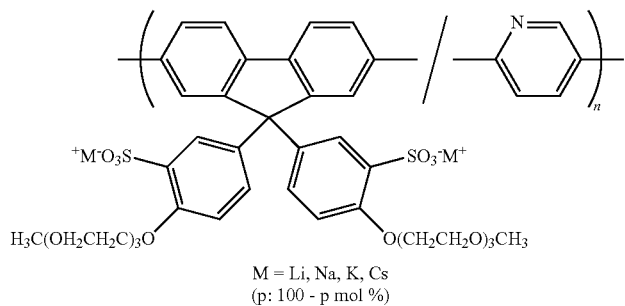
M = Li, Na, K, Cs
(p: 100 - p mol %)
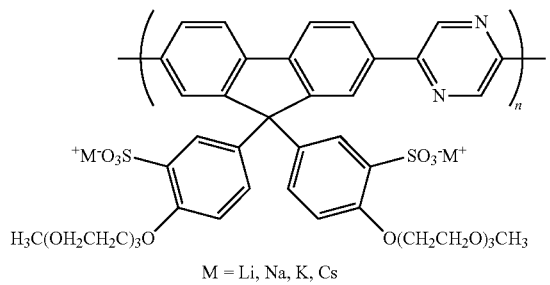
M = Li, Na, K, Cs -continued
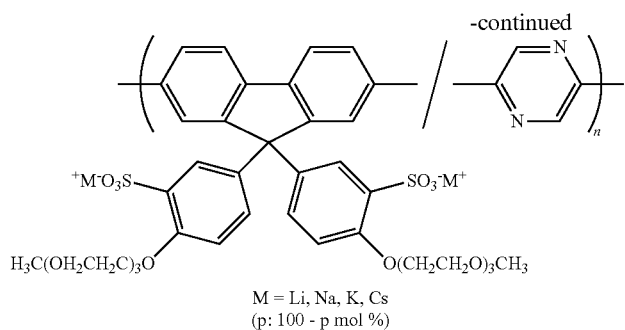
M = Li, Na, K, Cs
(p: 100 - p mol %)
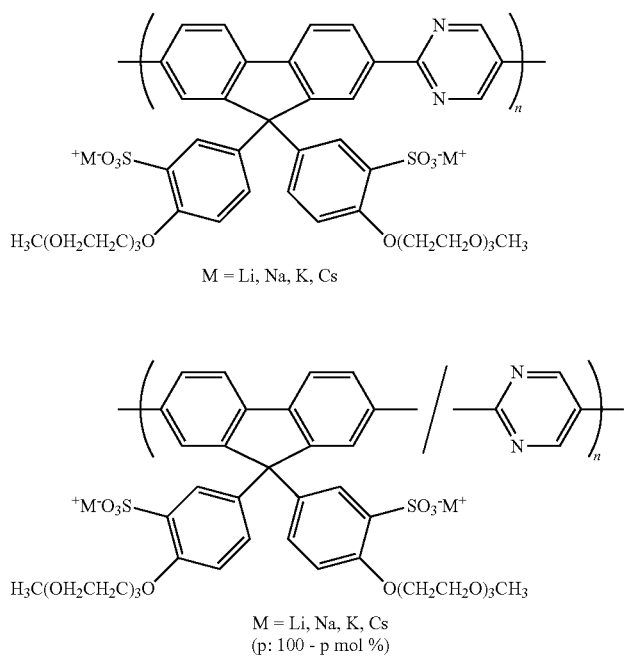
M = Li, Na, K, Cs
M = Li, Na, K, Cs
(p: 100 - p mol %)
M = Li, Na, K, Cs
[Chem. 56]
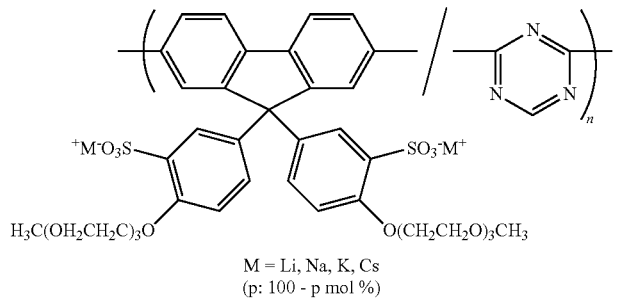
M = Li, Na, K, Cs
(p: 100 - p mol %)

-continued
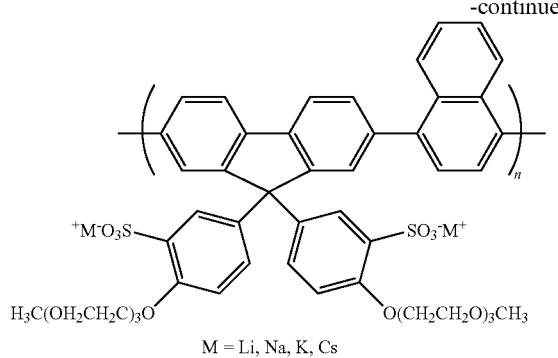
M = Li, Na, K, Cs
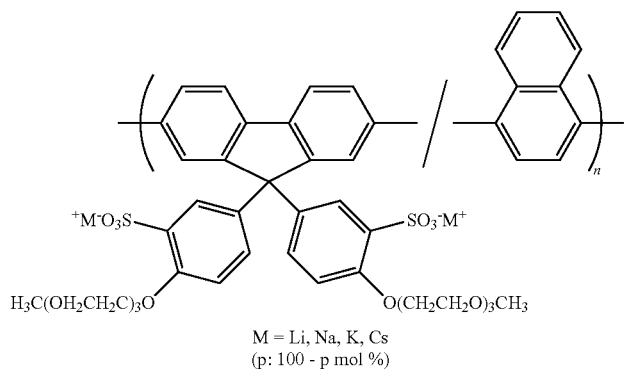
M = Li, Na, K, Cs
(p: 100 - p mol %)
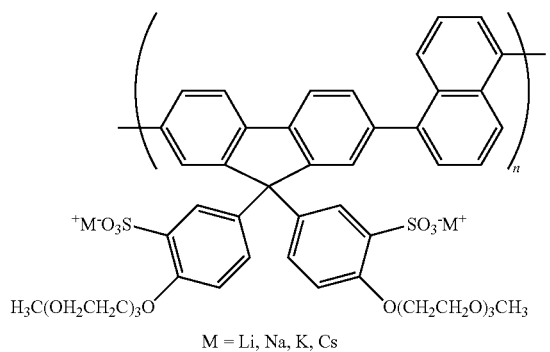
M = Li, Na, K, Cs
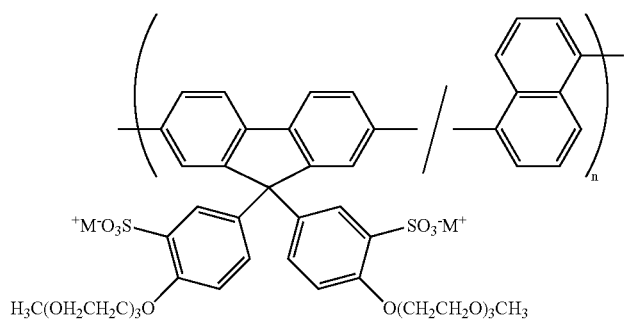
M = Li, Na, K, Cs
(p: 100 - p mol %)
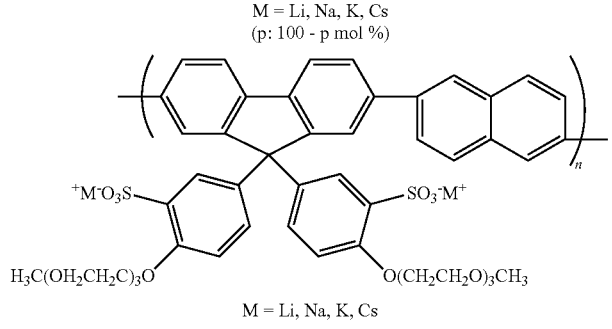
M = Li, Na, K, Cs -continued
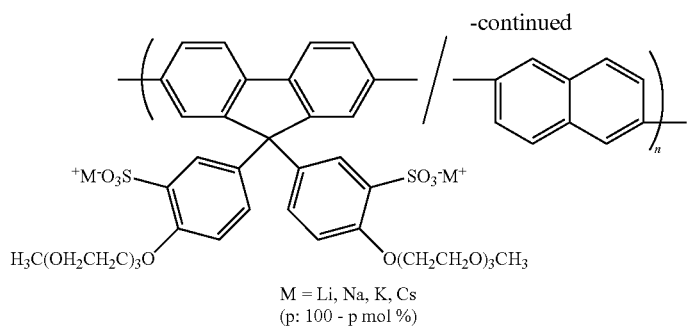
M = Li, Na, K, Cs
(p: 100 - p mol %)
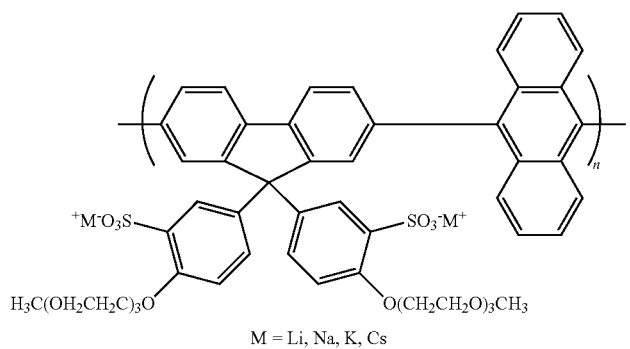
M = Li, Na, K, Cs
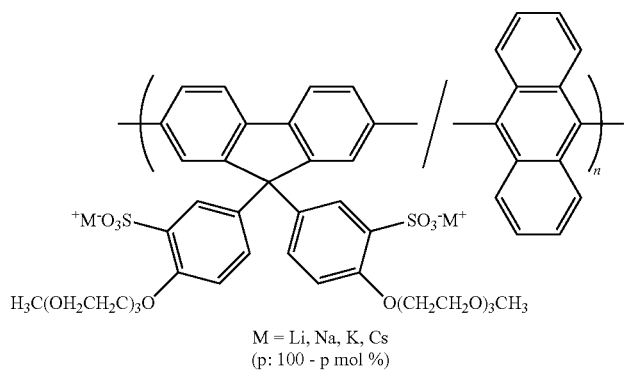
M = Li, Na, K, Cs
(p: 100 - p mol %)
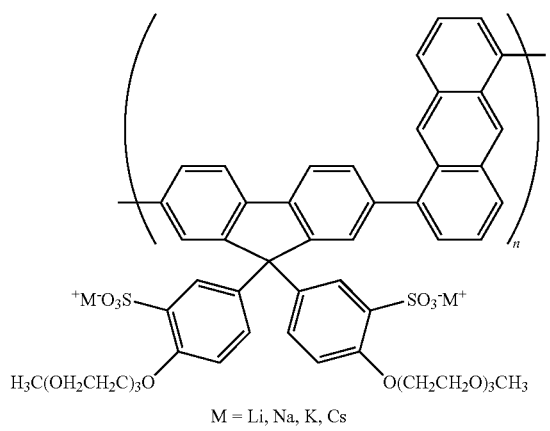
M = Li, Na, K, Cs

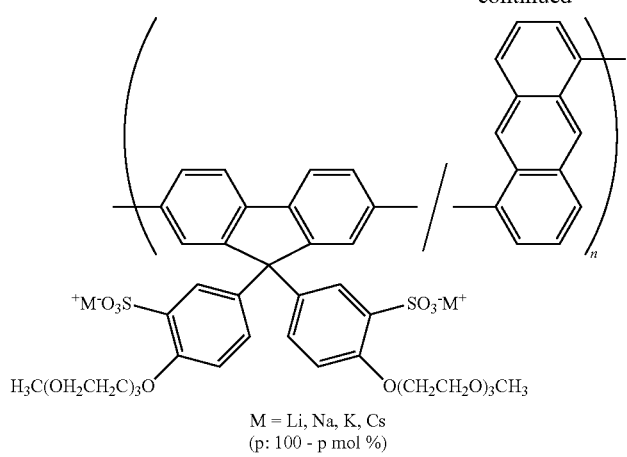
M = Li, Na, K, Cs
(p: 100 - p mol %)
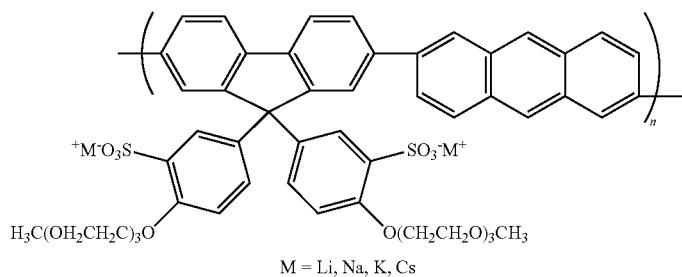
M = Li, Na, K, Cs
[Chem. 57]
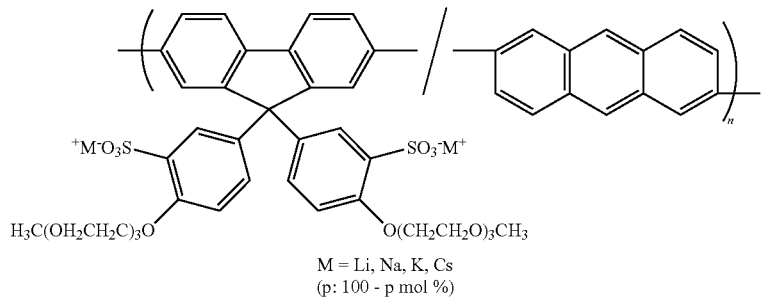
M = Li, Na, K, Cs
(p: 100 - p mol %)
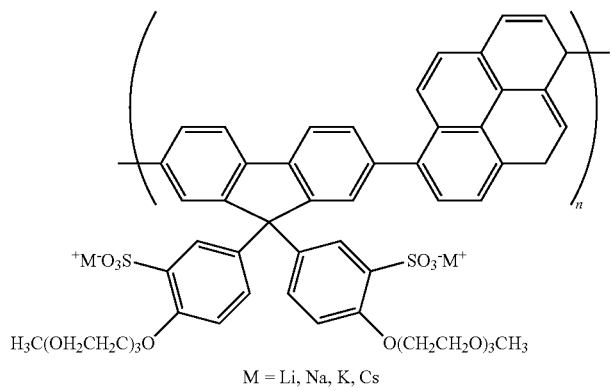
M = Li, Na, K, Cs -continued
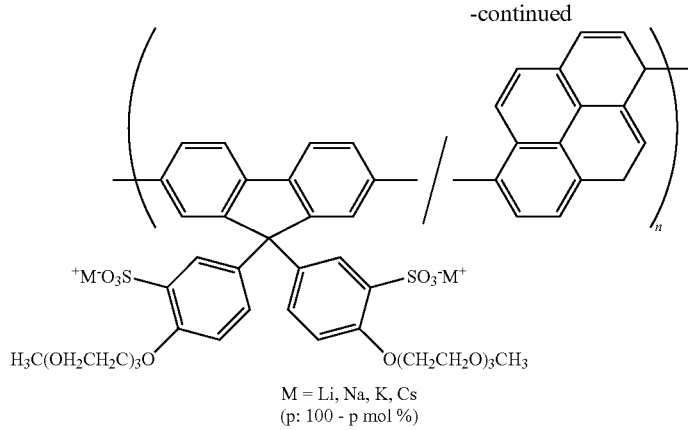
M = Li, Na, K, Cs
(p: 100 - p mol %)
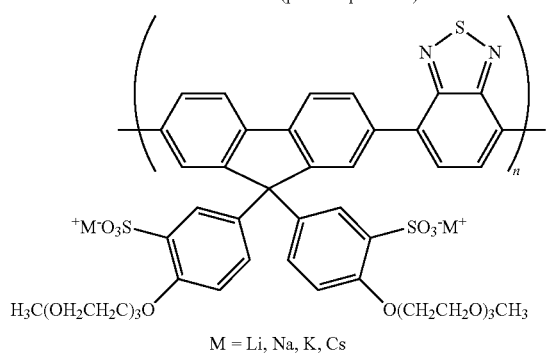
M = Li, Na, K, Cs
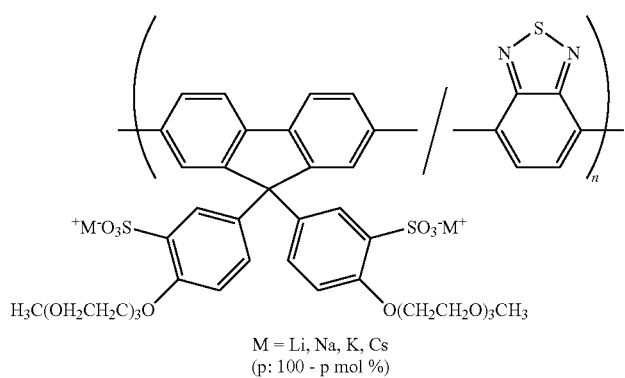
M = Li, Na, K, Cs
(p: 100 - p mol %)
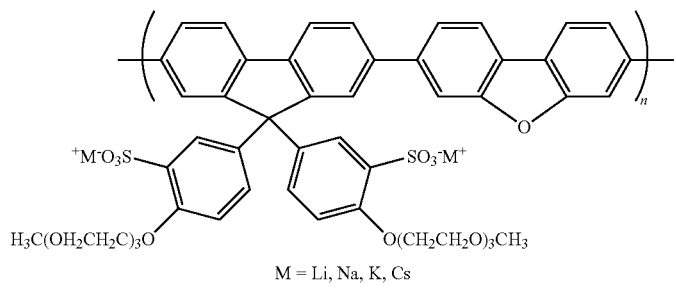
M = Li, Na, K, Cs
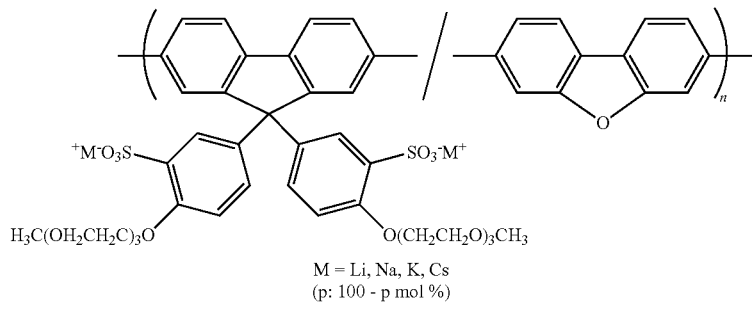
M = Li, Na, K, Cs
(p: 100 - p mol %)

-continued
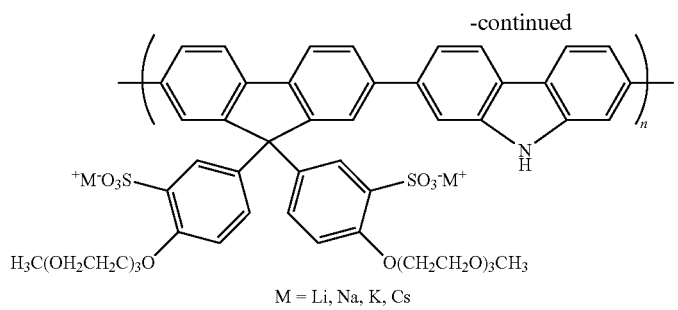
M = Li, Na, K, Cs
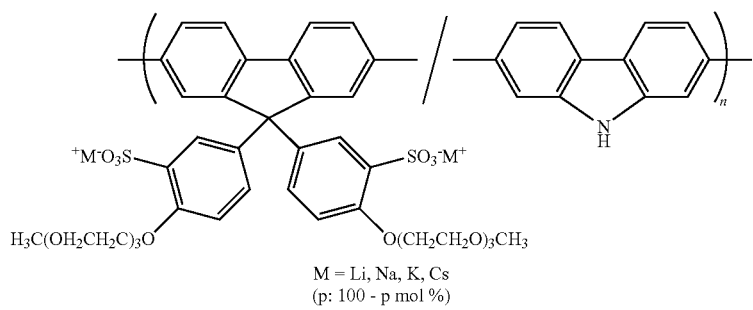
M = Li, Na, K, Cs
(p: 100 − p mol %)
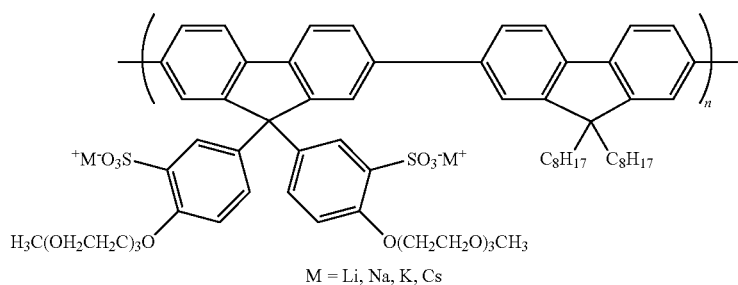
M = Li, Na, K, Cs
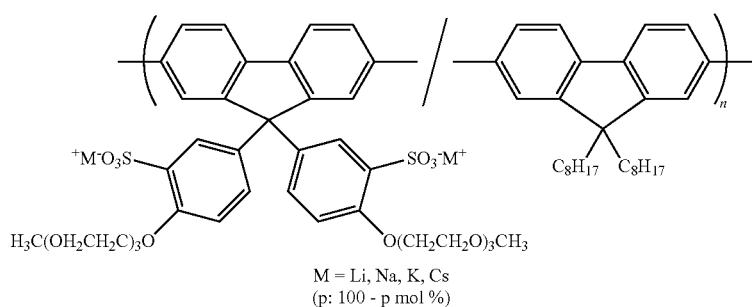
M = Li, Na, K, Cs
(p: 100 − p mol %)
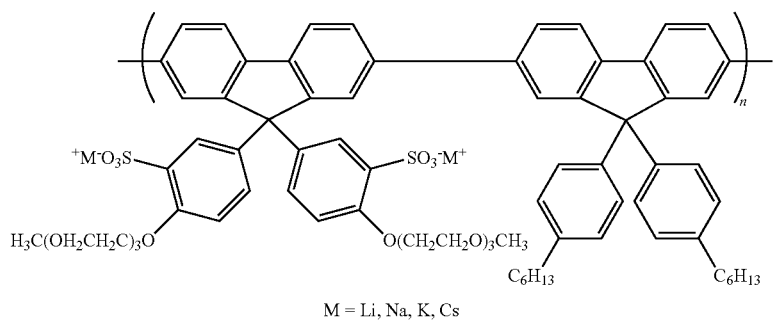
M = Li, Na, K, Cs

[Chem. 58]
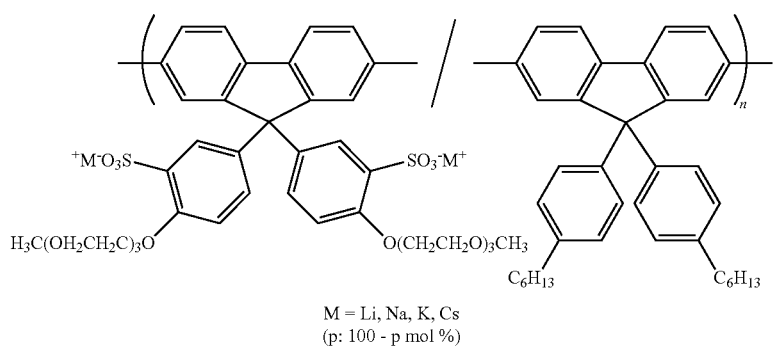
M = Li, Na, K, Cs
(p: 100 - p mol %)
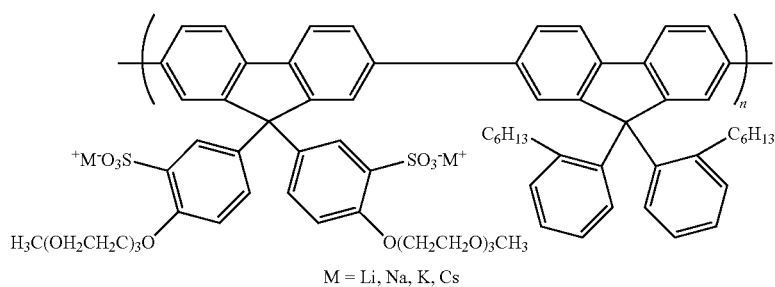
M = Li, Na, K, Cs
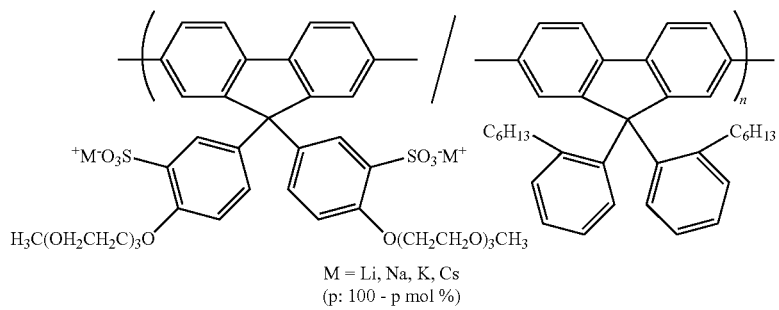
M = Li, Na, K, Cs
(p: 100 - p mol %)
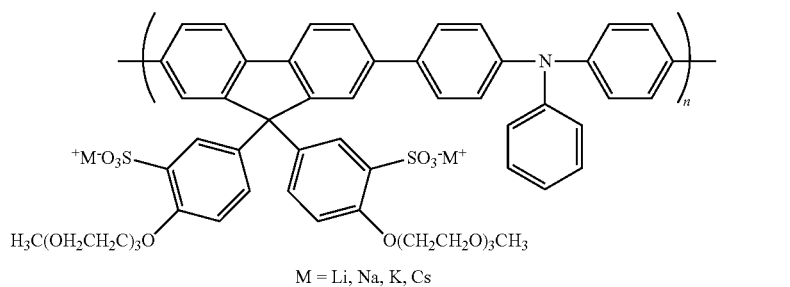
M = Li, Na, K, Cs
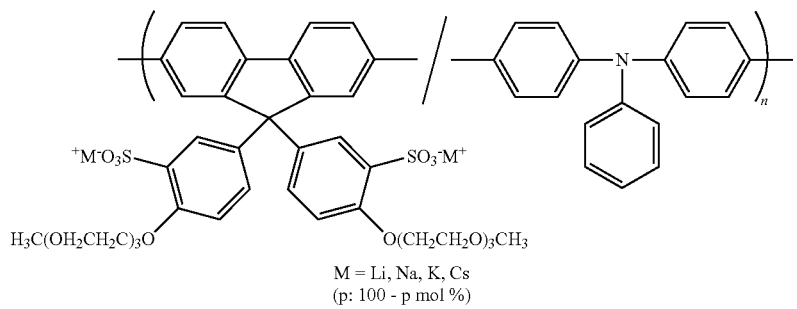
M = Li, Na, K, Cs
(p: 100 - p mol %)

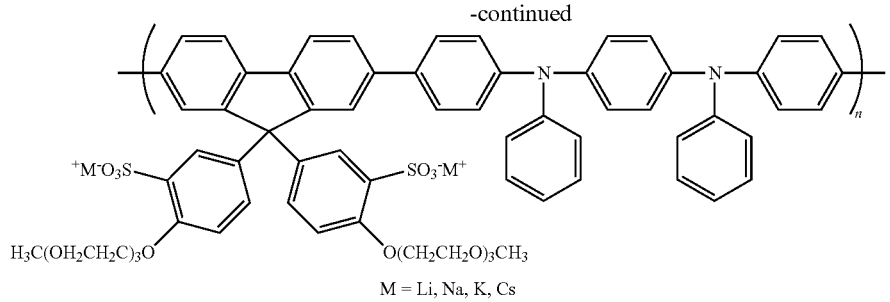

M = Li, Na, K, Cs

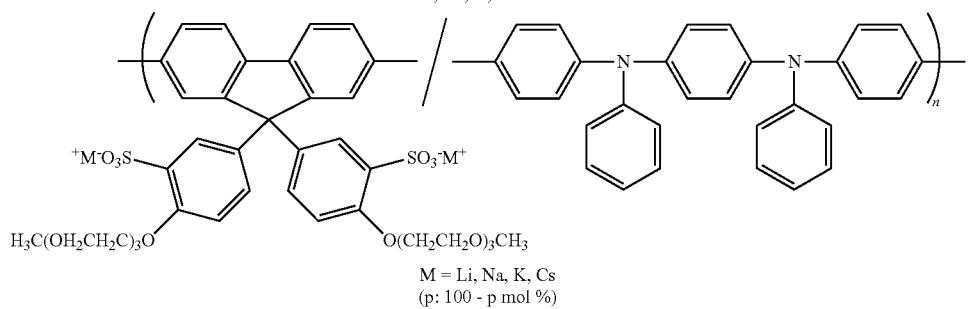

M = Li, Na, K, Cs
(p: 100 - p mol %)

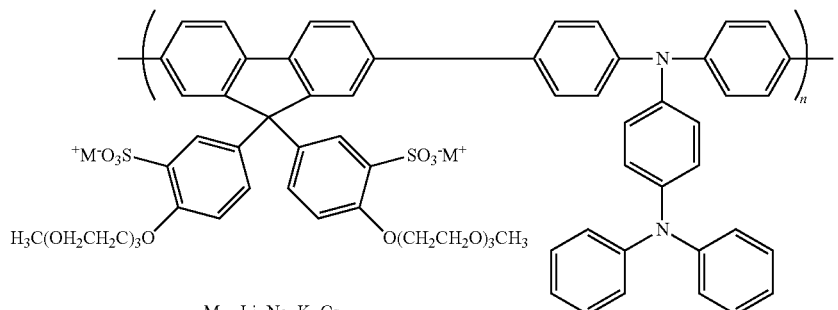

M = Li, Na, K, Cs

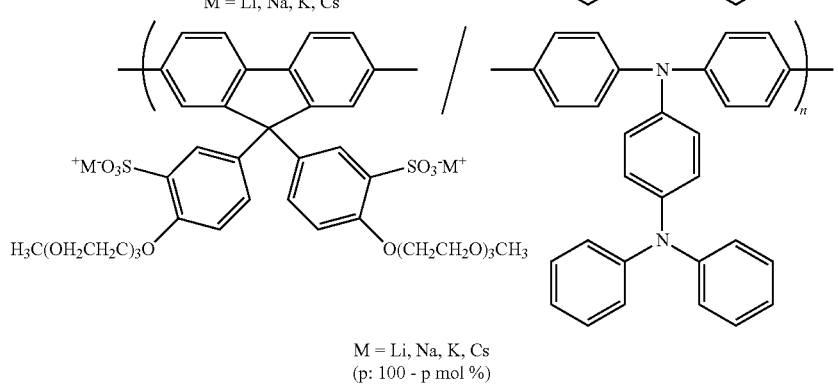

M = Li, Na, K, Cs
(p: 100 - p mol %)

(In the formula, p represents numbers of 15 to 100)

The ionic polymer including the group represented by the formula (2) and the group represented by the formula (3) includes an ionic polymer formed with only a group represented by the formula (26), an ionic polymer formed with one or more types of groups selected from the group consisting of a group represented by the formula (26) and a group in which two hydrogen atoms are removed from a group represented by 45 to 50, 59, 60, 77, 80, 91, 92, 96, 101 to 110, an ionic polymer formed with only a group represented by the formula (27), an ionic polymer formed with one or more types of groups selected from the group consisting of a group represented by the formula (27) and a group in which two hydrogen atoms are removed from a group represented by 45 to 50, 59, 60, 77, 80, 91, 92, 96, 101 to 110, an ionic polymer formed with only a group represented by the formula (28), an ionic polymer formed with one or more types of groups selected from the group consisting of a group represented by the formula (28) and a group in which two hydrogen atoms are removed from a group represented by 45 to 50, 59, 60, 77, 80, 91, 92, 96, 101 to 110, an ionic polymer formed with only a group represented by the formula (31), an ionic polymer formed with one or more types of groups selected from the group consisting of a group represented by the formula (31) and a group in which two hydrogen atoms are removed from a group represented by 45 to 50, 59, 60, 77, 80, 91, 92, 96, 101 to 110, an ionic polymer formed with only a group represented by the formula (32), and an ionic polymer formed with one or more types of groups selected from the group consisting of a group represented by the formula (32) and a group in which two hydrogen atoms are removed from a group represented by 45 to 50, 59, 60, 77, 80, 91, 92, 96, 101 to 110.

The ionic polymer including the group represented by the formula (2) and the group represented by the formula (3) includes the following polymer compounds. Among these, in the polymer compounds represented by the formula in which two types of structural units are separated by a slash "/", the proportion of structural units to the left is p mol %, the proportion of structural units to the right side is (100-p) mol %, and these structural units are arranged at random. In addition, in the formulae below, n represents a degree of polymerization.

[Chem. 59]

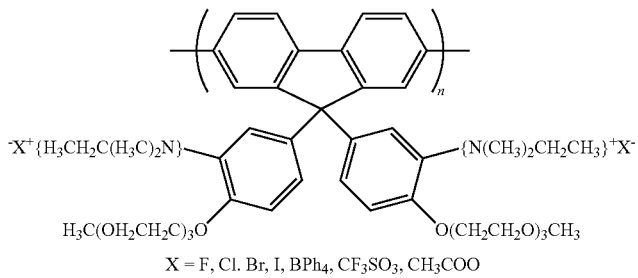

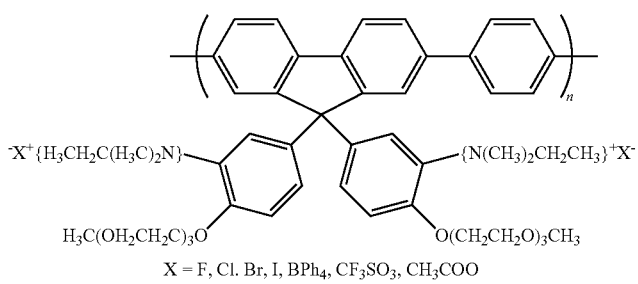

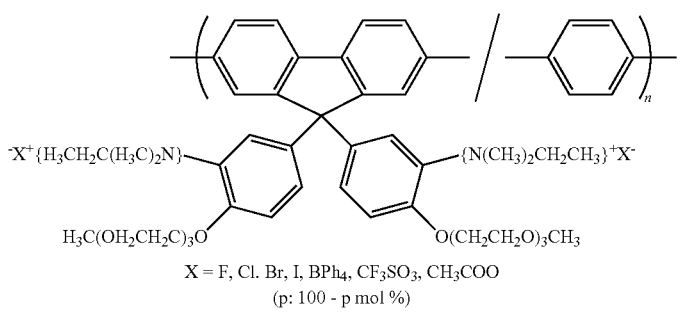

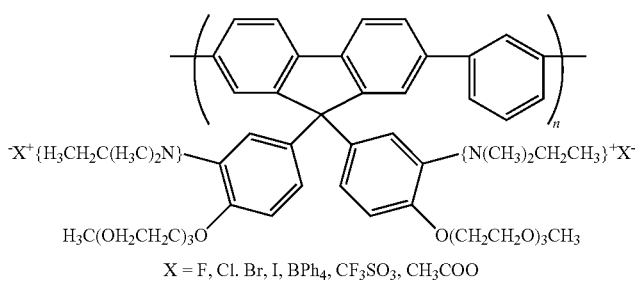

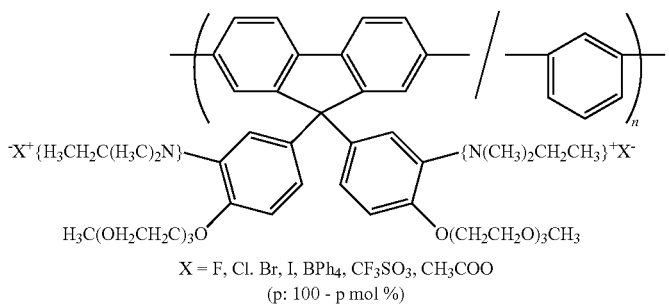

-continued
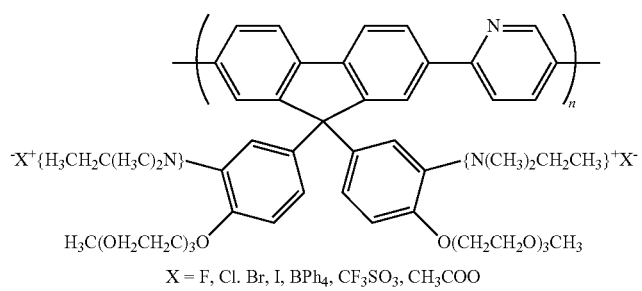
X = F, Cl. Br, I, BPh$_4$, CF$_3$SO$_3$, CH$_3$COO
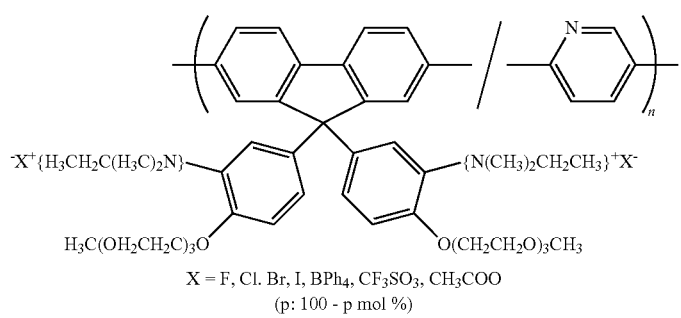
X = F, Cl. Br, I, BPh$_4$, CF$_3$SO$_3$, CH$_3$COO
(p: 100 - p mol %)
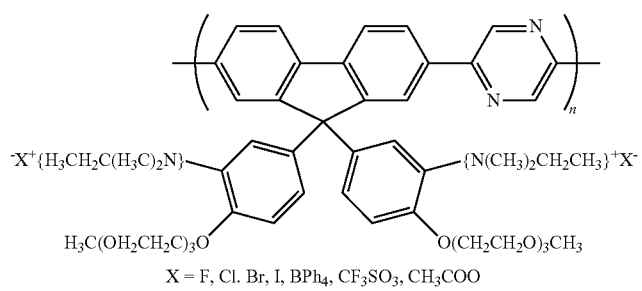
X = F, Cl. Br, I, BPh$_4$, CF$_3$SO$_3$, CH$_3$COO
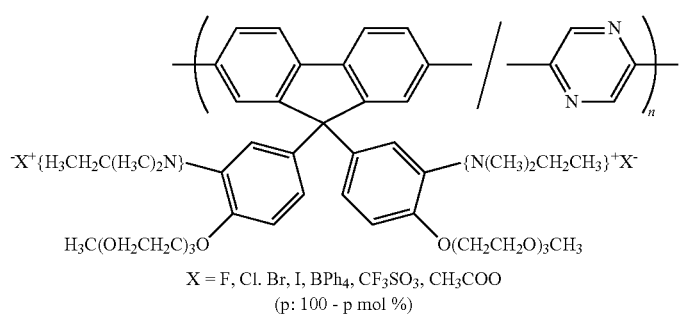
X = F, Cl. Br, I, BPh$_4$, CF$_3$SO$_3$, CH$_3$COO
(p: 100 - p mol %)
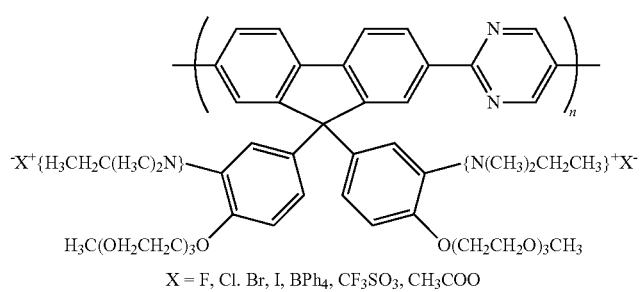
X = F, Cl. Br, I, BPh$_4$, CF$_3$SO$_3$, CH$_3$COO -continued
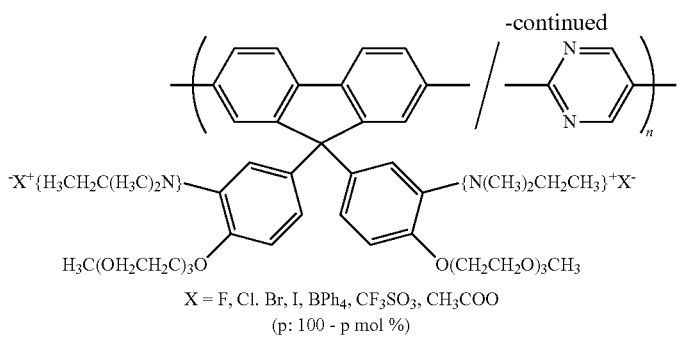
X = F, Cl, Br, I, BPh$_4$, CF$_3$SO$_3$, CH$_3$COO
(p: 100 - p mol %)
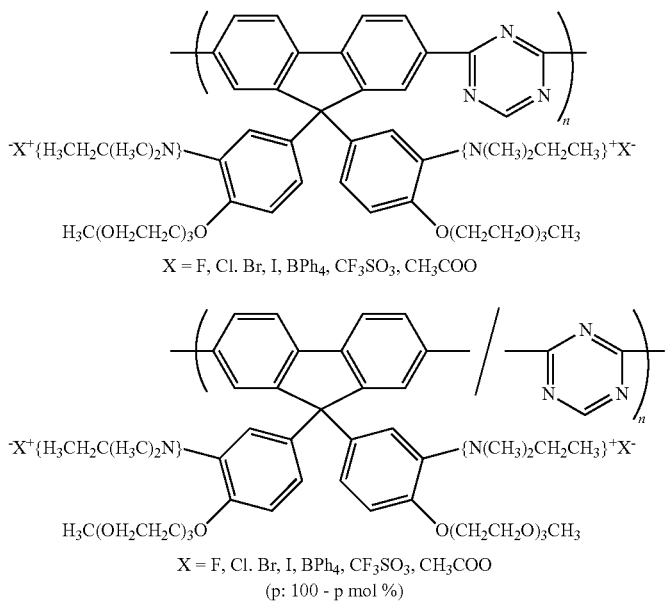
X = F, Cl, Br, I, BPh$_4$, CF$_3$SO$_3$, CH$_3$COO
X = F, Cl, Br, I, BPh$_4$, CF$_3$SO$_3$, CH$_3$COO
(p: 100 - p mol %)
[Chem. 60]
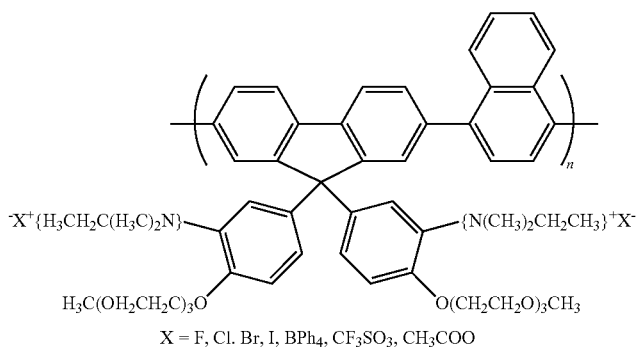
X = F, Cl, Br, I, BPh$_4$, CF$_3$SO$_3$, CH$_3$COO
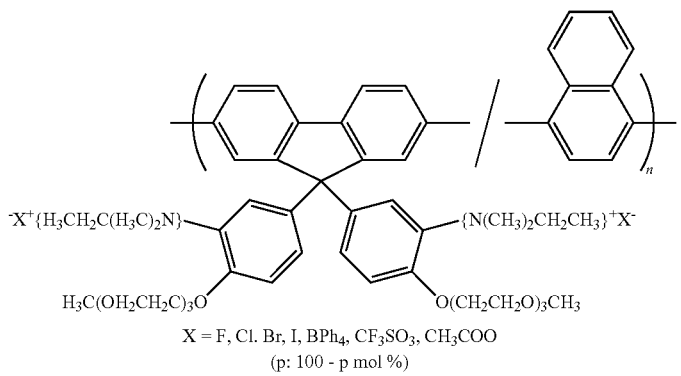
X = F, Cl, Br, I, BPh$_4$, CF$_3$SO$_3$, CH$_3$COO
(p: 100 - p mol %)

-continued
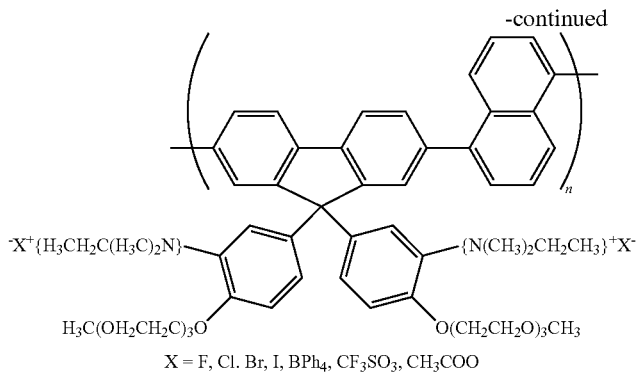
X = F, Cl, Br, I, BPh₄, CF₃SO₃, CH₃COO
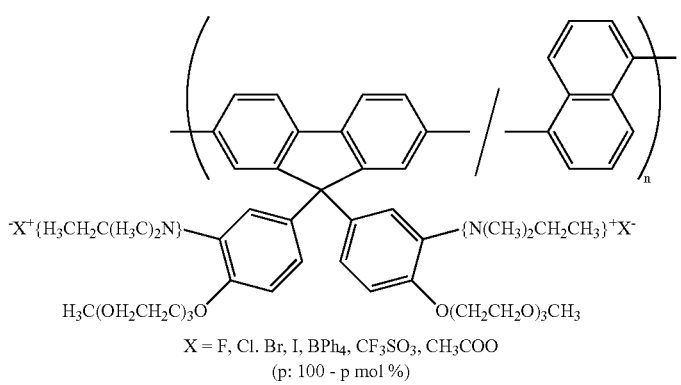
X = F, Cl, Br, I, BPh₄, CF₃SO₃, CH₃COO
(p: 100 - p mol %)
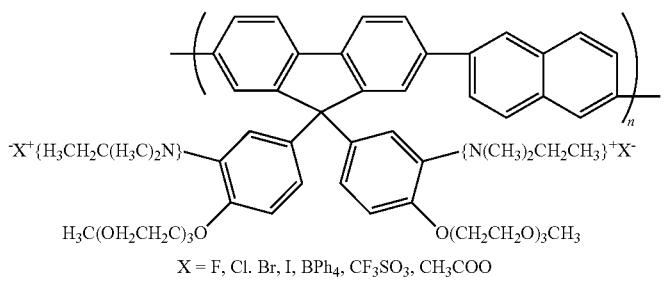
X = F, Cl, Br, I, BPh₄, CF₃SO₃, CH₃COO
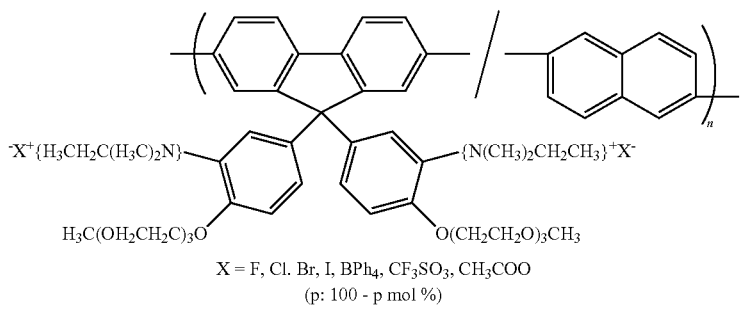
X = F, Cl, Br, I, BPh₄, CF₃SO₃, CH₃COO
(p: 100 - p mol %)
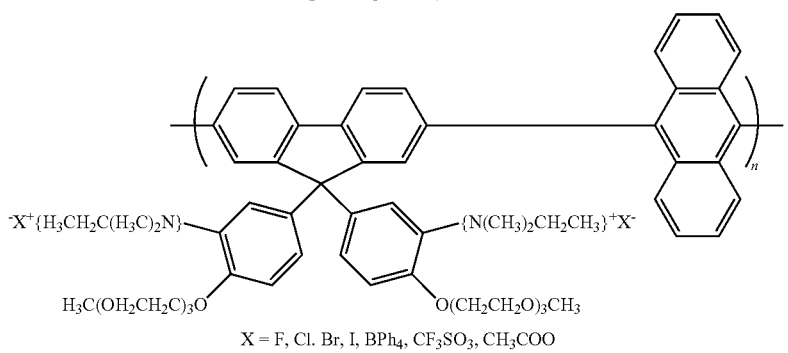
X = F, Cl, Br, I, BPh₄, CF₃SO₃, CH₃COO -continued
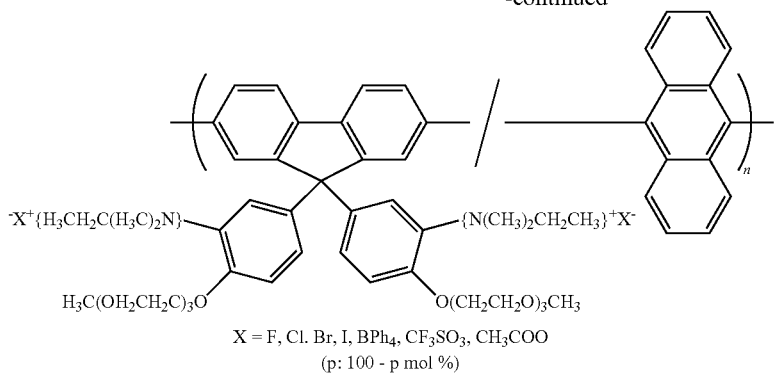
X = F, Cl, Br, I, BPh4, CF3SO3, CH3COO
(p: 100 - p mol %)
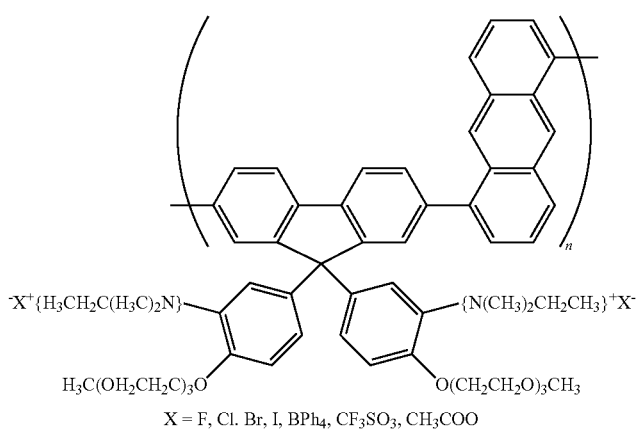
X = F, Cl, Br, I, BPh4, CF3SO3, CH3COO
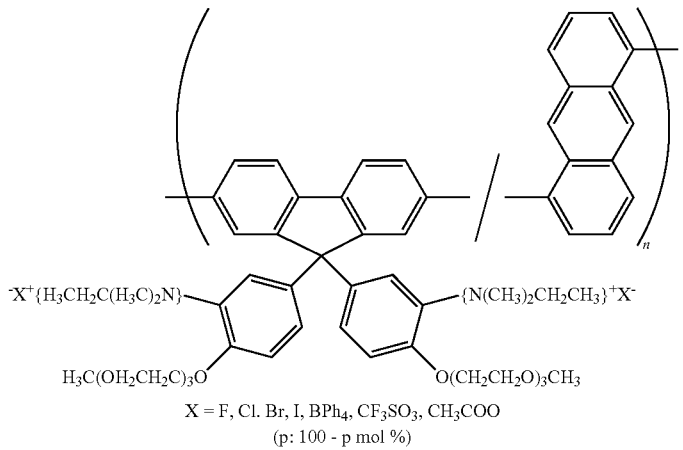
X = F, Cl, Br, I, BPh4, CF3SO3, CH3COO
(p: 100 - p mol %)
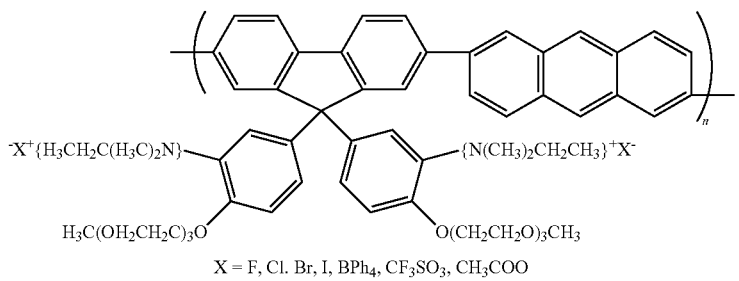
X = F, Cl, Br, I, BPh4, CF3SO3, CH3COO -continued
[Chem. 61]
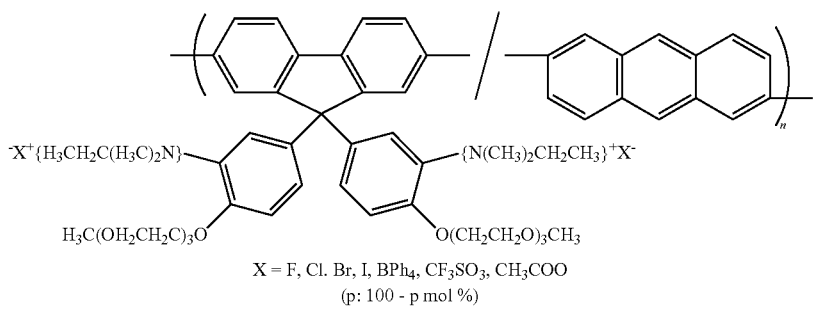
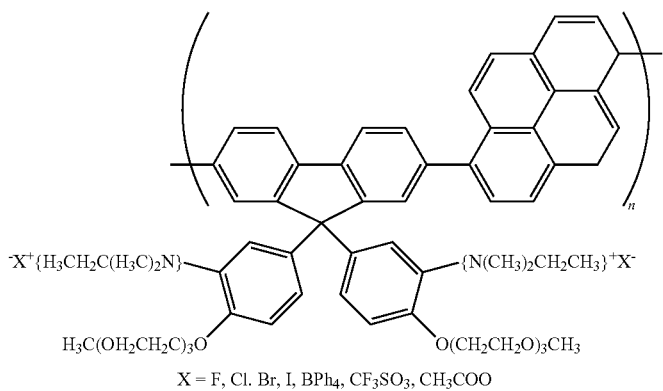
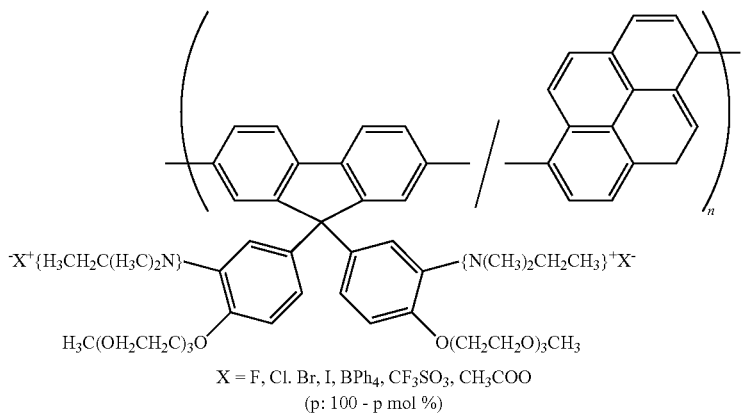
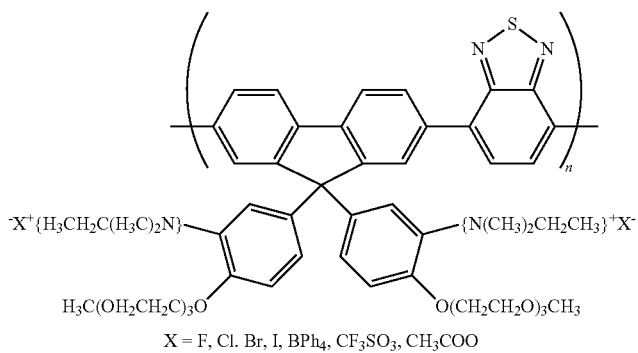

-continued
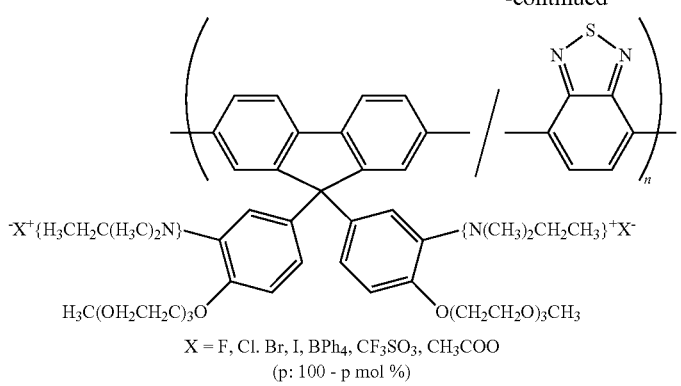
X = F, Cl. Br, I, BPh4, CF3SO3, CH3COO
(p: 100 - p mol %)
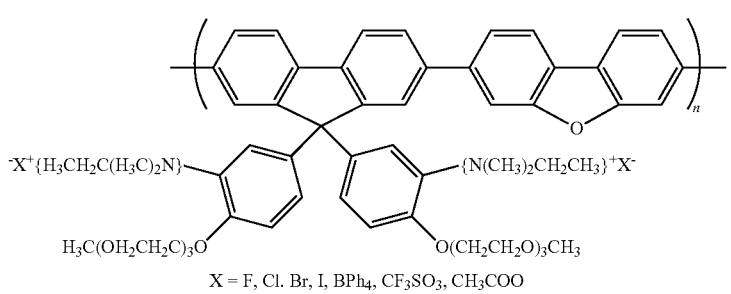
X = F, Cl. Br, I, BPh4, CF3SO3, CH3COO
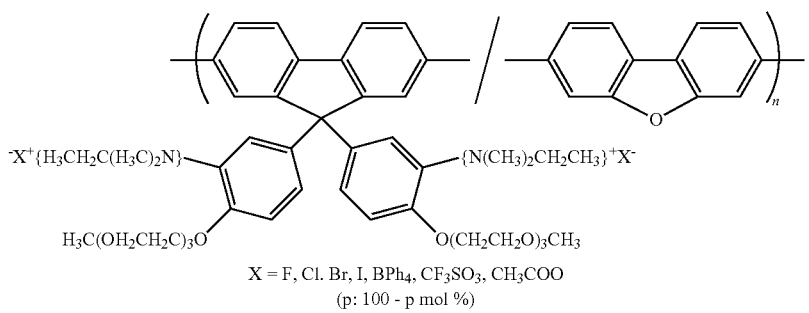
X = F, Cl. Br, I, BPh4, CF3SO3, CH3COO
(p: 100 - p mol %)
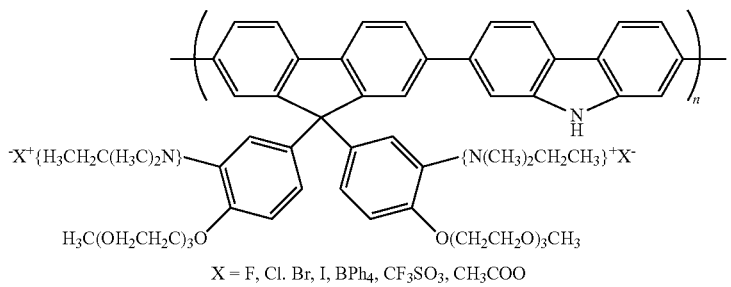
X = F, Cl. Br, I, BPh4, CF3SO3, CH3COO
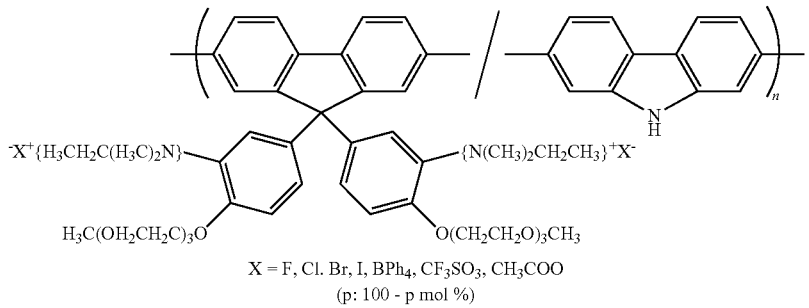
X = F, Cl. Br, I, BPh4, CF3SO3, CH3COO
(p: 100 - p mol %)

-continued
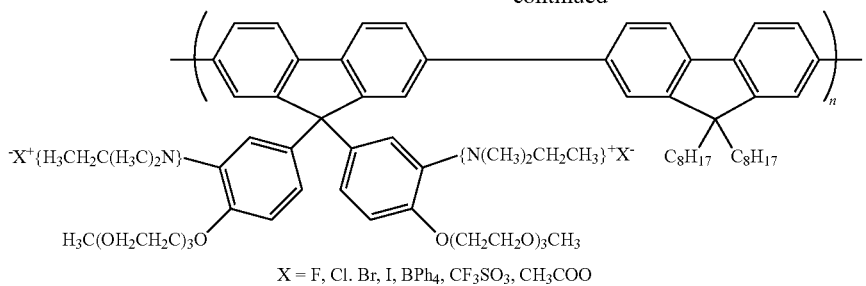
X = F, Cl. Br, I, BPh4, CF3SO3, CH3COO
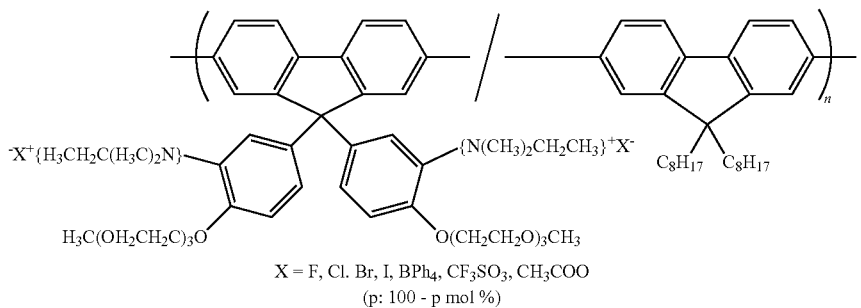
X = F, Cl. Br, I, BPh4, CF3SO3, CH3COO
(p: 100 - p mol %)
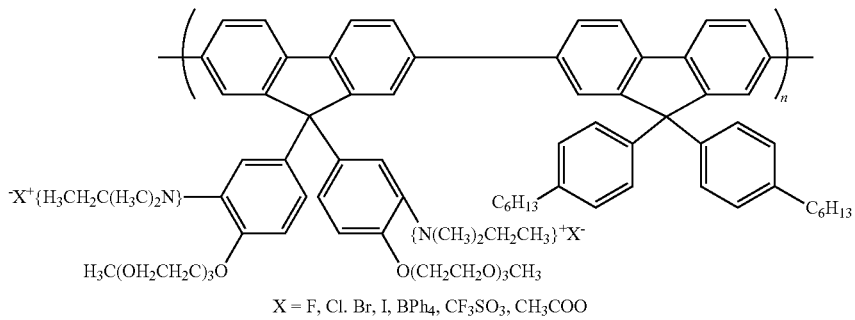
X = F, Cl. Br, I, BPh4, CF3SO3, CH3COO
[Chem. 62]
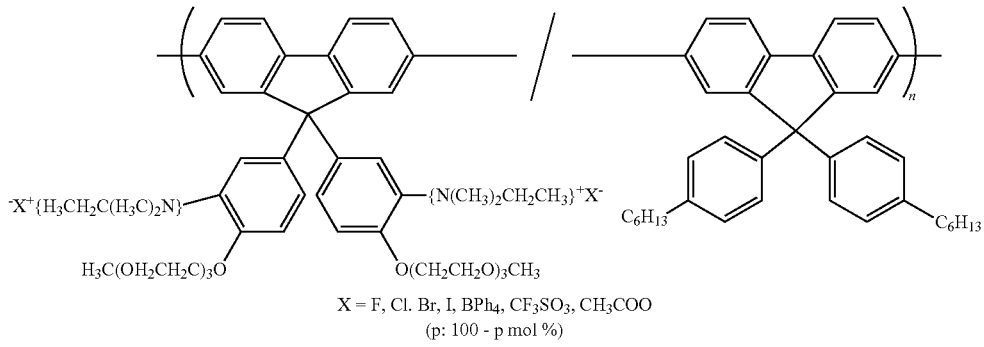
X = F, Cl. Br, I, BPh4, CF3SO3, CH3COO
(p: 100 - p mol %)
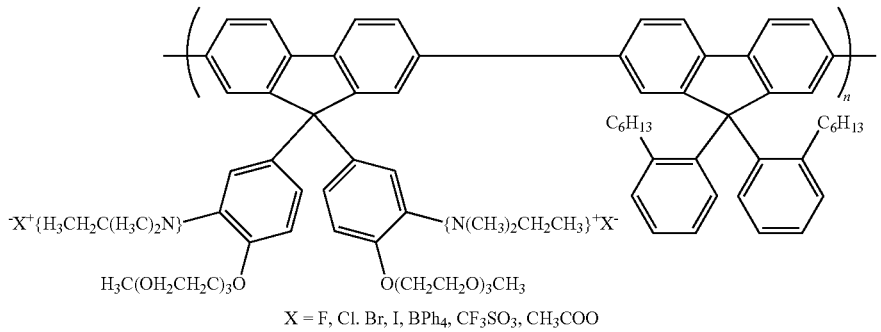
X = F, Cl. Br, I, BPh4, CF3SO3, CH3COO -continued
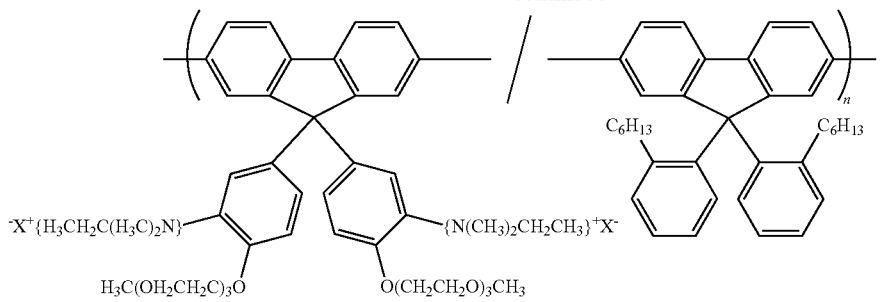
X = F, Cl, Br, I, BPh4, CF3SO3, CH3COO
(p: 100 - p mol %)
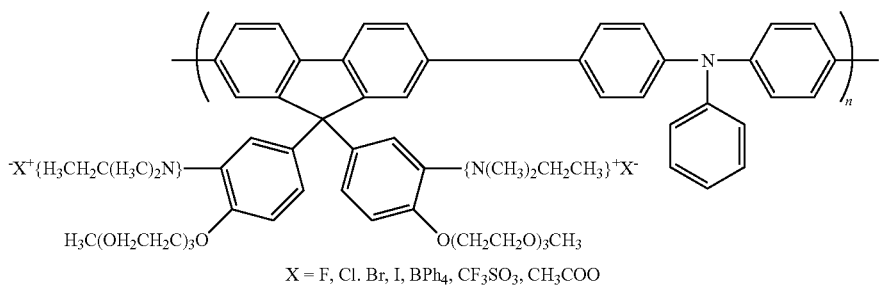
X = F, Cl, Br, I, BPh4, CF3SO3, CH3COO
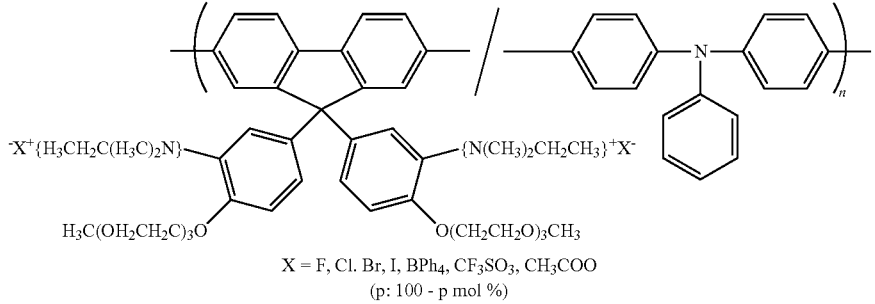
X = F, Cl, Br, I, BPh4, CF3SO3, CH3COO
(p: 100 - p mol %)
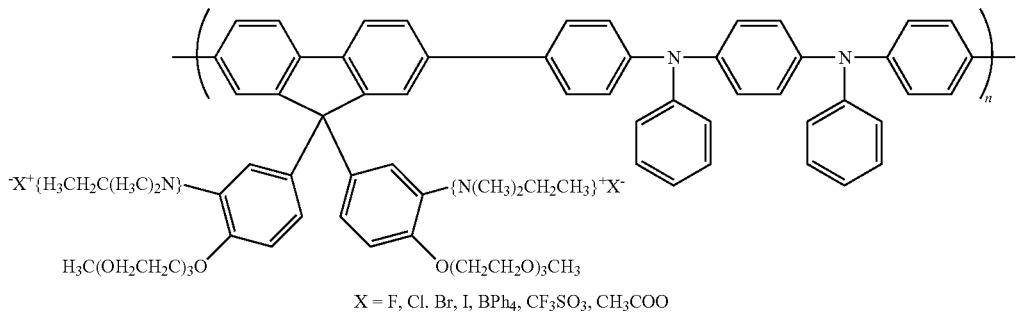
X = F, Cl, Br, I, BPh4, CF3SO3, CH3COO
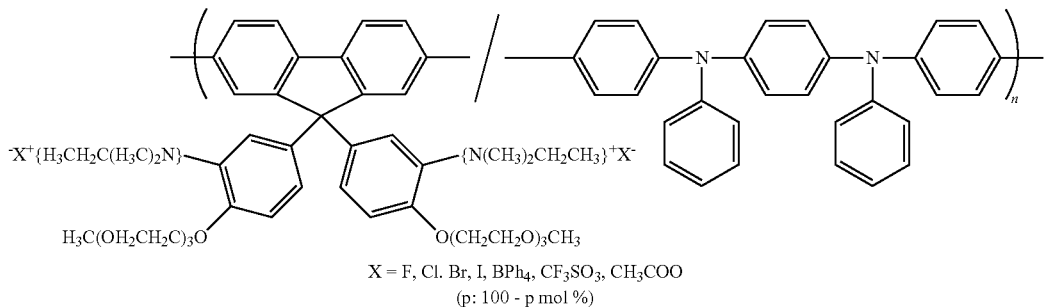
X = F, Cl, Br, I, BPh4, CF3SO3, CH3COO
(p: 100 - p mol %)

-continued

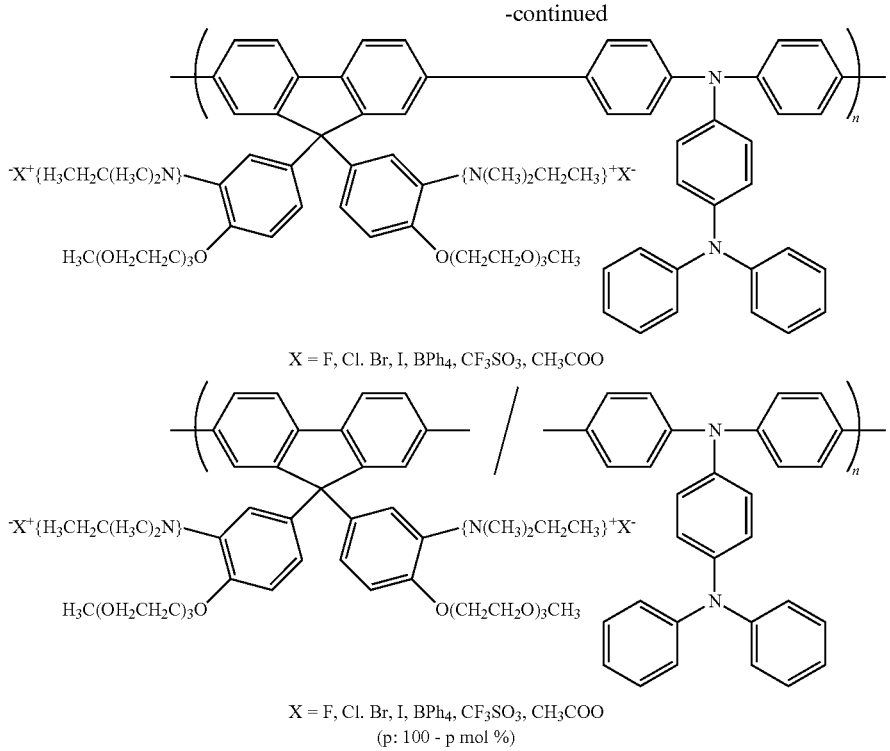

X = F, Cl, Br, I, BPh4, CF3SO3, CH3COO (p: 100 - p mol %)

(In the formula, p represents numbers of 15 to 100)

—Preparation Method of Ionic Polymer—

Next, a method for preparing the ionic polymer of the present embodiment is described. Examples of the favorable methods for preparing the ionic polymer may include a method in which a compound represented by the formula (36) is contained as an essential raw material, and condensation polymerization is performed on this compound. Among these, using at least one type of a compound in which -$A_a$- is a structural unit represented by the formula (13), a compound in which -$A_a$- is a structural unit represented by the formula (15), a compound in which -$A_a$- is a structural unit represented by the formula (17), and a compound in which -$A_a$- is a structural unit represented by the formula (20) as the compound represented by the formula 36 is preferable.

$$Y^4\text{-}A_a\text{-}Y^5 \tag{36}$$

(In the formula (36), $A_a$ represents a repeating unit including one or more types of groups selected from the group consisting of a group represented by the formula (1) and a group represented by the formula (2), and one or more types of groups represented by the formula (3), and $Y^4$ and $Y^5$ each independently represent a group involved in condensation polymerization.)

In addition, when other structural units other than -$A_a$- are contained together with the structural unit represented as -$A_a$- of the formula (36) in the ionic polymer of the present embodiment, a compound having a substituent involved in two condensation polymerizations, which is structural units other than -$A_a$-, is used, and this compound may be subjected to condensation polymerization together with the compound represented by the formula (36).

Examples of the compound having a substituent capable of two condensation polymerizations used in order to include such other structural units include a compound represented by the formula (37). In this way, an ionic polymer which further has a structural unit represented by -$A_b$- may be prepared in addition to the compound represented by the formula (36) (a compound represented by $Y^4$-$A_a$-$Y^5$) by performing condensation polymerization of the compound represented by the formula (37).

$$Y^6\text{-}A_b\text{-}Y^7 \tag{37}$$

(In the formula (37), $A_b$ is a structural unit represented by the formula (33) or a structural unit represented by the formula (35), and $Y^6$ and $Y^7$ each independently represent a group involved in condensation polymerization.)

The group involved in such condensation polymerization ($Y^4$, $Y^5$, $Y^6$ and $Y^7$) includes a hydrogen atom, a halogen atom, an alkylsulfonate group, an arylsulfonate group, an arylalkylsulfonate group, a borate ester residue, a methyl sulfonium group, a methyl phosphonium group, a methyl phosphonate group, a methyl monohalide group, —B(OH)$_2$, a formyl group, a cyano group, a vinyl group, or the like.

The halogen atom which may be selected as a group involved in such condensation polymerization includes a fluorine atom, a chlorine atom, a bromine atom and an iodine atom.

In addition, examples of the alkylsulfonate group which may be selected as a group involved in the condensation polymerization include a methanesulfonate group, an ethanesulfonate group, a trifluoromethanesulfonate group, and examples of the arylsulfonate group include a benzenesulfonate group, a p-toluenesulfonate group.

Examples of the arylalkylsulfonate group which may be selected as a group involved in the condensation polymerization include a benzylsulfonate group.

In addition, examples of the borate ester residue which may be selected as a group involved in the condensation polymerization include a group represented by the following formula.

[Chem. 63]

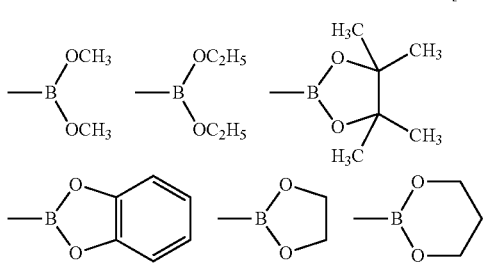

Furthermore, examples of the methyl sulfonium group which may be selected as a group involved in the condensation polymerization include a group represented by the following formula:

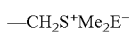

or

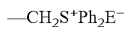

(In the formula, E represents a halogen atom. Ph represents a phenyl group, and hereinafter, the same applies.)

In addition, examples of the methyl phosphonium group which may be selected as a group involved in the condensation polymerization include a group represented by the following formula:

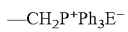

(In the formula, E represents a halogen atom.)

Furthermore, examples of the methyl phosphonate group which may be selected as a group involved in the condensation polymerization include a group represented by the following formula:

(In the formula, $R^d$ represents an alkyl group, an aryl group or an arylalkyl group.)

In addition, examples of the methyl monohalide group which may be selected as a group involved in the condensation polymerization include a methyl fluoride group, a methyl chloride group, a methyl bromide group or a methyl iodide group.

Furthermore, the group favorable as a group involved in the condensation polymerization varies depending on the types of polymerization reaction, however, for example, a halogen atom, an alkylsulfonate group, an arylsulfonate group or an arylalkylsulfonate group is included when a zerovalent nickel complex in a Yamamoto coupling reaction and the like is used. In addition, an alkylsulfonate group, a halogen atom, a borate ester residue, —B(OH)$_2$ or the like is included when a nickel catalyst or a palladium catalyst a Suzuki coupling reaction and the like is used, and a hydrogen atom is included when performing oxidative polymerization using an oxidizing agent or performing oxidative polymerization electrochemically.

In order to prepare the ionic polymer of the present embodiment, for example, a polymerization method may be employed in which a compound (a monomer) having a plurality of groups involved in the condensation polymerization represented by the formula (36) or the formula (37) is dissolved in an organic solvent if necessary, and reacted at a temperature greater than or equal to the melting point and less than or equal to the boiling point of the organic solvent using an alkali or a suitable catalyst. Examples of such a polymerization method include well-known methods described in "Organic Reactions)", Vol. 14, pages 270 to 490, John Wiley & Sons, Inc., 1965, "Organic Syntheses", Collective Volume VI, pages 407 to 411, John Wiley & Sons, Inc., 1988, Chem. Rev., Volume 95, page 2457 (1995), Journal of Organometallic Chemistry, Volume 576, page 147 (1999), Macromolecular Chemistry Macromolecular Symposium, Volume 12, page 229 (1987).

In addition, well-known condensation polymerizations may be employed depending on the group involved in the condensation polymerization when the ionic polymer is prepared. Such a polymerization method includes a method of polymerizing the corresponding monomer using a Suzuki coupling reaction, a method of polymerizing the corresponding monomer using a Grignard reaction, a method of polymerizing the corresponding monomer using a Ni(0) complex, a method of polymerizing the corresponding monomer using an oxidizing agent such as FeCl$_3$, a method of oxidative polymerizing the corresponding monomer electrochemically, or a method of polymerizing the corresponding monomer by decomposition of an intermediate polymer having a suitable leaving group, or the like. Among these polymerization reactions, a method of polymerizing the corresponding monomer using a Suzuki coupling reaction, a method of polymerizing the corresponding monomer using a Grignard reaction and a method of polymerizing the corresponding monomer using a zerovalent Ni complex are preferable since structure control of the ionic polymer obtained is easy.

One aspect of preferable preparation methods of the ionic polymer of the present embodiment is a method of preparing the ionic polymer using a starting monomer which has a group selected from the group consisting of a halogen atom, an alkylsulfonate group, an arylsulfonate group and an arylalkylsulfonate group as a group involved in the condensation polymerization, and performing condensation polymerization of the monomer under the presence of a zerovalent nickel complex. Examples of the starting monomer used in such methods include a dihalogenated compound, a bis(alkylsulfonate) compound, a bis(arylsulfonate) compound, a bis(arylalkylsulfonate) compound, a halogenalkylsulfonate compound, a halogenarylsulfonate compound, a halogenarylalkylsulfonate compound, an alkylsulfonate-arylsulfonate compound, an alkylsulfonate-arylalkylsulfonate compound, and an arylsulfonate-arylalkylsulfonate compound.

Another aspect of preferable preparation methods of the ionic polymer of the present embodiment is a method of preparing the ionic polymer using a starting monomer which has a group selected from the group consisting of a halogen atom, an alkylsulfonate group, an arylsulfonate group and an arylalkylsulfonate group, —B(OH)$_2$ and a borate ester residue as a group involved in the condensation polymerization, and has the ratio of the sum of the number of moles (J) of a halogen atom, an alkylsulfonate group, an arylsulfonate group and an arylalkylsulfonate group, to the sum of the number of moles (K) of —B(OH)$_2$ and a borate ester residue which the total starting monomers have being substantially 1 (K/J is typically in the range of 0.7 to 1.2), and performing condensation polymerization of the monomer under the presence of a nickel catalyst or a palladium catalyst.

The organic solvent varies depending on the compounds and reactions used, however, it is generally preferable to use an organic solvent which has been subjected to sufficient deoxidation treatment in order to suppress side reactions. It is preferable that a reaction be performed under an inert atmosphere using such an organic solvent in order to prepare the ionic polymer. Furthermore, for an organic solvent, it is preferable that a dehydration treatment be performed similar to the deoxidation treatment. However, the organic solvent is not limited to this in case of a reaction in a two-phase system with water, such as a Suzuki coupling reaction.

Examples of such an organic solvent include saturated hydrocarbons such as pentane, hexane, heptane, octane or cyclohexane, unsaturated hydrocarbons such as benzene, toluene, ethylbenzene or xylene, saturated halogenated hydrocarbons such as carbon tetrachloride, chloroform, dichloromethane, chlorobutane, bromobutane, chloropentane, bromopentane, chlorohexane, bromohexane, chlorocyclohexane or bromocyclohexane, unsaturated halogenated hydrocarbons such as chlorobenzene, dichlorobenzene or trichlorobenzene, alcohols such as methanol, ethanol, propanol, isopropanol, butanol or t-butyl alcohol, carboxylic acids such as formic acid, acetic acid or propionic acid, ethers such as dimethyl ether, diethyl ether, methyl-t-butyl ether, tetrahydrofuran, tetrahydropyran or dioxane, amines such as trimethylamine, triethylamine, N,N,N',N'-tetramethylethylenediamine or pyridine, amides such as N,N-dimethylformamide, N,N-dimethylacetamide, N,N-diethylacetamide or N-methylmorpholine oxide. Such organic solvents may be used either alone or as a combination of two types or more. In addition, among such organic solvents, ethers are more preferable, and tetrahydrofuran or diethyl ether is even more preferable from the viewpoint of reactivity, and toluene or xylene is preferable from the viewpoint of reaction rate.

When preparing the ionic polymer, adding an alkali or an appropriate catalyst is preferable in order to react the starting monomer. Such an alkali or a catalyst may be selected according to the polymerization method employed. It is preferable that such an alkali or a catalyst be sufficiently dissolved in a solvent used in the reaction. In addition, examples of the method of mixing an alkali or a catalyst include a method in which the solution of an alkali or a catalyst is slowly added while stirring a reaction liquid under an inert atmosphere such as argon or nitrogen, or a reaction liquid is slowly added to the solution of an alkali or a catalyst.

In the ionic polymer of the present embodiment, a terminal group may be protected by a stable group since there is a possibility that light emitting characteristics or lifetime characteristics of the light-emitting element obtained may be reduced if a polymerization active group remains intact in the terminal group. When the terminal group is protected by a stable group in this manner, it is preferable that the terminal group have a conjugated bond continuous with the conjugated structure of the main chain of the ionic polymer ion when the ionic polymer is a conjugated compound, and examples of the structure include a structure in which the terminal group is bonded to an aryl group or a heterocyclic group via a carbon-carbon bond. The stable group which protects such a terminal group includes a substituent such as a monovalent aromatic compound group represented by the structural formula of Chem. 10 in JP 9-45478A.

Another preferable method of preparing the ionic polymer including a structural unit represented by the formula (1) includes a method of polymerizing an ionic polymer which does not have a cation in the first step, and preparing an ionic polymer which has a cation from this ionic polymer in the second step. The method of polymerizing the ionic polymer which does not have a cation of the first step includes the condensation polymerization described above. The reaction of the second step includes a hydrolysis reaction using metal hydroxides, alkyl ammonium hydroxides or the like, or the like.

Another preferable method of preparing the ionic polymer including a structural unit represented by the formula (2) includes a method of polymerizing an ionic polymer which does not have a cation in the first step, and preparing an ionic polymer which has a cation from this ionic polymer in the second step. The method of polymerizing the ionic polymer which does not have a cation of the first step includes the condensation polymerization described above. The reaction of the second step includes a quaternary ammonium chlorination reaction of amines using alkyl halides, a halogen abstraction reaction using $SbF_5$, or the like.

The element which emits light at high luminance can be obtained since the ionic polymer of the present embodiment has excellent charge injection properties or transporting properties.

Examples of the method forming a layer including the ionic polymer includes a method forming a film using a solution containing the ionic polymer.

The solvent used in the film formation using such a solution is a solvent of which a solubility parameter is preferably 9.3 or more among solvents such as alcohols, ethers, esters, nitrile compounds, nitro compounds, alkyl halides, aryl halides, thiols, sulfides, sulfoxides, thioketones, amides and carboxylic acids, excepting water. Examples of the solvent (each value in parentheses represents the value of the solubility parameter of each solvent) include methanol (12.9), ethanol (11.2), 2-propanol (11.5), 1-butanol (9.9), t-butyl alcohol (10.5), acetonitrile (11.8), 1,2-ethanediol (14.7), N,N-dimethylformamide (11.5), dimethylsulfoxide (12.8), acetic acid, (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and a mixed solvent of these solvents.

Herein, to describe the mixed solvent made from mixing two types of solvent (denoted as solvent 1 and solvent 2), a solubility parameter ($\delta m$) of the mixed solvent is determined by $\delta m = \delta 1 \times \phi 1 + \delta 2 \times \phi 2$ ($\delta 1$ is a solubility parameter of solvent 1, $\phi 1$ is a volume fraction of solvent 1, $\delta 2$ is a solubility parameter of solvent 2, and $\phi 2$ is a volume fraction of solvent 2.)

A film thickness of an electron injection layer may be selected so that a driving voltage and luminous efficiency may have an adequate value since the optimum value varies depending on the ionic polymer used, however, a thickness with which pinholes do not occur is preferable. From the viewpoint of lowering the driving voltage of an element, the film thickness is preferably 1 nm to 1 μm, more preferably 2 nm to 500 nm, and even more preferably 2 nm to 200 nm. From the viewpoint of protecting a light emitting layer, the film thickness is preferably 5 nm to 1 μm.

<Cathode>

The cathode is composed of, for example, a thin film made of a conductive resin, a thin film made of a resin and a conductive filler, or the like. The conductive resin includes 3,4-polyethylenedioxythiophene/polystyrene sulfonate.

When a thin film is made of a resin and a conductive filler, a conductive resin may be used as the resin. In addition, metal particles, conductive wire or the like may be used as the conductive filler. Au or Ag, Al, Cu, or C may be used as the conductive filler. The cathode is formed by applying an ink in which a conductive filler and a resin are dispersed in dispersion medium, and by forming a film. In addition, the cathode is heated and baked, if necessary. Specifically, a conductive copper paste (TH9910) manufactured by Tatsuta Electric Wire & Cable Co., Ltd., a carbon conductive paste (MRX-713J-A) manufactured by TAMURA Corporation, or the like, may be used.

EXAMPLES

Hereinafter, the present invention will be described in detail based on Examples, Experimental Examples and Comparative Examples, but the present invention is not limited to the Examples and Experimental Examples below.

[Measurement Method Etc.]

The weight average molecular weight (Mw) and the number average molecular weight (Mn) of a polymer were measured by gel permeation chromatography (GPC) (manufacturer Tosho Corporation: HLC-8220 GPC) as a polystyrene equivalent weight average molecular weight and a polystyrene equivalent number average molecular weight. In addition, the sample to be measured was dissolved in tetrahydrofuran so that the concentration of the sample could become about 0.5% by mass and was injected into a GPC in an amount of 50 μL. Furthermore, tetrahydrofuran was used as a mobile phase for GPC, and the mobile phase was flowed at a flow rate of 0.5 mL/min. The structural analysis of a polymer was performed by $^1$H-NMR analysis using a 300 MHz NMR spectrometer manufactured by Varian, Inc. The measurement was performed by dissolving the sample in a deuterated solvent capable of dissolving the sample (a solvent in which hydrogen atoms in solvent molecules are substituted with deuterium atoms) so that the concentration of the sample could become 20 mg/mL.

The highest occupied molecular orbital (HOMO) energy of a polymer was obtained by measuring an ionization potential of the polymer and setting the obtained ionization potential to this orbital energy. Meanwhile, the lowest unoccupied molecular orbital (LUMO) energy was obtained by calculating an energy difference between the HOMO and the LUMO and setting the sum of the difference and the measured ionization potential to this orbital energy. For the measurement of the ionization potential, a photoelectron spectrometer (manufactured by Riken Keiki Co., Ltd.: AC-2) was used. The energy difference between the HOMO and the LUMO was obtained by measuring an absorption spectrum of the polymer using an ultraviolet, visible, and near-infrared spectrophotometer (manufactured by Varian, Inc.: Cary 5E) and from the absorption end thereof.

Reference Example 1

Synthesis of 2,7-dibromo-9,9-bis[3-ethoxycarbonyl-4-[2-[2-(2-methoxyethoxy)ethoxy]ethoxy]phenyl]-fluorene (compound A)

2,7-dibromo-9-fluorenone (52.5 g), ethyl salicylate (154.8 g), and mercaptoacetic acid (1.4 g) were charged into a 300 mL flask and the flask was purged with nitrogen. Methanesulfonic acid (630 mL) was added thereto and the resultant mixture was stirred at 75° C. overnight. The mixture was left to cool down and was charged into ice water and the resultant mixture was stirred for 1 hour. The resultant solid was filtered and was washed with heated acetonitrile. The washed solid was dissolved in acetone, and a solid was recrystallized from the resultant acetone solution and was filtered. The obtained solid (62.7 g), 2-[2-(2-methoxyethoxy)ethoxy]-p-toluenesulfonate (86.3 g), potassium carbonate (62.6 g), and 18-crown-6 (7.2 g) were dissolved in N,N-dimethylformamide (DMF) (670 mL) and the resultant solution was transferred into a flask, followed by stirring the solution at 105° C. overnight. The resultant mixture was left to cool down to room temperature and was charged into ice water, and the resultant mixture was stirred for 1 hour. Chloroform (300 mL) was added to the resultant reaction liquid, and the resultant mixture was subjected to solvent extraction, followed by concentrating the solution, thus obtaining 2,7-dibromo-9,9-bis[3-ethoxycarbonyl-4-[2-[2-(2-methoxyethoxy)ethoxy]ethoxy]phenyl]-fluorene (compound A) (51.2 g).

[Chem. 64]

Compound A

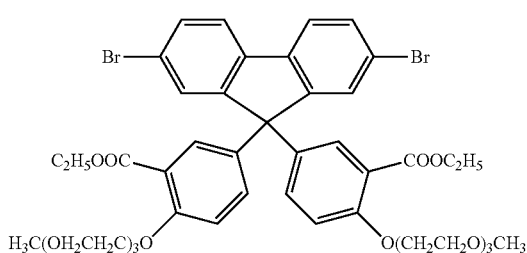

Reference Example 2

Synthesis of 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B)

Under nitrogen atmosphere, the compound A (15 g), bis(pinacolato)diboron (8.9 g), [1,1'-bis(diphenylphosphino)ferrocene]dichloropalladium (II) dichloromethane complex (0.8 g), 1,1'-bis(diphenylphosphino)ferrocene (0.5 g), potassium acetate (9.4 g), and dioxane (400 mL) were mixed, heated to 110° C., and refluxed under heating for 10 hours. The reaction liquid was left to cool down and was filtered, and the filtrate was concentrated under reduced pressure. The mixed solution was washed three times with methanol. The resultant residue was dissolved in toluene, and activated carbon was added to the solution, followed by stirring the mixture. Thereafter, the mixture was filtered and the filtrate was concentrated under reduced pressure, thus obtaining 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B) (11.7 g).

[Chem. 65]

Compound B

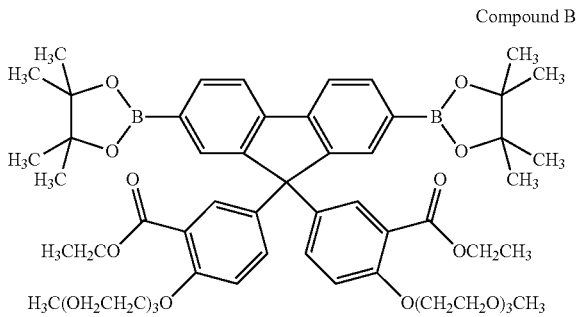

Reference Example 3

Synthesis of poly[9,9-bis[3-ethoxycarbonyl-4-[2-[2-(2-methoxyethoxy)ethoxy]ethoxy]phenyl]-fluorene] (polymer A)

Under an inert atmosphere, the compound A (0.55 g), the compound B (0.61 g), triphenylphosphine palladium (0.01 g), methyltrioctylammonium chloride (manufactured by Sigma-Aldrich Corporation, trade name Aliquat 336 (registered trade mark)) (0.20 g), and toluene (10 mL) were mixed and heated to 105° C. Into the reaction liquid, a 2 M aqueous solution of sodium carbonate (6 mL) was added dropwise and the resultant mixture was refluxed for 8 hours. To the reaction liquid, 4-t-butylphenylboronic acid (0.01 g) was added and the resultant mixture was refluxed for 6 hours. Then, an aqueous solution of sodium diethyldithiocarbamate (10 mL, concentration: 0.05 g/mL) was added and was stirred for 2 hours. The mixed solution was added dropwise into 300 mL of methanol and the resultant mixture was stirred for 1 hour. The deposited precipitate was filtered, dried under reduced pressure for 2 hours, and was dissolved in 20 mL of tetrahydrofuran. The resultant solution was added dropwise into a solvent mixture of 120 mL of methanol and 50 mL of a 3% by weight aqueous acetic acid solution and the resultant mixture was stirred for 1 hour. The deposited precipitate was filtered and was dissolved in 20 mL of tetrahydrofuran. The solution thus obtained was added dropwise into 200 mL of methanol and the resultant mixture was stirred for 30 minutes. The deposited precipitate was filtered to obtain a solid. The obtained solid was dissolved in tetrahydrofuran and was purified by passing the resultant solution through an alumina column and a silica gel column. The tetrahydrofuran solution collected from the column was concentrated and the concentrate was added dropwise to methanol (200 mL). The deposited solid was filtered and dried. The yield of the obtained poly[9,9-bis[3-ethoxycarbonyl-4-bis[2-[2-(2-methoxyethoxy)ethoxy]ethoxy]phenyl]-fluorene](polymer A (BSAFEGP)) was 520 mg.

The polystyrene equivalent number average molecular weight of the polymer A was $5.2 \times 10^4$. The polymer A is composed of a repeating unit represented by the formula (A).

[Chem. 66]

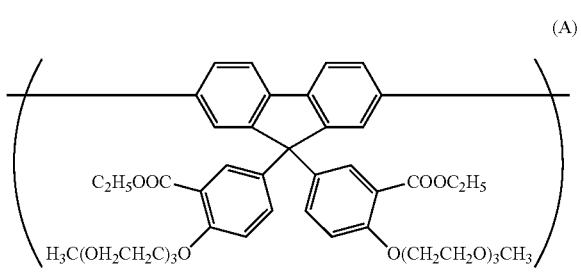

(A)

Experimental Example 1

Synthesis of Cesium Salt of Polymer A

The polymer A (200 mg) was charged into a 100 mL flask and the flask was purged with nitrogen. Thereto, tetrahydrofuran (20 mL) and ethanol (20 mL) were added and the temperature of the resultant mixture was elevated to 55° C. Thereto, an aqueous solution in which cesium hydroxide (200 mg) was dissolved in water (2 mL) was added and the resultant mixture was stirred at 55° C. for 6 hours. The resultant mixture was cooled down to room temperature and the reaction solvent was distilled off under reduced pressure. The resultant solid was washed with water and was dried under reduced pressure, thus obtaining a light yellow solid (150 mg). By the NMR spectrum thereof, it was confirmed that a signal attributed to an ethyl group at an ethyl ester moiety in the polymer A completely disappeared. The obtained cesium salt of the polymer A is termed the conjugated high-molecular compound 1.

The conjugated high-molecular compound 1 is composed of a repeating unit represented by the formula (B). In the conjugated high-molecular compound 1, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 100 mol %. The orbital energy of HOMO and the orbital energy of LUMO of the conjugated high-molecular compound 1 were −5.5 eV and −2.7 eV, respectively.

[Chem. 67]

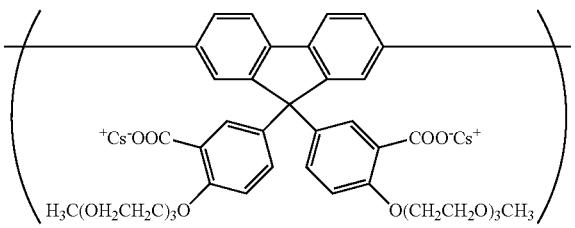

(B)

Experimental Example 2

Synthesis of Potassium Salt of Polymer A

The polymer A (200 mg) was charged into a 100 mL flask and the flask was purged with nitrogen. Thereto, tetrahydrofuran (20 mL) and methanol (10 mL) were added, an aqueous solution in which potassium hydroxide (400 mg) was dissolved in water (2 mL) was added to the mixed solution and the resultant mixture was stirred at 65° C. for 1 hours. 50 mL of methanol was added to the resultant reaction solution, and the resultant mixture was stirred at 65° C. for a further 4 hours. The resultant mixture was cooled down to room temperature and the reaction solvent was distilled off under reduced pressure. The resultant solid was washed with water and was dried under reduced pressure, thus obtaining a light yellow solid (131 mg). By the NMR spectrum thereof, it was confirmed that a signal attributed to an ethyl group at an ethyl ester moiety in the polymer A completely disappeared. The obtained potassium salt of the polymer A is termed the conjugated high-molecular compound 2.

The conjugated high-molecular compound 2 is composed of a repeating unit represented by the formula (C). In the conjugated high-molecular compound 2, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 100 mol %. The orbital energy of HOMO and the orbital energy of LUMO of the conjugated high-molecular compound 2 were −5.5 eV and −2.7 eV, respectively.

[Chem. 68]

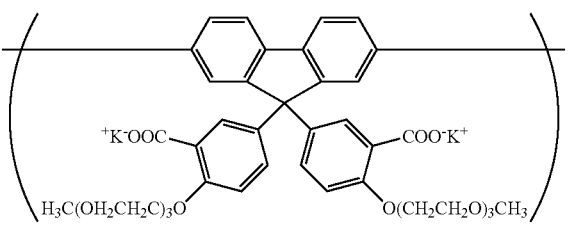

(C)

Experimental Example 3

Synthesis of Sodium Salt of Polymer A

The polymer A (200 mg) was charged into a 100 mL flask and the flask was purged with nitrogen. Thereto, tetrahydrofuran (20 mL) and methanol (10 mL) were added, an aqueous solution in which sodium hydroxide (260 mg) was dissolved in water (2 mL) was added to the mixed solution and the resultant mixture was stirred at 65° C. for 1 hours. 30 mL of methanol was added to the resultant reaction solution, and the resultant mixture was stirred at 65° C. for a further 4 hours. The resultant mixture was cooled down to room temperature and the reaction solvent was distilled off under reduced pressure. The resultant solid was washed with water and was dried under reduced pressure, thus obtaining a light yellow solid (123 mg). By the NMR spectrum thereof, it was confirmed that a signal attributed to an ethyl group at an ethyl ester moiety in the polymer A completely disappeared. The obtained sodium salt of the polymer A is termed the conjugated high-molecular compound 3.

The conjugated high-molecular compound 3 is composed of a repeating unit represented by the formula (D). In the conjugated high-molecular compound 3, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 100 mol %. The orbital energy of HOMO and the orbital energy of LUMO of the conjugated high-molecular compound 3 were −5.6 eV and −2.8 eV, respectively.

[Chem. 69]

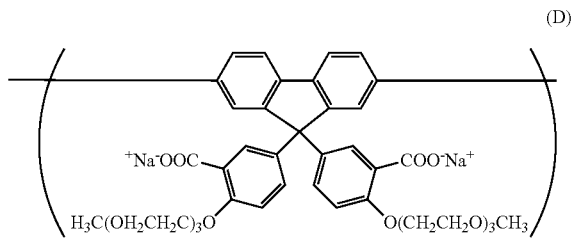

(D)

Experimental Example 4

Synthesis of Ammonium Salt of Polymer A

The polymer A (200 mg) was charged into a 100 mL flask and the flask was purged with nitrogen. Thereto, tetrahydrofuran (20 mL) and methanol (15 mL) were added, an aqueous solution in which tetramethylammonium hydroxide (50 mg) was dissolved in water (1 mL) was added to the mixed solution and the resultant mixture was stirred at 65° C. for 6 hours. An aqueous solution in which tetramethylammonium hydroxide (50 mg) was dissolved in water (1 mL) was added to the resultant reaction solution, and the resultant mixture was stirred at 65° C. for a further 4 hours. The resultant mixture was cooled down to room temperature and the reaction solvent was distilled off under reduced pressure. The resultant solid was washed with water and was dried under reduced pressure, thus obtaining a light yellow solid (150 mg). By the NMR spectrum thereof, it was confirmed that 90% of a signal attributed to an ethyl group at an ethyl ester moiety in the polymer A disappeared. The obtained ammonium salt of the polymer A is termed the conjugated high-molecular compound 4.

The conjugated high-molecular compound 4 is composed of a repeating unit represented by the formula (E). In the conjugated high-molecular compound 4, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 90 mol %. The orbital energy of HOMO and the orbital energy of LUMO of the conjugated high-molecular compound 4 were −5.6 eV and −2.8 eV, respectively.

[Chem. 70]

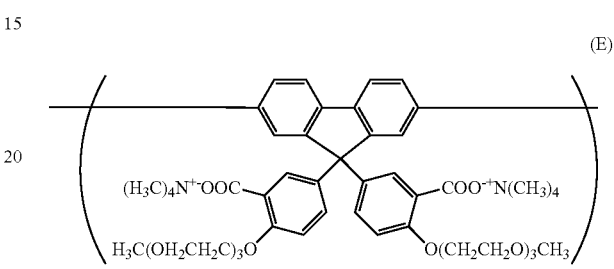

(E)

Reference Example 4

Synthesis of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (polymer B)

Under an inert atmosphere, the compound A (0.52 g), 2,7-bis(1,3,2-dioxaborolane-2-yl)-9,9-dioctylfluorene (1.29 g), triphenylphosphine palladium (0.0087 g), methyltrioctylammonium chloride (manufactured by Sigma-Aldrich Corporation, trade name Aliquat 336 (registered trade mark)) (0.20 g), toluene (10 mL) and 2 M of aqueous sodium carbonate solution (10 mL) were mixed and heated to 80° C. The reaction liquid was reacted for 3.5 hours. Thereafter, parabromotoluene (0.68 g) was added and the mixture was reacted for a further 2.5 hours. After the reaction, the reaction liquid was cooled down to room temperature and 50 ml of ethyl acetate/50 ml of distilled water were added thereto, and then the water layer was removed from the mixture. After adding 50 ml of distilled water to the mixture and removing the water layer again, magnesium sulfate as a desiccant was added to the mixture. Insoluble matter was filtered off and the organic solvent was removed from the mixture. Then, the residue thus obtained was dissolved again in 10 mL of THF. 2 mL of saturated sodium diethyldithiocarbamate water was added to the resultant solution. After stirring for 30 minutes, the organic solvent was removed. The resultant solution was allowed to pass through an alumina column (developing solvent hexane:ethyl acetate=1:1, v/v) for purification and the precipitate thus formed was filtered off and dried under reduced pressure for 12 hours to obtain 524 mg of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (polymer B).

The polystyrene equivalent number average molecular weight of the polymer B was $2.0 \times 10^3$. The polymer B is represented by the formula (F).

[Chem. 71]

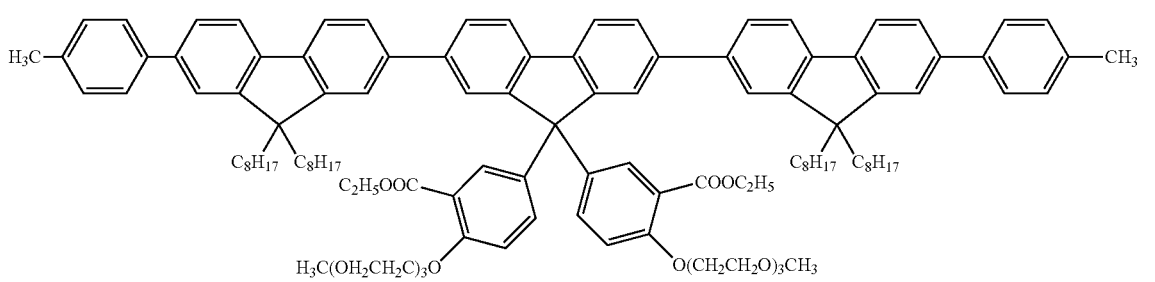

(F)

Experimental Example 5
Synthesis of Cesium Salt of Polymer B

The polymer B (262 mg) was charged into a 100 mL flask and the inside of the flask was purged with argon. Thereto, tetrahydrofuran (10 mL) and methanol (15 mL) were added and the temperature of the resultant mixture was elevated to 55° C. Thereto, an aqueous solution in which cesium hydroxide (341 mg) was dissolved in water (1 mL) was added and the resultant mixture was stirred at 55° C. for 5 hours. The resultant mixture was cooled down to room temperature and the reaction solvent was distilled off under reduced pressure. The resultant solid was washed with water and was dried under reduced pressure, thus obtaining a light yellow solid (250 mg). By the NMR spectrum thereof, it was confirmed that a signal attributed to an ethyl group at an ethyl ester moiety completely disappeared. The obtained cesium salt of the polymer B is termed the conjugated high-molecular compound 5.

The conjugated high-molecular compound 5 is represented by the formula (G). In the conjugated high-molecular compound 5, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 33.3 mol % after being rounded to one decimal place. The orbital energy of HOMO and the orbital energy of LUMO of the conjugated high-molecular compound 5 were −5.6 eV and −2.6 eV, respectively.

[Chem. 72]

t-butyl-2,6-dimethylphenyl)1,4-phenylenediamine (35 mg), triphenylphosphine palladium (8 mg), methyltrioctylammonium chloride (manufactured by Sigma-Aldrich Corporation, trade name Aliquat 336 (registered trade mark)) (0.20 g), and toluene (10 mL) were mixed and heated to 105° C. Into the reaction liquid, a 2 M aqueous solution of sodium carbonate (6 mL) was added dropwise and the resultant mixture was refluxed for 8 hours. To the reaction liquid, phenylboronic acid (0.01 g) was added and the resultant mixture was refluxed for 6 hours. Then, an aqueous solution of sodium diethyldithiocarbamate (10 mL, concentration: 0.05 g/mL) was added and was stirred for 2 hours. The mixed solution was added dropwise into 300 mL of methanol and the resultant mixture was stirred for 1 hour. The deposited precipitate was filtered off, dried under reduced pressure for 2 hours, and was dissolved in 20 mL of tetrahydrofuran. The solution thus obtained was added dropwise into a solvent mixture of 120 ml of methanol and 50 mL of a 3% by weight aqueous acetic acid solution and the resultant mixture was stirred for 1 hour. The deposited precipitate was then filtered and was dissolved in 20 ml of tetrahydrofuran. The solution thus obtained was added dropwise into 200 ml of methanol and the resultant mixture was stirred for 30 minutes. The deposited precipitate was filtered to obtain a solid. The obtained solid was dissolved in tetrahydrofuran and was purified by passing the resultant solution through an alumina column and a silica gel column. The tetrahydrofuran solution collected from the column was concentrated and the concentrate was added dropwise into methanol (200 mL). The deposited solid was filtered and dried. The yield of the obtained polymer C was 526 mg.

The polystyrene equivalent number average molecular weight of the polymer C was $3.6 \times 10^4$. The polymer C is composed of a repeating unit represented by the formula (H).

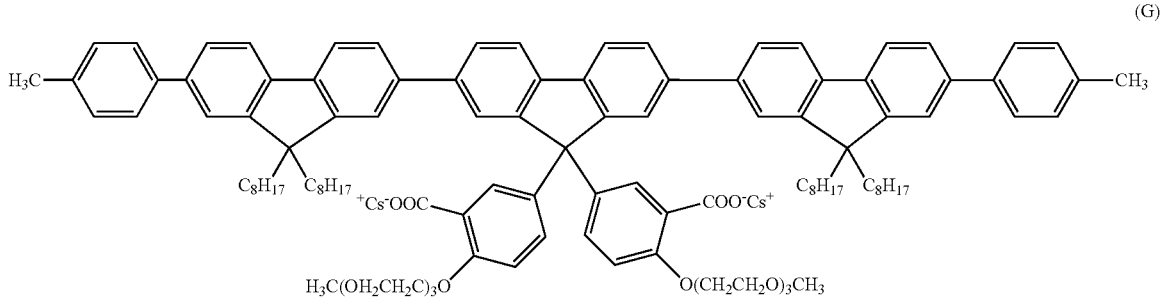

(G)

Reference Example 5
Synthesis of Polymer C

Under an inert atmosphere, the compound A (0.40 g), the compound B (0.49 g), N,N'-bis(4-bromophenyl)-N,N'-bis(4-

In addition, N,N'-bis(4-bromophenyl)-N,N'-bis(4-t-butyl-2,6-dimethylphenyl)1,4-phenylenediamine may be synthesized by the method described in JP 2008-74917A, for example.

[Chem. 73]

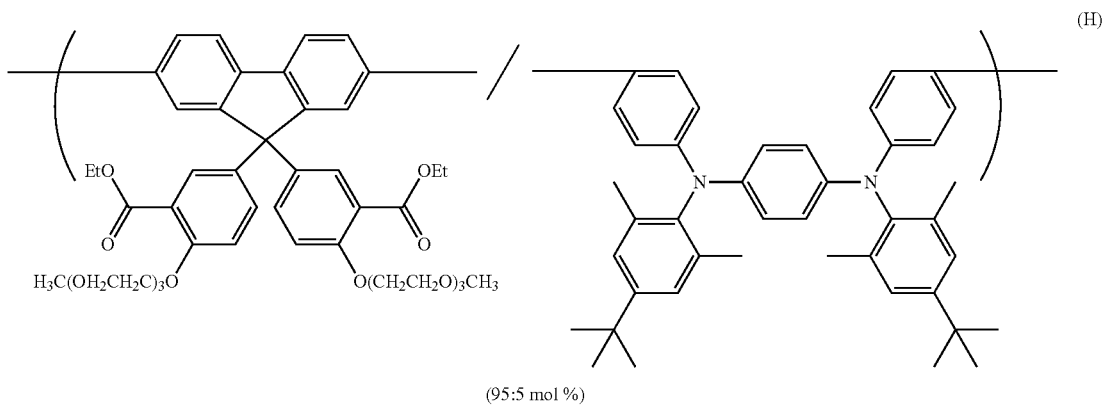

(95:5 mol %)

Experimental Example 6

Synthesis of Cesium Salt of Polymer C

The polymer C (200 mg) was charged into a 100 mL flask and the flask was purged with nitrogen. Thereto, tetrahydrofuran (20 mL) and methanol (20 mL) were added and then mixed. An aqueous solution in which cesium hydroxide (200 mg) was dissolved in water (2 mL) was added to the mixed solution and the resultant mixture was stirred at 65° C. for 1 hours. 30 mL of methanol was added to the resultant reaction solution, and the resultant mixture was stirred at 65° C. for a further 4 hours. The resultant mixture was cooled down to room temperature and the reaction solvent was distilled off under reduced pressure. The resultant solid was washed with water and was dried under reduced pressure, thus obtaining a light yellow solid (150 mg). By the NMR spectrum thereof, it was confirmed that a signal attributed to an ethyl group at an ethyl ester moiety in the polymer C completely disappeared. The obtained cesium salt of the polymer C is termed the conjugated high-molecular compound 6.

The conjugated high-molecular compound 6 is composed of a repeating unit represented by the formula (I). In the conjugated high-molecular compound 6, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 95 mol %. The orbital energy of HOMO and the orbital energy of LUMO of the conjugated high-molecular compound 6 were −5.3 eV and −2.6 eV, respectively.

[Chem. 74]

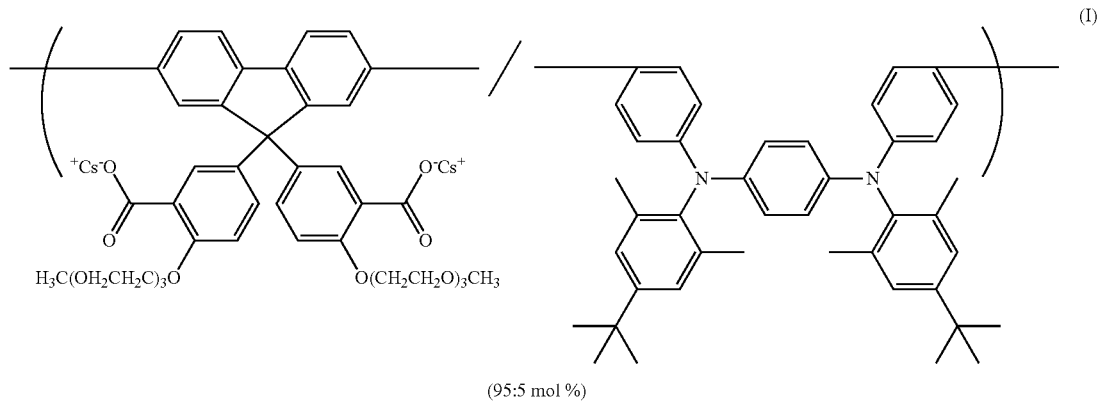

(95:5 mol %)

Reference Example 6

Synthesis of Polymer D

Under an inert atmosphere, the compound A (0.55 g), the compound B (0.67 g), N,N'-bis(4-bromophenyl)-N,N'-bis(4-t-butyl-2,6-dimethylphenyl) 1,4-phenylenediamine (0.038 g), 3,7-dibromo-N-(4-n-butylphenyl)phenoxazine (0.009 g), triphenylphosphine palladium (0.01 g), methyltrioctylammonium chloride (manufactured by Sigma-Aldrich Corporation, trade name Aliquat 336 (registered trade mark)) (0.20 g), and toluene (10 mL) were mixed and heated to 105° C. Into the reaction liquid, a 2 M aqueous solution of sodium carbonate (6 mL) was added dropwise and the resultant mixture was refluxed for 2 hours. To the reaction liquid, phenylboronic acid (0.004 g) was added and the resultant mixture was refluxed for 6 hours. Then, an aqueous solution of sodium diethyldithiocarbamate (10 mL, concentration: 0.05 g/mL) was added and was stirred for 2 hours. The mixed solution was added dropwise into 300 mL of methanol and the resultant mixture was stirred for 1 hour. The deposited precipitate was filtered, dried under reduced pressure for 2 hours, and was dissolved in 20 ml of tetrahydrofuran. The solution thus obtained was added dropwise into a solvent mixture of 120 ml of methanol and 50 mL of a 3% by weight aqueous acetic acid solution and the resultant mixture was stirred for 1 hour. The deposited precipitate was then filtered and was dissolved in 20 ml of tetrahydrofuran. The solution thus obtained was added dropwise into 200 ml of methanol and the resultant mixture was stirred for 30 minutes. The deposited precipitate was filtered to obtain a solid. The obtained solid was dissolved in tetrahydrofuran and was purified by passing the resultant solution through an alumina column and a silica gel column. The tetrahydrofuran solution recovered from the column was concentrated and the concentrate was added dropwise into methanol (200 mL). The deposited solid was filtered and dried. The yield of the obtained polymer D was 590 mg.

The polystyrene equivalent number average molecular weight of the polymer C was $2.7 \times 10^4$. The polymer D is composed of a repeating unit represented by the formula (J).

In addition, 3,7-dibromo-N-(4-n-butylphenyl)phenoxazine was synthesized based on the method described in JP 2007-70620A (alternatively, with reference to JP 2004-137456A).

Experimental Example 7

Synthesis of Cesium Salt of Polymer D

The polymer D (200 mg) was charged into a 100 mL flask and the flask was purged with nitrogen. Thereinto, tetrahydrofuran (15 mL) and methanol (10 mL) were mixed. An aqueous solution in which cesium hydroxide (360 mg) was dissolved in water (2 mL) was added to the mixed solution and the resultant mixture was stirred at 65° C. for 3 hours. 10 mL of methanol was added to the resultant reaction solution, and the resultant mixture was stirred at 65° C. for a further 4 hours. The resultant mixture was cooled down to room temperature and the reaction solvent was distilled off under reduced pressure. The resultant solid was washed with water and was dried under reduced pressure, thus obtaining a light yellow solid (210 mg). By the NMR spectrum thereof, it was confirmed that a signal attributed to an ethyl group at an ethyl ester moiety in the polymer D completely disappeared. The obtained cesium salt of the polymer D is termed the conjugated high-molecular compound 7. The conjugated high-molecular compound 7 is composed of a repeating unit represented by the formula (K) ("a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 90 mol %). The orbital energy of HOMO and the orbital energy of LUMO of the conjugated high-molecular compound 7 were −5.3 eV and −2.4 eV, respectively.

[Chem. 75]

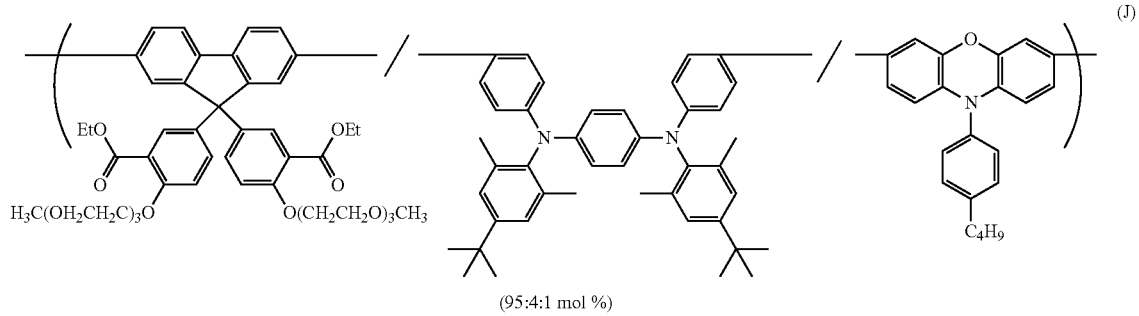

(J)

(95:4:1 mol %)

[Chem. 76]

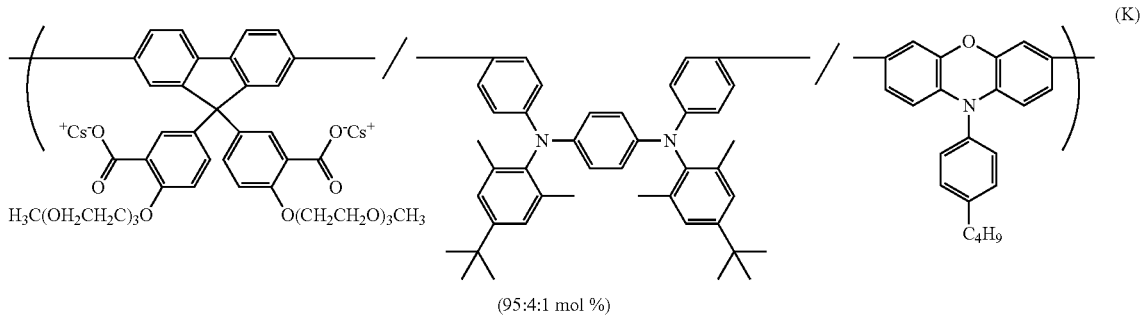

(K)

(95:4:1 mol %)

Reference Example 7

Synthesis of Polymer E

Under an inert atmosphere, the compound A (0.37 g), the compound B (0.82 g), 1,3-dibromobenzene (0.09 g), triphenylphosphine palladium (0.01 g), methyltrioctylammonium chloride (manufactured by Sigma-Aldrich Corporation, trade name Aliquat 336 (registered trade mark)) (0.20 g), and toluene (10 mL) were mixed and heated to 105° C. Into the reaction liquid, a 2 M aqueous solution of sodium carbonate (6 mL) was added dropwise and the resultant mixture was refluxed for 7 hours. To the reaction liquid, phenylboronic acid (0.002 g) was added and the resultant mixture was refluxed for 10 hours. Then, an aqueous solution of sodium diethyldithiocarbamate (10 mL, concentration: 0.05 g/mL) was added and was stirred for 1 hours. The mixed solution was added dropwise into 300 mL of methanol and the resultant mixture was stirred for 1 hour. The deposited precipitate was filtered, dried under reduced pressure for 2 hours, and was dissolved in 20 ml of tetrahydrofuran. The solution thus obtained was added dropwise into a solvent mixture of 120 ml of methanol and 50 mL of a 3% by weight aqueous acetic acid solution and the resultant mixture was stirred for 1 hour. The deposited precipitate was then filtered and was dissolved in 20 ml of tetrahydrofuran. The solution thus obtained was added dropwise into 200 ml of methanol and the resultant mixture was stirred for 30 minutes. The deposited precipitate was filtered to obtain a solid. The obtained solid was dissolved in tetrahydrofuran and was purified by passing the resultant solution through an alumina column and a silica gel column. The tetrahydrofuran solution recovered from the column was concentrated and the concentrate was added dropwise into methanol (200 mL). The deposited solid was filtered and dried. The yield of the obtained polymer E was 293 mg.

The polystyrene equivalent number average molecular weight of the polymer E was $1.8 \times 10^4$. The polymer E is composed of a repeating unit represented by the formula (L).

Experimental Example 8

Synthesis of Cesium Salt of Polymer E

The polymer E (200 mg) was charged into a 100 mL flask and the flask was purged with nitrogen. Thereinto, tetrahydrofuran (10 mL) and methanol (5 mL) were mixed. An aqueous solution in which cesium hydroxide (200 mg) was dissolved in water (2 mL) was added to the mixed solution and the resultant mixture was stirred at 65° C. for 2 hours. 10 mL of methanol was added to the resultant reaction solution, and the resultant mixture was stirred at 65° C. for a further 5 hours. The resultant mixture was cooled down to room temperature and the reaction solvent was distilled off under reduced pressure. The resultant solid was washed with water and was dried under reduced pressure, thus obtaining a light yellow solid (170 mg). By the NMR spectrum thereof, it was confirmed that a signal attributed to an ethyl group at an ethyl ester moiety in the polymer E completely disappeared. The obtained cesium salt of the polymer E is termed the conjugated high-molecular compound 8.

The conjugated high-molecular compound 8 is composed of a repeating unit represented by the formula (M). In the conjugated high-molecular compound 8, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 75 mol %. The orbital energy of HOMO and the orbital energy of LUMO of the conjugated high-molecular compound 8 were −5.6 eV and −2.6 eV, respectively.

[Chem. 77]

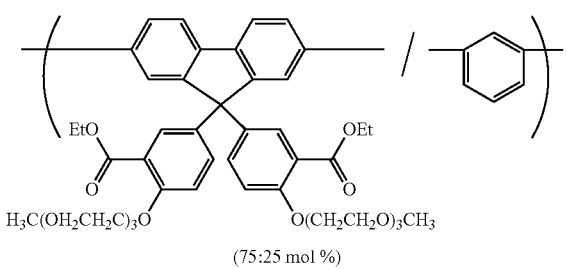

(L)

(75:25 mol %)

[Chem. 78]

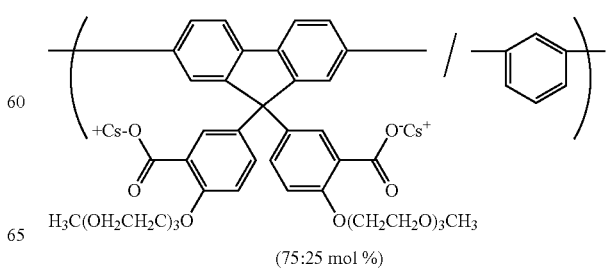

(M)

(75:25 mol %)

Reference Example 8

Synthesis of Polymer F

Under an inert atmosphere, the compound B (1.01 g), 1,4-dibromo-2,3,5,6-tetrafluorobenzene (0.30 g), triphenylphosphine palladium (0.02 g), methyltrioctylammonium chloride (manufactured by Sigma-Aldrich Corporation, trade name Aliquat 336 (registered trade mark)) (0.20 g), and toluene (10 mL) were mixed and heated to 105° C. Into the reaction liquid, a 2 M aqueous solution of sodium carbonate (6 mL) was added dropwise and the resultant mixture was refluxed for 4 hours. To the reaction liquid, phenylboronic acid (0.002 g) was added and the resultant mixture was refluxed for 4 hours. Then, an aqueous solution of sodium diethyldithiocarbamate (10 mL, concentration: 0.05 g/mL) was added and was stirred for 1 hours. The mixed solution was added dropwise into 300 mL of methanol and the resultant mixture was stirred for 1 hour. The deposited precipitate was filtered, dried under reduced pressure for 2 hours, and was dissolved in 20 ml of tetrahydrofuran. The solution thus obtained was added dropwise into a solvent mixture of 120 ml of methanol and 50 mL of a 3% by weight aqueous acetic acid solution and the resultant mixture was stirred for 1 hour. The deposited precipitate was then filtered and was dissolved in 20 ml of tetrahydrofuran. The solution thus obtained was added dropwise into 200 ml of methanol and the resultant mixture was stirred for 30 minutes. The deposited precipitate was filtered to obtain a solid. The obtained solid was dissolved in a solvent mixture of tetrahydrofuran/ethyl acetate (1/1 (volume ratio)) and was purified by passing the resultant solution through an alumina column and a silica gel column. The tetrahydrofuran solution recovered from the column was concentrated and the concentrate was added dropwise into methanol (200 mL). The deposited solid was filtered and dried. The yield of the obtained polymer F was 343 mg.

The polystyrene equivalent number average molecular weight of the polymer F was $6.0 \times 10^4$. The polymer F is composed of a repeating unit represented by the formula (N).

[Chem. 79]

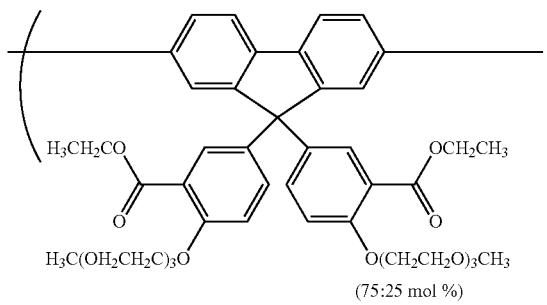

(N)

(75:25 mol %)

Experimental Example 9

Synthesis of Cesium Salt of Polymer F

The polymer F (150 mg) was charged into a 100 mL flask and the flask was purged with nitrogen. Thereinto, tetrahydrofuran (10 mL) and methanol (5 mL) were mixed. An aqueous solution in which cesium hydroxide (200 mg) was dissolved in water (2 mL) was added to the mixed solution and the resultant mixture was stirred at 65° C. for 2 hours. 10 mL of methanol was added to the resultant reaction solution, and the resultant mixture was stirred at 65° C. for a further 5 hours. The resultant mixture was cooled down to room temperature and the reaction solvent was distilled off under reduced pressure. The resultant solid was washed with water and was dried under reduced pressure, thus obtaining a light yellow solid (130 mg). By the NMR spectrum thereof, it was confirmed that a signal attributed to an ethyl group at an ethyl ester moiety in the polymer F completely disappeared. The obtained cesium salt of the polymer F is termed the conjugated high-molecular compound 9.

The conjugated high-molecular compound 9 is composed of a repeating unit represented by the formula (O). In the conjugated high-molecular compound 9, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 75 mol %. The orbital energy of HOMO and the orbital energy of LUMO of the conjugated high-molecular compound 9 were −5.9 eV and −2.8 eV, respectively.

[Chem. 80]

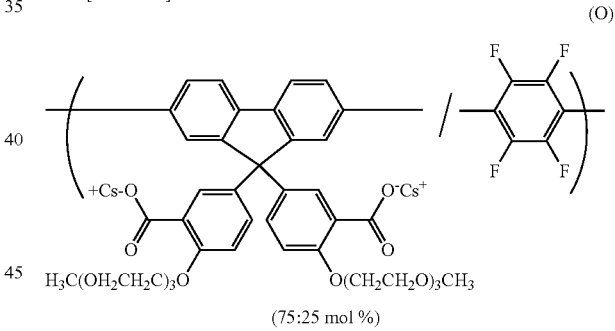

(O)

(75:25 mol %)

Reference Example 9

Under an inert atmosphere, 2-[2-(2-methoxyethoxy)ethoxy]-p-toluenesulfonate (11.0 g), triethylene glycol (30.0 g), and potassium hydroxide (3.3 g) were mixed. The resultant mixture was stirred at 100° C. under heating for 18 hours. The reaction mixture was cooled down and then added to water (100 mL). The resultant mixture was subjected to solvent extraction using chloroform and the resultant solution was concentrated. The concentrate was subjected to Kugelrohr distillation (10 mm Torr, 180° C.) to obtain 2-(2(2-(2-(2-methoxyethoxy)-ethoxy)-ethoxy)-ethoxy)ethoxy)ethanol (6.1 g).

Reference Example 10

Under an inert atmosphere, 2-(2-(2-(2-(2-(2-methoxyethoxy)-ethoxy)-ethoxy)-ethoxy)-ethoxy)ethanol (8.0 g), sodium hydroxide (1.4 g), distilled water (2 mL), and tetrahydrofuran (2 mL) were mixed and the resultant mixture was cooled with ice. A solution of p-tosyl chloride (5.5 g) in tetrahydrofuran (6.4 mL) was added dropwise over 30 minutes to the reaction mixture. After completion of the dropwise addition, the reaction mixture was heated to room temperature and stirred for 15 hours. Distilled water (50 mL) was added to the reaction mixture, followed by neutralization with 6 M sulfuric acid. The neutralized solution was subjected to solvent extraction using chloroform. The resultant solution was concentrated to obtain 2-(2-(2-(2-(2-(2-methoxyethoxy)-ethoxy)-ethoxy)-ethoxy)-ethoxy)p-toluenesulfonate (11.8 g).

Reference Example 11

Synthesis of 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (compound C)

2,7-dibromo-9-fluorenone (127.2 g), ethyl salicylate (375.2 g), and mercaptoacetic acid (3.5 g) were charged into a 300 mL flask and the flask was purged with nitrogen. Methanesulfonic acid (1420 mL) was added thereto and the resultant mixture was stirred at 75° C. over a night. The mixture was left to cool down and was charged into ice water and the resultant mixture was stirred for 1 hour. The resultant solid was filtered and was washed with heated acetonitrile. The washed solid was dissolved in acetone, and a solid was recrystallized from the resultant acetone solution and was filtered to obtain a solid (167.8 g).

The obtained solid (5 g), 2-(2-(2-(2-(2-(2-methoxyethoxy)-ethoxy)-ethoxy)-ethoxy)-ethoxy)p-toluenesulfonate (10.4 g), potassium carbonate (5.3 g), and 18-crown-6 (0.6 g) were dissolved in N,N-dimethylformamide (DMF) (100 mL) and the resultant solution was transferred into a flask, followed by stirring the solution at 105° C. for 4 hours. The resultant mixture was left to cool down to room temperature and was charged into ice water, and the resultant mixture was stirred for 1 hour. Chloroform (300 mL) was added to the resultant reaction liquid, and the resultant mixture was subjected to solvent extraction, followed by concentrating the solution. The concentrate was dissolved in ethyl acetate. The resultant solution was allowed to pass through an alumina column and the solution was concentrated to obtain 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (compound C) (4.5 g).

[Chem. 81]

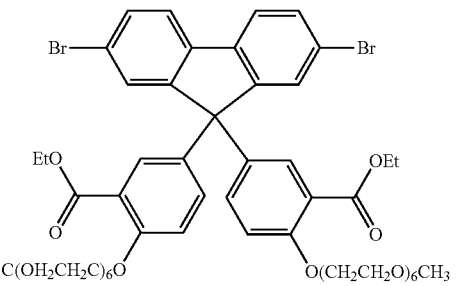

Compound C

Reference Example 12

Synthesis of Polymer G

Under an inert atmosphere, the compound C (1.0 g), 4-t-butylphenylbromide (0.9 mg), 2,2'-bipyridine (0.3 g), and dehydrated tetrahydrofuran (50 mL) were placed in a 200 mL flask and mixed. After heating the resultant mixture to 55° C., bis(1,5-cyclooctadiene)nickel (0.6 g) was added. The resultant mixture was stirred at 55° C. for 5 hours. After cooling down to room temperature, the reaction mixture was added dropwise to a mixture of methanol (200 mL) and 1 N dilute hydrochloric acid (200 mL). The precipitate thus formed was recovered by filtration and re-dissolved in tetrahydrofuran. The resultant solution was added dropwise to a mixture of methanol (200 mL) and 15% aqueous ammonia (100 mL). The precipitate thus formed was collected by filtration. The precipitate was re-dissolved in tetrahydrofuran. The resultant solution was added dropwise to a mixture of methanol (200 mL) and water (100 mL). The precipitate thus formed was collected by filtration. The precipitate thus collected was dried under reduced pressure to obtain a polymer G (360 mg). The polystyrene equivalent number average molecular weight of the polymer G was $6.0 \times 10^4$. The polymer G is composed of a repeating unit represented by the formula (P).

[Chem. 82]

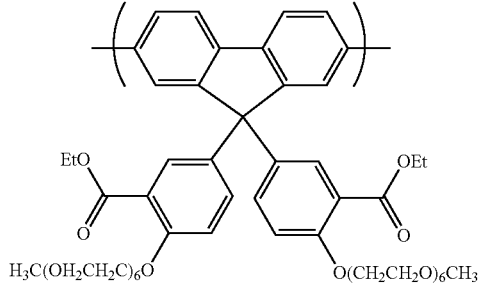

(P)

Experimental Example 10

Synthesis of Cesium Salt of Polymer G

The polymer G (150 mg) was charged into a 100 mL flask and the flask was purged with nitrogen. Thereinto, tetrahydrofuran (15 mL) and methanol (5 mL) were mixed. An aqueous solution in which cesium hydroxide (170 mg) was dissolved in water (2 mL) was added to the mixed solution and the resultant mixture was stirred at 65° C. for 6 hours. The resultant mixture was cooled down to room temperature and the reaction solvent was distilled off under reduced pressure. The resultant solid was washed with water and was dried under reduced pressure, thus obtaining a light yellow solid (95 mg). By the NMR spectrum thereof, it was confirmed that a signal attributed to an ethyl group at an ethyl ester moiety in the polymer G completely disappeared. The obtained cesium salt of the polymer G is termed the conjugated high-molecular compound 10.

The conjugated high-molecular compound 10 is composed of a repeating unit represented by the formula (Q). In the conjugated high-molecular compound 10, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 100 mol %. The orbital energy of HOMO and the orbital energy of LUMO of the conjugated high-molecular compound 10 were −5.7 eV and −2.9 eV, respectively.

[Chem. 83]

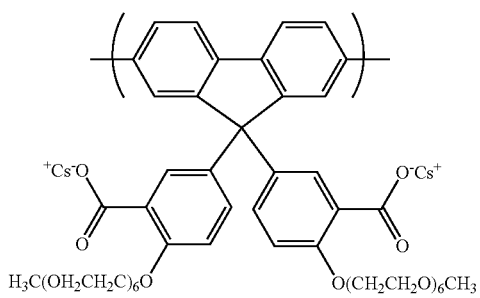

Reference Example 13

Synthesis of 1,3-dibromo-5-ethoxycarbonyl-6-[2-[2-(2-methoxyethoxy)ethoxy]ethoxy]benzene Under an inert atmosphere, 3,5-dibromosalicylic acid (20 g), ethanol (17 mL), concentrated sulfuric acid (1.5 mL), and toluene (7 mL) were mixed. The resultant mixture was stirred at 130° C. under heating for 20 hours. The reaction mixture was cooled down and then added to ice water (100 mL). The mixture was subjected to solvent extraction using chloroform, followed by concentration. The solid thus obtained was dissolved in isopropanol and the solution was added dropwise to distilled water. The precipitate thus formed was filtered to obtain a solid (18 g). Under an inert atmosphere, the resultant solid (1 g), 2-[2-(2-methoxyethoxy)ethoxy]p-toluenesulfonate (1.5 g), potassium carbonate (0.7 g), and DMF (15 mL) were mixed. The resultant mixture was stirred at 100° C. under heating for 4 hours. The reaction mixture was cooled down, and then subjected to solvent extraction using chloroform. The resultant solution was concentrated. The concentrate was dissolved in chloroform and was purified by passing the resultant solution through a silica gel column. The resultant solution was concentrated to obtain 1,3-dibromo-5-ethoxycarbonyl-6-[2-[2-(2-methoxyethoxy)ethoxy]ethoxy]benzene (1.0 g).

Reference Example 14

Synthesis of Polymer H

Under an inert atmosphere, the compound A (0.2 g), the compound B (0.5 g), 1,3-dibromo-5-ethoxycarbonyl-6-[2-[2-(2-methoxyethoxy)ethoxy]ethoxy]benzene (0.1 g), triphenylphosphine palladium (30 mg), tetrabutylammonium bromide (4 mg), and toluene (19 mL) were mixed. The resultant mixture was heated to 105° C. A 2 M aqueous solution (5 mL) of sodium carbonate was added dropwise to the reaction mixture, followed by refluxing for 5 hours. Phenylboronic acid (6 mg) was added to the reaction mixture and the mixture was refluxed for 14 hours. Then, an aqueous solution (10 mL, concentration: 0.05 g/mL) of sodium diethyldithiocarbamate was added and the mixture was stirred for 2 hours. After removing the water layer, the organic layer was washed with distilled water and concentrated. The solid thus obtained by concentration was dissolved in chloroform and was purified by passing the resultant solution through an alumina column and silica gel column. The effluent from the column was concentrated, followed by drying. The yield of the polymer H thus obtained was 0.44 g.

The polystyrene equivalent number average molecular weight of the polymer H was $3.6 \times 10^4$. The polymer H is composed of a repeating unit represented by the formula (R).

[Chem. 84]

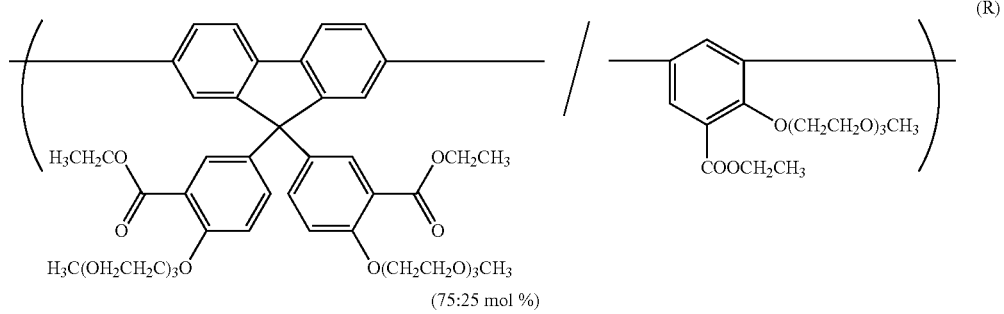

(75:25 mol %)

Experimental Example 11

Synthesis of Cesium Salt of Polymer H

The polymer H (200 mg) was charged into a 100 mL flask and the flask was purged with nitrogen. Thereto, tetrahydrofuran (14 mL) and methanol (7 mL) were added and mixed. An aqueous solution in which cesium hydroxide (90 mg) was dissolved in water (1 mL) was added to the mixed solution and the resultant mixture was stirred at 65° C. for 1 hours. 5 mL of methanol was added to the resultant reaction solution and the resultant mixture was stirred at 65° C. for a further 4 hours. The resultant mixture was cooled down to room temperature and the reaction solvent was distilled off under reduced pressure. The resultant solid was washed with water and was dried under reduced pressure, thus obtaining a light yellow solid (190 mg). By the NMR spectrum thereof, it was confirmed that a signal attributed to an ethyl group at an ethyl ester moiety in the polymer H completely disappeared. The obtained cesium salt of the polymer H is termed the conjugated high-molecular compound 11.

The conjugated high-molecular compound 11 is composed of a repeating unit represented by the formula (S). In the conjugated high-molecular compound 2, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 100 mol %. The orbital energy of HOMO and the orbital energy of LUMO of the conjugated high-molecular compound 11 were −5.6 eV and −2.8 eV, respectively.

[Chem. 85]

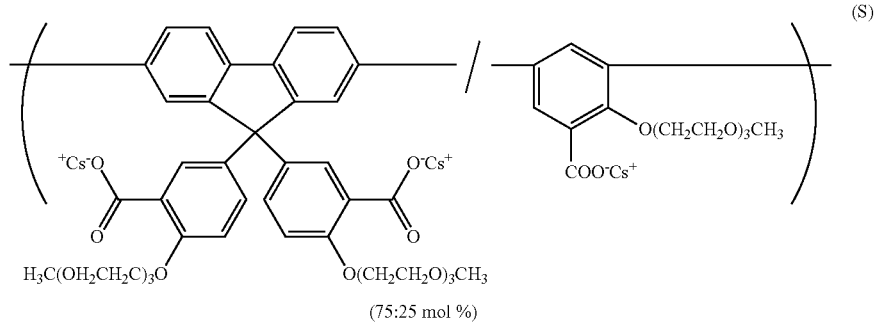

(S)

(75:25 mol %)

Reference Example 15

Synthesis of 2,7-dibromo-9,9-bis[3,4-bis[2-[2-(2-methoxyethoxy)ethoxy]ethoxy]-5-methoxycarbonylphenyl]fluorene (compound D)

2,7-dibromo-9-fluorenone (34.1 g), methyl 2,3-dihydroxybenzoate (101.3 g), and mercaptoacetic acid (1.4 g) were charged into a 500 mL flask, and the flask was purged with nitrogen. Methanesulfonic acid (350 mL) was added and the resultant mixture was stirred at 90° C. for 19 hours. The reaction mixture was cooled down and then added to ice water, followed by stirring for 1 hour. The resultant solid was recovered by filtration and washed with heated acetonitrile. The solid thus washed was dissolved in acetone. A solid was recrystallized from the acetone solution and recovered by filtration. The resultant solid (16.3 g), 2-[2-(2-methoxyethoxy)ethoxy]p-toluenesulfonate (60.3 g), potassium carbonate (48.6 g), and 18-crown-6 (2.4 g) were dissolved in N,N-dimethylformamide (DMF) (500 mL). The resultant solution was transferred to a flask and stirred at 110° C. for 15 hours. The mixture thus obtained was cooled down to room temperature and added to ice water, followed by stirring for 1 hour. The reaction mixture was subjected to solvent extraction using ethyl acetate (300 mL). The solution thus obtained was concentrated. The concentrate was dissolved in a chloroform/methanol (50/1 (volume ratio)) mixed solvent. The resultant solution was allowed to pass a silica gel column for purification. The solution allowed to pass through the column was then concentrated to obtain 2,7-dibromo-9,9-bis[3,4-bis[2-[2-(2-methoxyethoxy)ethoxy]ethoxy]-5-methoxycarbonylphenyl]fluorene (compound D) (20.5 g).

Reference Example 16

Synthesis of 2,7-bis[7-(4-methylphenyl)-9,9-dioctylfluoren-2-yl]-9,9-bis[5-methoxycarbonyl-3,4-bis[2-[2-(2-methoxyethoxy)ethoxy]ethoxy]phenyl]-fluorene (polymer I)

Under an inert atmosphere, the compound D (0.70 g), 2-(4,4,5,5-tetramethyl-1,2,3-dioxaboran-2-yl)-9,9-dioctylfluorene (0.62 g), triphenylphosphine palladium (0.019 g), dioxane (40 mL), water (6 mL), and an aqueous potassium carbonate solution (1.38 g) were mixed. The resultant mixture was heated to 80° C. The reaction mixture was reacted for 1 hour. After completion of the reaction, 5 mL of aqueous solution of saturated sodium diethyldithiocarbamate was added, followed by stirring for 30 minutes. The organic solvent was then removed from the reaction mixture. The resultant solid was allowed to pass through an alumina column (developing solvent hexane:ethyl acetate=1:1 (volume ratio)) for purification and the effluent from the column was concentrated to obtain 660 mg of 2,7-bis[7-(4-methylphenyl)-9,9-dioctylfluoren-2-yl]-9,9-bis[3-ethoxycarbonyl-4-[2-[2-(2-methoxyethoxy)ethoxy]ethoxy]phenyl]-fluorene (polymer I).

The polystyrene equivalent number average molecular weight of the polymer I was $2.0 \times 10^3$. The polymer I is represented by the formula (T).

In addition, 2-(4,4,5,5-tetramethyl-1,2,3-dioxaboran-2-yl)-9,9-dioctylfluorene can be synthesized, for example, by the method described in The Journal of Physical Chemistry B 2000, 104, 9118-9125.

[Chem. 86]

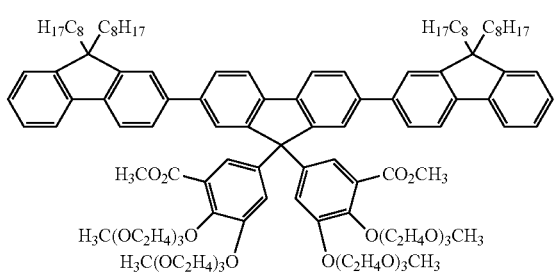

(T)

Experimental Example 12

Synthesis of Cesium Salt of Polymer I

The polymer I (236 mg) was charged into a 100 mL flask and the inside of the flask was purged with argon. Thereto, tetrahydrofuran (20 mL) and methanol (10 mL) were added and the temperature of the resultant mixture was elevated to 65° C. Thereto, an aqueous solution in which cesium hydroxide (240 mg) was dissolved in water (2 mL) was added and the resultant mixture was stirred at 65° C. for 7 hours. The resultant mixture was cooled down to room temperature and the reaction solvent was distilled off under reduced pressure. The resultant solid was washed with water and was dried under reduced pressure, thus obtaining a light yellow solid (190 mg). By the NMR spectrum thereof, it was confirmed that a signal attributed to an ethyl group at an ethyl ester moiety completely disappeared. The obtained cesium salt of the polymer I is termed the conjugated high-molecular compound 12.

The conjugated high-molecular compound 12 is composed of a repeating unit represented by the formula (U). In the conjugated high-molecular compound 12, "a proportion of a repeating unit containing one or more types of groups selected from the group consisting of the group represented by the formula (1) and the group represented by the formula (2) and one or more types of groups represented by the formula (3), based on the total repeating units" and "a proportion of repeating units represented by the formulae (13), (15), (17) and (20), based on the total repeating units" are each 33.3 mol % after being rounded to one decimal place. The orbital energy of HOMO and the orbital energy of LUMO of the conjugated high-molecular compound 12 were −5.6 eV and −2.8 eV, respectively.

Example 1

Fabrication of Organic EL Element

A glass substrate of which an ITO thin film had been formed on one surface was prepared. The ITO thin film corresponds to an anode of the organic EL element and the thickness thereof is 45 nm. On the substrate, the ITO thin film was patterned into a shape corresponding to a light-emitting area and a wiring shape for discharging electrodes, in advance. The glass substrate on which the ITO thin film was formed was immersed in acetone and washed by ultrasonic vibrations. The glass substrate was taken out of acetone and acetone thereof was dried at room temperature. Subsequently, the surface of the ITO thin film was subjected to ozone cleaning with UV irradiation.

Next, in the atmospheric air, a coating material for hole injection layer was applied onto the ITO thin film by a spin coat method to form a film, thus obtaining a coating film for hole injection layer having a thickness of 60 nm. As the coating material for hole injection layer, a PEDOT:PSS solution (poly(3,4-ethylenedioxythiophene)polystyrenesulfonic acid, product name: "Baytron") manufactured by Stark V TECH K.K. was used. Subsequently, in the atmospheric air, the coating film for forming a hole injection layer was dried on a hot plate at 200° C. for 10 minutes to form a hole injection layer.

Next, the high-molecular compound a was dissolved in a mixed solvent (a solvent consisting of anisole and cyclohexylbenzene in a weight ratio of 1:1) to obtain a coating material for forming a hole transport layer in which the concentration of the high-molecular compound a was 0.5% by weight. The coating material was applied onto the hole injection layer by a spin coat method in the atmospheric air, and then the mixed solvent was dried under a vacuum atmosphere, thus obtaining a hole transport layer having a film thickness of 20 nm. In addition, under nitrogen atmosphere, the glass substrate was heated on a hot plate at 180° C. for 30 minutes to remove the mixed solvent.

Next, the high-molecular compound b was dissolved in a mixed solvent (a solvent consisting of anisole and cyclohexylbenzene in a weight ratio of 1:1) to obtain a coating material for a light-emitting layer in which the concentration of the high-molecular compound b was 1.0% by weight. The coating material was applied onto the hole transport layer by a spin coat method in the atmospheric air, and then the mixed solvent was dried under a vacuum atmosphere, thus obtaining

[Chem. 87]

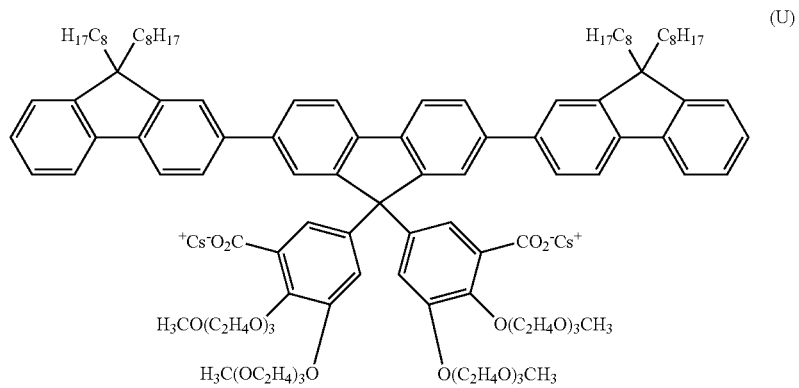

(U)

a light-emitting layer having a thickness of 65 nm. In addition, under nitrogen atmosphere, the glass substrate was heated on a hot plate at 180° C. for 30 minutes to remove the mixed solvent.

Next, the conjugated high-molecular compound 1 synthesized above was dissolved to a concentration of 0.2% by weight in methanol to obtain a coating material for an electron injection layer. The coating material was applied onto a light-emitting layer by a spin coat method in the atmospheric air, thus obtaining a coating film for an electron injection layer having a thickness of 10 nm. Subsequently, in the atmospheric air, the glass substrate was heated on a hot plate at 130° C. for 10 minutes to obtain an electron injection layer.

Next, a conductive coating material (manufactured by Fujikura Kasei K.K., Dodite: D-550) was applied onto the electron injection layer by using a metallic spatula to form a film. Thereafter, in order to remove a solvent contained in the coating film, in the atmospheric air, the glass substrate was heated on a hot plate at 90° C. for 10 minutes to obtain a cathode consisting of a silver filler and an acrylic resin. The sheet resistance of the cathode was 2 Ω/sq. In this way, a layered structure was fabricated on the glass substrate.

The glass substrate having the layered structure formed thereon and a glass substrate with a seal material were press-bonded so as to interpose the seal material therebetween, thus fabricating an organic EL element.

When a voltage of 15 V was applied between the anode and the cathode of the organic EL element obtained, it was confirmed that the organic EL element emitted light.

Experimental Example 13

Fabrication of Organic EL Element

A hole injection material solution was applied on an ITO anode (thickness: 45 nm), which had been formed into a film formation pattern on the surface of a glass substrate, to form a hole injection layer by a spin coat method such that the hole injection layer had a thickness of 60 nm. The glass substrate having the hole injection layer formed thereon was heated at 200° C. for 10 minutes under an inert atmosphere (under nitrogen atmosphere) to insolubilize the hole injection layer. The resultant substrate was naturally cooled down to room temperature to obtain a substrate having the hole injection layer formed thereon.

Here, as the solution of hole injection material, a PEDOT: PSS solution (poly(3,4-ethylenedioxythiophene)polystyrenesulfonic acid, product name: "Baytron") manufactured by Starck-V TECH Ltd. was used.

Next, the hole transport high-molecular material and xylene were mixed to obtain a composition for forming a hole transport layer, which contained 0.7% by weight of the hole transport high-molecular material.

Herein, the hole transport high-molecular material was synthesized using the following method. 2,7-bis(1,3,2-dioxyborol)-9,9-di(1-octyl)fluorene (3.863 g, 7.283 mmol), N,N-di(p-bromophenyl)-N-(4-(butan-2-yl)phenyl)amine (3.177 g, 6.919 mmol) and di(4-bromophenyl)benzocyclobutane-amine (156.3 mg, 0.364 mmol) were added in a 1 L three-necked round-bottom flask equipped with a reflux condenser and an overhead stirrer. Then, methyltrioctylammonium chloride (manufactured by Sigma-Aldrich Corporation, trade name Aliquat 336 (registered trade mark)) (2.29 g) and 50 mL of toluene were added successively. After addition of $PdCl_2$ $(PPh_3)_2$ (4.9 mg), the resultant mixture was stirred in an oil bath at 105° C. for 15 minutes. An aqueous sodium carbonate solution (2.0 M, 14 mL) was added and the resultant mixture was stirred in an oil bath at 105° C. for 16.5 hours. Then, phenylboronic acid (0.5 g) was added and the resultant mixture was stirred for 7 hours. The water layer was removed and the organic layer was washed with 50 mL of water. The organic layer was returned to the reaction flask and 0.75 g of sodium diethyldithiocarbamate and 50 mL of water were added. The mixture thus obtained was stirred in an oil bath at 85° C. for 16 hours. The water layer was removed. The organic layer was washed three times with 100 mL of water, and then allowed to pass through a silica gel column and a basic alumina column. Toluene was used as an eluent and the polymer-containing toluene solution thus eluted was collected. Then, the toluene solution thus collected was poured in methanol to precipitate the polymer. The polymer thus precipitated was dissolved in toluene again and the toluene solution thus obtained was poured in methanol to precipitate the polymer again. The polymer thus precipitated was dried in a vacuum at 60° C. to obtain 4.2 g of a hole transport high-molecular material. According to the gel permeation chromatography, the polystyrene equivalent weight average molecular weight of the hole transport high-molecular material obtained was $1.24 \times 10^5$ and the molecular weight distribution index (Mw/Mn) thereof was 2.8.

On the hole injection layer of the substrate having the above-obtained hole injection layer formed thereon, the composition for forming a hole transport layer was applied by a spin coat method, thus obtaining a coating film having a film thickness of 20 nm. The substrate having the coating film formed thereon was heated at 190° C. for 20 minutes under an inert atmosphere (under nitrogen atmosphere) to insolubilize the coating film and then naturally cooled down to room temperature to obtain a substrate having the hole transport layer formed thereon.

Next, a light-emitting high-molecular material (manufactured by Sumation Co., Ltd., "Lumation BP361") and xylene were mixed to obtain a composition for forming a light-emitting layer, which contains 1.4% by weight of the light-emitting high-molecular material. On the hole transport layer of the substrate having the above-obtained hole transport layer formed thereon, the composition for forming a light-emitting layer was applied by a spin coat method, thus obtaining a coating film having a film thickness of 80 nm. The substrate having the coating film formed thereon was heated at 130° C. for 15 minutes under an inert atmosphere (under nitrogen atmosphere) to dry off the solvent and then naturally cooled down to room temperature, thus obtaining a substrate on which a light-emitting layer was formed.

Next, methanol and the conjugated high-molecular compound 1 were mixed to obtain a composition, which contained 0.2% by weight of the conjugated high-molecular compound 1. On the light-emitting layer of the substrate having the above-obtained light-emitting layer, the composition was applied by a spin coat method, thus obtaining a coating film having a film thickness of 10 nm. The substrate having the coating film formed thereon was heated at 130° C. for 10 minutes under an inert atmosphere of normal pressure (under nitrogen atmosphere) to dry off the solvent and then naturally cooled down to room temperature, thus obtaining a substrate on which an electron injection layer containing the conjugated high-molecular compound 1 was formed.

The substrate having the layer containing the conjugated high-molecular compound 1 obtained was inserted in a vacuum apparatus and a cathode was formed on the layer by depositing an 80 nm thick Al layer by a vacuum deposition method. In so doing, a layered structure 1 was fabricated.

The layered structure 1 thus fabricated was taken out from the vacuum apparatus and sealed with a sealing glass and a two-pack mixing type epoxy resin under an inert atmosphere (under nitrogen atmosphere) to obtain an organic EL element 1.

Experimental Example 14

An organic EL element 2 was obtained in a manner similar to Experimental Example 13, except that the conjugated high-molecular compound 2 was used instead of the conjugated high-molecular compound 1 in Experimental Example 13.

Experimental Example 15

An organic EL element 3 was obtained in a manner similar to Experimental Example 13, except that instead of mixing methanol and the conjugated high-molecular compound 1 to obtain a composition containing 0.2% by weight of the conjugated high-molecular compound 1 in Experimental Example 13, methanol, water, and the conjugated high-molecular compound 3 were mixed (a methanol/water volume ratio=20/1) to obtain a composition containing 0.2% by weight of the conjugated high-molecular compound 3.

Experimental Example 16

An organic EL element 4 was obtained in a manner similar to Experimental Example 13, except that the conjugated high-molecular compound 4 was used instead of the conjugated high-molecular compound 1 in Experimental Example 13.

Experimental Example 17

An organic EL element 5 was obtained in a manner similar to Experimental Example 13, except that the conjugated high-molecular compound 5 was used instead of the conjugated high-molecular compound 1 in Experimental Example 13.

Experimental Example 18

An organic EL element 6 was obtained in a manner similar to Experimental Example 13, except that the conjugated high-molecular compound 6 was used instead of the conjugated high-molecular compound 1 in Experimental Example 13.

Experimental Example 19

An organic EL element 7 was obtained in a manner similar to Experimental Example 13, except that the conjugated high-molecular compound 7 was used instead of the conjugated high-molecular compound 1 in Experimental Example 13.

Experimental Example 20

An organic EL element 8 was obtained in a manner similar to Experimental Example 13, except that the conjugated high-molecular compound 8 was used instead of the conjugated high-molecular compound 1 in Experimental Example 13.

Experimental Example 21

An organic EL element 9 was obtained in a manner similar to Experimental Example 13, except that the conjugated high-molecular compound 9 was used instead of the conjugated high-molecular compound 1 in Experimental Example 13.

Experimental Example 22

An organic EL element 10 was obtained in a manner similar to Experimental Example 13, except that the conjugated high-molecular compound 10 was used instead of the conjugated high-molecular compound 1 in Experimental Example 13.

Experimental Example 23

An organic EL element 11 was obtained in a manner similar to Experimental Example 13, except that the conjugated high-molecular compound 11 was used instead of the conjugated high-molecular compound 1 in Experimental Example 13.

Experimental Example 24

An organic EL element 12 was obtained in a manner similar to Experimental Example 13, except that the conjugated high-molecular compound 12 was used instead of the conjugated high-molecular compound 1 in Experimental Example 13.

Experimental Example 25

An organic EL element 13 was obtained in a manner similar to Experimental Example 13, except that instead of mixing methanol and the conjugated high-molecular compound 1 to obtain a composition containing 0.2% by weight of the conjugated high-molecular compound 1 in Experimental Example 13, methanol, the conjugated high-molecular compound 1, Al-doped ZnO nanoparticles (product of Sigma-Aldrich Co.) were mixed to obtain a composition.

Experimental Example 26

An organic EL element 14 was obtained in a manner similar to Experimental Example 13, except that instead of mixing methanol and the conjugated high-molecular compound 1 to obtain a composition containing 0.2% by weight of the conjugated high-molecular compound 1 in Experimental Example 13, methanol, the conjugated high-molecular compound 1, and a low molecular compound (3,5-bis(4-t-butylphenyl)-4-phenyl-4H-1,2,4-triazole, product of Sigma-Aldrich Co.) were mixed to obtain a composition containing 0.2% by weight of the conjugated high-molecular compound 1 and 0.2% by weight of the low molecular compound.

Experimental Example 27

An organic EL element 15 was obtained in a manner similar to Experimental Example 13, except that Ag was used instead of Al in Experimental Example 13.

Experimental Example 28

An organic EL element 16 was obtained in a manner similar to Experimental Example 13, except that Au was used instead of Al in Experimental Example 13.

[Measurement of Organic EL Elements 1 to 16]

A forward voltage of 10 V was applied to each of the organic EL elements 1 to 16 obtained above to measure the luminance and the luminous efficiencies. The results are shown in Table 1.

TABLE 1

| | High-molecular compound | Cathode | Luminance (cd/m$^2$) | Luminous Efficiency (cd/A) |
|---|---|---|---|---|
| Experimental Example 13 (Organic EL Element 1) | Conjugated high-molecular compound 1 | Al | 31652 | 7.9 |
| Experimental Example 14 (Organic EL Element 2) | Conjugated high-molecular compound 2 | Al | 22664 | 7.2 |
| Experimental Example 15 (Organic EL Element 3) | Conjugated high-molecular compound 3 | Al | 16673 | 6.3 |
| Experimental Example 16 (Organic EL Element 4) | Conjugated high-molecular compound 4 | Al | 20748 | 7.7 |
| Experimental Example 17 (Organic EL Element 5) | Conjugated high-molecular compound 5 | Al | 33254 | 9.1 |
| Experimental Example 18 (Organic EL Element 6) | Conjugated high-molecular compound 6 | Al | 25496 | 8.0 |
| Experimental Example 19 (Organic EL Element 7) | Conjugated high-molecular compound 7 | Al | 33984 | 8.8 |
| Experimental Example 20 (Organic EL Element 8) | Conjugated high-molecular compound 8 | Al | 28114 | 7.9 |
| Experimental Example 21 (Organic EL Element 9) | Conjugated high-molecular compound 9 | Al | 10212 | 5.3 |
| Experimental Example 22 (Organic EL Element 10) | Conjugated high-molecular compound 10 | Al | 12308 | 6.5 |
| Experimental Example 23 (Organic EL Element 11) | Conjugated high-molecular compound 11 | Al | 14927 | 6.5 |
| Experimental Example 24 (Organic EL Element 12) | Conjugated high-molecular compound 12 | Al | 17735 | 6.1 |
| Experimental Example 25 (Organic EL Element 13) | Conjugated high-molecular compound 1 + ZnO Al | Al | 10773 | 6.9 |
| Experimental Example 26 (Organic EL Element 14) | Conjugated high-molecular compound 1 + Low molecular compound 1 | Al | 19610 | 6.8 |
| Experimental Example 27 (Organic EL Element 15) | Conjugated high-molecular compound 1 | Ag | 18300 | 7.1 |
| Experimental Example 28 (Organic EL Element 16) | Conjugated high-molecular compound 1 | Au | 3579.5 | 3.1 |

Experimental Example 29

Synthesis of Compound E

Under nitrogen atmosphere, 2,7-dibromo-9-fluorenone (92.0 g, 272 mmol) and diethyl ether (3.7 L) were mixed and cooled down to 0° C. A 1 mol/L methylmagnesium iodide-diethyl ether solution (0.5 L, 545 mmol) was added dropwise thereto and the resultant mixture was stirred for 3 hours. An aqueous solution of ammonium chloride was added to the reaction mixture to remove the water layer, and the organic layer was dried with anhydrous sodium sulfate and concentrated under reduced pressure. The crude product thus obtained was purified by silica gel column chromatography, thus obtaining a compound E (92.81 g, 262 mmol, and yield 96%).

[Chem. 88]

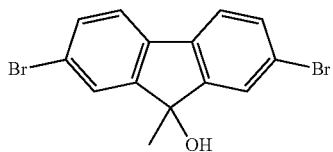

Compound E

Synthesis of Compound F

Under nitrogen atmosphere, the compound E (83.0 g, 234 mmol), p-toluenesulfonic acid monohydrate (4.49 g, 23.6 mmol) and chloroform (2.5 L) were refluxed for 1 hour. An aqueous solution of ammonium chloride was added to the reaction mixture to remove the water layer. The organic layer was dried with anhydrous sodium sulfate and concentrated under reduced pressure. A compound F was obtained (73.6 g, 219 mmol, and yield 93%).

[Chem. 89]

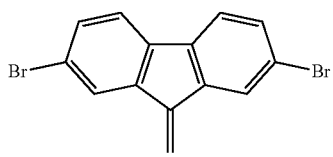

Compound F

Synthesis of Compound G

Under nitrogen atmosphere, the compound F (70.0 g, 208 mmol), ethyl salicylate (104 g, 625 mmol), mercaptoacetic acid (4.20 g, 45.6 mmol) and methanesulfonic acid (1214 g) were stirred at 70° C. for 8 hours. The reaction mixture was added dropwise to ice water, and the deposited solid was recovered by filtration and washed with methanol. The crude product thus obtained was purified by a silica gel column chromatography, thus obtaining a compound G (52.14 g, 104 mmol, and yield 50%).

[Chem. 90]

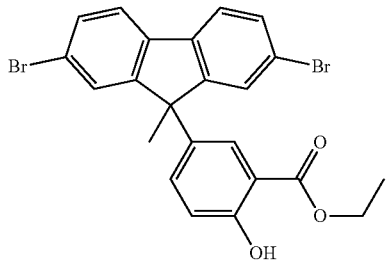

Compound G

Synthesis of Compound H

Under nitrogen atmosphere, the compound G (41.2 g, 82.0 mmol), 2-[2-(2-methoxyethoxy)ethoxy]-ethyl-p-toluene-sulfonate (75.8 g, 238 mmol), dimethylformamide (214 g), potassium carbonate (54.4 g, 394 mmol) and 18-crown-6 (4.68 g, 18 mmol) were stirred at 105° C. for 2 hours, and the reaction mixture was added to water to extract using ethyl acetate. The organic layer was dried with anhydrous sodium sulfate and concentrated under reduced pressure. The crude product thus obtained was purified by a silica gel column chromatography, thus obtaining a compound H (40.2 g, 62.0 mmol, and yield 76%). The $^1$H NMR measurement result of the compound H was as follows.

$^1$H NMR (400 MHz, CDCl$_3$, rt)

δ (ppm) 1.37 (3H), 1.84 (3H), 3.36 (3H), 3.53 (2H), 3.58-3.79 (6H), 3.73 (2H), 4.12 (2H), 4.34 (2H), 6.80 (1H), 6.90 (1H), 7.28 (2H), 7.48 (2H), 7.58 (2H), 7.70 (1H).

[Chem. 91]

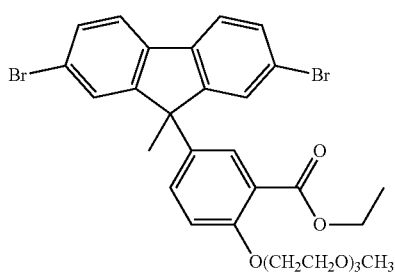

Compound H

Synthesis of Compound I

Under nitrogen atmosphere, the compound H (28.4 g, 43.8 mmol), bis(pinacolato)diboron (24.30 g, 95.7 mmol), [1,1'-bis(diphenylphosphino)ferrocene]dichloropalladium (II) dichloromethane adduct (0.35 g, 0.4 mmol), 1,1'-bis(diphenylphosphino)ferrocene (0.24 g, 0.4 mmol), potassium acetate (25.60 g, 260 mmol) and 1,4-dioxane (480 mL) were stirred at 120° C. for 17 hours. The reaction mixture was filtered and washed with ethyl acetate. The filtrate was concentrated under reduced pressure and purified by a silica gel column chromatography, and then was recrystallized for purification, thus obtaining a compound I (18.22 g, 24.5 mmol, and yield 56%). The $^1$H NMR measurement result of the compound I was as follows.

$^1$H NMR (400 MHz, CDCl$_3$, rt)

δ (ppm) 1.30-1.47 (27H), 1.88 (3H), 3.35 (3H), 3.53 (2H), 3.60-3.69 (4H), 3.73 (2H), 3.84 (2H), 4.10 (2H), 4.34 (2H), 6.74 (1H), 6.87 (1H), 7.58 (2H), 7.72-7.89 (5H).

[Chem. 92]

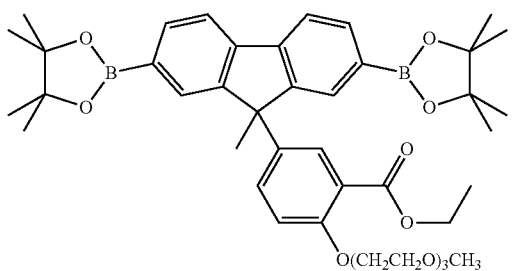

Compound I

Synthesis of Polymer J

Under argon atmosphere, the compound H (0.47 g), the compound I (0.48 g), dichlorobis(triphenylphosphine)palladium (0.6 mg), tetrabutylammonium bromide (6 mg), toluene (6 mL) and 2 mol/L aqueous solution of sodium carbonate (2 mL) were stirred at 105° C. for 6 hours. Then, phenylboronic acid (35 mg) was added thereto and stirred at 105° C. for 14 hours. Sodium diethyldithiocarbamate trihydrate (0.65 g) and water (13 mL) were added to the reaction mixture and stirred at 80° C. for 2 hours. The resultant mixture was added dropwise to methanol. The deposited precipitate was recovered by filtration and dried. The obtained solid was dissolved in chloroform and was purified by an alumina chromatography and a silica gel chromatography. The effluent was added dropwise to methanol and the deposited precipitate was recovered by filtration and dried, thus obtaining a polymer J (0.57 g).

The polystyrene equivalent number average molecular weight of the polymer J was 2.0×10$^4$. The polymer J is composed of a structural unit represented by the formula (V).

[Chem. 93]

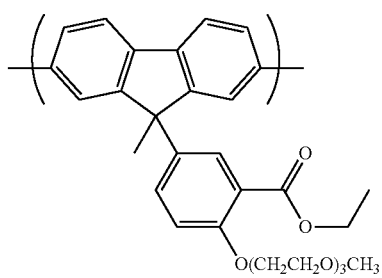

(V)

Synthesis of Cesium Salt of Polymer J

Under argon atmosphere, the polymer J (0.20 g), THF (18 mL), methanol (9 mL), cesium hydroxide monohydrate (97 mg) and water (1 mL) were stirred at 65° C. for 2 hours. Then, methanol (52 mL) was added thereto and stirred at 65° C. for 6 hours. The reaction mixture was concentrated and dried. Methanol was added to the solid and the resultant mixture was filtered. The filtrate was added dropwise to isopropanol and the solid was recovered by filtration and dried, thus obtaining a cesium salt of the polymer J (0.20 g). The obtained cesium salt of the polymer J is called a conjugated high-molecular compound 13.

The conjugated high-molecular compound 13 is composed of a structural unit represented by the formula (W). The orbital energy of HOMO and the orbital energy of LUMO of the conjugated high-molecular compound 13 were −5.51 eV and −2.64 eV, respectively.

[Chem. 94]

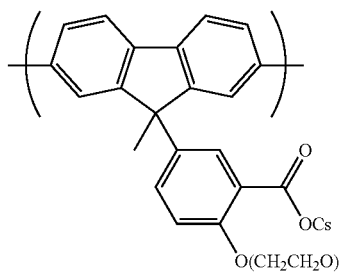

(W)

Preparation of Composition A

The conjugated high-molecular compound 13 (2 mg) and cesium hydroxide monohydrate (0.2 mg) were mixed to obtain a composition A, which was composed of the conjugated high-molecular compound 13 and cesium hydroxide.

(Fabrication of Electroluminescent Element 17)

A hole injection material solution was applied on an ITO anode (thickness: 45 nm), which had been formed into a film formation pattern on the surface of a glass substrate, to form a hole injection layer by a spin coat method such that the hole injection layer had a thickness of 60 nm. The glass substrate having the hole injection layer formed thereon was heated at 200° C. for 10 minutes under an inert atmosphere (under nitrogen atmosphere) to insolubilize the hole injection layer. The resultant substrate was naturally cooled down to room temperature to obtain a substrate having the hole injection layer formed thereon.

Here, as the hole injection material solution, AQ-1200, which is a sulfonated polythiophene-based hole injection material available from Plextronics, was used.

Next, the hole transport high-molecular material and xylene were mixed to obtain a composition for forming a hole transport layer containing 0.7% by weight of hole transport high-molecular material.

Herein, the hole transport high-molecular material was synthesized using the following method. Under an inert gas atmosphere, 2,7-dibromo-9,9-di(octyl)fluorene (1.4 g), 2,7-bis(4,4,5,5-tetramethyl-1,3,2-dioxaborolan-2-yl)-9,9-di(octyl)fluorene (6.4 g), N,N-bis(4-bromophenyl)-N',N'-bis(4-butylphenyl)-1,4-phenylenediamine (4.1 g), bis(4-bromophenyl)benzocyclobutaneamine (0.6 g), tetraethylammonium hydroxide (1.7 g), palladium acetate (4.5 mg), tri(2-methoxyphenyl)phosphine (0.03 g) and toluene (100 mL) were mixed. The resultant mixture was heated and stirred at 100° C. for 2 hours. Then, phenylboronic acid (0.06 g) was added and the resultant mixture was stirred for 10 hours. The resultant mixture was left to cool down and then the water layer was removed. An aqueous solution of sodium diethyldithiocarbamate was added thereto and stirred and then the water layer was removed. The organic layer was washed with water and 3% by weight of acetic acid hydrate. The organic layer was poured into methanol to precipitate the polymer. Thereafter, the polymer filtered was dissolved in toluene again and then allowed to pass through a silica gel column and an alumina column. The eluted toluene solution containing the polymer was collected and the toluene solution thus collected was poured in methanol to precipitate the polymer. The polymer thus precipitated was filtered and then dried in a vacuum at 50° C. to obtain a hole transport high-molecular material. The polystyrene equivalent weight average molecular weight of the hole transport high-molecular material was $3.0\times10^5$.

On the hole injection layer of the substrate having the above-obtained hole injection layer formed thereon, the composition for forming a hole transport layer was applied by a spin coat method, thus obtaining a coating film having a thickness of 20 nm. The substrate having the coating film formed thereon was heated at 180° C. for 60 minutes under an inert atmosphere (under nitrogen atmosphere) to insolubilize the coating film and then naturally cooled down to room temperature to obtain a substrate having the hole transport layer formed thereon.

Next, a light-emitting high-molecular material and xylene were mixed to obtain a composition for forming a light-emitting layer, which contains 1.4% by weight of the light-emitting high-molecular material.

Herein, the light-emitting high-molecular material was synthesized using the following method. Under an inert gas atmosphere, 2,7-dibromo-9,9-di(octyl)fluorene (9.0 g), N,N'-bis(4-bromophenyl)-N,N'-bis(4-tert-butyl-2,6-dimethylphenyl)1,4-phenylenediamine (1.3 g), 2,7-bis(4,4,5,5-tetramethyl-1,3,2-dioxaborolan-2-yl)-9,9-di(4-hexylphenyl)fluorene (13.4 g), tetraethylammonium hydroxide (43.0 g), palladium acetate (8 mg), tri(2-methoxyphenyl)phosphine (0.05 g) and toluene (200 mL) were mixed. The resultant mixture was heated and stirred at 90° C. for 8 hours. Then, phenylboronic acid (0.22 g) was added and the resultant mixture was stirred for 14 hours. The resultant mixture was left to cool down and then the water layer was removed. An aqueous solution of sodium diethyldithiocarbamate was added thereto and stirred and then the water layer was removed. The organic layer was washed with water and 3% by weight of acetic acid hydrate. The organic layer was poured in methanol to precipitate the polymer. Thereafter, the polymer filtered was dissolved in toluene again and then allowed to pass through a silica gel column and an alumina column. The eluted toluene solution containing the polymer was collected and the toluene solution thus collected was poured in methanol to precipitate the polymer. The polymer thus precipitated was dried in a vacuum at 50° C. to obtain a light-emitting high-molecular material (12.5 g). According to the gel permeation chromatography, the polystyrene equivalent weight average molecular weight of the light-emitting high-molecular material obtained was $3.1\times10^5$.

On the hole transport layer of the substrate having the above-obtained hole transport layer formed thereon, the composition for forming a light-emitting layer was applied by a spin coat method, thus obtaining a coating film having a thickness of 80 nm. The substrate having the coating film formed thereon was heated at 130° C. for 10 minutes under an inert atmosphere (under nitrogen atmosphere) to dry off the solvent and then naturally cooled down to room temperature, thus obtaining a substrate on which a light-emitting layer was formed.

Next, methanol and the composition A were mixed to obtain a solution containing 0.2% by weight of the composition A. On the light-emitting layer of the substrate having the above-obtained light-emitting layer formed thereon, the solution was applied by a spin coat method, thus obtaining a coating film having a thickness of 10 nm. The substrate having the coating film formed thereon was heated at 130° C. for 10 minutes under an inert atmosphere (under nitrogen atmosphere) to dry off the solvent and then naturally cooled down to room temperature, thus obtaining a substrate on which a layer containing the composition A was formed.

The substrate having the layer containing the composition A obtained above was inserted in a vacuum apparatus and a cathode was formed on the layer by depositing an 80 nm thick Al layer by a vacuum deposition method. In so doing, a layered structure 29 was fabricated.

The layered structure 29 thus fabricated was taken out from the vacuum apparatus and sealed with a sealing glass and a two-pack mixing type epoxy resin under an inert atmosphere (under nitrogen atmosphere) to obtain an electroluminescent element 17.

Experimental Example 30

Synthesis of Compound J

Under nitrogen atmosphere, 2,7-dibromo-9,9-bis(3,4-dihydroxy)-fluorene (138.4 g), 2-[2-(2-methoxyethoxy)ethoxy]-ethyl-p-toluenesulfonate (408.6 g), potassium carbonate (358.5 g) and acetonitrile (2.5 L) were mixed and refluxed under heating for 3 hours. The resultant mixture was left to cool down and then the reaction mixture was filtered. The filtrate was concentrated under reduced pressure and purified by a silica gel column chromatography, thus obtaining a compound J (109.4 g).

[Chem. 95]

Compound J

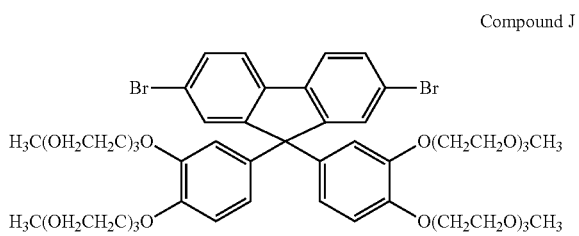

Synthesis of Compound K

Under nitrogen atmosphere, the compound J (101.2 g), bis(pinacolato)diboron (53.1 g), [1,1'-bis(diphenylphosphino)ferrocene]dichloropalladium (II) dichloromethane complex (3.7 g), 1,1'-bis(diphenylphosphino)ferrocene (5.4 g), potassium acetate (90.6 g) and dioxane (900 mL) were mixed. The resultant mixture was heated at 110° C. and refluxed under heating for 8 hours. The resultant mixture was left to cool down and then the reaction liquid was filtered. The filtrate was concentrated under reduced pressure and purified by a silica gel column chromatography, thus obtaining a compound K (51.4 g).

[Chem. 96]

Compound K

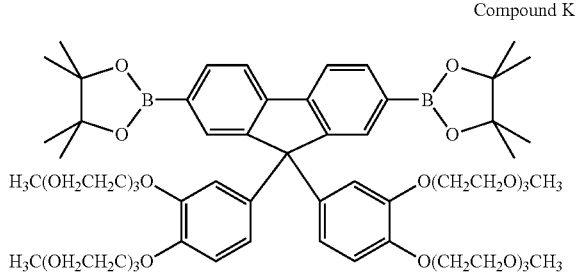

Synthesis of Polymer K

The compound K (0.715 g), the compound J (0.426 g), Aliquot 336 (6.60 mg), dichlorobis(triphenylphosphine)palladium (0.460 mg), 2 mol/L aqueous solution of sodium carbonate (10 mL) and toluene (20 mL) were added and stirred at 105° C. for 5 hours. Then, phenylboronic acid (32 mg) was added thereto and stirred at 105° C. for 6 hours. Sodium diethyldithiocarbamate trihydrate (0.72 g) and water (14 mL) were added to the reaction mixture and stirred at 80° C. for 2 hours. The resultant mixture was added dropwise to methanol. The deposited precipitate was recovered by filtration and dried. The obtained solid was dissolved in chloroform and was purified by an alumina chromatography and a silica gel chromatography. The effluent was concentrated and dried. The concentrate was dissolved in toluene, added dropwise to methanol and the deposited precipitate was recovered by filtration and dried, thus obtaining a polymer K (0.55 g).

The polystyrene equivalent number average molecular weight of the polymer K was $2.3 \times 10^4$. The polymer K is composed of a structural unit represented by the formula (X).

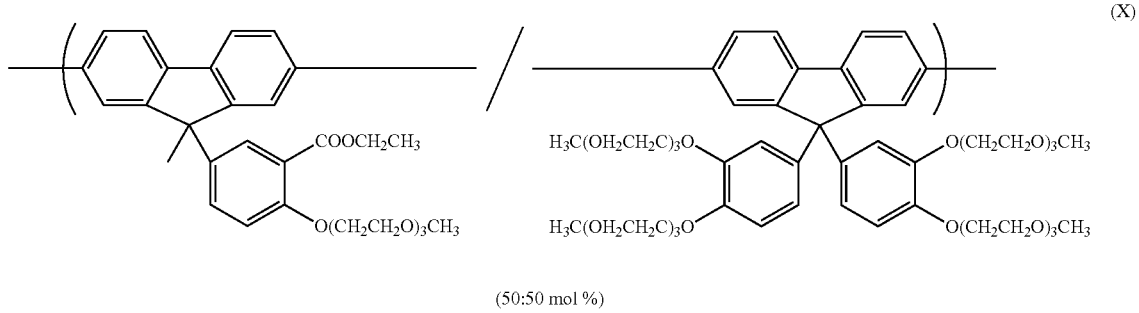

(X)

(50:50 mol %)

Synthesis of Cesium Salt of Polymer K

Under argon atmosphere, the polymer K (0.15 g), THF (20 mL), methanol (10 mL), cesium hydroxide monohydrate (103 mg) and water (1 mL) were stirred at 65° C. for 2 hours. Then, methanol (20 mL) was added thereto and stirred at 65° C. for 2 hours. The reaction mixture was concentrated and dried. Methanol was added to the solid and the resultant mixture was filtered. The filtrate thus obtained was concentrated and dried. A solid thus obtained was washed with water and dried, thus obtaining a cesium salt of the polymer K (0.14 g). The obtained cesium salt of the polymer K is called a conjugated high-molecular compound 14. The conjugated high-molecular compound 14 is composed of a structural unit represented by the formula (Y). The orbital energy of HOMO and the orbital energy of LUMO of the conjugated high-molecular compound 14 were −5.56 eV and −2.67 eV, respectively.

[Chem. 98]

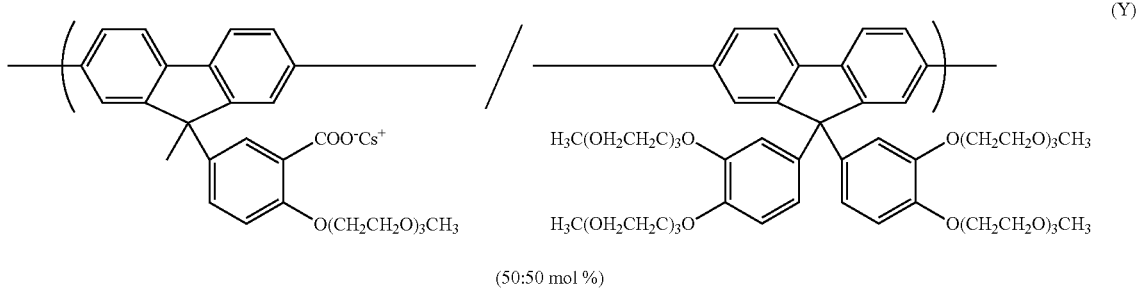

(50:50 mol %)

Preparation of Composition B

The conjugated high-molecular compound 14 (2 mg) and cesium hydroxide monohydrate (0.2 mg) were mixed to obtain a composition B, which was composed of the conjugated high-molecular compound 14 and cesium hydroxide.

(Fabrication of Electroluminescent Element 18)

An electroluminescent element 18 was obtained in a manner similar to Experimental Example 29, except that instead of the composition A in the fabrication of the electroluminescent element 17 of Experimental Example 29, the composition B was used.

Experimental Example 31

Synthesis of Compound L

Under nitrogen atmosphere, 5-bromo-2-hydroxybenzoic acid (92.85 g), ethanol (1140 mL) and concentrated sulfuric acid (45 mL) were refluxed for 48 hours and concentrated under reduced pressure. Ethyl acetate (1000 mL) was added thereto and the organic layer was washed with water and 10% by weight of an aqueous solution of sodium carbonate. The organic layer was dried with anhydrous sodium sulfate and concentrated under reduced pressure. The crude product thus obtained was purified by a silica gel column chromatography, thus obtaining a compound L (95.38 g, and yield 91%).

[Chem. 99]

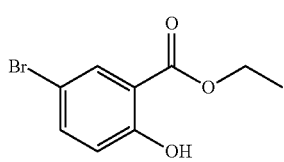

Compound L

Synthesis of Compound M

Under nitrogen atmosphere, the compound L (95.0 g), bis(pinacolato)diboron (108.5 g), [1,1'-bis(diphenylphosphino)ferrocene]dichloropalladium (II) dichloromethane adduct (3.3 g), 1,1'-bis(diphenylphosphino)ferrocene (2.2 g), potassium acetate (117.2 g) and 1,4-dioxane (1.3 L) were stirred at 105° C. for 22 hours. The reaction mixture was filtered and washed with dioxane and toluene. The filtrate was concentrated under reduced pressure. Ethyl acetate was added thereto and the resultant mixture was washed with saturated saline. The organic layer was dried with anhydrous sodium sulfate and concentrated under reduced pressure. The crude product thus obtained was purified by a silica gel column chromatography, thus obtaining a compound M (90.1 g, and 308 mmol).

[Chem. 100]

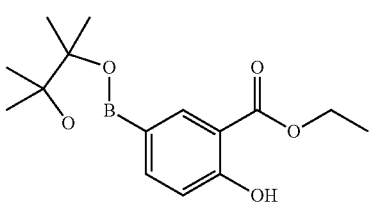

Compound M

Synthesis of Compound N

Under nitrogen atmosphere, 1,5-dihydroxynaphthalene (15.0 g), triethylamine (28.5 g) and chloroform (105 mL) were mixed and cooled down to 0° C. Trifluoromethanesulfonic anhydride (68.7 g) was added dropwise thereto and stirred for 1 hour. Water and chloroform were added to the reaction mixture to remove the water layer and the organic layer was washed with water. The organic layer was dried with anhydrous sodium sulfate and concentrated under reduced pressure. A solid thus obtained was recrystallized for purification, thus obtaining a compound N (31.46 g). In the following formula, Tf represents a trifluoromethylsulfonyl group.

[Chem. 101]

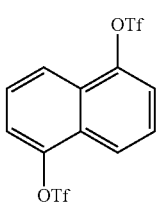

Compound N

Synthesis of Compound O

Under nitrogen atmosphere, the compound N (16.90 g), the compound M (23.30 g), tetrakis(triphenylphosphine)palladium (0) (4.60 g), potassium phosphate (42.30 g) and 1,2-dimethoxyethane (340 mL) were stirred at 80° C. for 14 hours. The reaction mixture was filtered and washed with chloroform and methanol. The filtrate was concentrated under reduced pressure and purified by a silica gel column chromatography, thus obtaining a compound O (8.85 g).

[Chem. 102]

Compound O

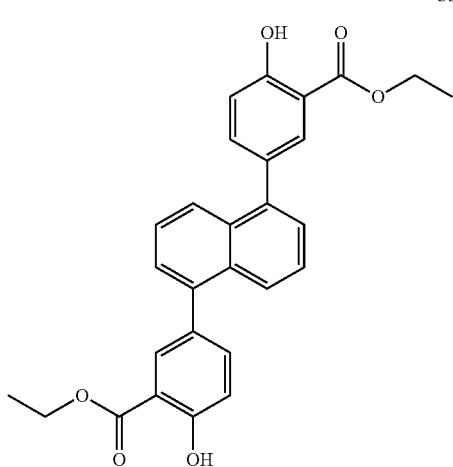

Synthesis of Compound P

Under nitrogen atmosphere, the compound O (8.80 g), 2-[2-(2-methoxyethoxy)ethoxy]-ethyl-p-toluenesulfonate (12.52 g), dimethylformamide (380 mL), potassium carbonate (13.32 g) and 18-crown-6 (1.02 g) were stirred at 100° C. for 23 hours. The reaction mixture was added to water to extract using ethyl acetate. The organic layer was washed with an aqueous solution of sodium chloride. The organic layer was dried with anhydrous sodium sulfate and concentrated under reduced pressure. The crude product thus obtained was purified by a silica gel column chromatography, thus obtaining a compound P (7.38 g).

[Chem. 103]

Compound P

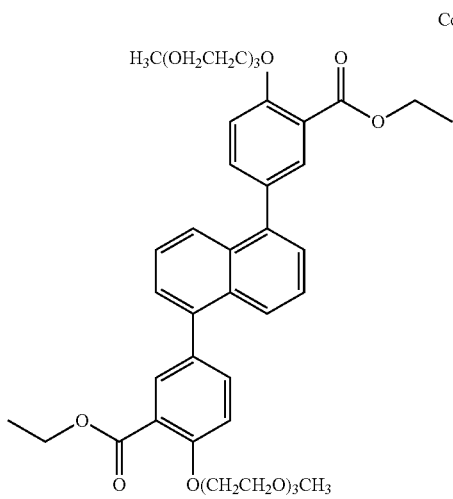

Synthesis of Compound Q

Under nitrogen atmosphere, the compound P (5.53 g), bis(pinacolato)diboron (11.25 g), (1,5-cyclooctadiene)(methoxy)iridium (I) dimer (0.15 g, manufactured by Sigma-Aldrich Corporation), 4,4'-di-tert-butyl-2,2'-dipyridyl (0.12 g, manufactured by Sigma-Aldrich Corporation) and 1,4-dioxane (300 mL) were stirred at 110° C. for 19 hours and the reaction mixture was concentrated under reduced pressure. The crude product was purified by a silica gel column chromatography and then recrystallized for purification, thus obtaining a compound Q (5.81 g). The $^1$H NMR measurement result of the compound Q was as follows.

$^1$H NMR (400 MHz, CDCl$_3$, rt)

δ (ppm) 1.27-1.41 (30H), 3.39 (6H), 3.57 (4H), 3.66-3.75 (8H), 3.83 (4H), 3.99 (4H), 4.27-4.42 (8H), 7.13 (2H), 7.60 (2H), 7.76 (2H), 7.93 (2H), 8.30 (2H).

[Chem. 104]

Compound Q

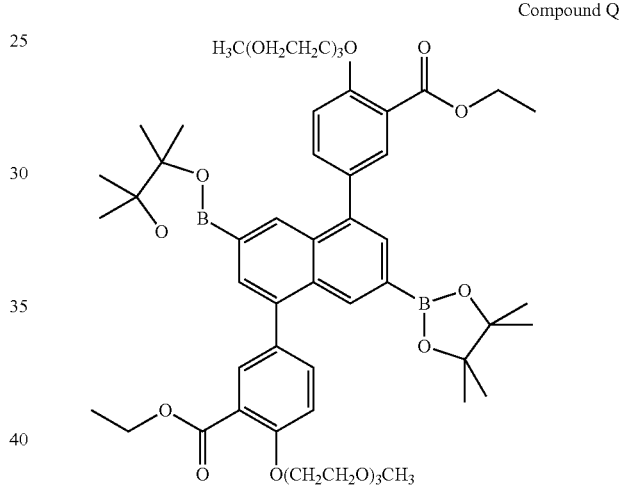

Synthesis of Polymer L

Under argon atmosphere, the compound J (0.53 g), the compound Q (0.43 g), dichlorobis(triphenylphosphine)palladium (0.3 mg), Aliquat 336 (5 mg, manufactured by Sigma-Aldrich Corporation), toluene (12 mL) and 2 mol/L aqueous solution of sodium carbonate (1 mL) were stirred at 105° C. for 9 hours. Then, phenylboronic acid (23 mg) was added thereto and stirred at 105° C. for 14 hours. Sodium diethyldithiocarbamate trihydrate (0.40 g) and water (8 mL) were added to the reaction mixture and stirred at 80° C. for 2 hours. The resultant mixture was added dropwise to methanol. The deposited precipitate was recovered by filtration and dried. The obtained solid was dissolved in chloroform and was purified by an alumina chromatography and a silica gel chromatography. The effluent was added dropwise to methanol and deposited precipitate was recovered by filtration and dried, thus obtaining a polymer L (0.56 g).

The polystyrene equivalent number average molecular weight of the polymer L was 3.4×10$^4$. The polymer L is composed of a structural unit represented by the formula (Z).

[Chem. 105]

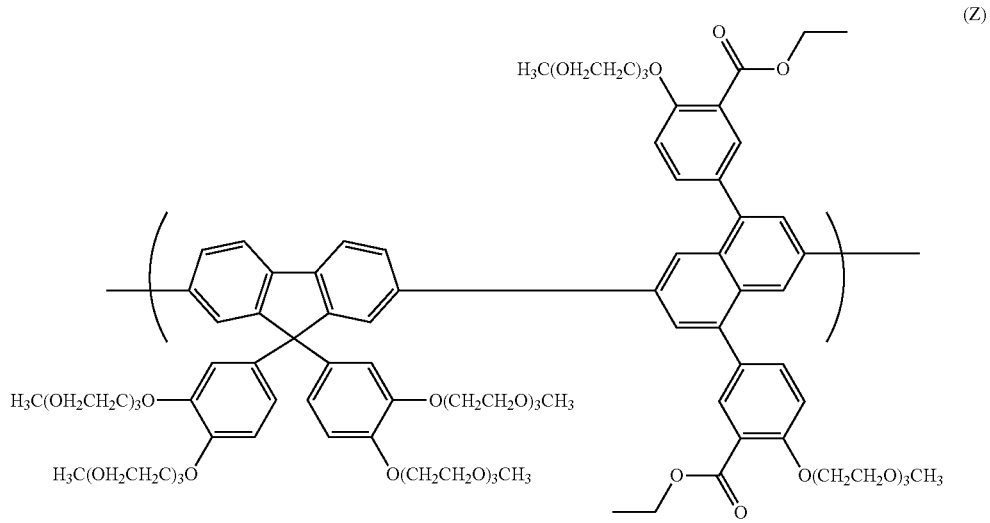

(Z)

Synthesis of Cesium Salt of Polymer L

Under argon atmosphere, the polymer L (0.25 g), THF (13 mL), methanol (6 mL), cesium hydroxide monohydrate (69 mg) and water (1 mL) were stirred at 65° C. for 6 hours. The reaction mixture was concentrated and added dropwise to isopropanol and the solid was recovered by filtration and dried. Methanol was added to the solid and the mixture was filtered. The filtrate was added dropwise to isopropanol and the solid was recovered by filtration and dried, thus obtaining a cesium salt of the polymer L (0.19 g). The obtained cesium salt of the polymer L is called a conjugated high-molecular compound 15. The conjugated high-molecular compound 15 is composed of a structural unit represented by the formula (AA). The orbital energy of HOMO and the orbital energy of LUMO of the conjugated high-molecular compound 15 were −5.50 eV and −2.65 eV, respectively.

Preparation of Composition C

The conjugated high-molecular compound 15 (2 mg) and cesium hydroxide monohydrate (0.2 mg) were mixed to obtain a composition C, which was composed of the conjugated high-molecular compound 15 and cesium hydroxide.

(Fabrication of Electroluminescent Element 19

An electroluminescent element 19 was obtained in a manner similar to Experimental Example 29, except that instead of the composition A in the fabrication of the electroluminescent element 17 of Experimental Example 29, the composition C was used.

Evaluation of Electroluminescent Elements 17 to 19

A forward voltage of 10 V was applied to the electroluminescent elements 17 and 19 to measure the luminance and the luminous efficiencies. The results are shown in Table 2.

[Chem. 106]

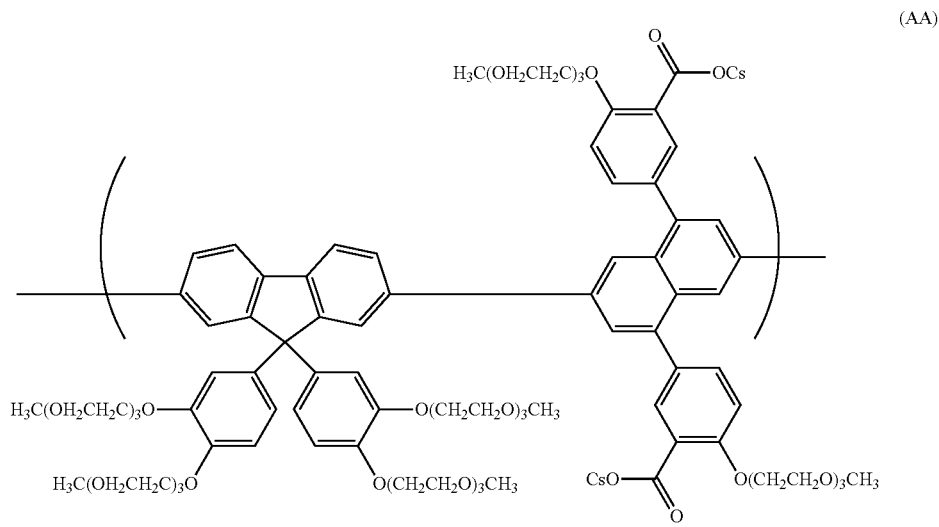

(AA)

TABLE 2

| | Composition | Cathode | Luminance (cd/m$^2$) | Luminous Efficiency (cd/A) |
|---|---|---|---|---|
| Experimental Example 29 (Electroluminescent Element 17) | Composition A | Al | 4713.3 | 3.14 |
| Experimental Example 30 (Electroluminescent Element 18) | Composition B | Al | 4385.1 | 3.73 |
| Experimental Example 31 (Electroluminescent Element 19) | Composition C | Al | 6532.6 | 3.27 |

REFERENCE SIGNS LIST

1: ORGANIC EL ELEMENT, 2: SUPPORTING SUBSTRATE, 3: ANODE, 4: HOLE INJECTION LAYER, 5: LIGHT-EMITTING LAYER, 6: ELECTRON INJECTION LAYER, 7: CATHODE

The invention claimed is:

1. An organic electroluminescence (EL) element comprising:
   a supporting substrate;
   an anode;
   a light-emitting layer;
   an electron injection layer; and
   a cathode in this order,
   wherein the electron injection layer comprises an ionic polymer, and
   the ionic polymer comprises one or more structural units selected from the group consisting of a structural unit represented by formula (13), a structural unit represented by formula (15), a structural unit represented by formula (17) and a structural unit represented by formula (20):

(13)

wherein R$^1$ represents a group represented by formula (14), Ar$^1$ represents a (2+n4)-valent aromatic group having or not having a substituent other than R$^1$, and n4 represents an integer of 1 or more, and in a case in which there is a plurality of R$^1$s they may be the same as or different from each other,

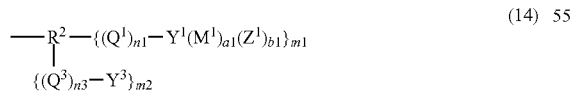

(14)

wherein R$^2$ represents a (1+m1+m2)-valent organic group, Q$^1$ represents a divalent organic group, Y$^1$ represents —CQ$_2^-$, —SO$_3^-$, —SO$_2^-$, —PO$_3^{2-}$, or —B(R$^3$)$_3$, M$^1$ represents a metal cation or an ammonium cation having a substituent or not having a substituent, Z$^1$ represents F$^-$, Cl$^-$, Br$^-$, I$^-$, OH$^-$, R$^a$SO$_3^-$, R$^a$COO$^-$, ClO$^-$, ClO$_2^-$, ClO$_3^-$, ClO$_4^-$, SCN$^-$, CN$^-$, NO$_3^-$, SO$_4^{2-}$, HSO$_4^-$, PO$_4^{3-}$, HPO$_4^{2-}$, H$_2$PO$_4^-$, BF$_4^-$, or PF$_6^-$, n1 represents an integer of 0 or more, a1 represents an integer of 1 more, and b1 represents an integer of 0 or more, provided that a1 and b1 are selected so that the charge of the group represented by the formula (14) can become zero, R$^a$ represents an alkyl group which has or does not have a substituent and has 1 to 30 carbon atoms or an aryl group which has or does not have a substituent has 6 to 50 carbon atoms, and, in a case in which there are a plurality of Q$^1$s, N$^1$s, and Z$^1$s respectively they may be the same as or different from each other, Q$^3$ represents a divalent organic group, Y$^3$ represents a group represented by any of the formulae (4) to (12), and n3 represents an integer of 0 or more.

(4)

(5)

(6)

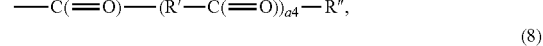

(7)

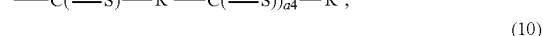

(8)

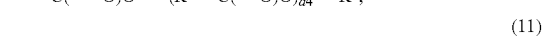

(10)

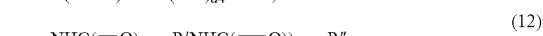

(11)

(12)

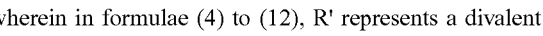

wherein in formulae (4) to (12), R' represents a divalent hydrocarbon group having or not having a substituent, R" represents a hydrogen atom, a monovalent hydrocarbon group having or not having a substituent, —COOH, —SO$_3$H, —OH, —SH, —NR$^c_2$, —CN, or —C(=O)NR$^c_2$, R''' presents a trivalent hydrocarbon group having or not having a substituent, a3 of formula (4) represents an integer of 2 or more, a3 of formula (5) represents an integer of 1 or more, a4 of formulas (6), (7) and (10) to 12) represents an integer of 1 or more, a4 of formula (8) represents an integer of 0 or more, R$^c$ represents an alkyl group which has or does not have a substituent and has 1 to 30 carbon atoms or an aryl group which has or does not have a substituent and has 6 to 50 carbon atoms, and, in a case in which there are a plurality of R's, R''s, and R'''s respectively, they may be the same as or different from each other, and m1 and m2 individually represent an integer of 1 or more respectively and, in a case in which there are a plurality of Q$^1$s, Q$^3$s, Y$^1$s, M$^1$s, Z$^1$s, Y$^3$s, n1s, a1s, b1s and n3s respectively, they may be the same as or different from each other;

(15)

wherein R$^3$ represents a group represented by the formula (16), Ar$^2$ represents a (2+n5)-valent aromatic group having or not having a substituent other than R$^3$, and n$^5$ represents an integer of 1 or more, and in a case in which there is a plurality of $R^3$s, they may be the same as or different from each other,

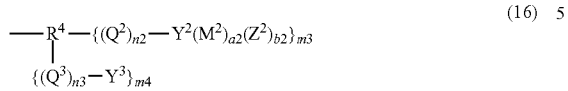 (16)

$Q^2$ represents a divalent organic group, $Y^2$ represents a carbocation, an ammonium cation, a phosphonyl cation, a sulfonyl cation, or an iodonium cation, $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Z^2$ represents a metal cation or an ammonium cation having a substituent or not having a substituent, n2 represents an integer of 0 or more, a2 represents an integer of 1 or more, and b2 represents an integer of 0 or more, provided, a2 and b2 are selected so that the charge of the group represented by the formula (16) can become zero, $R^b$ represents an alkyl group which has or does not have a substituent and has 1 to 30 carbon atoms or an aryl group which has or does not have a substituent and has 6 to 50 carbon atoms, and, in a case in which there are a plurality of $Q^2$s, $M^2$s, and $Z^2$s respectively, they may be the same as or different from each other, $Q^3$, $Y^3$ and $n^3$ are as defined above, and m3 and m4 individually represent an integer of 1 or more respectively, and in a case in which there are a plurality of $Q^2$s, $Q^3$s, $Y^2$s, $M^2$s, $Z^2$s, $Y^3$s, n2s, a2s, b2s and n3s respectively, they may be the same as or different from each other:

 (17)

wherein $R^5$ represents a group represented by the formula (18), $R^6$ represents a group represented by the formula (19), $Ar^3$ represents a (2+n6+n7)-valent aromatic group having or not having a substituent other than $R^5$ and $R^6$, and n6 and n7 individually represent an integer of 1 or more respectively, and in a case in which there is a plurality of $R^5$s and $R^6$s respectively, they may be the same as or different from each other,

 (18)

wherein $R^7$ represents a direct bond or (1+m5)-valent organic group, $Q^1$, $Y^1$, $M^1$, $Z^1$, n1, a1, and b1 have the same meaning as defined above, provided that a1 and b1 are selected so that the charge of the group represented by the formula (18) can become zero, and m5 represents an integer of 1 or more, and in a case in which there are a plurality of $Q^1$s, $Y^1$s, $M^1$s, $Z^1$s, n1s, a1s and b1s respectively, they may be the same as or different from each other,

 (19)

wherein $R^8$ represents a single bond or (1+m6)-valent organic group, $Q^3$, $Y^3$, and n3 have the same meaning as defined above, and m6 represent an integer of 1 or more, provided that in a case in which $R^8$ is a single bond, m6 represents 1, and in a case in which there are a plurality of $Q^3$s, $Y^3$s and n3s respectively, they may be the same as or different from each other,

 (20)

wherein $R^9$ represents a group represented by the formula (21), $R^{10}$ represents a group represented by the formula (22), $Ar^4$ represents a (2+n8+n9)-valent aromatic group having or not having a substituent other than $R^9$ and $R^{10}$, and n8 and n9 individually represent an integer of 1 or more respectively, and in a case in which there is a plurality of $R^9$s and $R^{10}$s respectively, they may be the same as or different from each other,

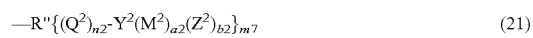 (21)

wherein $R^{11}$ represents a single bond or (1±m7)-valent organic group, $Q^2$, $Y^2$, $M^2$, $Z^2$, n2, a2 and b2 have the same meaning as defined above, provided, a2 and b2 are selected so that the charge of the group represented by the formula (21) can become zero, and m7 represents an integer of 1 or more, provided that in a case in which $R^{11}$ is a single bond, m7 represents 1, and, in a case in which there are a plurality of $Q^2$s, $Y^2$s, $M^2$s, $Z^2$s, n2s, a2s and b2s respectively, they may be the same as or different from each other,

 (22)

wherein $R^{12}$ represents a single bond or (1+m8)-valent organic group, $Q^3$, $Y^3$ and n3 have the same meaning as above, and m8 represent an integer of 1 or more, provided that in a case in which $R^{12}$ is a single bond, m8 represents 1, and in a case in which there are a plurality of $Q^3$s, $Y^3$s and n3s respectively, they may be the same as or different from each other.

2. The organic electroluminescence (EL) element according to claim 1,
wherein the cathode includes a conductive filler.

3. A method of manufacturing an organic electroluminescence (EL) element comprising a supporting substrate, an anode, a light-emitting layer, an electron injection layer, and a cathode in this order, comprising:
a step of forming the electron injection layer by applying an ink including an ionic polymer so as to form a film;
the ionic polymer comprises one or more structural units selected from the group consisting of a structural unit represented by formula (13), a structural unit represented by formula (15), a structural unit represented by formula (17) and a structural unit represented by formula (20):

 (13)

wherein $R^1$ represents a group represented by formula (14), $Ar^1$ represents a (2+n4)-valent aromatic group having or not having a substituent other than $R^1$, and n4 represents an integer of 1 or more, and in a case in which there is a plurality of R¹s they may be the same as or different from each other,

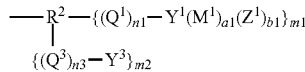
(14)

wherein $R^2$ represents a (1+m1+m2)-valent organic group, $Q^1$ represents a divalent organic group, $Y^1$ represents $-CQ_2^-$, $-SO_3^-$, $-SO_2^-$, $-PO_3^{2-}$, or $-B(R^3)_3$, $M^1$ represents a metal cation or an ammonium cation having a substituent or not having a substituent, $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, n1 represents an integer of 0 or more, a1 represents an integer of 1 or more, and b1 represents an integer of 0 or more, provided that a1 and b1 are selected so that the charge of the group represented by the formula (4) can become zero, $R^a$ represents an alkyl group which has or does not have a substituent and has 1 to 30 carbon atoms or an aryl group which has or does not have a substituent and has 6 to 50 carbon atoms, and, in a case in which there are a plurality of $Q^1$s, $M^1$s, and $Z^1$s respectively, they may be the same as or different from each other, $Q^3$ represents a divalent organic group, $Y^3$ represents a group represented by any of the formulae (4) to (12), and n3 represents an integer of 0 or more, $$-O-(R'O)_{a3}-R'', \quad (4)$$

$$-R'''\!\!<\!\!\begin{array}{c}\\(OR')_{a3}\end{array}\!\!O, \quad (5)$$

$$-A-(R'S)_{a4}-R'' \quad (6)$$

$$-C(=O)-(R'-C(=O))_{a4}-R'', \quad (7)$$

$$-C(=S)-R'-C(=S))_{a4}-R'', \quad (8)$$

$$-C(=O)O-(R-C(=O)O)_{a4}-R'', \quad (10)$$

$$-C(=O)O-(R'O)_{a4}-R'', \quad (11)$$

$$-NHC(=O)-R'NHC(=O))_{a4}-R'', \quad (12)$$

wherein in formulae (4) to (12), R' represents a divalent hydrocarbon group having or not having a substituent, R" represents a hydrogen atom, a monovalent hydrocarbon group having or not having a substituent, $-COOH$, $-SO_3H$, $-SH$, $-NR^c_2$, $-CN$, or $-C(=O)NR^c_2$, R''' represents a trivalent hydrocarbon group having or not having a substituent, a3 of formula (4) represents an integer of 2 or more, a3 of formula (5) represents an integer of 1 or more, a4 of formulas (6), (7) and (10) to (12) represents an integer of 1 or more, a4 of formula (8) represents an integer of 0 or more, $R^c$ represents an alkyl group which has or does not have a substituent and has 1 to 30 carbon atoms or an aryl group which has or does not have a substituent and has 6 to 50 carbon atoms, and, in a case in which there are a plurality of R's, R"s, and R'''s respectively, they may be the same as or different from each other, and m1 and m2 individually represent an integer of 1 or more respectively and, in a case in which there are a plurality of $Q^1$s, $Q^3$s, $Y^1$s, $M^1$s, $Z^1$s, $Y^3$s, n1s, a1s, b1s and n3s respectively, they may be the same as or different from each other;

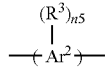
(15)

wherein $R^3$ represents a group represented by the formula (16). $Ar^2$ represents a (2+n5)-valent aromatic group having or not having a substituent other than $R^3$, and $n^5$ represents an integer of 1 or more, and in a case in which there is a plurality of $R^3$s, they may be the same as or different from each other,

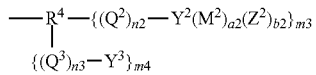
(16)

$Q^2$ represents a divalent organic group, $Y^2$ represents a carbocation, an ammonium cation, a phosphonyl cation, a sulfonyl cation, or an iodonium cation, $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Z^2$ represents a metal cation or an ammonium cation having a substituent or not having a substituent, n2 represents an integer of 0 or more, a2 represents an integer of 1 or more, and b2 represents an integer of 0 or more, provided, a2 and b2 are selected so that the charge of the group represented by the formula (16) can become zero, $R^b$ represents an alkyl group which has or does not have a substituent and has 1 to 30 carbon atoms or an aryl group which has or does not have a substituent and has 6 to 50 carbon atoms, and, in a case in which there are a plurality of $Q^2$s, $M^2$s, and $Z^2$s respectively, they may be the same as or different from each other, $Q^3$, $Y^3$ and $n^3$ are as defined above, and m3 and m4 individually represent an integer of 1 or more respectively, and in a case in which there are a plurality of $Q^2$s, $Q^3$s, $Y^2$s, $M^2$s, $Z^2$s, n2s, a2s, b2s and n3s respectively, they may be the same as or different from each other:

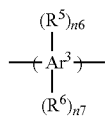
(17)

wherein $R^5$ represents a group represented by the formula (18), $R^6$ represents a group represented by the formula (19), $Ar^3$ represents a (2+n6+n7)-valent aromatic group having or not having a substituent other than $R^5$ and $R^6$, and n6 and n7 individually represent an integer of 1 or more respectively, and in a case in which there is a plurality of $R^5$s and $R^6$s respectively, they may be the same as or different from each other,

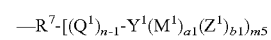
(18)

wherein $R^7$ represents a direct bond or (1+m5)-valent organic group, $Q^1$, $Y^1$, $M^1$, $Z^1$, n1, a1, and b1 have the same meaning as defined above, provided that a1 and b1 are selected so that the charge of the group represented by the formula (18) can become zero, and m5 represents an integer of 1 or more, and in a case in which there are a plurality of $Q^1$, $Y^1$s, $M^1$, $Z^1$s, n1s, a1s and b1s respectively, they may be the same as or different from each other,

 (19)

wherein $R^8$ represents a single bond or (1+m6)-val organic group, $Q^3$, $Y^3$, and n3 have the same meaning as defined above, and m6 represent an integer of 1 or more, provided that in a case in which $R^8$ is a single bond, m6 represents 1, and in a case in which there are a plurality of $Q^3$s, $Y^3$s and n3s respectively, they may be the same as or different from each other,

 (20)

wherein $R^9$ represents a group represented by the formula represents a group represented by the formula (22), $Ar^4$ represents a (2+n8+n9)-valent aromatic group having or not having a substituent other than $R^9$ and $R^{10}$, and n8 and n9 individually represent an integer of 1 or more respectively, and in a case in which there is a plurality of $R^9$s and $R^{10}$s respectively, they may be the same as or different from each other,

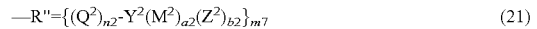 (21)

wherein $R^{11}$ represents a single bond or (1+m7)-valent organic group, $Q^2$, $Y^2$, $M^2$, $Z^2$, n2, a2 and b2 have the same meaning as defined above, provided, a2 and b2 are selected so that the charge of the group represented by the formula (21) can become zero, and m7 represents an integer of 1 or more, provided that in a case in which $R^{11}$ is a single bond, m7 represents 1; and, in a case in which there are a plurality of $Q^2$s, $Y^2$s, $M^2$s, n2s, a2s and b2s respectively, they may be the same as or different from each other,

 (22)

wherein $R^{12}$ represents a single bond or (1+m8)-valent organic group, $Q^3$, $Y^3$ and n3 have the same meaning as above, and m8 represent an integer of 1 or more, provided that in a case in which $R^{12}$ is a single bond, m8 represents 1, and in a case in which there are a plurality of $Q^3$s, $Y^3$s and n3s respectively, they may be the same as or different from each other, and a step of forming the cathode by transferring a conductive thin film or applying an ink including a material which forms the cathode so as to form a film.

4. The method of manufacturing an organic electroluminescence (EL) element according to claim 3,
wherein the electron injection layer and the cathode are formed by using a roll to roll method.

* * * * *